(12) United States Patent
Schulze et al.

(10) Patent No.: US 12,707,805 B2
(45) Date of Patent: Aug. 11, 2026

(54) ORGANIC ELECTROLUMINESCENT DEVICE AND A DISPLAY DEVICE COMPRISING THE ORGANIC ELECTROLUMINESCENT DEVICE

(71) Applicant: Novaled GmbH, Dresden (DE)

(72) Inventors: Benjamin Schulze, Dresden (DE); Thomas Rosenow, Dresden (DE); Max Peter Nüllen, Dresden (DE); Regina Luschtinetz, Dresden (DE); Jakob Jacek Wudarczyk, Dresden (DE)

(73) Assignee: Novaled GmbH, Dresden (DE)

(*) Notice: Subject to any disclaimer, the term of this patent is extended or adjusted under 35 U.S.C. 154(b) by 426 days.

(21) Appl. No.: 18/531,383

(22) Filed: Dec. 6, 2023

(65) Prior Publication Data

US 2024/0237509 A1 Jul. 11, 2024

(30) Foreign Application Priority Data

Dec. 15, 2022 (EP) .................................... 22213841

(51) Int. Cl.

*H10K 50/19* (2023.01)
*H10K 50/155* (2023.01)
*H10K 50/165* (2023.01)
*H10K 50/17* (2023.01)
*H10K 85/60* (2023.01)
*H10K 101/30* (2023.01)

(52) U.S. Cl.

CPC ........... *H10K 50/19* (2023.02); *H10K 50/155* (2023.02); *H10K 50/165* (2023.02); *H10K 50/17* (2023.02); *H10K 50/171* (2023.02); *H10K 85/60* (2023.02); *H10K 85/615* (2023.02); *H10K 85/622* (2023.02); *H10K 85/631* (2023.02); *H10K 85/654* (2023.02); *H10K 85/657* (2023.02); *H10K 85/6572* (2023.02); *H10K 2101/30* (2023.02)

(58) Field of Classification Search

CPC .... H10K 50/19; H10K 50/155; H10K 50/165; H10K 50/17; H10K 85/60; H10K 85/615; H10K 85/622; H10K 85/631; H10K 85/654; H10K 85/657; H10K 85/6572; H10K 2101/30

See application file for complete search history.

(56) References Cited

U.S. PATENT DOCUMENTS 5,093,698 A 3/1992 Egusa
2019/0207122 A1 7/2019 Lim et al.
(Continued)

FOREIGN PATENT DOCUMENTS

EP 1970371 A1 9/2008
EP 4036080 A1 8/2022
(Continued)

OTHER PUBLICATIONS

Chemical Book, CAS Database List, CAS No. 850918-68-2.
Allen, Leland C., Electronegativity Is the Average One-Electron Energy of the Valence-Shell Electrons in Ground-State Free Atoms, J. Am. Chem. Soc. 1989, 111, 9003-9014.
(Continued)

*Primary Examiner* — Aaron J Gray
(74) *Attorney, Agent, or Firm* — Eversheds Sutherland (US) LLP

(57) ABSTRACT

The present invention is directed to an organic electroluminescent device and a display device comprising the organic electroluminescent device.

33 Claims, 4 Drawing Sheets

(56) References Cited

U.S. PATENT DOCUMENTS

| | | | | |
|---|---|---|---|---|
| 2020/0144552 | A1* | 5/2020 | Kim | H10K 85/631 |
| 2020/0303651 | A1* | 9/2020 | Kim | C07C 255/47 |
| 2021/0265568 | A1* | 8/2021 | Han | H10K 50/11 |
| 2022/0037595 | A1* | 2/2022 | Schulze | H10K 50/165 |
| 2022/0158110 | A1* | 5/2022 | Jeon | H10K 59/32 |
| 2023/0209859 | A1* | 6/2023 | Seo | H10K 85/6572 257/40 |
| 2024/0074221 | A1* | 2/2024 | Xie | H10K 50/11 |
| 2025/0393391 | A1* | 12/2025 | Luschtinetz | H10K 50/17 |

FOREIGN PATENT DOCUMENTS

| | | | |
|---|---|---|---|
| GB | 2492400 | A | 1/2013 |
| WO | 0215292 | A2 | 2/2002 |
| WO | 2013079217 | A1 | 6/2013 |

OTHER PUBLICATIONS

Reeves, G.K. et al., Obtaining the specific contact resistance from transmission line model measurements, IEEE Electron Device Letters (vol. 3, Issue: 5, May 1982), pp. 113-133 (Abstract only).

Schroder, Dieter K., Semiconductor Material and Device Characterization, John Wiley & Sons, 146 (2006) ISBN 0471739065 (2 pages).

Tang, C. W. et al., Organic electroluminescent diodes, Appl. Phys. Lett. 51, 913 (1987) (4 pages).

Williams, Ralph, Modern GaAs Processing Methods, Artech House (1990) ISBN 0890063435 (8 pages).

Yamazaki, Asumi et al., Spatial Resolution Characteristics of Organic Light-emitting Diode Displays: A comparative Analysis of MTF for Handheld and Workstation Formats, SID Symposium Digest of Technical Papers, vol. 44 (2013) pp. 419-422.

* cited by examiner

ORGANIC ELECTROLUMINESCENT DEVICE AND A DISPLAY DEVICE COMPRISING THE ORGANIC ELECTROLUMINESCENT DEVICE

CROSS-REFERENCE TO RELATED APPLICATIONS

This application claims priority to European Patent Application No. 22213841.4, filed Dec. 15, 2022, which is incorporated by reference herein.

TECHNICAL FIELD

The present invention relates to an organic electroluminescent device and an display device comprising the organic electroluminescent device.

BACKGROUND ART

Organic electroluminescent devices, such as organic light-emitting diodes OLEDs, which are self-emitting devices, have a wide viewing angle, excellent contrast, quick response, high brightness, excellent operating voltage characteristics, and color reproduction. A typical OLED comprises an anode, a hole transport layer HTL, an emission layer EML, an electron transport layer ETL, and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

Performance of an organic light emitting diode may be affected by characteristics of the organic semiconductor layer, and among them, may be affected by characteristics of an organic material of the organic semiconductor layer.

Particularly, development of an organic semiconductor layer being capable of improving electron transport, electron injection and electron generation properties is needed. Thereby, operating voltage in OLEDs may be reduced. Lower operating voltage is important for reduced power consumption and improved battery life, esp. of mobile devices.

Further, development of an organic electroluminescent device with improved efficiency is needed.

Increased efficiency is important for reducing power consumption and increasing battery life, for example of a mobile display device.

There remains a need to improve performance of organic semiconductor materials, organic semiconductor layers, as well as organic electroluminescent devices thereof, in particular to achieve reduced operating voltage and increased efficiency through improving the characteristics of the compounds comprised therein.

DISCLOSURE

An aspect provides an organic electroluminescent device comprising an anode layer, a cathode layer, a first emission layer, a second emission layer, a hole injection layer, an electron injection layer, a first electron transport layer, and a first charge generation layer, wherein the first charge generation layer is arranged between the first emission layer and the second emission layer, the electron injection layer is arranged adjacent to the cathode layer;

the first charge generation layer comprises a first n-type charge generation layer and a first p-type charge generation layer, the first n-type charge generation layer is arranged closer to the anode layer than the first p-type charge generation layer, the first electron transport layer is arranged between the first emission layer and the first charge generation layer, the first electron transport layer is arranged in direct contact with the first n-type charge generation layer, wherein the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV;

the first electron transport layer comprises an electron transport compound comprising a six-member heteroaromatic ring comprising at least two nitrogen ring atoms and wherein the first electron transport layer is:

essentially free of a compound selected from the group comprising a 8-hydroxy-quinolinolato-lithium complex; or comprises ≥0 wt.-% to ≤1 wt.-% of a compound selected from the group comprising a 8-hydroxyquinolinolato-lithium complex, wherein the wt.-% of the components is based on the total weight of the first electron transport layer;

the first n-type charge generation layer comprises an electron transport matrix compound comprising a heteroaromatic ring comprising at least one nitrogen ring atom, and a metal dopant;

the first p-type charge generation layer comprises a second organic p-dopant and a second hole transport matrix compound;

wherein the second organic p-dopant comprises at least four CN groups, and wherein the second organic p-dopant has a molecular weight of ≥400 g/mol and a LUMO energy level of less than −4.80 eV;

wherein the first hole transport matrix compound and the second hole transport matrix compound are selected the same or different from the group comprising an arylamine compound, diarylamine compound, triarylamine compound, a compound of formula (Ia) or a compound of formula (Ib):

(Ia)

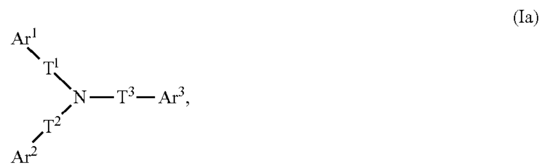

(Ib)

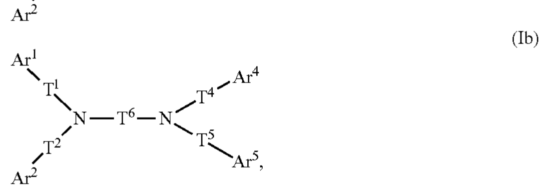

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted orunsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C(=O)R'^1$, CN, $Si(R'^1)_3$, $P(=O)(R'^1)_2$, $OR'^1$, $S(=O)R'^1$, $S(=O)_2R'^1$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R'^1$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl;

wherein the LUMO energy level of the first organic p-dopant is further away from vacuum level than the LUMO energy level of the second organic p-dopant; and wherein the electron injection layer comprises Ytterbium.

According to one embodiment, wherein the organic electroluminescent device comprises an anode layer, a cathode layer, a first emission layer, a second emission layer, a hole injection layer, an electron injection layer, a first electron transport layer, and a first charge generation layer, wherein the first charge generation layer is arranged between the first emission layer and the second emission layer, the electron injection layer is arranged adjacent to the cathode layer;

the first charge generation layer comprises a first n-type charge generation layer and a first p-type charge generation layer, the first n-type charge generation layer is arranged closer to the anode layer than the first p-type charge generation layer, the first electron transport layer is arranged between the first emission layer and the first charge generation layer, the first electron transport layer is arranged in direct contact with the first n-type charge generation layer, wherein the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV;

the first electron transport layer comprises an electron transport compound comprising a six-member heteroaromatic ring comprising at least two nitrogen ring atoms and wherein the first electron transport layer is:

essentially free of a compound selected from the group comprising a 8-hydroxy-quinolinolato-lithium complex; or comprises ≥0 wt.-% to ≤1 wt.-% of a compound selected from the group comprising a 8-hydroxyquinolinolato-lithium complex, wherein the wt.-% of the components is based on the total weight of the first electron transport layer;

the first n-type charge generation layer comprises an electron transport matrix compound comprising a heteroaromatic ring comprising at least one nitrogen ring atom, and a metal dopant;

the first p-type charge generation layer comprises a second organic p-dopant and a second hole transport matrix compound;

wherein the second organic p-dopant comprises at least four CN groups, and wherein the second organic p-dopant has a molecular weight of ≥400 g/mol and a LUMO energy level of less than −4.80 eV;

wherein the first hole transport matrix compound and the second hole transport matrix compound are selected the same or different from the group comprising an arylamine compound, diarylamine compound, triarylamine compound, a compound of formula (Ta) or a compound of formula (Ib):

(Ia)

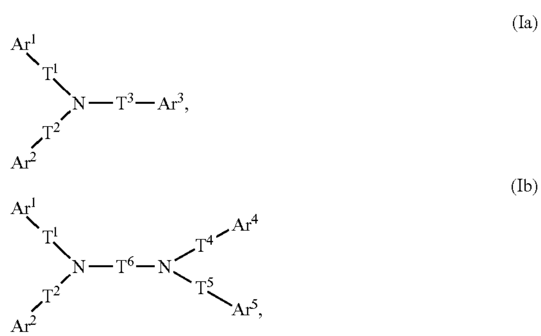

(Ib)

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C(=O)R'^1$, CN, $Si(R'^1)_3$, $P(=O)(R'^1)_2$, $OR'^1$, $S(=O)R'^1$, $S(=O)_2R'^1$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R'^1$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl;

wherein the LUMO energy level of the first organic p-dopant is further away from vacuum level than the LUMO energy level of the second organic p-dopant; and wherein the electron injection layer comprises Ytterbium; and wherein the LUMO energy level of the first organic p-dopant and the LUMO energy level of the second organic p-dopant are calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to one embodiment, wherein the organic electroluminescent device comprises an anode layer, a cathode layer, a first emission layer, a second emission layer, a hole injection layer, an electron injection layer, a first electron transport layer, and a first charge generation layer, wherein the first charge generation layer is arranged between the first emission layer and the second emission layer, the electron injection layer is arranged adjacent to the cathode layer;

the first charge generation layer comprises a first n-type charge generation layer and a first p-type charge generation layer, the first n-type charge generation layer is arranged closer to the anode layer than the first p-type charge generation layer, the first electron transport layer is arranged between the first emission layer and the first charge generation layer, the first electron transport layer is arranged in direct contact with the first n-type charge generation layer, wherein the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV;

the first electron transport layer comprises an electron transport compound comprising a six-member heteroaromatic ring comprising at least two nitrogen ring atoms and wherein the first electron transport layer is:

essentially free of a compound selected from the group comprising a 8-hydroxy-quinolinolato-lithium complex; or comprises ≥0 wt.-% to ≤1 wt.-% of a compound selected from the group comprising a 8-hydroxyquinolinolato-lithium complex; or comprises ≥0 wt.-% to ≤1 wt.-%, preferably ≥0 wt.-% to ≤0.001 wt.-%, and more preferred ≥0 wt.-% to ≤0.0001 wt.-%, of a metal complex and/or and a metal salt;

wherein the wt.-% of the components is based on the total weight of the first electron transport layer;

the first n-type charge generation layer comprises an electron transport matrix compound comprising a heteroaromatic ring comprising at least one nitrogen ring atom, and a metal dopant;

the first p-type charge generation layer comprises a second organic p-dopant and a second hole transport matrix compound;

wherein the second organic p-dopant comprises at least four CN groups, and wherein the second organic p-dopant has a molecular weight of ≥400 g/mol and a LUMO energy level of less than −4.80 eV;

wherein the first hole transport matrix compound and the second hole transport matrix compound are selected the same or different from the group comprising an arylamine compound, diarylamine compound, triarylamine compound, a compound of formula (Ia) or a compound of formula (Ib):

(Ia)

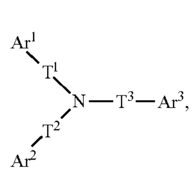

(Ib)

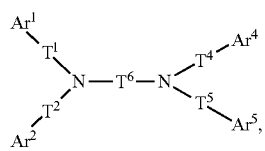

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted orunsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, C(=O)R'$^1$, CN, Si(R'$^1$)$_3$, P(=O)(R'$^1$)$_2$, OR'$^1$, S(=O)R'$^1$, S(=O)$_2$R'$^1$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein R'$^1$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl;

wherein the LUMO energy level of the first organic p-dopant is further away from vacuum level than the LUMO energy level of the second organic p-dopant; and wherein the electron injection layer comprises Ytterbium.

According to one embodiment, wherein the organic electroluminescent device comprises an anode layer, a cathode layer, a first emission layer, a second emission layer, a hole injection layer, an electron injection layer, a first electron transport layer, and a first charge generation layer, wherein the first charge generation layer is arranged between the first emission layer and the second emission layer, the electron injection layer is arranged adjacent to the cathode layer;

the first charge generation layer comprises a first n-type charge generation layer and a first p-type charge generation layer, the first n-type charge generation layer is arranged closer to the anode layer than the first p-type charge generation layer, the first electron transport layer is arranged between the first emission layer and the first charge generation layer, the first electron transport layer is arranged in direct contact with the first n-type charge generation layer, wherein the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV;

the first electron transport layer comprises an electron transport compound comprising a six-member heteroaromatic ring comprising at least two nitrogen ring atoms and wherein the first electron transport layer is:

essentially free of a compound selected from the group comprising a 8-hydroxyquinolinolato-lithium complex; or comprises ≥0 wt.-% to ≤1 wt.-% of a compound selected from the group comprising a 8-hydroxyquinolinolato-lithium complex; or comprises ≥0 wt.-% to ≤1 wt.-%, preferably ≥0 wt.-% to ≤0.001 wt.-%, and more preferred ≥0 wt.-% to ≤0.0001 wt.-%, of a metal complex and/or and a metal salt;

wherein the wt.-% of the components is based on the total weight of the first electron transport layer;

the first n-type charge generation layer comprises an electron transport matrix compound comprising a heteroaromatic ring comprising at least one nitrogen ring atom, and a metal dopant;

the first p-type charge generation layer comprises a second organic p-dopant and a second hole transport matrix compound;

wherein the second organic p-dopant comprises at least four CN groups, and wherein the second organic p-dopant has a molecular weight of ≥400 g/mol and a LUMO energy level of less than −4.80 eV;

wherein the first hole transport matrix compound and the second hole transport matrix compound are selected the same or different from the group comprising an arylamine compound, diarylamine compound, triarylamine compound, a compound of formula (Ia) or a compound of formula (Ib):

(Ia)

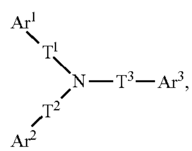

(Ib)

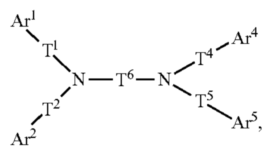

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C(=O)R'^1$, CN, $Si(R'^1)_3$, $P(=O)(R'^1)_2$, $OR'^1$, $S(=O)R'^1$, $S(=O)_2R'^1$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5-to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R'^1$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl;

wherein the LUMO energy level of the first organic p-dopant is further away from vacuum level than the LUMO energy level of the second organic p-dopant; and wherein the electron injection layer comprises Ytterbium; and wherein the LUMO energy level of the first organic p-dopant and the LUMO energy level of the second organic p-dopant are calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to one embodiment, wherein the organic electroluminescent device comprises an anode layer, a cathode layer, a first emission layer, a second emission layer, a hole injection layer, an electron injection layer, a first electron transport layer, and a first charge generation layer, wherein the LUMO energy level of the first organic p-dopant and the LUMO energy level of the second organic p-dopant are calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to one embodiment, wherein the organic electroluminescent device comprises an anode layer, a cathode layer, a first emission layer, a second emission layer, a hole injection layer, an electron injection layer, a first electron transport layer, and a first charge generation layer, wherein the hole injection layer comprises a first organic p-dopant and a first hole transport matrix compound, and the first p-type charge generation layer comprises a second organic p-dopant and a second hole transport matrix compound, wherein the LUMO energy level of the first organic p-dopant and the LUMO energy level of the second organic p-dopant are calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

Definitions

The term "LUMO energy level of the first organic p-dopant is further away from vacuum level than the second organic p-dopant" is understood to mean that the absolute value of the LUMO energy level of the first organic p-dopant is higher than the absolute value of the LUMO energy level of the second organic p-dopant.

The term "organic p-dopant" as used herein, may refer to a material capable of facilitating hole injection, i.e. positive charges injected from an anode preferably into an organic layer in particular hole transport layer, and preferably wherein said material is capable of reducing the operational voltage at a certain current density if present; or a material capable of increasing the density of positive charge carriers of a material, for example organic redox p-dopant, in particular a hole transport material, preferably if present.

In the present specification "aryl substituted" refers to a substitution with one or more aryl groups, which themselves may be substituted with one or more aryl and/or heteroaryl groups.

Correspondingly, in the present specification "heteroaryl substituted" refers to a substitution with one or more heteroaryl groups, which themselves may be substituted with one or more aryl and/or heteroaryl groups.

In the present specification an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (preferably less than 10 percent of the atoms other than H), such as, for example, an $sp^3$-hybridised C, N or O atom. Thus, for example, systems such as 9,9'-spirobifluorene, 9,9-diarylfluorene, triarylamine, diaryl ether, stilbene, benzophenone, etc., are also intended to be taken to mean aromatic ring systems for the purposes of this invention. Likewise, an aromatic or heteroaromatic ring system is taken to mean systems in which a plurality of aryl or heteroaryl groups are linked to one another by single bonds, for example biphenyl, terphenyl or bipyridine.

In the present specification, when a definition is not otherwise provided, an "alkyl group" refers to a saturated aliphatic hydrocarbyl group. The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and tert-butyl.

Specific examples of the alkyl group may be a methyl group, an ethyl group, a propyl group, an isopropyl group, a butyl group, an iso-butyl group, a tert-butyl group, a pentyl group, a hexyl group.

The term "cycloalkyl" refers to saturated hydrocarbyl groups derived from a cycloalkane by formal abstraction of one hydrogen atom from a ring atom comprised in the corresponding cycloalkane. Examples of the cycloalkyl group may be a cyclopropyl group, a cyclobutyl group, a cyclopentyl group, a cyclohexyl group, a methyl cyclohexyl group, an adamantly group and the like.

The term "hetero" is understood the way that at least one carbon atom, in a structure which may be formed by covalently bound carbon atoms, is replaced by another polyvalent atom. Preferably, the heteroatoms are selected from B, Si, N, P, O, S; more preferably from N, P, O, S.

In the present specification, "aryl group" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenylyl, and polycyclic groups comprising fused rings, like naphthyl or fluoren-2-yl.

Analogously, under heteroaryl, it is especially where suitable understood a group derived by formal abstraction of one ring hydrogen from a heterocyclic aromatic ring in a compound comprising at least one such ring.

Under heterocycloalkyl, it is especially where suitable understood a group derived by formal abstraction of one ring hydrogen from a saturated cycloalkyl ring in a compound comprising at least one such ring.

The term "fused aryl rings" or "condensed aryl rings" is understood the way that two aryl rings are considered fused or condensed when they share at least two common $sp^2$-hybridized carbon atoms In the present specification, the single bond refers to a direct bond.

In the context, "different" means that the compounds do not have an identical chemical structure.

The term "free of", "does not contain", "does not comprise" does not exclude impurities which may be present in the compounds prior to deposition. Impurities have no technical effect with respect to the object achieved by the present invention.

The term "contacting sandwiched" refers to an arrangement of three layers whereby the layer in the middle is in direct contact with the two adjacent layers.

The terms "light-absorbing layer" and "light absorption layer" are used synonymously.

The terms "light-emitting layer", "light emission layer" and "emission layer" are used synonymously.

The terms "OLED", "organic light-emitting diode" and "organic light-emitting device" are used synonymously.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

Advantageous Effects

Surprisingly, it was found that the organic electroluminescent device according to the invention solves the problem underlying the present invention by enabling devices in various aspects superior over the organic electroluminescent devices known in the art, in particular with respect to operating voltage and efficiency. The organic electroluminescent device according to the invention possesses in particular an improved operational voltage and voltage increase over time, current efficiency, external quantum efficiency, and lifetime in particular the operation voltage, voltage increase over time and the lifetime.

First Electron Transport Layer

Position of the First Electron Transport Layer

According to an embodiment, the first electron transport layer is in direct contact with the first emission layer.

According to an embodiment, the first emission layer is arranged closer to the anode layer than the second emission layer.

According to an embodiment, the first electron transport layer is closest to the anode layer than any other electron transport layer within the organic electroluminescent device.

According to an embodiment, the first electron transport layer which is in direct contact with the first n-type charge generation layer is the electron transport layer closest to the anode layer.

Composition of the First Electron Transport Layer

According to an embodiment, the first electron transport layer is essentially free of a lithium complex.

According to an embodiment, the first electron transport layer is essentially free of a metal complex.

According to an embodiment, the first electron transport layer is essentially free of a metal complex and metal salt.

Definition of "Essentially Free of"

In the context of the present specification the term "essentially free of a 8-hydroxyquinolinolato-lithium" or "essentially free of lithium organic metal complex" or "essentially free of a metal organic complex" or "essentially free of a metal complex" or "essentially free of a metal complex and a metal salt" means that less than 1.0 wt.-% (weight percent) of the respective component is present in the first electron transport layer, alternatively less than 0.5 wt.-%, alternatively less than 0.01 wt.-%, alternatively less than 0.001 wt %, alternatively less than 0.0001 wt.-%; wherein the wt.-% of the components is based on the total weight of the first electron transport layer.

According to an embodiment, wherein the first electron transport layer:

- is essentially free of a compound selected from the group comprising a 8-hydroxyquinolinolato-lithium complex; or
- is essentially free of a compound selected from the group comprising a metal complex and/or a metal salt; or
- comprises ≥0 wt.-% to ≤1 wt.-%, preferably ≥0 wt.-% to ≤0.001 wt.-%, and more preferred ≥0 wt.-% to ≤0.0001 wt.-%, of a metal complex and/or a metal salt;
- comprises ≥0 wt.-% to ≤1 wt.-%, preferably ≥0 wt.-% to ≤0.001 wt.-%, and more preferred ≥0 wt.-% to ≤0.0001 wt.-%, of a lithium complex and/or lithium salt, preferably the lithium complex is selected from 8-hydroxyquinolinolato-lithium complex; wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a metal complex and/or a metal salt, wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a lithium complex and/or lithium salt, preferably the lithium complex is selected from 8-hydroxyquinolinolato-lithium complex, wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a metal complex or and a metal salt, wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a lithium complex or lithium salt, preferably the lithium complex is selected from 8-hydroxyquinolinolato-lithium complex, wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a metal complex and a metal salt, wherein the wt.-% of the components is based on the total weight of the first electron transport layer.

According to an embodiment, wherein the first electron transport layer comprises ≥0 wt.-% to ≤1 wt.-%, preferably ≥0 wt.-% to ≤0.001 wt.-%, and more preferred ≥0 wt.-% to ≤0.0001 wt.-%, of a lithium complex and lithium salt, preferably the lithium complex is selected from 8-hydroxyquinolinolato-lithium complex, wherein the wt.-% of the components is based on the total weight of the first electron transport layer.

According to an embodiment, wherein the first electron transport layer comprises ≥0 wt.-% to ≤0.0001 wt.-%, of a metal complex and/or a metal salt, wherein the wt.-% of the components is based on the total weight of the first electron transport layer.

According to an embodiment, wherein the first electron transport layer comprises ≥0 wt.-% to ≤0.0001 wt.-%, of a lithium complex and/or lithium salt, preferably the lithium complex is selected from 8-hydroxyquinolinolato-lithium complex, wherein the wt.-% of the components is based on the total weight of the first electron transport layer.

According to an embodiment, the first electron transport layer is free of 8-hydroxyquinolinolato-lithium.

According to an embodiment, the first electron transport layer is free of a lithium complex.

According to an embodiment, the first electron transport layer is may be free of a metal complex.

According to an embodiment, the first electron transport layer is may be free of a metal complex and metal salt.

The electron transport compound may have a molecular weight in the range of ≥400 g/mol to ≤2000 g/mol, preferably ≥415 g/mol to ≤1500 g/mol, more preferably ≥430 g/mol to ≤1000 g/mol, and most preferably ≥440 g/mol to ≤900 g/mol.

According to one embodiment, wherein the six-member heteroaromatic ring of the electron transport compound is selected from pyrazine, pyridine, pyrimidine, or triazine.

According to one embodiment, wherein the six-member heteroaromatic ring of the electron transport compound is selected from pyrazine, pyrimidine, or triazine.

According to one embodiment, wherein the six-member heteroaromatic ring of the electron transport compound is selected from pyrimidine, or triazine.

According to an embodiment, wherein the the electron transport compound is selected from a compound of formula (IIIa) or formula (IIIb):

(IIIa)

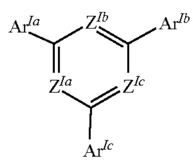

(IIIb)

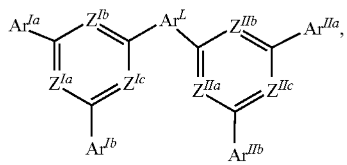

wherein $Z^{Ia}$ is selected from N or CH, $Z^{Ib}$ is selected from N or CH, $Z^{Ic}$ is selected from N or CH, $Z^{IIa}$ is selected from N or CH, $Z^{IIb}$ is selected from N or CH, and $Z^{IIc}$ is selected from N or CH, wherein in formula (IIIa) at least two of $Z^{Ia}$, $Z^{Ib}$ and $Z^{Ic}$ are selected from N, wherein in formula (IIIb) at least two of $Z^{Ia}$, $Z^{Ib}$, $Z^{Ic}$, or at least two of $Z^{IIa}$, $Z^{IIb}$, and $Z^{IIc}$ are selected from N;

$Ar^{Ia}$, $Ar^{Ib}$, $Ar^{Ic}$, $A^{IIa}$ and $Ar^{IIb}$ are selected the same or different from the group comprising a monovalent aromatic or heteroaromatic ring system having 5 to 60 aromatic ring atoms, which may in each case be substituted by one or more radicals $R^a$;

$Ar^L$ is a divalent aromatic or heteroaromatic ring system having 5 to 60 aromatic ring atoms, which is optionally substituted by one or more radicals $R^a$, $R^a$ is selected the same or different from the group comprising H, D, F, Cl, Br, I, CHO, $N(R^b)_2$, $N(Ar^{1s})_2$, $B(Ar^{1s})_2$, $C(=O)Ar^{1s}$, $P(=Y)(R^c)_2$, $S(=O)Ar^{1s}$, $S(=O)_2Ar^{1s}$, $CR^b=CR^bAr^{1s}$, CN, $NO_2$, $Si(R^b)_3$, $B(OR^b)_2$, $B(R^b)_2$, $B(N(R^b)_2)_2$, $OSO_2R^b$, a substituted or unsubstituted straight-chain $C_1$ to $C_{20}$ alkyl, a substituted or unsubstituted straight-chain $C_1$ to $C_{20}$ alkenyl, a substituted or unsubstituted straight-chain $C_1$ to $C_{20}$ alkynyl, a substituted or unsubstituted straight-chain $C_1$ to $C_{20}$ alkoxy, a substituted or unsubstituted straight-chain $C_1$ to $C_{20}$ thioalkoxy, substituted or unsubstituted branched $C_3$ to $C_{20}$ alkyl, a substituted or unsubstituted branched $C_3$ to $C_{20}$ alkenyl, a substituted or unsubstituted branched $C_3$ to $C_{20}$ alkynyl, a substituted or unsubstituted $C_3$ to $C_{20}$ alkoxy or a substituted or unsubstituted $C_3$ to $C_{20}$ thioalkoxy, substituted or unsubstituted cyclic $C_3$ to $C_{40}$ alkyl, substituted or unsubstituted cyclic $C_3$ to $C_{40}$ alkenyl, substituted or unsubstituted cyclic $C_3$ to $C_{40}$ alkynyl, substituted or unsubstituted cyclic $C_3$ to $C_{40}$ alkoxy or substituted or unsubstituted cyclic $C_3$ to $C_{40}$ thioalkoxy substituted or unsubstituted heterocyclic $C_3$ to $C_{40}$ alkyl, substituted or unsubstituted heterocyclic $C_3$ to $C_{40}$ alkenyl, substituted or unsubstituted heterocyclic $C_3$ to $C_{40}$ alkynyl, substituted or unsubstituted heterocyclic $C_3$ to $C_{40}$ alkoxy or substituted or unsubstituted heterocyclic $C_3$ to $C_{40}$ thioalkoxy;

wherein the substituent of $R^a$ is selected from the group comprising $R^b$, D, F, Cl, Br, I, CN or $NO_2$, an aromatic or heteroaromatic ring system having 5 to 60 aromatic ring atoms, an aromatic or heteroaromatic ring system having 5 to 60 aromatic ring atoms substituted by one or more radicals $R^b$, an aryloxy or heteroaryloxy group having 5 to 60 aromatic ring atoms, an aryloxy or heteroaryloxy group having 5 to 60 aromatic ring atoms which is substituted by one or more radicals $R^b$, two or more adjacent substituents $R^a$ form a mono- or polycyclic, aliphatic or aromatic ring system with one another, or one or more non-adjacent $CH_2$ groups of $R^a$ is replaced by $R^bC=CR^b$, C≡C, $Si(R^b)_2$, $Ge(R^b)_2$, $Sn(R^b)_2$, C=O, C=S, C=Se, $C=NR^b$, $P(=O)(R^b)$, SO, $SO_2$, $NR^b$, O, S or $CONR^b$, or any combination thereof;

$Ar^{1s}$ is selected the same or different from the group comprising an aromatic or heteroaromatic ring system having 5 to 30 aromatic ring atoms, an aromatic or heteroaromatic ring system having 5 to 30 aromatic ring atoms which is substituted by one or more radicals $R^b$, or two radicals $Ar^{1s}$ which are bonded to the same nitrogen, phosphorus or boron atom can be linked to one another by a single bond or a bridge selected from $B(R^b)$, $C(R^b)_2$, $Si(R^b)_2$, C=O, $C=NR^b$, $C=C(R^b)_2$, O, S, S=O, $SO_2$, $N(R^b)$, $P(R^b)$ and $P(=Y)R^c$, or any combination thereof;

$R^b$ is selected the same or different from the group comprising H, D or a $C_1$ to $C_{20}$ aliphatic hydrocarbyl, a $C_1$ to $C_{20}$ aryl or $C_1$ to $C_{20}$ heteroaryl, a $C_1$ to $C_{20}$ aryl or $C_1$ to $C_{20}$ heteroaryl in which at least one H atoms is replaced by D or F, or two or more adjacent substituents $R^b$ form a mono- or polycyclic, aliphatic or aromatic ring system with one another, or any combination thereof;

Y is selected from O, S or Se, preferably O;

$R^c$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, or any combination thereof.

According to one embodiment, wherein the electron transport compound is selected from the group comprising the compounds D1 to D9:

-continued
(D1)
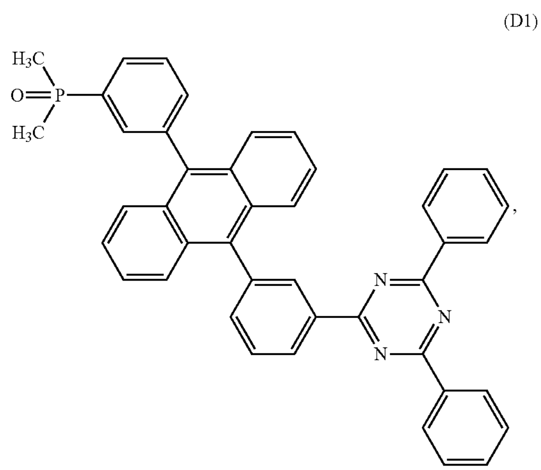
(D2)
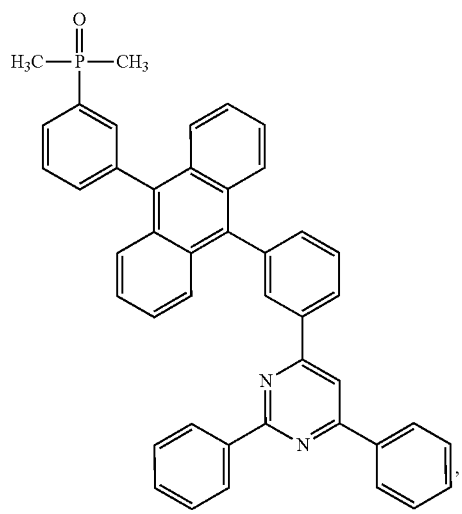
(D3)
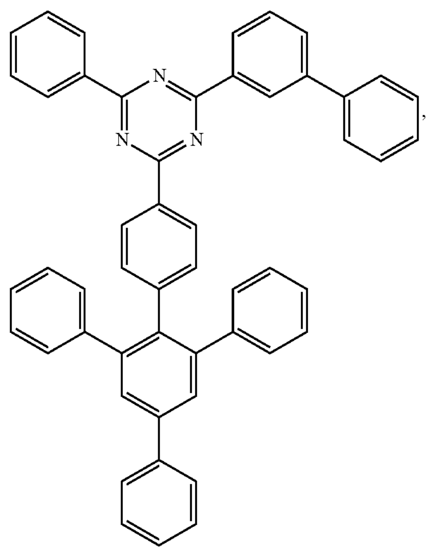
(D4)
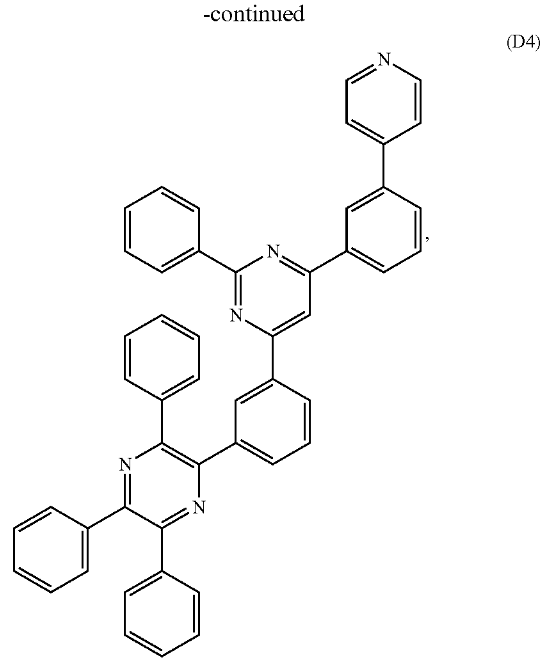
(D5)
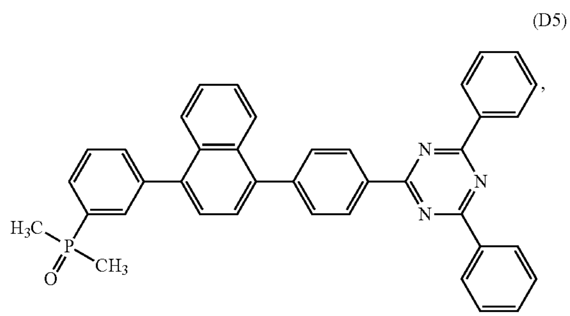
(D6)
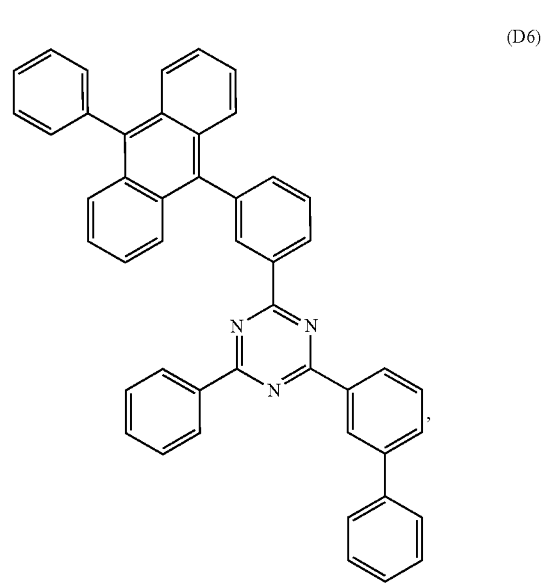

-continued (D7)

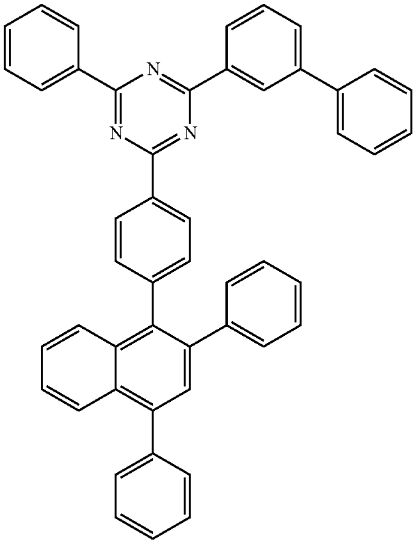

(D8)

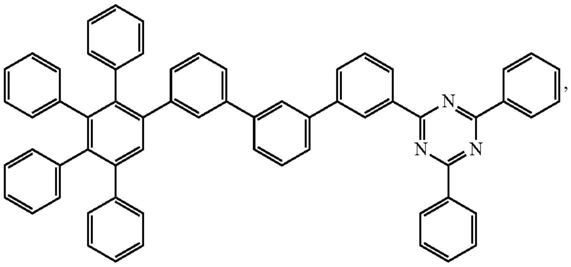

(D9)

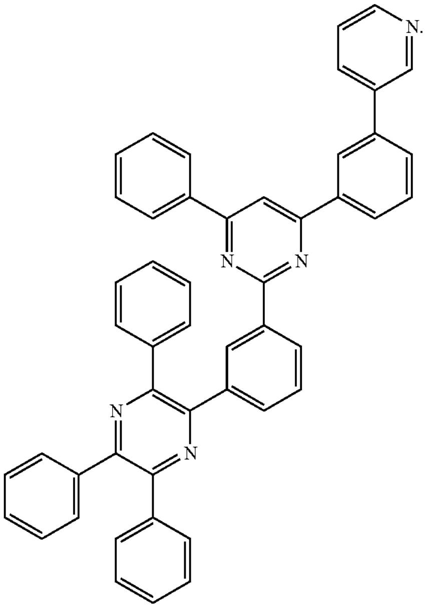

According to one embodiment, wherein the electron transport compound has a LUMO energy level when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase of ≤−1.50 eV, preferably ≤−1.55 eV, preferably ≤−1.60 eV, and most preferably ≤−1.65 eV.

According to an embodiment, wherein the electron transport compound has a LUMO energy level when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase in the range of ≥−2.50 eV to ≤−1.50 eV, preferably ≥−2.00 eV to ≤−1.50 eV, more preferably ≥−1.95 eV to ≤−1.55 eV, even more preferably ≥−1.90 eV to ≤−1.60 eV, even more preferably ≥−1.87 eV to ≤−1.65 eV, and most preferably ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤5.0 D; alternatively ≥0 D to ≤4.5 D; alternatively ≥0 D to ≤4.0 D; alternatively ≥0 D to ≤3.7 D; alternatively ≥0 D to ≤3.5 D; alternatively ≥0 D to ≤3.0 D; alternatively ≥0 D to ≤2.5 D; alternatively ≥0 D to 5 2.0 D; alternatively ≥0 D to ≤1.5 D; alternatively ≥0 D to ≤1.0 D; alternatively ≥0 D to ≤0.5 D.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.5 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and ≤−1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.5 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.5 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and 5-1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤3.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and 5-1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤3.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤3.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.7 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and 5-1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.7 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.7 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and 5-1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤2.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤1.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.9 eV and ≤−1.60 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤1.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.87 eV to ≤−1.65 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤1.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−1.83 eV to ≤−1.65 eV.

The unit for the dipole moment "Debye" is abbreviated with the symbol "D". In this regards, the dipole moment $|\vec{\mu}|$ of a molecule containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r}_i$ are the partial charge and position of atom i in the molecule. The partial charges and optimized geometries of the molecular structures are determined using the hybrid functional B3LYP with the 6-31G* basis set in the gas phase as implemented in the program package TURBOMOLE V6.5 (TURBOMOLE GmbH, Litzenhardtstrasse 19, 76135 Karlsruhe, Germany). If more than one conformation is viable, the conformation with the lowest total energy is selected to determine the bond lengths of the molecules.

Thickness of ETL

The thickness of the first electron transport layer may be in the range from 0.5 nm to 50 nm; alternatively in the range from 1 nm to about 40 nm; or alternatively in the range of 2 nm to 30 nm.

If a second electron transport layer or a second and third electron transport layer is present, the thickness of the second electron transport layer or the third electron transport layer can be independently of each other be in the range from 0.5 nm to 50 nm; alternatively in the range from 1 nm to about 40 nm; or alternatively in the range of 2 nm to 30 nm.

First Charge Generation Layer

Preferably, the n-type charge generation layer and the p-type charge generation layer are arranged in direct contact.

n-Type Charge Generation Layer

According to one embodiment, wherein the charge generation layer comprises an n-type charge generation layer, wherein the n-type charge generation layer comprises a metal dopant, wherein the metal dopant is selected from the group comprising a metal with an electronegativity of ≥1.4 eV by Pauling scale, a metal alloy comprising a metal with an electronegativity of ≥1.4 eV by Pauling scale, a metal selected from the group consisting of Li, Na, K, Rb, Cs, Mg, Ca, Sr, Ba, a rare earth metal or a metal alloy comprising a metal selected from the group consisting of Li, Na, K, Rb, Cs, Mg, Ca, Sr, Ba, and a rare earth metal, preferably the metal dopant of the n-type charge generation layer is selected from a rare earth metal, an alloy containing a rare earth metal or a combination thereof, and more preferred the metal dopant of the n-type charge generation layer is selected from Ytterbium or Ytterbium in the oxidation state 0; wherein more preferred the metal dopant in the n-type charge generation layer is Yb.

Metal Dopant

According to one embodiment, the metal dopant is selected from a metal with an electronegativity of ≥1.4 eV by Pauling scale or a metal alloy comprising a metal with an electronegativity of ≥1.4 eV by Pauling scale.

According to one embodiment, the metal dopant is selected from a metal with an electronegativity of ≥1.35 eV by Pauling scale or a metal alloy comprising a metal with an electronegativity of ≥1.35 eV by Pauling scale.

According to one embodiment, the metal dopant is a metal selected from the group consisting of Li, Na, K, Rb, Cs, Mg, Ca, Sr, Ba, and a rare earth metal or a metal alloy comprising a metal selected from the group consisting of Li, Na, K, Rb, Cs, Mg, Ca, Sr, Ba, and a rare earth metal.

According to one embodiment, the metal dopant is a metal selected from the group consisting of Na, K, Rb, Cs, Mg, Ca, Sr, Ba, and a rare earth metal or a metal alloy comprising a metal selected from the group consisting of Na, K, Rb, Cs, Mg, Ca, Sr, Ba, and a rare earth metal.

According to an embodiment, the metal dopant of the n-type charge generation layer is selected from a rare earth metal and/or an alloy containing a rare earth metal.

According to an embodiment, the metal dopant of the n-type charge generation layer is selected from Ytterbium and/or an alloy containing Ytterbium.

According to an embodiment, the metal dopant of the n-type charge generation layer is selected from Ytterbium.

According to an embodiment, the metal dopant of the n-type charge generation layer is selected from Ytterbium in the oxidation state ±0.

According to a more preferred embodiment the metal dopant in the n-type charge generation layer is Yb.

Electron Transport Matrix Compound in the n-Type Charge Generation Layer

According to an embodiment, wherein the organic electron transport matrix compound is an organic electron transport matrix compound.

According to an embodiment, the electron transport matrix compound has a LUMO energy level when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase 5-1.30 eV, or alternatively of ≤−1.40 eV, or alternatively ≤−1.50 eV.

According to an embodiment, the electron transport matrix compound has a LUMO energy level when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase of ≥−2.50 eV, preferably of ≥−2.00 eV, more preferably ≥−1.90 eV, even more preferably ≥−1.85 eV, and most preferably ≥−1.80 eV.

According to an embodiment, the electron transport matrix compound has a LUMO energy level when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase in the range of ≥−2.50 eV and 5-1.30 eV; or alternatively of ≥−2.00 eV to ≤1.40 eV, or alternatively of ≥−1.90 eV to ≤1.50 eV, or alternatively of ≥−1.85 eV to ≤1.50 eV, or alternatively of ≥−1.80 eV to ≤1.50 eV.

According to an embodiment, wherein the electron transport matrix compound has a molecular dipole moment calculated by the TURBOMOLE V6.5 program package using hybrid functional B3LYP and Gaussian 6-31G* basis set in the gas phase in the range of ≥0 D to ≤6.0 D; or alternatively ≥0 D to ≤5.5 D; or alternatively ≥0 D to ≤5.0 D; or alternatively ≥0 D to ≤4.75 D.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤5.0 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−2.00 eV and ≤−1.40 eV.

According to an embodiment, wherein the electron transport compound has a molecular dipole moment calculated by the TURBOMOLE V6.5 program package using hybrid functional B3LYP and Gaussian 6-31G* basis set in the gas phase in the range of ≥0 D to ≤4.75 D; and the LUMO energy level of the electron transport compound of the first electron transport layer when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase is in the range of ≥−2.00 eV and ≤−1.40 eV.

According to an embodiment, the electron transport matrix compound has a molecular weight in the range of ≥400 g/mol to ≤2000 g/mol, preferably ≥415 g/mol to ≤1500 g/mol, more preferably ≥430 g/mol to ≤1000 g/mol, and most preferably ≥440 g/mol to ≤900 g/mol.

According to an embodiment, the electron transport matrix compound is a compound that comprises at least one $C_2$ to $C_{24}$ N-heteroaryl.

According to an embodiment, the electron transport matrix compound is a compound comprising at least one $sp^2$-hybridized nitrogen atoms, and preferably at least two $sp^2$-hybridized nitrogen atoms.

According to an embodiment, the electron transport matrix compound is a compound comprising at least one $sp^2$-hybridized nitrogen, and preferably at least two $sp^2$-hybridized nitrogen atoms.

According to an embodiment, the electron transport matrix compound is a compound comprising at least two $sp^2$-hybridized nitrogen atoms, and wherein the at least two $sp^2$-hybridized nitrogen atoms can chelating binding a metal atom or cation.

According to an embodiment, the at least one $C_2$ to $C_{24}$ N-heteroaryl may be selected from a compound comprising at least one azine group, or alternatively at least two azine groups.

According to an embodiment, the electronic transport matrix compound comprises at least one group selected from the list consisting of pyrazine, pyridine, pyrimidine, triazine, imidazole, benzimidazole, benzoxazole, quinoline, benzoquinoline, imidazo[1,5-a]pyridine, quinoxaline, benzoquinoxaline, acridine, phenanthroline, benzoacridine, benzo[c]acridine, dibenzoacridine, dibenzo[c,h]acridine, terpyridine orphosphine oxide.

According to an embodiment, the electron transport matrix compound comprises at least one phenanthroline group, at least one pyridine group, at least one pyrazine group, at least one pyrimidine group, at least one triazine group, at least one imidazo[1,5-a]pyridine group, or at least one phosphine oxide groups.

According to an embodiment, the electron transport matrix compound comprises at least one phenanthroline group, at least one pyridine group, at least one pyrazine group, at least one pyrimidine group, at least one triazine group, or at least one imidazo[1,5-a]pyridine group.

According to an embodiment, the electron transport matrix compound comprises at least one phenanthroline group, at least one pyridine group, at least one pyrazine group, at least one pyrimidine group, at least one triazine group.

According to an embodiment, wherein the electron transport matrix comprises at least one phenanthroline group.

According to an embodiment, wherein the electron transport matrix comprises at least one nitrogen atom in a six-member aromatic ring.

According to an embodiment, wherein the electron transport matrix compound of the n-type charge generation layer is selected from a compound of formula (IIa) or formula (IIb):

(IIa)

(IIb)

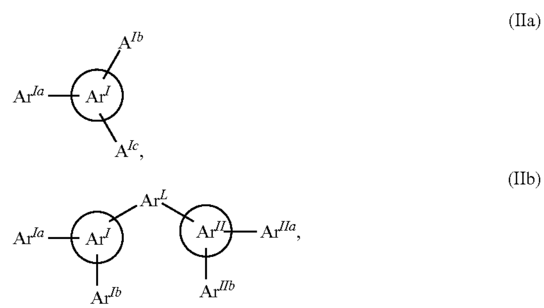

wherein $Ar^{I}$ is a substituted or unsubstituted $C_3$ to $C_{40}$ heteroaromatic ring comprising at least one nitrogen atom, $Ar^{II}$ is a substituted or unsubstituted $C_3$ to $C_{40}$ heteroaromatic ring comprising at least one nitrogen atom, wherein the substituents on $Ar^{I}$ and $Ar^{II}$ are, identically or differently on each occurrence, D, a monovalent aromatic or heteroaromatic ring system having 5 to 60 aromatic ring atoms, a straight-chain $C_1$ to $C_{20}$ alkyl, a straight-chain $C_1$ to $C_{20}$ alkenyl, a straight-chain $C_1$ to $C_{20}$ alkynyl, a branched $C_3$ to $C_{20}$ alkyl, a branched $C_3$ to $C_{20}$ alkenyl, a branched $C_3$ to $C_{20}$ alkynyl, CN, $NO_2$, F, which may in each case be substituted by one or more radicals $R^a$; preferably a monovalent aromatic or heteroaromatic ring system having 5 to 60 aromatic ring atoms which may in each case be substituted by one or more radicals $R^a$;

wherein $Ar^{Ia}$, $Ar^{Ib}$, $Ar^{Ic}$, $Ar^{IIa}$, and $Ar^{IIb}$ are, identically or differently on each occurrence, H, D, a monovalent aromatic or heteroaromatic ring system having 5 to 60 aromatic ring atoms, which may in each case be substituted by one or more radicals $R^a$;

wherein at least one of $Ar^{Ia}$, $Ar^{Ib}$, $Ar^{Ic}$ in formula (IIa) and in case of formula (IIb) at least one of $Ar^{Ia}$, $Ar^{Ib}$, $Ar^{IIa}$, and $Ar^{IIb}$ is independently selected from a monovalent aromatic or heteroaromatic ring system having 5 to 60 aromatic ring atoms, which may in each case be substituted by one or more radicals $R^a$;

wherein $Ar^L$ is a divalent aromatic or heteroaromatic ring system having 5 to 60 aromatic ring atoms, which is optionally substituted by one or more radicals $R^a$, $R^a$ is selected the same or different from the group comprising H, D, F, Cl, Br, I, CHO, $N(R^b)_2$, $N(Ar^{1s})_2$, $B(Ar^{1s})_2$, $C(=O)Ar^{1s}$, $P(=Y)(R^c)_2$, $S(=O)Ar^{1s}$, $S(=O)_2Ar^{1s}$, $CR^b=CR^bAr^{1s}$, CN, $NO_2$, $Si(R^b)_3$, $B(OR^b)_2$, $B(R^b)_2$, $B(N(R^b)_2)_2$, $OSO_2R^b$, a substituted or unsubstituted straight-chain $C_1$ to $C_{20}$ alkyl, a substituted or unsubstituted straight-chain $C_1$ to $C_{20}$ alkenyl, a substituted or unsubstituted straight-chain $C_1$ to $C_{20}$ alkynyl, a substituted or unsubstituted straight-chain $C_1$ to $C_{20}$ alkoxy, a substituted or unsubstituted straight-chain $C_1$ to $C_{20}$ thioalkoxy, substituted or unsubstituted branched $C_3$ to $C_{20}$ alkyl, a substituted or unsubstituted branched $C_3$ to $C_{20}$ alkenyl, a substituted or unsubstituted branched $C_3$ to $C_{20}$ alkynyl, a substituted or unsubstituted $C_3$ to $C_{20}$ alkoxy or a substituted or unsubstituted $C_3$ to $C_{20}$ thioalkoxy, substituted or unsubstituted cyclic $C_3$ to $C_{40}$ alkyl, substituted or unsubstituted cyclic $C_3$ to $C_{40}$ alkenyl, substituted or unsubstituted cyclic $C_3$ to $C_{40}$ alkynyl, substituted or unsubstituted cyclic $C_3$ to $C_{40}$ alkoxy or substituted or unsubstituted cyclic $C_3$ to $C_{40}$ thioalkoxy substituted or unsubstituted heterocyclic $C_3$ to $C_{40}$ alkyl, substituted or unsubstituted heterocyclic $C_3$ to $C_{40}$ alkenyl, substituted or unsubstituted heterocyclic $C_3$ to $C_{40}$ alkynyl, substituted or unsubstituted heterocyclic $C_3$ to $C_{40}$ alkoxy or substituted or unsubstituted heterocyclic $C_3$ to $C_{40}$ thioalkoxy;

wherein the substituent of $R^a$ is selected from the group comprising $R^b$, D, F, Cl, Br, I, CN or N02, an aromatic or heteroaromatic ring system having 5 to 60 aromatic ring atoms, an aromatic or heteroaromatic ring system having 5 to 60 aromatic ring atoms substituted by one or more radicals $R^b$, an aryloxy or heteroaryloxy group having 5 to 60 aromatic ring atoms, an aryloxy or heteroaryloxy group having 5 to 60 aromatic ring atoms which is substituted by one or more radicals $R^b$, two or more adjacent substituents $R^a$ form a mono- or polycyclic, aliphatic or aromatic ring system with one another, or one or more non-adjacent $CH_2$ groups of $R^a$ is replaced by $R^bC=CR^b$, C≡C, $Si(R^b)_2$, $Ge(R^b)_2$, $Sn(R^b)_2$, C=O, C=S, C=Se, $C=NR^b$, $P(=O)(R^b)$, SO, $SO_2$, $NR^b$, O, S or $CONR^b$, or any combination thereof;

$Ar^{1s}$ is selected the same or different from the group comprising an aromatic or heteroaromatic ring system having 5 to 30 aromatic ring atoms, an aromatic or heteroaromatic ring system having 5 to 30 aromatic ring atoms which is substituted by one or more radicals $R^b$, or two radicals $Ar^{1s}$ which are bonded to the same nitrogen, phosphorus or boron atom can be linked to one another by a single bond or a bridge selected from $B(R^b)$, $C(R^b)_2$, $Si(R^b)_2$, C=O, $C=NR^b$, $C=C(R)_2$, O, S, S=O, $SO_2$, $N(R^b)$, $P(R^b)$ and $P(=Y)R^c$, or any combination thereof;

$R^b$ is selected the same or different from the group comprising H, D or a $C_1$ to $C_{20}$ aliphatic hydrocarbyl, a $C_1$ to $C_{20}$ aryl or $C_1$ to $C_{20}$ heteroaryl, a $C_1$ to $C_{20}$ aryl or $C_1$ to $C_{20}$ heteroaryl in which at least one H atoms is replaced by D or F, or two or more adjacent substituents $R^b$ form a mono- or polycyclic, aliphatic or aromatic ring system with one another, or any combination thereof;

Y is selected from O, S or Se, preferably O;

$R^c$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, or any combination thereof.

According to one embodiment, $Ar^I$ is a group selected from pyrazine, pyridine, pyrimidine, triazine, phenanthroline, imidazo[1,5-a]pyridine, imidazole, benzimidazole, benzooxazole, quinoline, benzoquinoline, quinoxaline, benzoquinoxaline, acridine, benzoacridine, dibenzoacridine, dibenzo[c,h]acridine, terpyridine.

According to one embodiment, $Ar^{II}$ is a group selected from pyrazine, pyridine, pyrimidine, triazine, phenanthroline, imidazo[1,5-a]pyridine, imidazole, benzimidazole, benzooxazole, quinoline, benzoquinoline, quinoxaline, benzoquinoxaline, acridine, benzoacridine, dibenzoacridine, dibenzo[c,h]acridine, terpyridine.

According to one embodiment, $Ar^I$ in formula (IIa) or (IIb) is a group selected from pyrazine, pyridine, pyrimidine, triazine, phenanthroline; or $Ar^I$ in formula (IIa) or (IIb) and $Ar^1$ in formula (IIb) are independently of each other selected from pyrazine, pyridine, pyrimidine, triazine, phenanthroline, imidazo[1,5-a]pyridine, imidazole, benzimidazole, benzooxazole, quinoline, benzoquinoline, quinoxaline, benzoquinoxaline, acridine, benzoacridine, dibenzo[c,h]acridine dibenzoacridine, dibenzo[c,h]acridine, terpyridine.

According to one embodiment, $Ar^I$ is a group selected from pyridine, pyrimidine, triazine, phenanthroline, imidazo [1,5-a]pyridine.

According to one embodiment, $Ar^{II}$ is a group selected from pyridine, pyrimidine, triazine, phenanthroline, imidazo [1,5-a]pyridine.

According to one embodiment, $Ar^I$ in formula (IIa) or (IIb) is a group selected from pyridine, pyrimidine, triazine, phenanthroline; or $Ar^I$ in formula (IIa) or (IIb) and $Ar^{II}$ in formula (IIb) are independently of each other selected from pyridine, pyrimidine, triazine, phenanthroline, imidazo[1,5-a]pyridine.

According to one embodiment, $Ar^I$ is a group selected from pyridine, pyrimidine, triazine, phenanthroline.

According to one embodiment, $Ar^{II}$ is a group selected from pyridine, pyrimidine, triazine, phenanthroline.

According to one embodiment, $Ar^I$ in formula (IIa) or (IIb) is a group selected from pyridine, pyrimidine, triazine, phenanthroline; or $Ar^I$ in formula (IIa) or (IIb) and $Ar^{II}$ in formula (IIb) are independently of each other selected from pyridine, pyrimidine, triazine, phenanthroline.

According to one embodiment, $Ar^I$ is a group selected from pyrimidine, triazine, phenanthroline.

According to one embodiment, $Ar^{II}$ is a group selected from pyrimidine, triazine, phenanthroline.

According to one embodiment, $Ar^I$ in formula (IIa) or (IIb) is a group selected from pyridine, pyrimidine, triazine, phenanthroline; or $Ar^I$ in formula (IIa) or (IIb) and $Ar^{II}$ in formula (IIb) are independently of each other selected from pyrimidine, triazine, phenanthroline.

According to one embodiment, $Ar^I$ is a group selected from phenanthroline.

According to one embodiment, $Ar^{II}$ is a group selected from phenanthroline.

According to one embodiment, $Ar^I$ in formula (IIa) or (IIb) is a group selected from phenanthroline; or $Ar^I$ in formula (IIa) or (IIb) and $Ar^{II}$ in formula (IIb) are independently of each other selected from phenanthroline.

According to an embodiment, the organic electron transport matrix compound is selected from the group consisting of 2,2'-(1,3-Phenylene)bis[9-phenyl-1,10-phenanthroline] N-10), (3-(10-(3-(2,6-diphenylpyrimidin-4-yl)phenyl)anthracen-9-yl)phenyl)dimethylphosphine oxide (N-2), 3-(3-(9,10-diphenylanthracen-2-yl)phenyl)-1-(pyridin-2-yl)imidazo[1,5-a]pyridine (N-16), 7-(3-(1,10-phenanthrolin-2-yl)phenyl)dibenzo[c,h]acridine (N-17), 7-(3-([2,2': 6',2"-terpyridin]-4'-yl)phenyl)dibenzo[c,h]acridine (N-18), 4'-(4'-(4,6-diphenyl-1,3,5-triazin-2-yl)-[1,1'-biphenyl]-4-yl)-2,2': 6',2"-terpyridine (N-19), or 4'-(4-(fluoranthen-3-yl)phenyl)-2,2': 6',2"-terpyridine (N-20), 2-(4-(3,5,6-triphenylpyrazin-2-yl)phenyl)-1,10-phenanthroline (N-12), and 0.2-(3-(1-(pyridin-2-yl)imidazo[1,5-a]pyridin-3-yl)phenyl)-1,10-phenanthroline (N-13).

According to an embodiment, the electron transport matrix compound is present in the first n-type charge generation layer in an amount of ≥0.1 vol %, preferably ≥1 vol %, preferably ≥2 vol %, more preferably ≥3 vol %, more preferably ≥5 vol %, more preferably ≥8 vol %, more preferably ≥20 vol %, more preferably ≥30 vol %, more preferably 40 vol %, more preferably ≥45 vol %, more preferably ≥50 vol %, more preferably ≥60 vol %, more preferably ≥70 vol %, more preferably 80 vol %, more preferably 90 vol %, more preferably ≥95 vol %, and more preferably 98 vol %, based on the total volume of the first n-type charge generation layer.

According to an embodiment, the metal dopant is present in the first n-type charge generation layer in amount of ≤99.9 vol %, preferably ≤99 vol %, more preferably ≤98 vol %, more preferably ≤97 vol %, more preferably ≤95 vol %, more preferably ≤92 vol %, more preferably ≤80 vol %, more preferably ≤70 vol %, more preferably ≤60 vol %, more preferably ≤55 vol %, more preferably ≤50 vol %, more preferably ≤40 vol %, more preferably ≤30 vol %, more preferably ≤20 vol %, more preferably ≤10 vol %, more preferably ≤5 vol %, more preferably ≤2 vol %, based on the total volume of the first n-type charge generation layer.

According to an embodiment, the electron transport matrix compound is present in the first n-type charge generation layer in an amount of ≥0.1 vol % to ≤99.99 vol %, preferably ≥1 vol % to ≤99.99 vol %, preferably ≥2 vol % to ≤99.99 vol %, more preferably ≥3 vol % to ≤99.99 vol %, more preferably ≥5 vol % to ≤99.99 vol %, more preferably ≥8 vol % to ≤99.99 vol %, more preferably ≥20 vol % to ≤99.99 vol %, more preferably ≥30 vol % to ≤99.99 vol %, more preferably ≥40 vol % to ≤99.99 vol %, more preferably ≥45 vol % to ≤99.99 vol %, more preferably ≥50 vol % to ≤99.99 vol %, more preferably ≥60 vol % to ≤99.99 vol %, more preferably ≥70 vol % to ≤99.99 vol %, more preferably ≥80 vol % to ≤99.99 vol %, more preferably ≥90 vol % to ≤99.99 vol %, more preferably ≥95 vol % to ≤99.99 vol %, more preferably ≥98 vol % to ≤99.99 vol %, based on the total volume of the first n-type charge generation layer.

According to an embodiment, the metal dopant is present in the first n-type charge generation layer in amount of 0.01 vol % to ≤99.9 vol %, preferably 0.01 vol % to ≤99 vol %, more preferably 0.01 vol % to ≤98 vol %, more preferably 0.01 vol % to ≤97 vol %, more preferably 0.01 vol % to ≤95 vol %, more preferably 0.01 vol % to ≤92 vol %, more preferably 0.01 vol % to ≤80 vol %, more preferably 0.01 vol % to ≤70 vol %, more preferably 0.01 vol % to ≤60 vol %, more preferably 0.01 vol % to ≤55 vol %, more preferably 0.01 vol % to ≤50 vol %, more preferably 0.01 vol % to ≤40 vol %, more preferably 0.01 vol % to ≤30 vol %; more preferably 0.01 vol % to ≤20 vol %, more preferably 0.01 vol % to ≤10 vol %, more preferably 0.01 vol % to ≤5 vol %, more preferably 0.01 vol % to ≤2 vol % based on the total volume of the first n-type charge generation layer.

The thickness of the first n-type charge generation layer may be in the range from 0.5 nm to 50 nm; alternatively in the range from 1 nm to about 40 nm; alternatively in the range of 2 nm to 30 nm; alternatively 3 nm to 25 nm; alternatively 4 nm to 20 nm; or alternatively 5 nm to 15 nm.

Hole Injection Layer and p-Type Charge Generation Layer First Organic p-Dopant and Second Organic p-Dopant/Hole Injection Layer and p-Type Charge Generation Layer According to an embodiment, wherein the first organic p-dopant has a LUMO energy level of ≤−5.15 eV, and preferably ≤−5.19 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the second organic p-dopant has a LUMO energy level of ≤−4.85 eV, preferably ≤−4.90 eV, and more preferably ≤−4.95 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.15 eV, and the second organic p-dopant has a LUMO energy level of ≤−4.85 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.15 eV, and the second organic p-dopant has a LUMO energy level of ≤−4.90 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.15 eV, and the second organic p-dopant has a LUMO energy level of ≤−4.95 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.19 eV, and the second organic p-dopant has a LUMO energy level of ≤−4.85 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.19 eV, and the second organic p-dopant has a LUMO energy level of ≤−4.90 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, wherein the first organic p-dopant has a LUMO energy level of ≤−5.19 eV, and the second organic p-dopant has a LUMO energy level of ≤−4.95 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

First Organic p-Dopant and/or Second Organic p-Dopant

According to one embodiment, wherein the first organic p-dopant comprises at least ≥4 CN groups or ≥5 to ≤8 CN groups.

According to one embodiment, wherein the first organic p-dopant and/or the second organic p-dopant comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_3$ to $C_{12}$ alkyl, $CF_3$.

According to one embodiment, wherein the first organic p-dopant and/or the second organic p-dopant comprises independently of each other at least two groups selected from $C_6$ to $C_{19}$ aryl group, wherein each of the $C_6$ to $C_{19}$ aryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to one embodiment, wherein the first organic p-dopant and/or the second organic p-dopant is selected from a compound of formula (IV):

(IV)

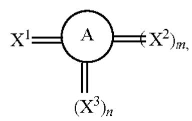

wherein n is an integer including 0, 1, 2, 3, 4, 5 or 6, preferably 0, 2, or 4;

m is an integer selected from 0 or 1;

$X^1$, $X^2$ and $X^3$ are independently selected from O, S, $CR^{1a}R^{2a}$, $CR^{1b}R^{2b}$, $NR^{3a}$, $NR^{3b}$ or at least one of $X^1$, $X^2$, and $X^3$ form a fused ring with A, and wherein each $X^3$ is selected the same or different, preferably the same, $R^{1a}$, $R^{2a}$, $R^{1b}$, and $R^{2b}$ are independently selected from an electron-withdrawing group, halogen, $C_1$, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted aryl, substituted or unsubstituted heteroaryl, wherein the one or more substituents on $R^{1a}$, $R^{2a}$, $R^{1b}$, and $R^{2b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$R^{3a}$ and $R^{3b}$ is selected from an electron-withdrawing group, CN, partially fluorinated $C_1$ to $C_6$ alkyl, perfluorinated $C_1$ to $C_6$ alkyl, $CF_3$, substituted or unsubstituted $C_6$ to $C_{30}$ aryl, or substituted or unsubstituted $C_3$ to $C_{30}$ heteroaryl, wherein the one or more substituents on $R^{3a}$ and $R^{3b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

A is selected from substituted or unsubstituted $C_3$ to $C_{40}$ cyclohydrocarbon group, substituted or unsubstituted $C_3$ to $C_{40}$ cycloalkane group, substituted or unsubstituted $C_3$ to $C_{40}$ cycloalkane group containing one or more double-bonds, substituted or unsubstituted $C_3$ to $C_{40}$ cycloalkene group, substituted or unsubstituted $C_2$ to $C_{40}$ heterocycloalkane group, substituted or unsubstituted $C_2$ to $C_{40}$ heterocycloalkane group containing one or more double-bonds, substituted or unsubstituted $C_2$ to $C_{40}$ heterocycloalkene group, substituted or unsubstituted $C_6$ to $C_{40}$ aromatic group, substituted or unsubstituted $C_2$ to $C_{40}$ heteroaromatic group, wherein the one or more substituents on A are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, substituted or unsubstituted $C_2$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

and wherein preferably the compound of formula (IV) comprises at least two groups selected from substituted $C_6$ to $C_{19}$ aryl group or substituted $C_3$ to $C_{12}$ heteroaryl group, wherein each of the substituents of $C_6$ to $C_{19}$ aryl group or $C_3$ to $C_{12}$ heteroaryl group are independently of each other selected from halogen, F, CN, partially perfluorinated $C_1$ to $C_{12}$ alkyl, perfluorinated $C_1$ to $C_{12}$ alkyl, or $CF_3$.

The $C_6$ to $C_{40}$ aromatic group may be a group which is aromatic, or a group containing at least one aromatic moiety, i.e. an aromatic group may also contain a fused non-aromatic moiety. The moiety can contain different atoms.

The $C_2$ to $C_{40}$ heteroaromatic group may be a group which is heteroaromatic, or a group containing at least one heteroaromatic moiety, i.e. a heteroaromatic group may also contain a fused non-aromatic moiety. The moiety can contain different atoms.

n

According to an embodiment, n can be an integer selected from 0, 1, 2, 3, or 4.

According to a preferred embodiment, n can be an integer selected from 0, 1, or 2.

m

According to a preferred embodiment, m can be an integer selected from 1.

$X^1$, $X^2$, and $X^3$

According to an embodiment, $X^1$, $X^2$, and $X^3$ are independently selected from $CR^{1a}R^{2a}$, $CR^{1b}R^{2b}$, $NR^{3a}$, $NR^{3b}$; wherein each $X^3$ can be selected the same or different.

According to an embodiment, $X^1$, $X^2$, and $X^3$ are independently selected from $CR^{1a}R^{2a}$, $CR^{1b}R^{2b}$; wherein each $X^3$ can be selected the same or different.

According to an embodiment, wherein A of formula (IV) is selected from a group of E1 to E72:

(E1)

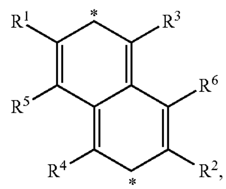

(E2)

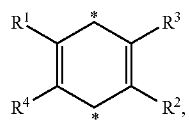

(E3)

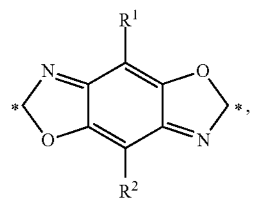

(E4)

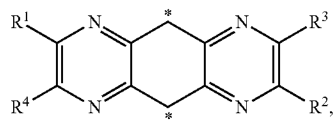

(E5)

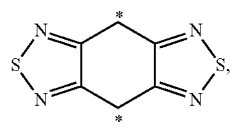

-continued (E6)

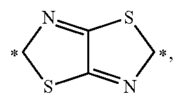

(E7)

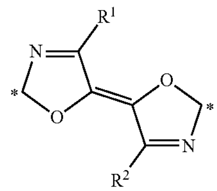

(E8)

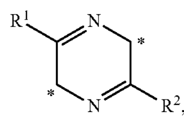

(E9)

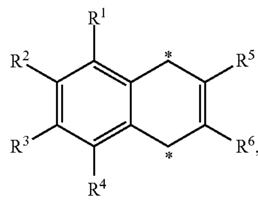

(E10)

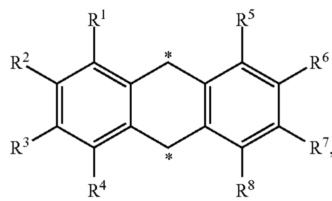

(E11)

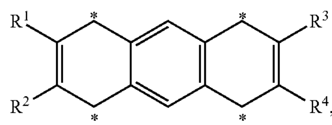

(E12)

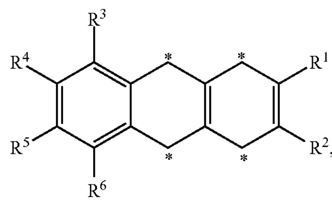

(E13)

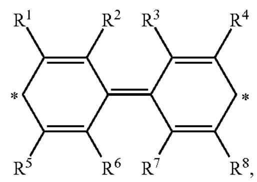

(E14)

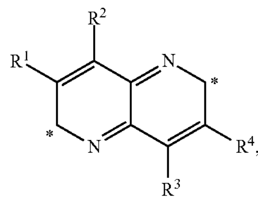

-continued
(E15)
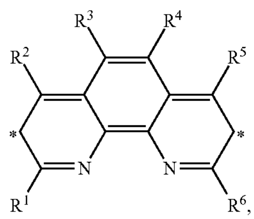
(E16)
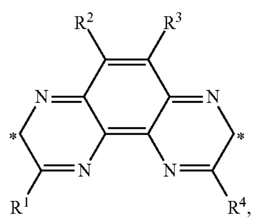
(E17)
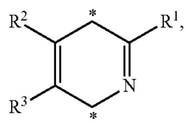
(E18)
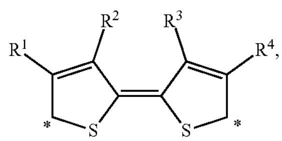
(E19)
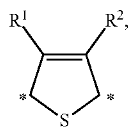
(E20)
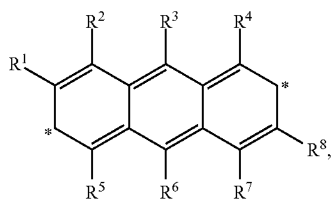
(E21)
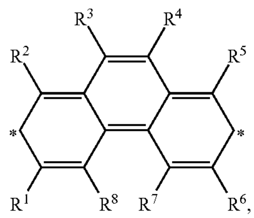
(E22)
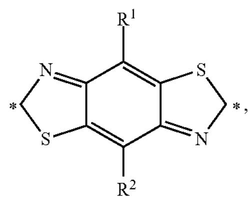
(E23)
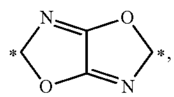
-continued
(E24)
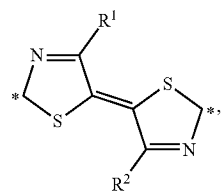
(E25)
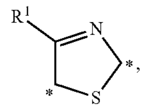
(E26)
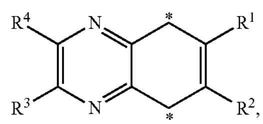
(E27)
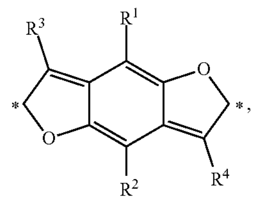
(E28)
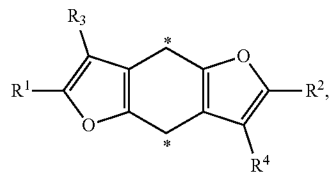
(E29)
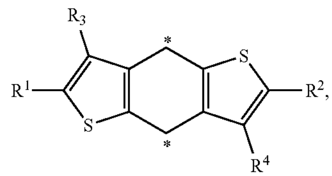
(E30)
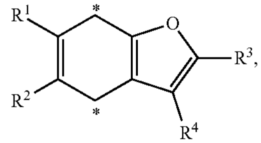
(E31)
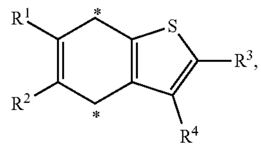
(E32)
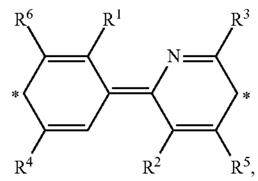

-continued
(E33)
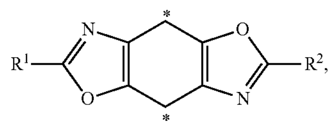
(E34)
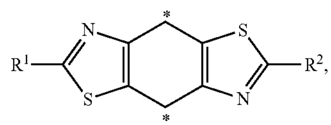
(E35)
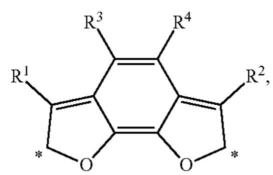
(E36)
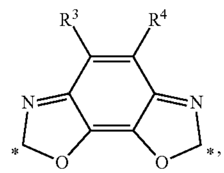
(E37)
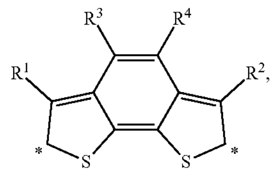
(E38)
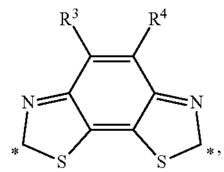
(E39)
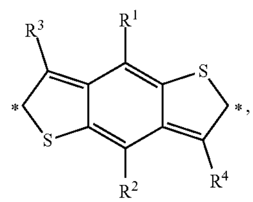
(E40)
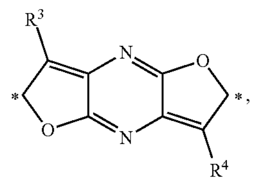
(E41)
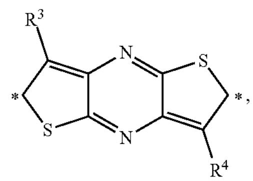
-continued
(E42)
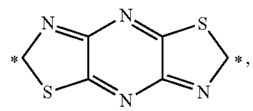
(E43)
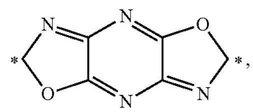
(E44)
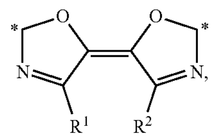
(E45)
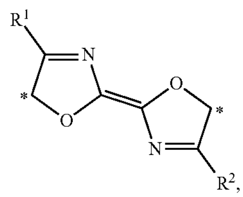
(46)
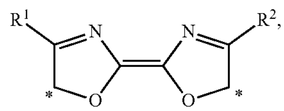
(E47)
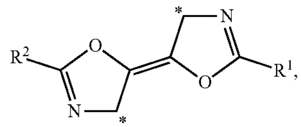
(E48)
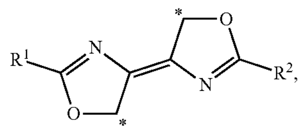
(E49)
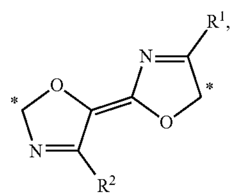
(E50)
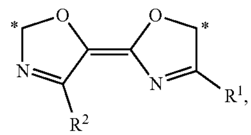
(E51)
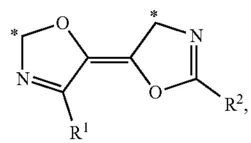

-continued
(E52)
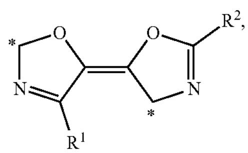
(E53)
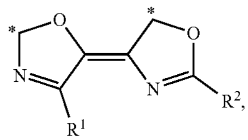
(E54)
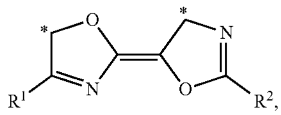
(E55)
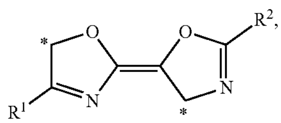
(E56)
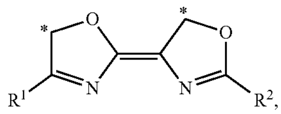
(E57)
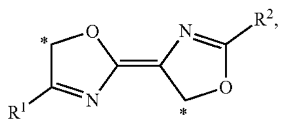
(E58)
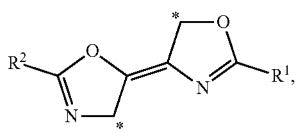
(E59)
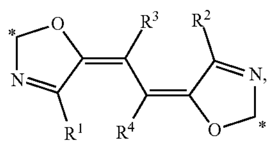
(E60)
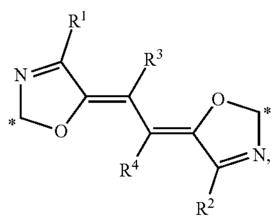
(E61)
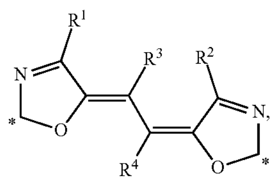
-continued
(E62)
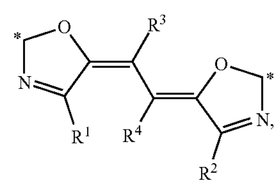
(E63)
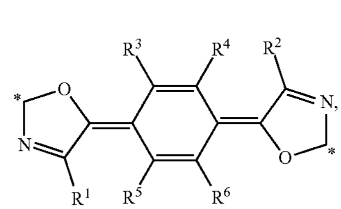
(E64)
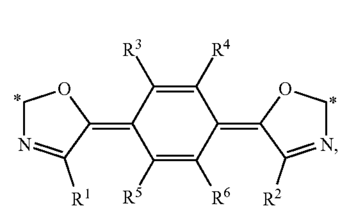
(E65)
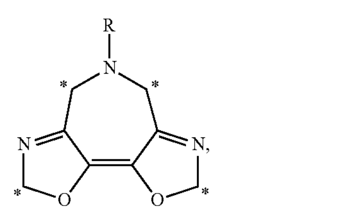
(E66)
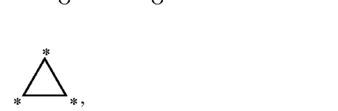
(E67)
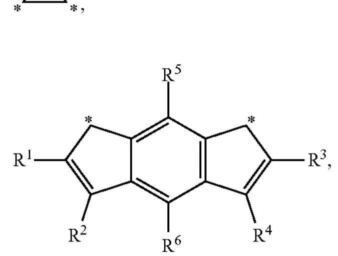
(E68)
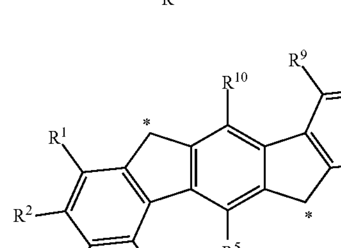
(E69)
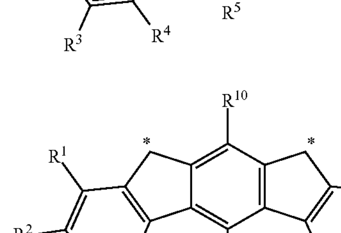
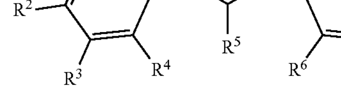

-continued (E70)

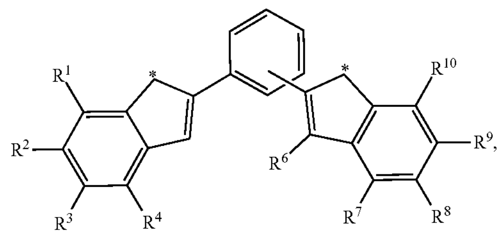

(E71)

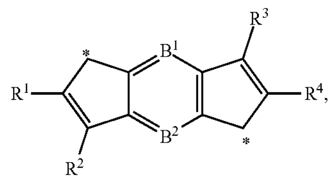

(E72)

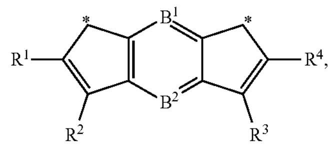

wherein the asterisk "*" denotes the binding position;

$R^1$, $R^2$, $R^3$, $R^4$, $R^5$, $R^6$, $R^7$ and $R^8$ are independently selected from H, D, halogen, Cl, F, substituted or unsubstituted $C_1$ to $C_6$ alkyl, partially fluorinated $C_1$ to $C_6$ alkyl, perfluorinated $C_1$ to $C_6$ alkyl, $CF_3$, substituted or unsubstituted $C_1$ to $C_6$ alkoxy, partially fluorinated $C_1$ to $C_6$ alkoxy, perfluorinated $C_1$ to $C_6$ alkoxy, $OCF_3$, substituted or unsubstituted $C_6$ to $C_{30}$ aryloxy, partially fluorinated $C_6$ to $C_3$n aryloxy, perfluorinated $C_6$ to $C_3$n aryloxy, substituted or unsubstituted $C_6$ to $C_{30}$ aryl, substituted or unsubstituted $C_3$ to $C_{30}$ heteroaryl, CN, isocyano, SCN, OCN, $NO_2$, $SF_5$, wherein the substituents are selected from D, halogen, Cl, F, partially fluorinated $C_1$ to $C_6$ alkyl, perfluorinated $C_1$ to $C_6$ alkyl, $CF_3$, partially fluorinated $C_1$ to $C_6$ alkoxy, perfluorinated $C_1$ to $C_6$ alkoxy, $OCF_3$, CN, isocyano, SCN, OCN, $NO_2$, $SF_5$, $B^1$ and $B^2$ are independently of each other selected from N, $CR^{5A'}$, or $CR^{6A'}$, wherein $CR^{5A'}$, or $CR^{6A'}$ are each independently selected from other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably at least one among $R^1$ to $R^6$ comprises CN, wherein the one or more substituents on $CR^{5A'}$, or $CR^{6A'}$ are independently selected from each other from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from each other from D, an electron-withdrawing group, halogen, Cl, F, CN, $-NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

According to an embodiment, wherein A of formula (IV) is selected from a group of E1 to E27, E44 to E46, E49, E50, E66 to E72:

(E1)

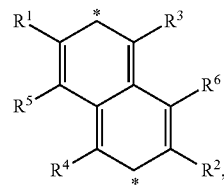

(E2)

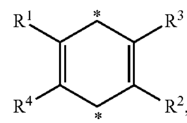

(E3)

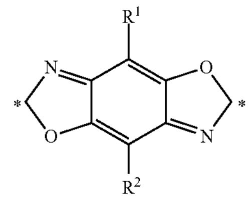

(E4)

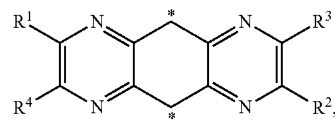

(E5)

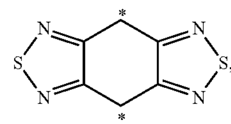

(E6)

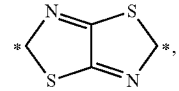

(E7)

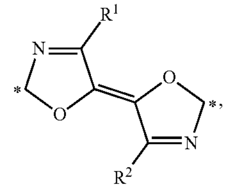

(E8)

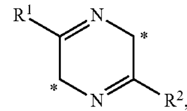

-continued
(E9)
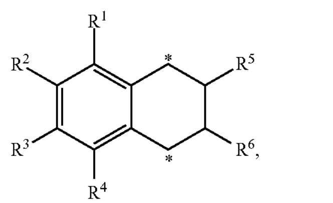
(E10)
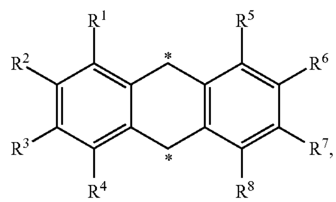
(E11)
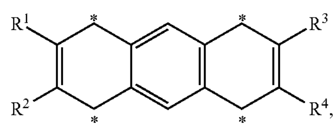
(E12)
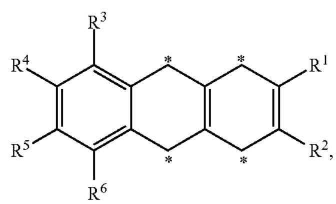
(E13)
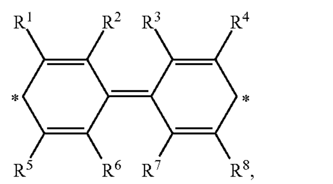
(E14)
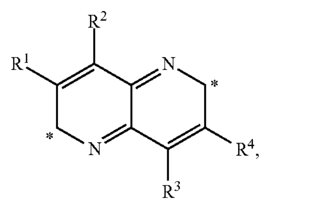
(E15)
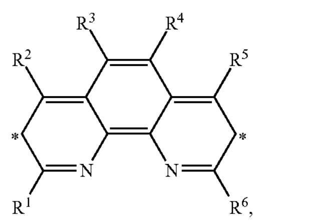
(E16)
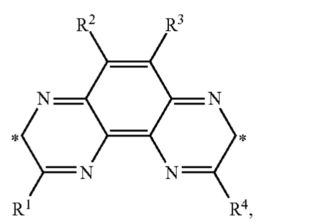
-continued
(E17)
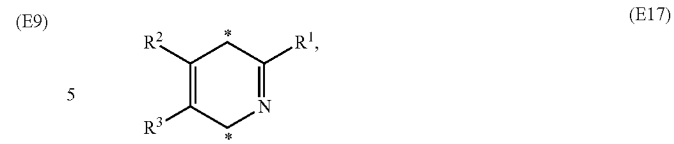
(E18)
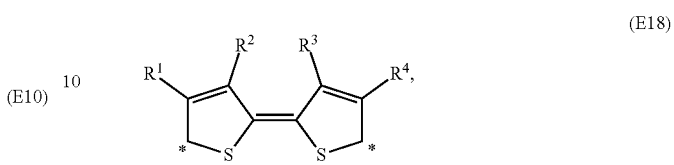
(E19)
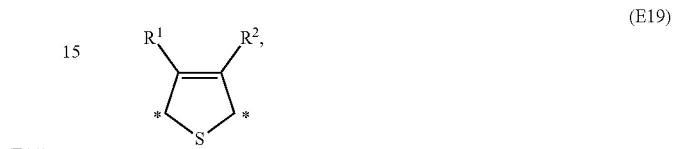
(E20)
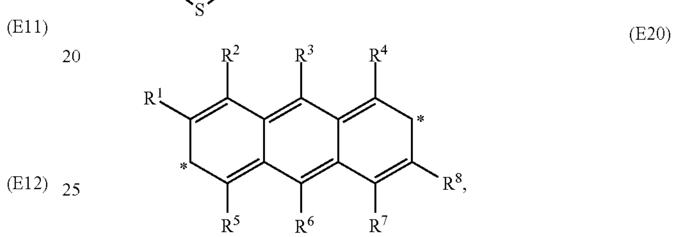
(E21)
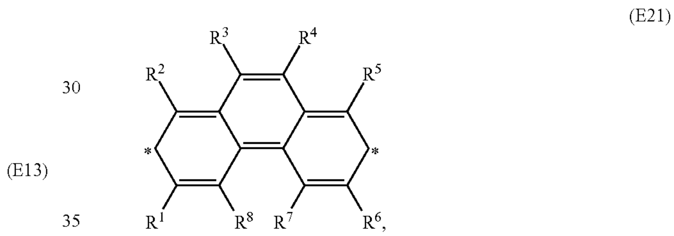
(E22)
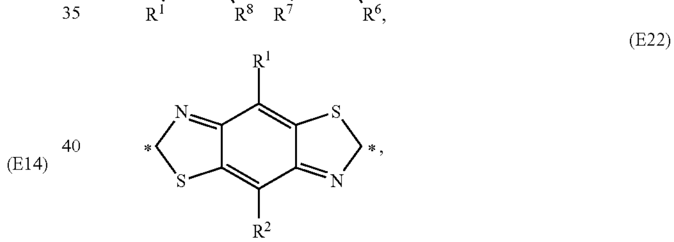
(E23)
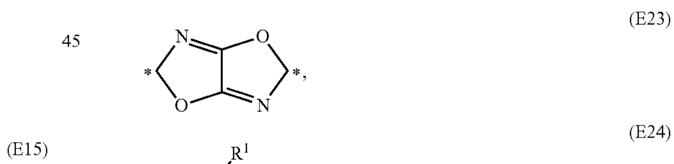
(E24)
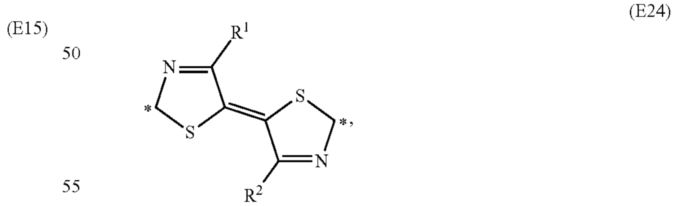
(E25)
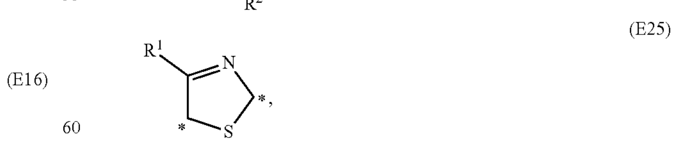
(E26)
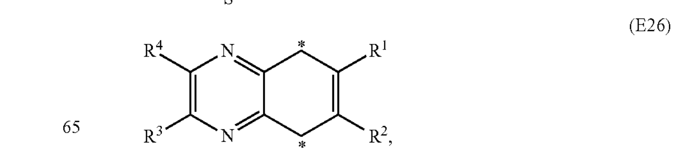

-continued (E27)

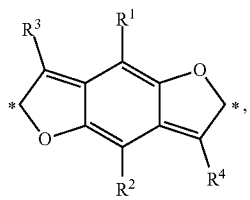

(E44)

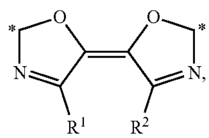

(E45)

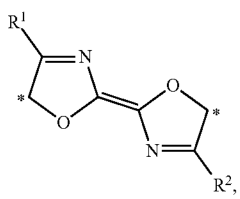

(E46)

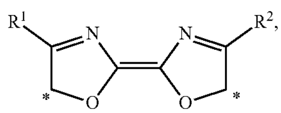

(E49)

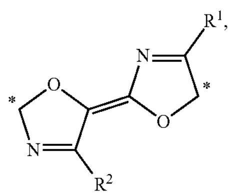

(E50)

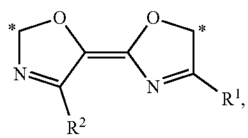

(E66)

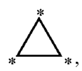

(E67)

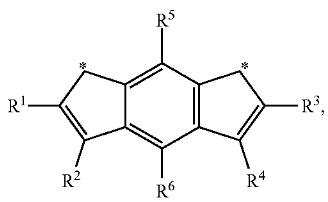

(E68)

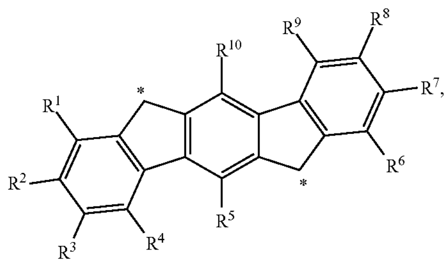

-continued (E69)

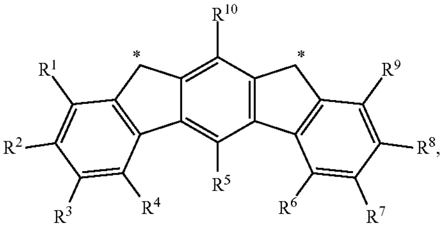

(E70)

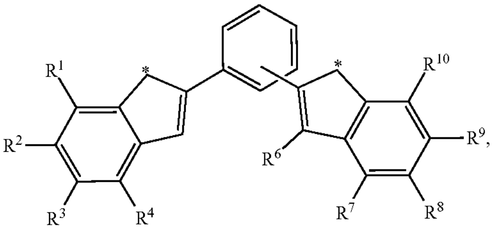

(E71)

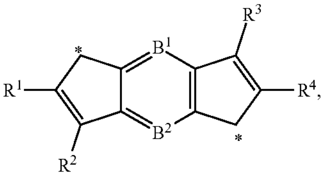

(E72)

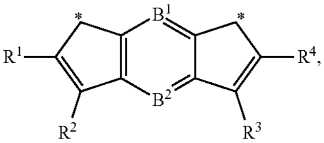

wherein the asterisk “*” denotes the binding position;

$R^1$, $R^2$, $R^3$, $R^4$, $R^5$, $R^6$, $R^7$ and $R^8$ are independently selected from H, D, halogen, Cl, F, substituted or unsubstituted $C_1$ to $C_6$ alkyl, partially fluorinated $C_1$ to $C_6$ alkyl, perfluorinated $C_1$ to $C_6$ alkyl, $CF_3$, substituted or unsubstituted $C_1$ to $C_6$ alkoxy, partially fluorinated $C_1$ to $C_6$ alkoxy, perfluorinated $C_1$ to $C_6$ alkoxy, $OCF_3$, substituted or unsubstituted $C_6$ to $C_{30}$ aryloxy, partially fluorinated $C_6$ to $C_{30}$ aryloxy, perfluorinated $C_6$ to $C_{30}$ aryloxy, substituted or unsubstituted $C_6$ to $C_{30}$ aryl, substituted or unsubstituted $C_3$ to $C_{30}$ heteroaryl, CN, isocyano, SCN, OCN, $NO_2$, $SF_5$, wherein the substituents are selected from D, halogen, Cl, F, partially fluorinated $C_1$ to $C_6$ alkyl, perfluorinated $C_1$ to $C_6$ alkyl, $CF_3$, partially fluorinated $C_1$ to $C_6$ alkoxy, perfluorinated $C_1$ to $C_6$ alkoxy, $OCF_3$, CN, isocyano, SCN, OCN, $NO_2$, $SF_5$, $B^1$ and $B^2$ are independently of each other selected from N, $CR^{5A'}$, or $CR^{6A'}$, wherein $CR^{5A'}$, or $CR^{6A'}$ are each independently selected from each other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably at least one among $R^1$ to $R^6$ comprises CN, wherein the one or more substituents on $CR^{5A'}$, or $CR^{6A'}$ are independently of each other selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently of each other selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

According to an embodiment, wherein A may be preferably selected from a compound of table I.

TABLE I

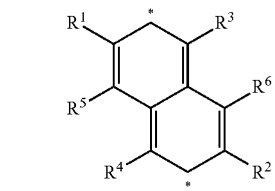

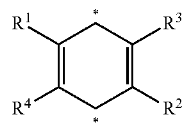

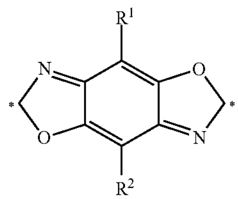

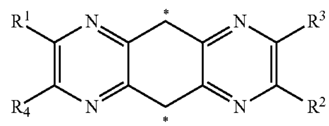

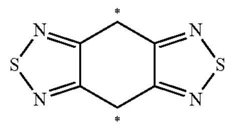

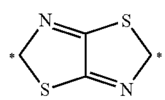

TABLE I-continued

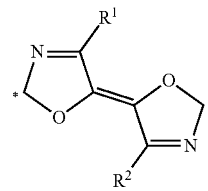

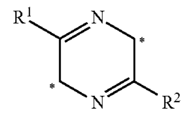

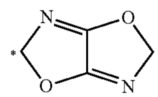

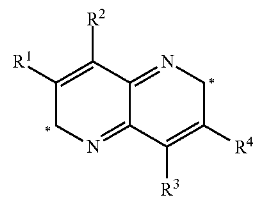

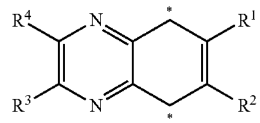

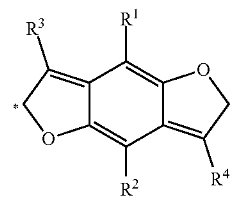

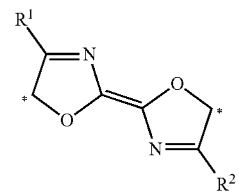

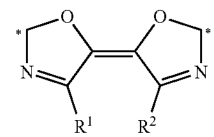

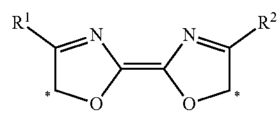

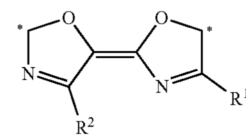

TABLE I-continued
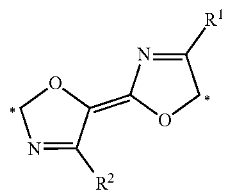
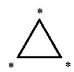
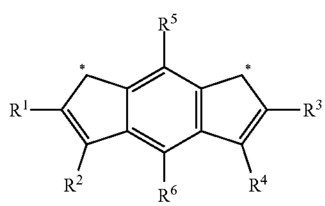
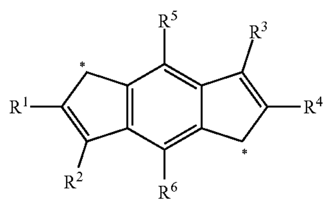
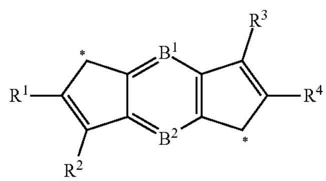
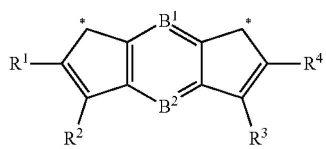
According to an embodiment, wherein A may be preferably selected from a compound of table II.
TABLE II
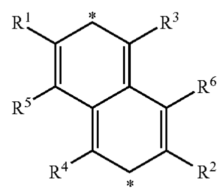
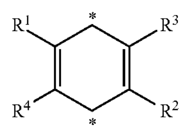
TABLE II-continued
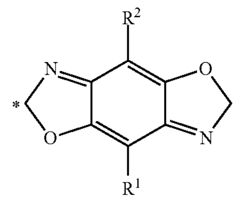
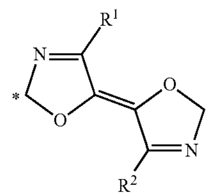
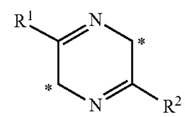
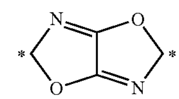
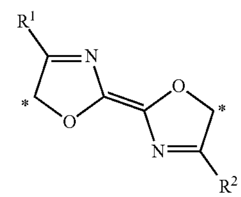
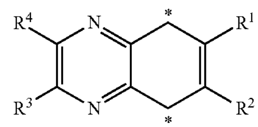
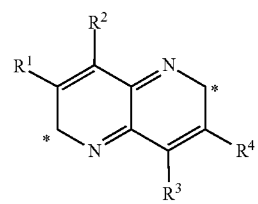
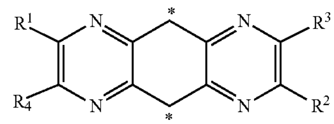
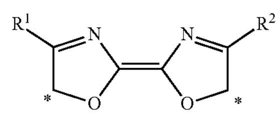
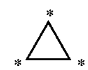

TABLE II-continued

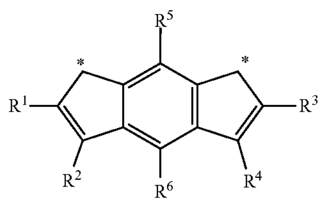

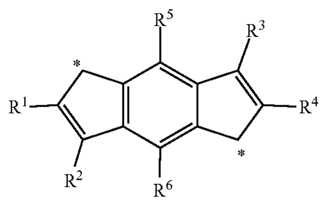

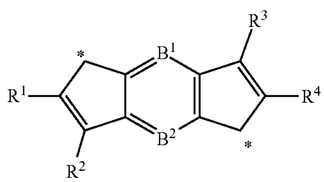

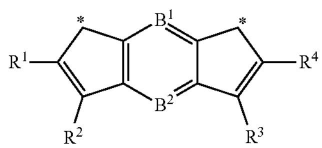

According to an embodiment, wherein A may be preferably selected from a compound of table III.

TABLE III

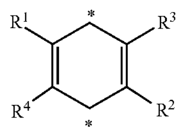

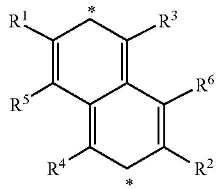

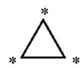

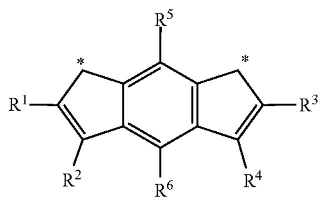

TABLE III-continued

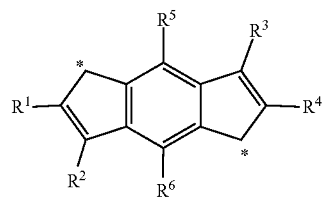

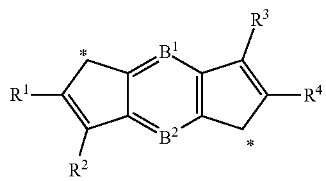

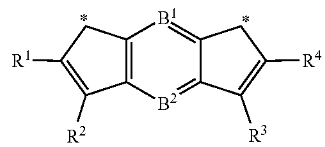

According to an embodiment, wherein A may be preferably selected from one of the following compound:

(E2)

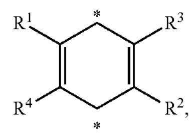

(E66)

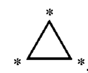

(E67)

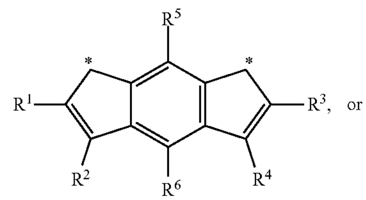

or (E72)

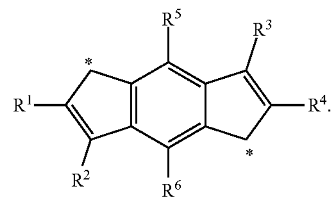

Radialene

According to an embodiment, the first organic p-dopant and/or the second organic p-dopant is selected from a compound of formula (V):

(V)

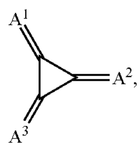

wherein in formula (V)

$A^1$ is independently selected from a group of formula (Va):

(Va)

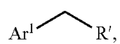

wherein $Ar^1$ is independently selected from substituted or unsubstituted aryl and substituted or unsubstituted heteroaryl, wherein for the case that $Ar^1$ is substituted, one or more of the substituents are independently selected from the group consisting of D, an electron-withdrawing group, halogen, Cl, F, CN, —$NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$A^2$ is independently selected from a group of formula (Vb):

(Vb)

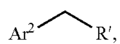

wherein $Ar^2$ is independently selected from substituted or unsubstituted aryl and substituted or unsubstituted heteroaryl, wherein for the case that $Ar^2$ is substituted, one or more of the substituents are independently selected from the group consisting of D, an electron-withdrawing group, halogen, Cl, F, CN, —$NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$A^3$ is independently selected from a group of formula (Vc)

(Vc)

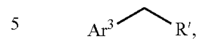

wherein $Ar^3$ is independently selected from substituted or unsubstituted aryl and substituted or unsubstituted heteroaryl, wherein for the case that $Ar^3$ is substituted, one or more of the substituents are independently selected from the group consisting of D, an electron-withdrawing group, halogen, Cl, F, CN, —$NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

wherein in $A^1$, $A^2$, $A^3$ each R' is independently selected from substituted or unsubstituted $C_6$ to $C_{18}$ aryl, $C_3$ to $C_{18}$ heteroaryl, electron-withdrawing group, substituted or unsubstituted $C_1$ to $C_8$ alkyl, partially fluorinated $C_1$ to $C_8$ alkyl, perfluorinated $C_1$ to $C_8$ alkyl, halogen, F and CN; and wherein preferably the compound of formula (V) comprises at least two groups selected from $C_6$ to $C_{19}$ aryl groups, or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

The term "electron-withdrawing group" refers to a chemical group in a molecule, which can draw electrons away from an adjacent part of the molecule. The distance over which the electron-withdrawing group can exert its effect, namely the number of bonds over which the electron-withdrawing effect spans, is extended by conjugated pi-electron systems such as aromatic systems. Examples of electron-withdrawing groups include $NO_2$, CN, halogen, Cl, F, partially fluorinated or perfluorinated alkyl and partially fluorinated or perfluorinated $C_1$ to $C_{12}$ alkyl, partially fluorinated or perfluorinated alkoxy, partially fluorinated or perfluorinated $C_1$ to $C_6$ alkoxy.

First Organic Dopant

Quinoid-Like

The first organic p-dopant is a quinoid-like compound when it is reduced, i.e. when oxidation level of said compounds is lowered by one, two, three or four electrons, results in an at least partial aromatization of said first organic p-dopant or of said second organic p-dopant, preferably the quinoid-like compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the first organic p-dopant is a quinoid-like compound, whereby the term "quinoid-like compound" means and/includes a compound which contains a moiety which is (formally) derived from a compound comprising an annelated aromatic system or non-annelated aromatic system whereby one or more carbon atoms of said annelated aromatic system or non-annelated aromatic system are double bonded to an atom or a group outside said annelated aromatic system or non-annelated aromatic system with any necessary rearrangement of double bonds preferably the quinoid-like compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the first organic p-dopant is a quinoid-like compound, whereby the term "quinoid-like compound" means and/includes a compound which contains a moiety which is (formally) derived from a compound comprising an annelated aromatic system or non-annelated aromatic system whereby one or more carbon atoms of said annelated aromatic system or non-annelated aromatic system are double bonded to an atom or a group outside said annelated aromatic system or non-annelated aromatic system with any necessary rearrangement of double bonds and resulting in at least a partial lift of aromaticity in the annelated aromatic system or non-annelated aromatic system; preferably the quinoid-like compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the first organic p-dopant is a quinoid compound, whereby the term "quinoid compound" means/includes a compound which contains a moiety which is (formally) derived from a compound comprising an annelated aromatic system or non-annelated aromatic system whereby an even number of carbon atoms of said annelated aromatic system or non-annelated aromatic system are double bonded to an atom or a group outside said annelated aromatic system or non-annelated aromatic system with any necessary rearrangement of double bonds and resulting in at least a partial lift of aromaticity in the annelated aromatic system or non-annelated aromatic system, wherein the even number of carbon atoms of said annelated aromatic system or non-annelated aromatic system which are double bonded to an atom or a group outside said annelated aromatic system or non-annelated aromatic system were a —CH═ of said aromatic system or non-annelated aromatic system; preferably the quinoid compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$. Reduction of the quinoid compound by one or two electrons, i.e. when the oxidation level of said compounds is lowered by adding two electrons, results in an at least partial aromatization of the quinoid compound.

According to an embodiment, the first organic p-dopant is a quinoid compound and represented by formula (IV), whereby the term "quinoid compound" means and/includes a compound which contains a moiety which is (formally) derived from a compound comprising an annelated aromatic system or non-annelated aromatic system whereby an even number of carbon atoms of said annelated aromatic system or non-annelated aromatic system are double bonded to an atom or a group outside said annelated aromatic system or non-annelated aromatic system with any necessary rearrangement of double bonds and resulting in at least a partial lift of aromaticity in the annelated aromatic system or non-annelated aromatic system, preferably the quinoid compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CE_3$; wherein the even number of carbon atoms of said annelated aromatic system or non-annelated aromatic system which are double bonded to an atom or a group outside said annelated aromatic system or non-annelated aromatic system were a —CH═ of said aromatic system or non-annelated aromatic system. Reduction of the quinoid compound by one or two electrons, i.e. when the oxidation level of said compounds is lowered by adding two electrons, results in an at least partial aromatization of the quinoid compound.

According to an embodiment, wherein the first organic p-dopant is selected from a compound comprising a quinoid structure, an indacenedione structure or a compound of formula (IV):

(IV)

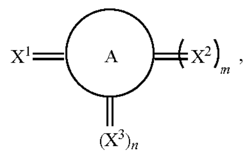

n is an integer including 0, 1, 2, 3, 4, 5 or 6, preferably 0, 2, or 4;

m is an integer selected from 0 or 1;

$X^1$, $X^2$ and $X^3$ are independently selected from O, S, $CR^{1a}R^{2a}$, $CR^{1b}R^{2b}$, $NR^{3a}$, $NR^{3b}$ or at least one of $X^1$, $X^2$, and $X^3$ form a fused ring with A, and wherein each $X^3$ is selected the same or different, preferably the same, $R^{1a}$, $R^{2a}$, $R^{1b}$, and $R^{2b}$ are independently selected from an electron-withdrawing group, halogen, $C_1$, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted aryl, substituted or unsubstituted heteroaryl, wherein the one or more substituents on $R^{1a}$, $R^{2a}$, $R^{1b}$, and $R^{2b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$R^{3a}$ and $R^{3b}$ is selected from an electron-withdrawing group, CN, partially fluorinated $C_1$ to $C_6$ alkyl, perfluorinated $C_1$ to $C_6$ alkyl, $CF_3$, substituted or unsubstituted $C_6$ to $C_{30}$ aryl, or substituted or unsubstituted $C_3$ to $C_{30}$ heteroaryl, wherein the one or more substituents on $R^{3a}$ and $R^{3b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

A is selected from substituted or unsubstituted $C_3$ to $C_{40}$ cycloalkane group containing at least one or more double-bonds, substituted or unsubstituted $C_3$ to $C_{40}$ cycloalkene group, substituted or unsubstituted $C_2$ to $C_{40}$ heterocycloalkane group, substituted or unsubstituted $C_2$ to $C_{40}$ heterocycloalkane group containing one or more double-bonds, substituted or unsubstituted $C_2$ to $C_{40}$ heterocycloalkene group, substituted or unsubstituted $C_6$ to $C_{40}$ aromatic group, substituted or unsubstituted $C_2$ to $C_{40}$ heteroaromatic group, wherein $X^1$, $X^2$, and/or $X^3$ are conjugated to each other via a double-bond in A;

wherein the substituents on A, when present, are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, substituted or unsubstituted $C_2$ to $C_{30}$ heteroaryl, wherein the substituent of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

and wherein preferably the compound of formula (IV) comprises at least two groups selected from substituted $C_6$ to $C_{19}$ aryl group or substituted $C_3$ to $C_{12}$ heteroaryl group, wherein each of the substituted $C_6$ to $C_{19}$ aryl group or substituted $C_3$ to $C_{12}$ heteroaryl group is substituted with a substituent independently selected from halogen, F, CN, partially perfluorinated $C_1$ to $C_{12}$ alkyl, perfluorinated $C_1$ to $C_{12}$ alkyl, or $CF_3$.

The $C_6$ to $C_{40}$ aromatic group may be a group which is aromatic, or a group containing at least one aromatic moiety, i.e. an aromatic group may also contain a fused non-aromatic moiety. The moiety can contain different atoms. The $C_2$ to $C_{40}$ heteroaromatic group may be a group which is heteroaromatic, or a group containing at least one heteroaromatic moiety, i.e. a heteroaromatic group may also contain a fused non-aromatic moiety. The moiety can contain different atoms.

According to an embodiment, the first organic p-dopant is a compound of formula (IV)

(IV)

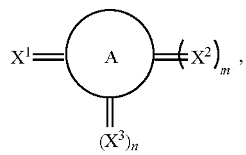

wherein n is an even integer including 0 preferably n is selected from 0, 2, or 4, m is an integer selected from 1, $X^1$, $X^2$, and $X^3$ are independently selected from O, S, $CR^{1a}R^{2a}$, $CR^{1b}R^{2b}$, $NR^{3a}$, $NR^{3b}$; wherein each $X^3$ can be selected the same or different, wherein $X^1$, $X^2$, and $X^3$ can independently of each other form a fused ring with A;

wherein $R^{1a}$, $R^{2a}$, $R^{1b}$, and $R^{2b}$, are independently selected from an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted aryl, substituted or unsubstituted heteroaryl, wherein the one or more substituents on $R^{1a}$, $R^{2a}$, $R^{1b}$, and $R^{2b}$, when present, are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

wherein $R^{3a}$ and $R^{3b}$ is selected from an electron-withdrawing group, CN, partially fluorinated $C_1$ to $C_6$ alkyl, perfluorinated $C_1$ to $C_6$ alkyl, $CF_3$, substituted or unsubstituted $C_6$ to $C_{30}$ aryl, or substituted or unsubstituted $C_3$ to $C_{30}$ heteroaryl, wherein the one or more substituents on $R^{3a}$ and $R^{3b}$, when present, are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, $—NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

wherein A is selected from substituted or unsubstituted $C_3$ to $C_{40}$ cycloalkane group containing at least one or more double-bonds, substituted or unsubstituted $C_3$ to $C_{40}$ cycloalkene group, substituted or unsubstituted $C_2$ to $C_{40}$ heterocycloalkane group, substituted or unsubstituted $C_2$ to $C_{40}$ heterocycloalkane group containing one or more double-bonds, substituted or unsubstituted $C_2$ to $C_{40}$ heterocycloalkene group, substituted or unsubstituted $C_6$ to $C_{40}$ aromatic group, substituted or unsubstituted $C_2$ to $C_{40}$ heteroaromatic group, wherein $X^1$, each $X^2$, and each $X^3$ are conjugated to each other via a double-bond in A;

wherein the one or more substituents on A, when present, are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, substituted or unsubstituted $C_2$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, $—NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

According to one embodiment, wherein the compound of formula (IV) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Second Organic p-Dopant

Radialene

According to an embodiment, the second organic p-dopant is selected from a compound of formula (V), preferably the compound of formula (V) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Indacendione or Indacenedione Type Compounds

According to an embodiment, the second organic p-dopant is an indacenedione-type compound whereby the term "indacendione-type compound" means and/includes a compound which contains a moiety which is (formally) derived from a compound comprising an annelated aromatic system or non-annelated aromatic system whereby one or more carbon atoms of said annelated aromatic system or non-annelated aromatic system are double bonded to an atom or a group outside said annelated aromatic system or non-annelated aromatic system without a rearrangement of double bonds, preferably the indacenedione-type compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the second organic p-dopant is an indacenedione-type compound whereby the term "indacendione-type compound" means and/includes indacenedione or a compound which contains a moiety which is (formally) derived indacenedione whereby at least one of the two oxygens are replaced by other atoms preferably carbon atoms, without a rearrangement of double bonds preferably the indacenedione-type compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the second organic p-dopant is selected from a compound of comprising a indacenedione group, a radialene from a compound of formula (V), or a compound of formula (VIa) or (VIb):

(VIa)

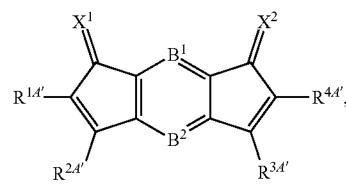

(VIb)

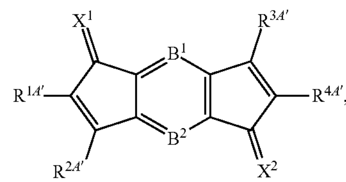

wherein $B^1$ and $B^2$ are independently of each other selected from N, $CR^{5A'}$ or $CR^{6A'}$ $R^{1A'}$, $R^{2A'}$, $R^{3A'}$, $R^{4A'}$, $R^{5A'}$ and $R^{6A'}$ are independently selected from each other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably at least one among $R^1$ to $R^6$ comprises CN, wherein the one or more substituents on $CR^{5A'}$, or $CR^{6A'}$ are independently selected from each other from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from each other from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$X^1$ and $X^2$ are independently of each other selected from formula (VII)

(VII)

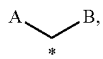

wherein

A and B are independently of each other is selected from H, D, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the second organic p-dopant is selected from a compound of formula (VIa) or (VIb), and the compound of formula (VIa) or (VIb) is represented by (VllIa) or (VIIIb)

(VIIIa)

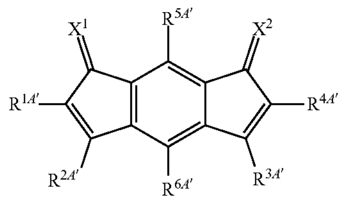

-continued (VIIIb)

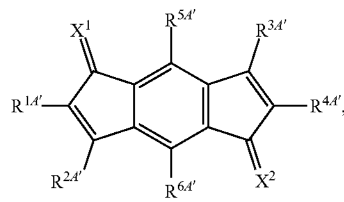

wherein $R^{1A'}$, $R^{2A'}$, $R^{3A'}$, $R^{4A'}$, $R^{5A'}$, and $R^{6A'}$, are each independently of each other selected from H, D, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably at least one among $R^1$ to $R^6$ comprises CN; and $X^1$ and $X^2$ are independently of each other selected from formula (IX)

(IX)

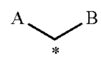

wherein A and B are independently of each other is selected from H, D, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, preferably the compound of formula (VIIIa) or (VIIIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, in formula (IV), (VIa), (VIb) the one or more substituents of the aryl, heteroaryl, alkyl, alkoxy, and ether group, when present, are independently of each other selected from $C_1$ to $C_{12}$ alkyl, $C_1$ to $C_{12}$ alkoxy, a $C_1$ to $C_{15}$ heteroalkyl with 1 to 4 heteroatoms one among 0, N, O, S, and Si, CN, halogen Cl, F, $CF_3$, $OCF_3$, $Si(CH_3)_3$.

According to an embodiment, the compound of formula (IV), (VIa) or (VIb) may be selected from a compound F1 to F10:

(F1)

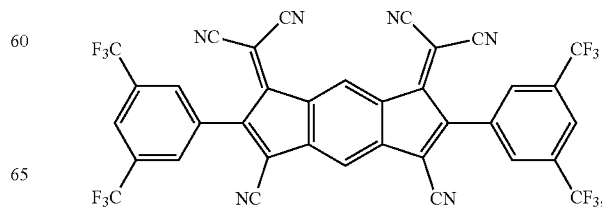

-continued (F2)

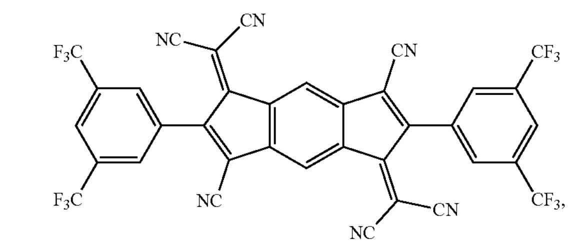

(F3)

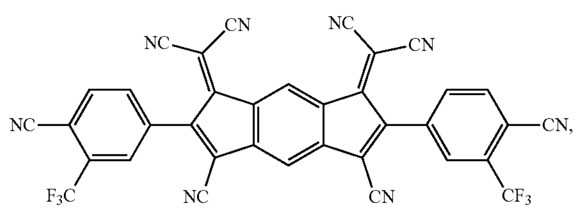

(F4)

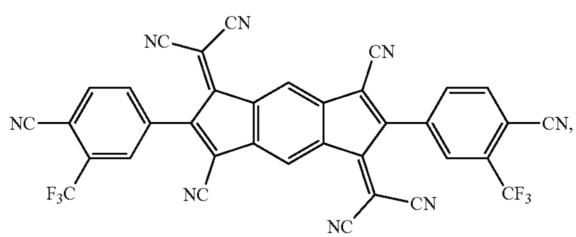

(F5)

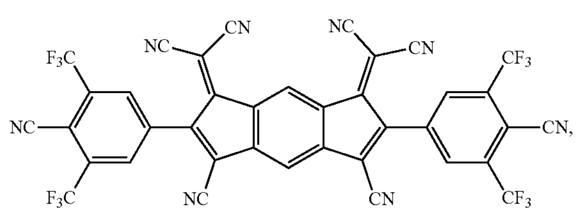

(F6)

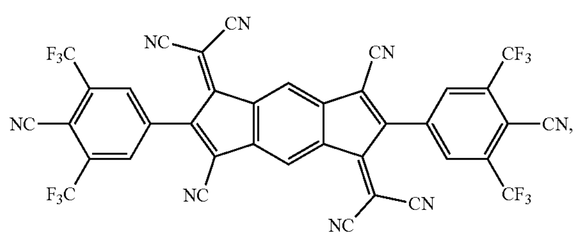

(F7)

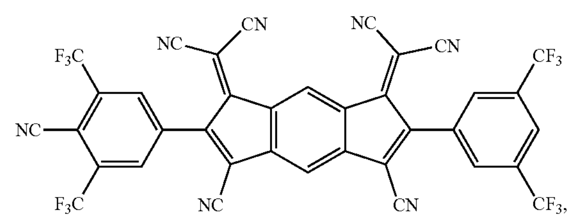

-continued (F8)

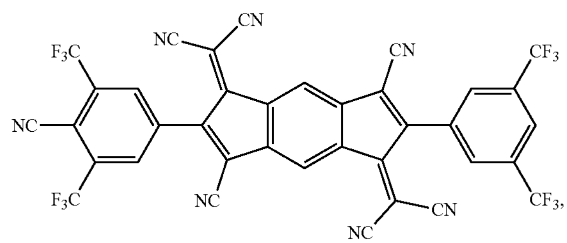

(F9)

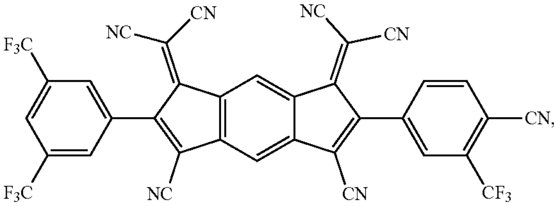

(F10)

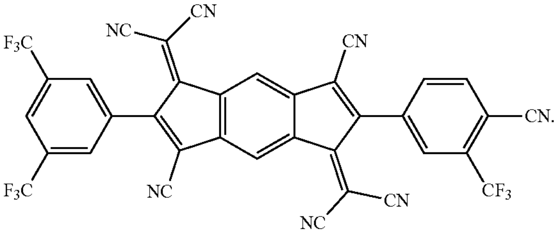

Combination First and Second Organic p-Dopant

Radialene Formula (V)/Radialene Formula (V)

According to an embodiment, the first organic p-dopant and the second organic p-dopant are independently of each other selected from a compound of formula (V), preferably the compound of formula (V) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like Formula (IV)/Radialene Formula (V)

According to an embodiment, the first organic p-dopant is a quinoid-like compound of formula (IV) and the second organic p-dopant is a compound of formula (V), preferably the quinoid-like compound of formula (IV) or the compound of formula (V) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CE_3$, and more preferably the quinoid-like compound and the compound of formula (V) comprises independently of each other at least two s groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, According to an embodiment, the first organic p-dopant is a compound of formula (IV) compound and the second organic p-dopant is a compound of formula (V), preferably the compound of formula (IV) or the compound of formula (V) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the compound of formula (IV) and the compound of formula (V), and more preferably the compound of formula (IV) and the compound of formula (V) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like/Indacenedione-Type Compounds

According to an embodiment, the first organic p-dopant is a quinoid-like compound, and the second organic p-dopant is an indacenedione-type compound, preferably the quinoid-like compound or the indacenedione-type compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid-like compound and the indacenedione-type compound comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like/Indacendione Formula (VIa) or (VIb)

According to an embodiment, the first organic p-dopant is a quinoid-like compound and the second organic p-dopant is a compound of formula (VIa) or (VIb), preferably the quinoid-like compound or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid-like compound and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like Formula (IV)/Indacendione Formula (VIa) or (VIb)

According to an embodiment, the first organic p-dopant is a compound of formula (IV) and the second organic p-dopant is a compound of formula (VIa) or (VIb), preferably the compound of formula (IV) or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the compound of formula (IV) and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like/Indacendione Formula (VIa) or (VIb)

According to an embodiment, the first organic p-dopant is a quinoid-like compound and the second organic p-dopant is a compound of formula (VIa) or (VIb), preferably the quinoid-like compound or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid-like compound and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

Quinoid-Like Formula (IV)/Indacendione Formula (VIa) or (VIb)

According to an embodiment, the first organic p-dopant is a compound of formula (IV) and the second organic p-dopant is a compound of formula (VIa) or (VIb), preferably the compound of formula (IV) or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the compound of formula (IV) and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the compound of formula (IV) and the compound Quinoid/Radialene Formula (V)

According to an embodiment, the first organic p-dopant is a quinoid compound and the second organic p-dopant is a compound of formula (V), preferably the quinoid compound comprises or the compound of formula (V) at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid compound and the compound of formula (V) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the compound of formula (IV) and the compound Quinoid/Indacenedione-Type Compounds According to an embodiment, the first organic p-dopant is a quinoid compound, and the second organic p-dopant is an indacenedione-type compound, preferably the quinoid compound or the indacenedione-type compound comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid compound and the indacenedione-type compound comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$,
Quinoid/Indacendione Formula (VIa) or (VIb)

According to an embodiment, the first organic p-dopant is a quinoid compound and the second organic p-dopant is a compound of formula (VIa) or (VIb), preferably the quinoid compound or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid compound and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

According to an embodiment, the first organic p-dopant is a quinoid compound and the second organic p-dopant is a compound of formula (VIa) or (VIIb), preferably the quinoid compound or the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$, and more preferably the quinoid compound and the compound of formula (VIa) or (VIb) comprises independently of each other at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$,
First Organic p-Dopant and/or the Second Organic p-Dopant of Formula (V)

According to one embodiment, wherein the first organic p-dopant is selected from a compound of G1 to G25:

(G1)

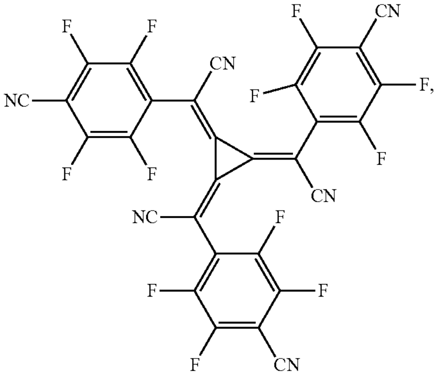

(G2)

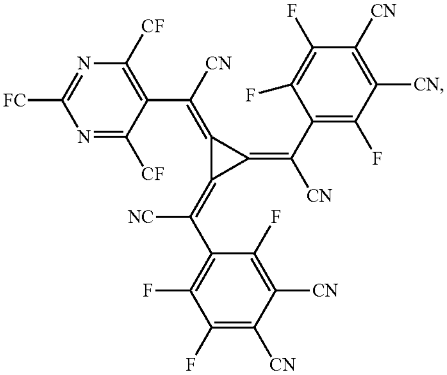

(G3)

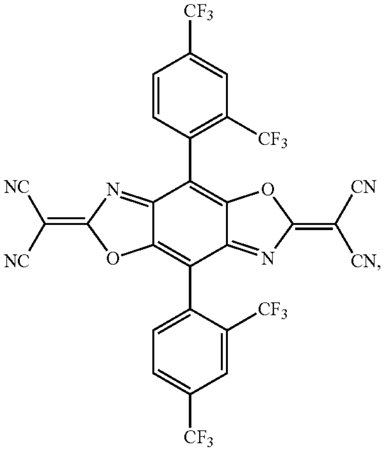

(G4)

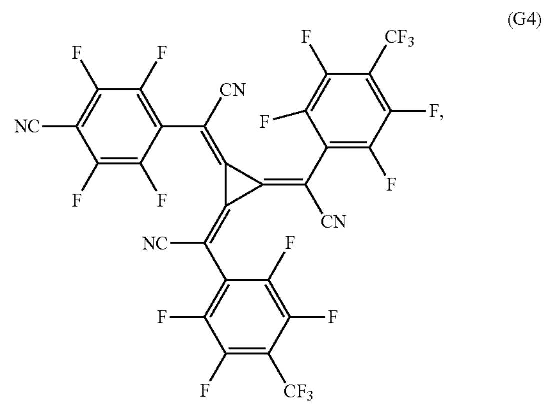

-continued
(G5)
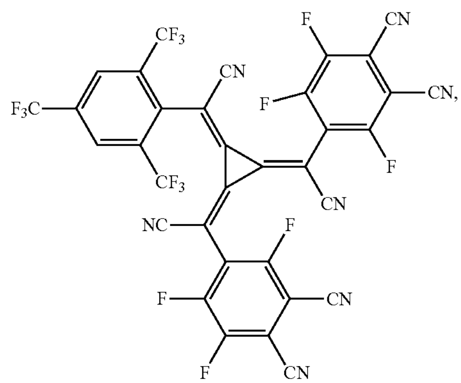
(G6)
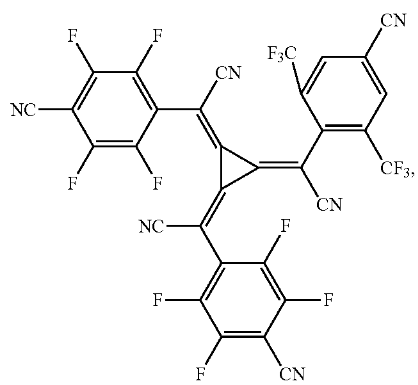
(G7)
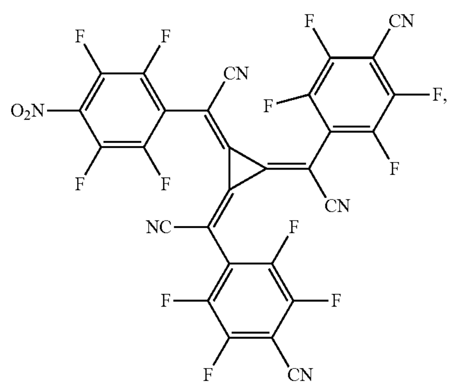
(G8)
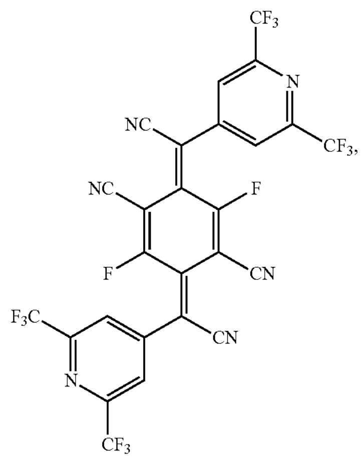
-continued
(G9)
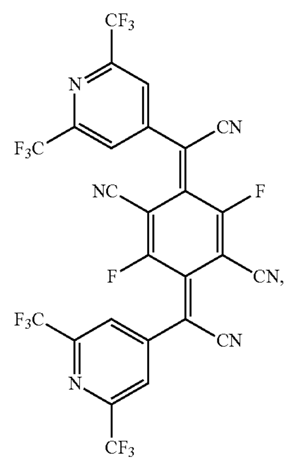
(G10)
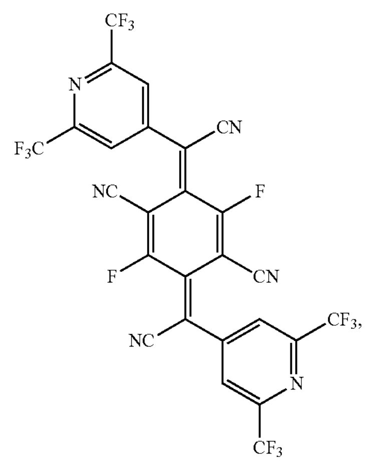
(G11)
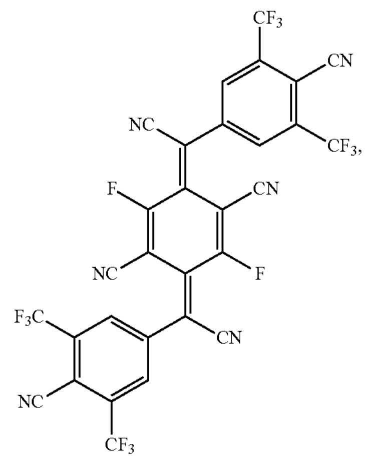

-continued
(G12)
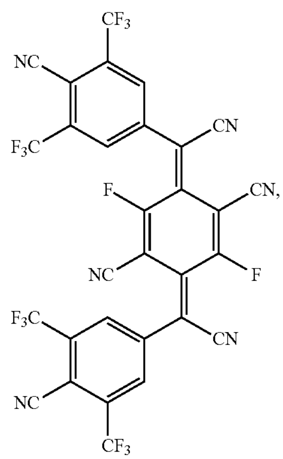
(G13)
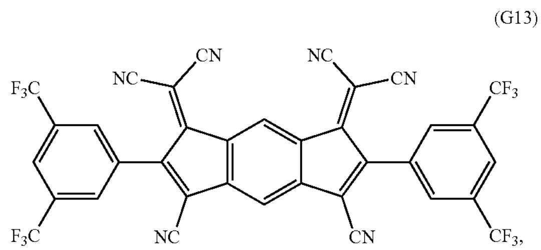
(G14)
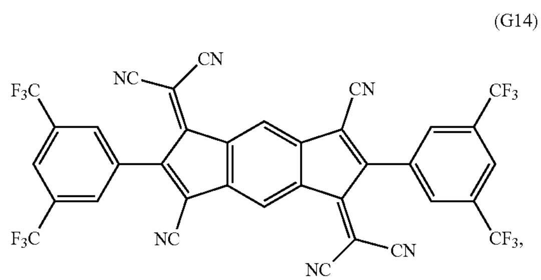
(G15)
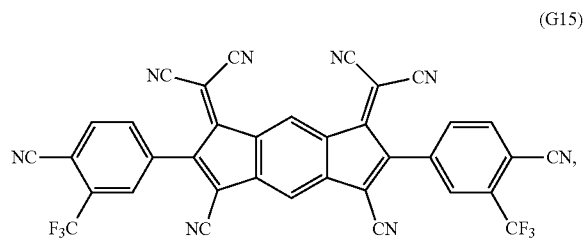
(G16)
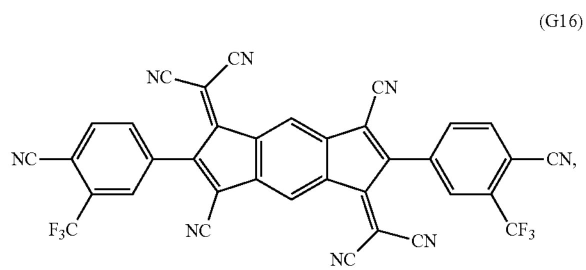
-continued
(G17)
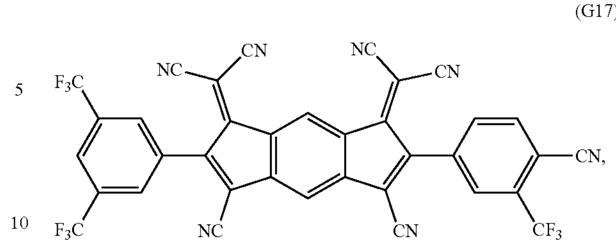
(G18)
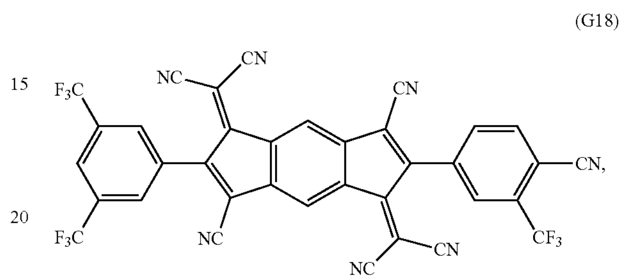
(G19)
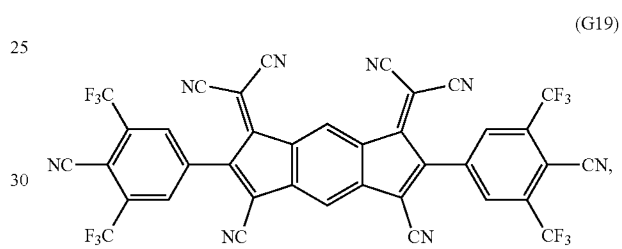
(G20)
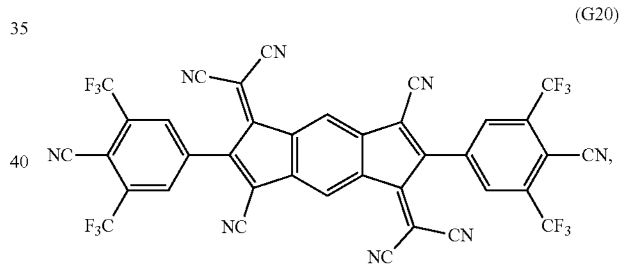
(G21)
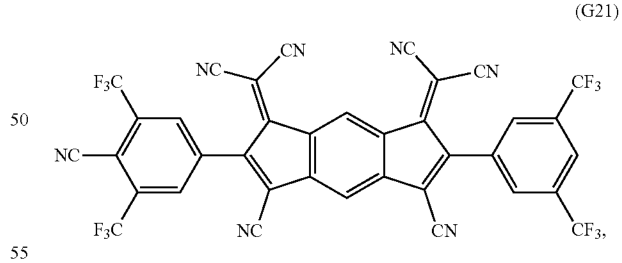
(G22)
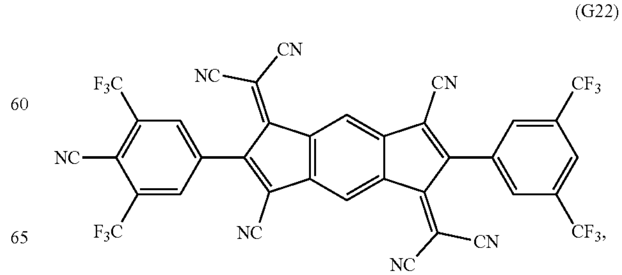

-continued
(G23)
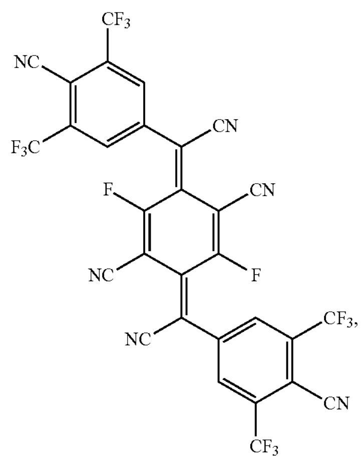
(G24)
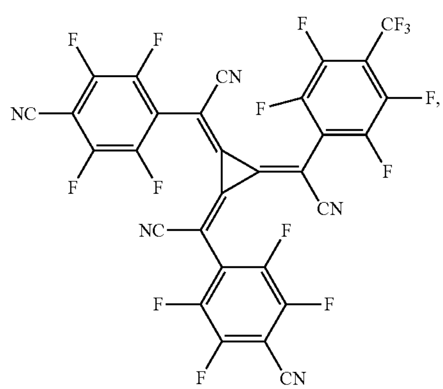
(G25)
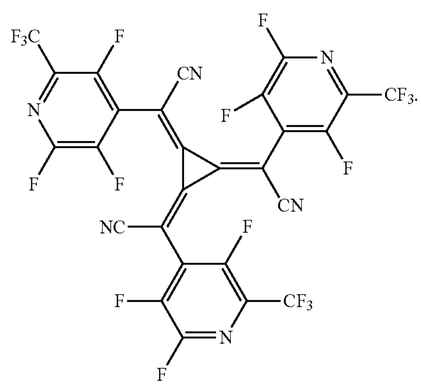
According to one embodiment, wherein the first organic p-dopant is selected from G1 to G3, G5, G7 to G12 and G23:
(G1)
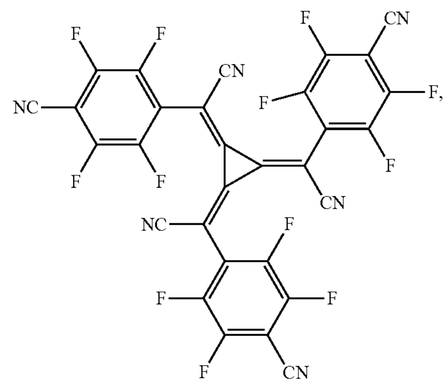
(G2)
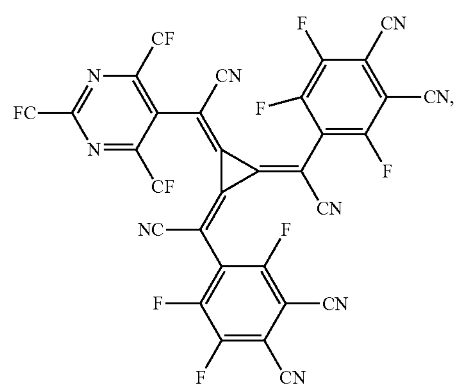
(G3)
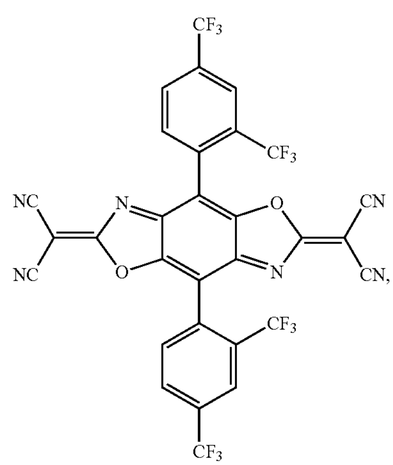
(G5)
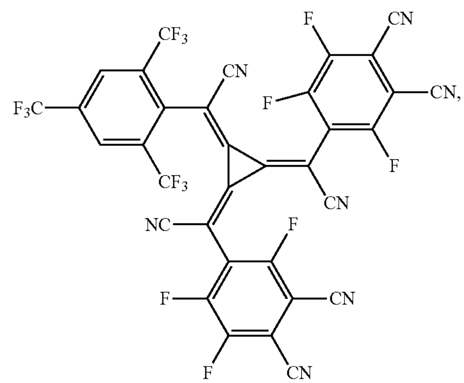

-continued
(G7)
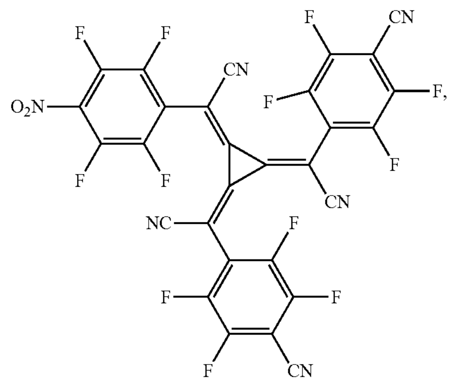
-continued
(G10)
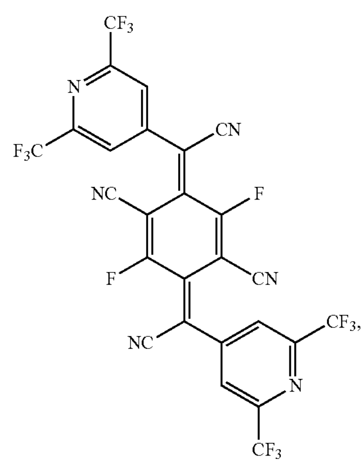
(G8)
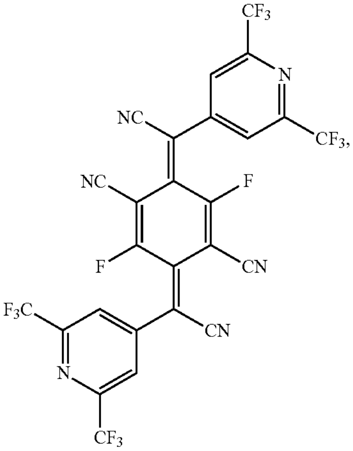
(G11)
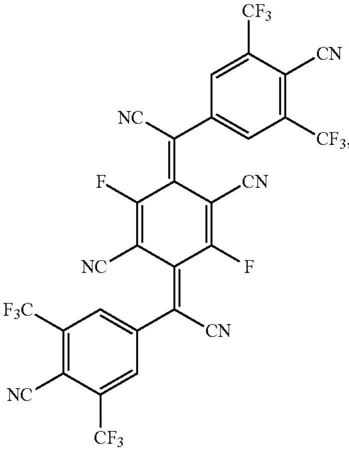
(G9)
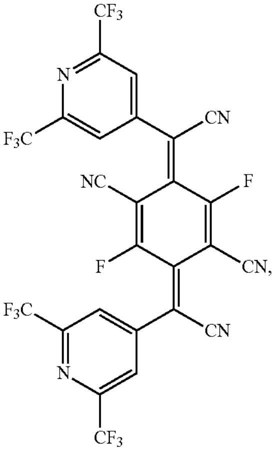
(G12)
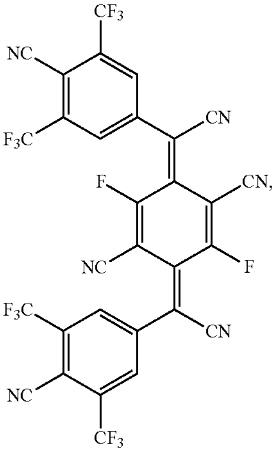

-continued
(G23)
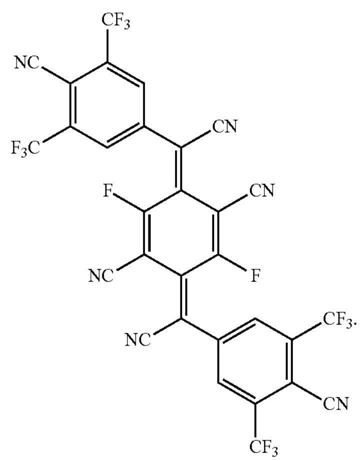
According to one embodiment, wherein the first organic p-dopant is selected from G1, G2, G5 and G7:
(G1)
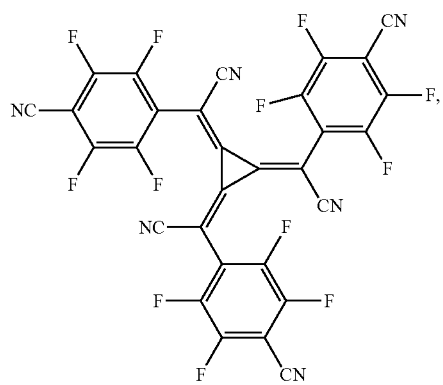
(G2)
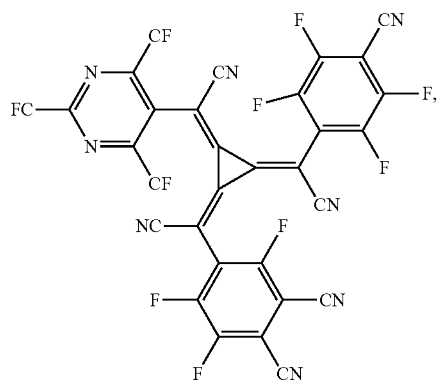
-continued
(G5)
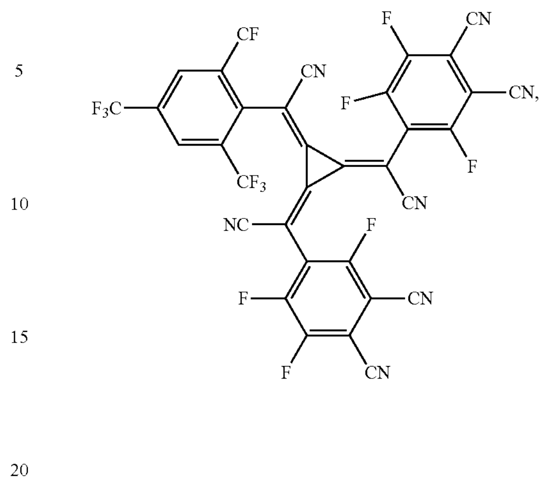
(G7)
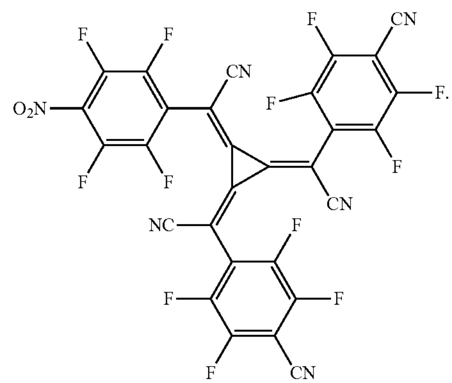
According to one embodiment, wherein the first organic p-dopant is selected from G3, G8, G9, G10, G11, G12 and 23:
(G3)
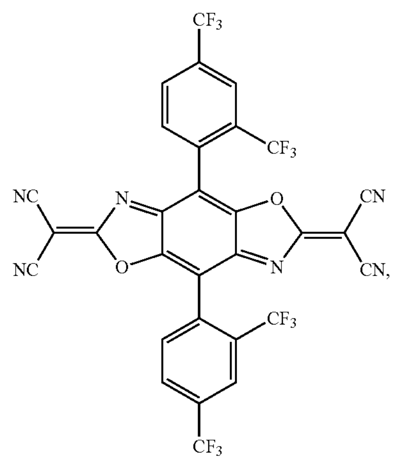

-continued
(G8)
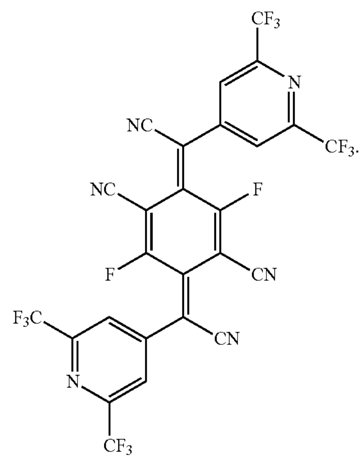
(G9)
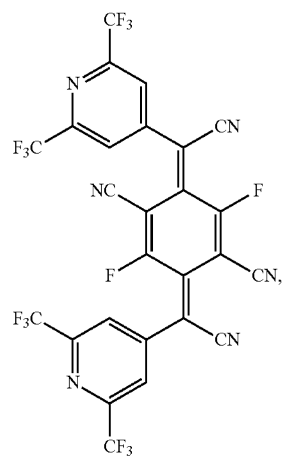
(G10)
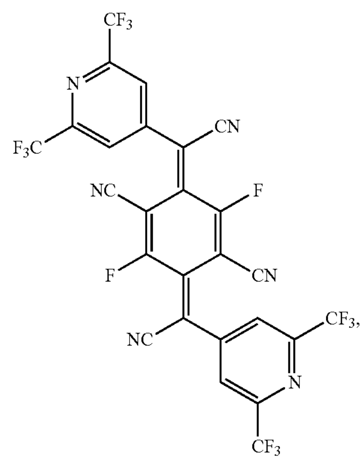
-continued
(G11)
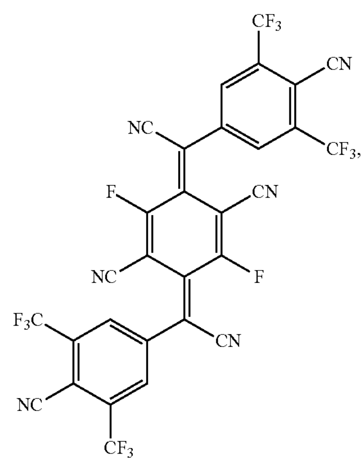
(G12)
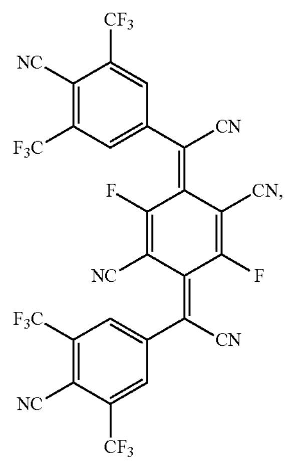
(G23)
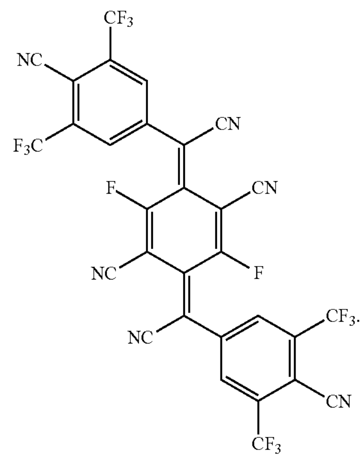
According to one embodiment, wherein the second organic p-dopant is selected from a compound of G1 to G25:

-continued
(G1)
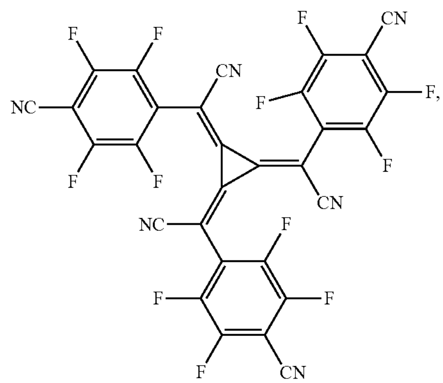
(G2)
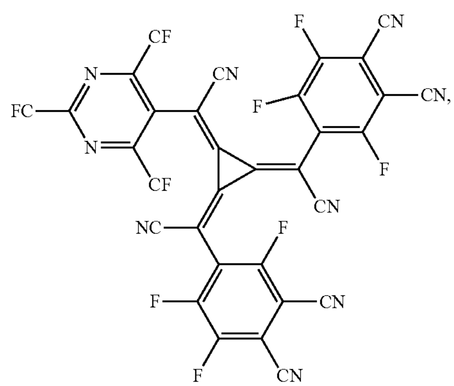
(G3)
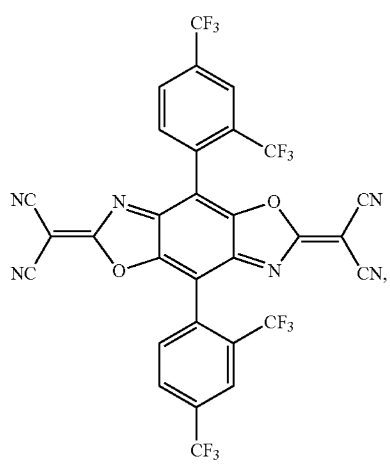
(G4)
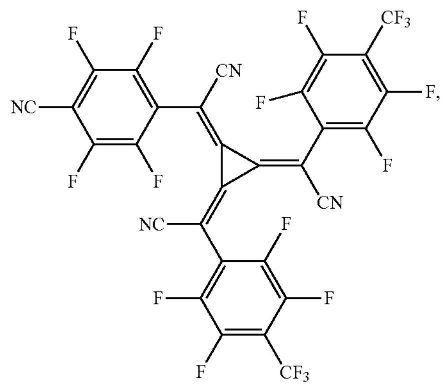
(G5)
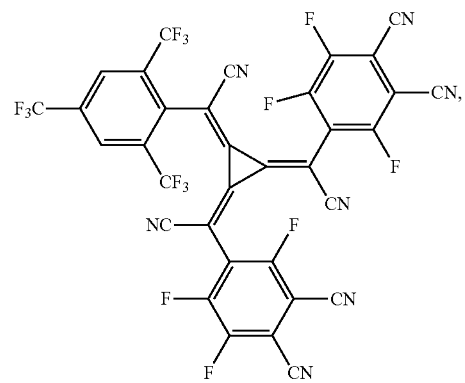
(G6)
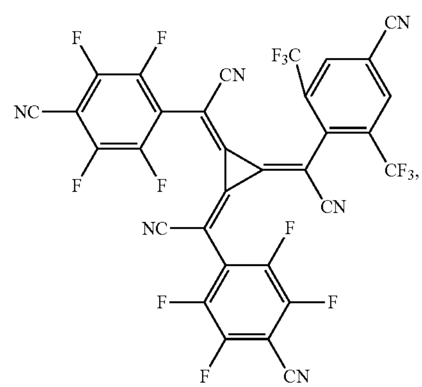
(G7)
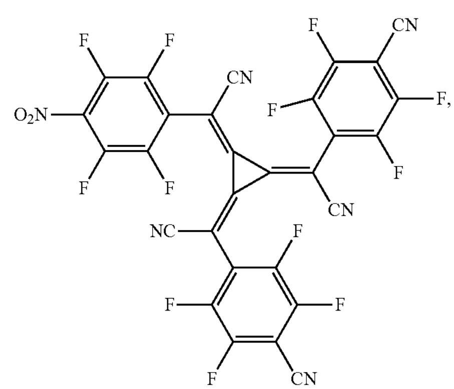
(G8)
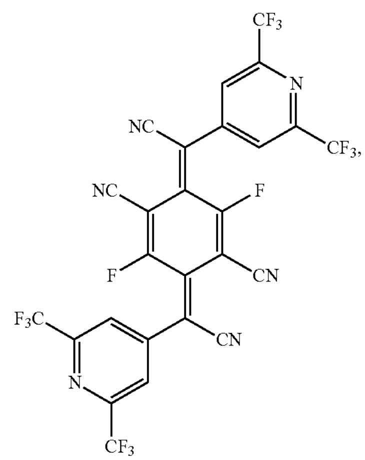

-continued
(G9)
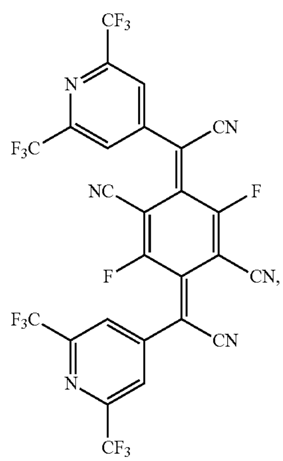
(G10)
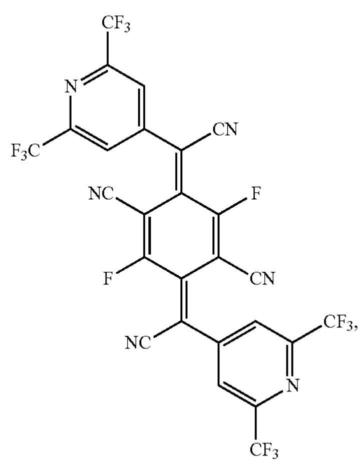
(G11)
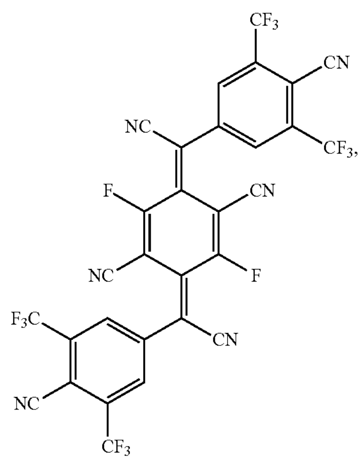
-continued
(G12)
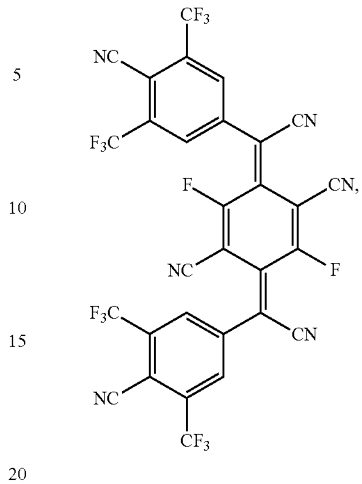
(G13)
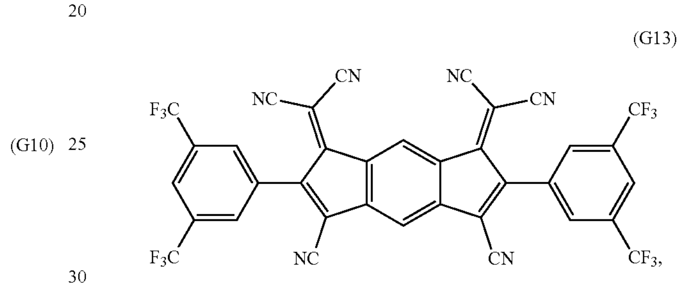
(G14)
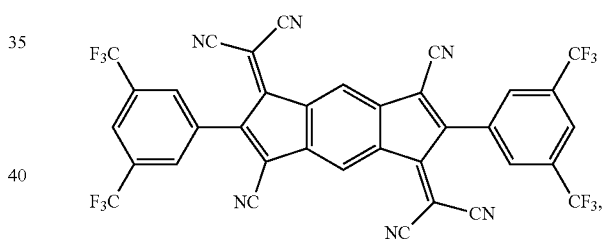
(G15)
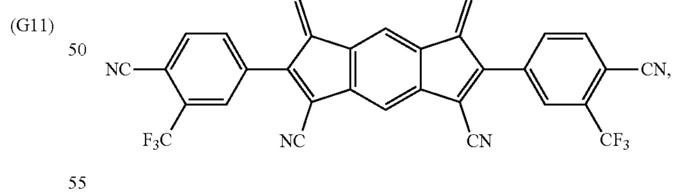
(G16)
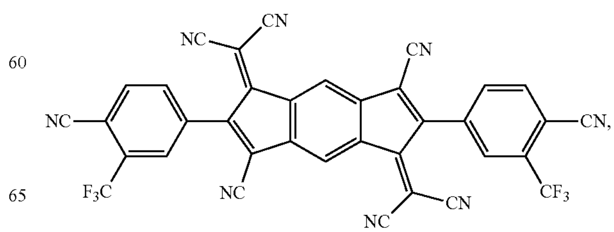

-continued
(G17)
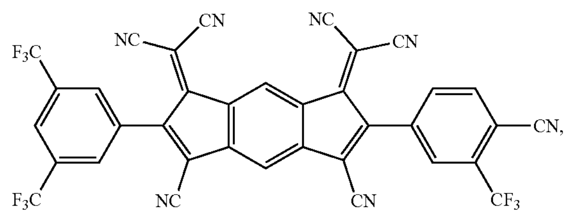
(G18)
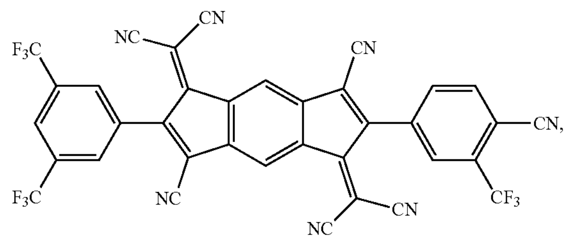
(G19)
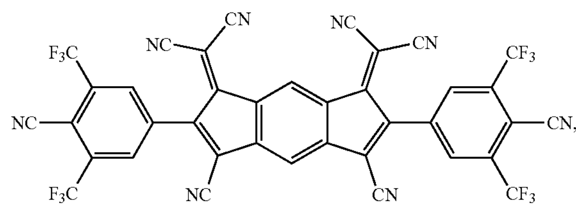
(G20)
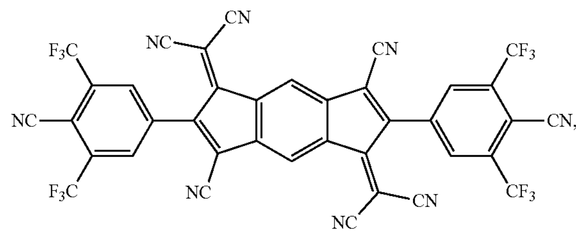
(G21)
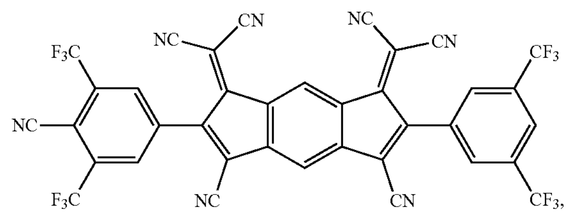
(G22)
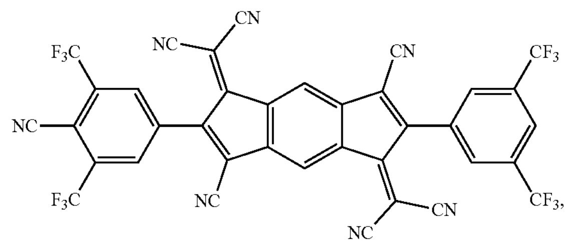
-continued
(G23)
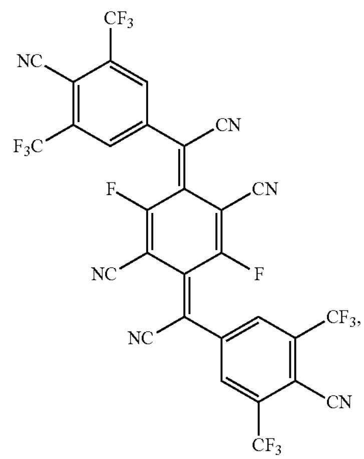
(G24)
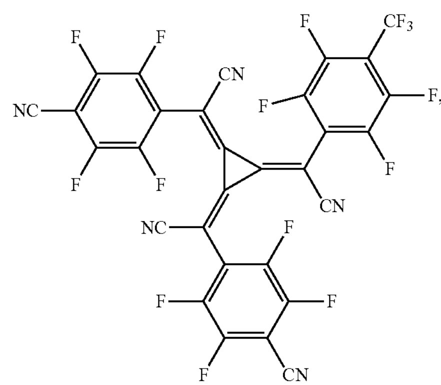
(G25)
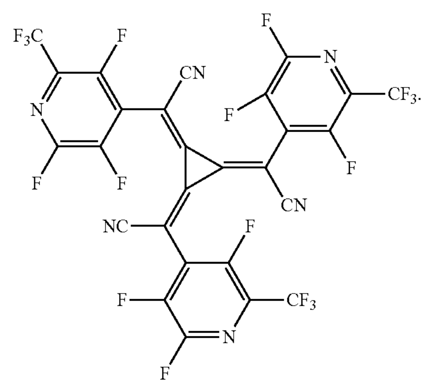
According to one embodiment, wherein the second organic p-dopant is selected from G1 to G3, G5, G7 to G12 and G23:

(G1)
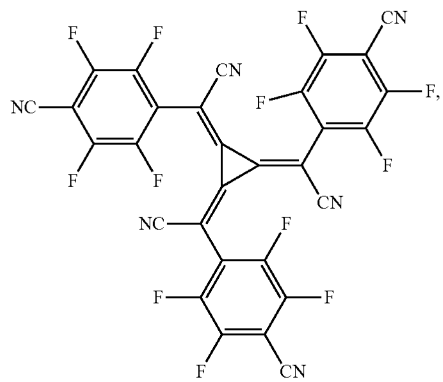
(G2)
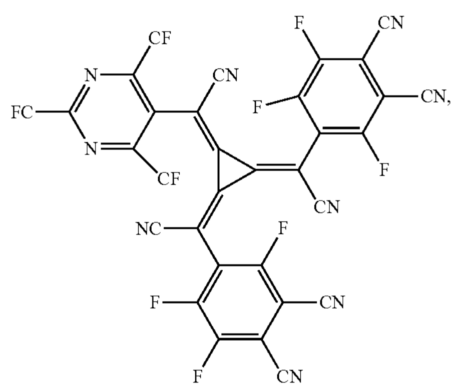
(G3)
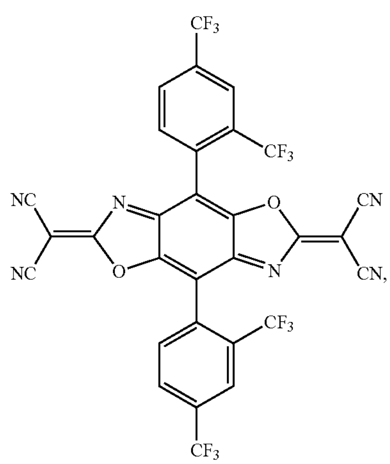
(G5)
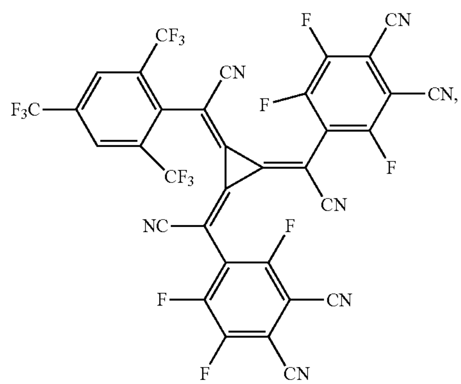
-continued
(G7)
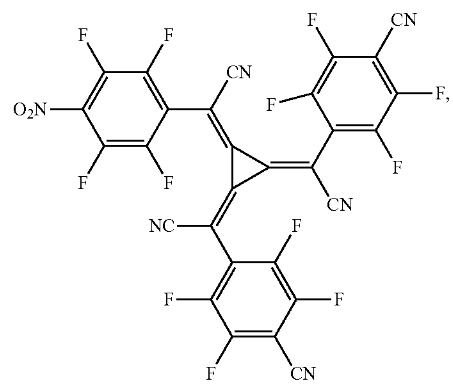
(G8)
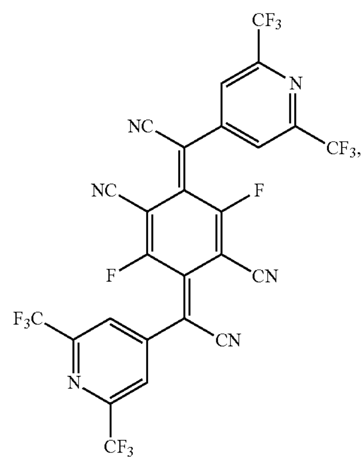
(G9)
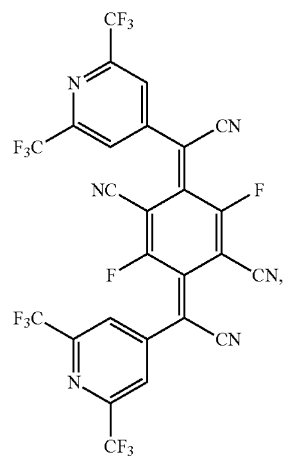

-continued
(G10)
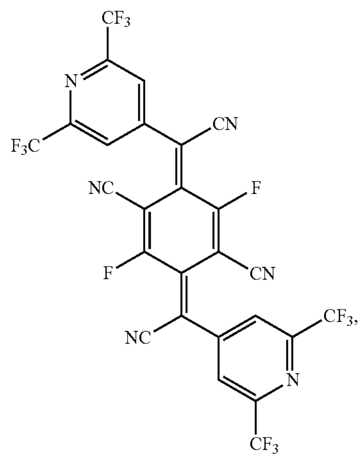
(G11)
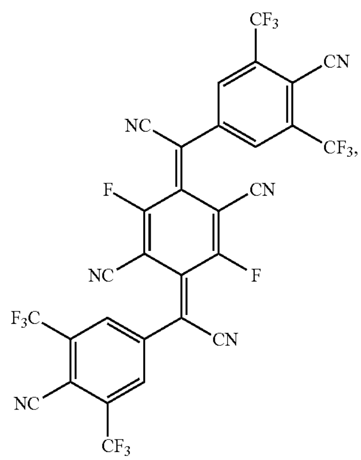
(G12)
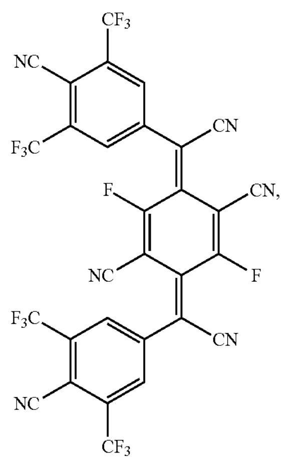
-continued
(G23)
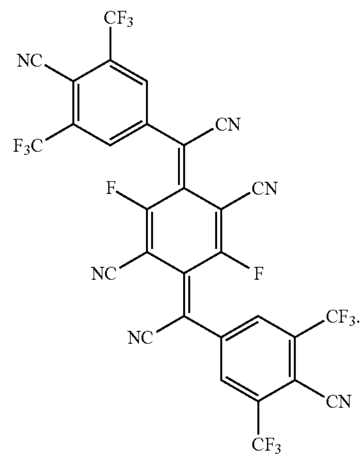
According to one embodiment, wherein the second organic p-dopant is selected from G1, G2, G4, G5, G6, G7 and G24:
(G1)
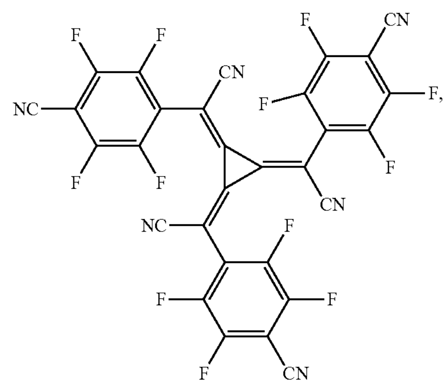
(G2)
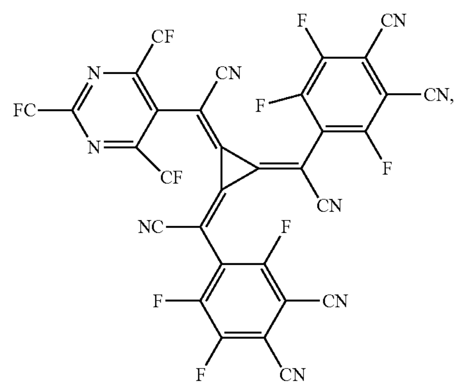

-continued
(G3)
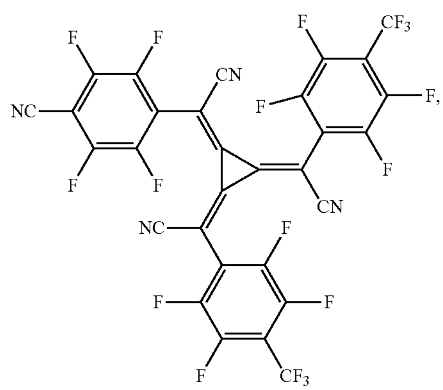
(G5)
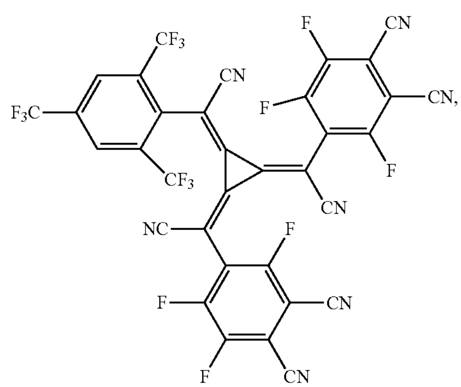
(G6)
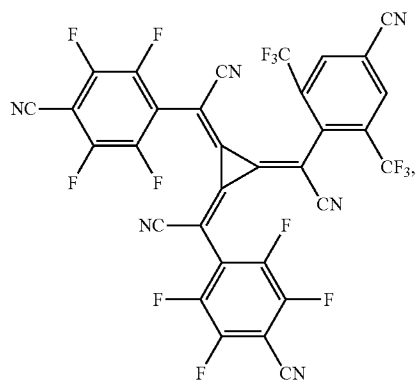
(G7)
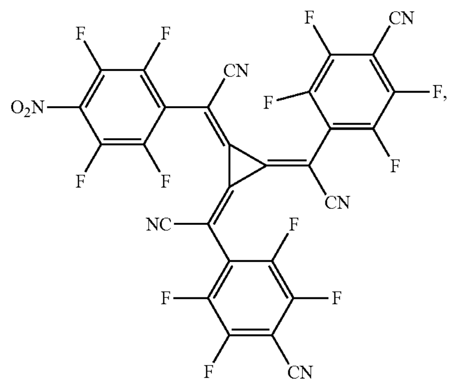
-continued
(G24)
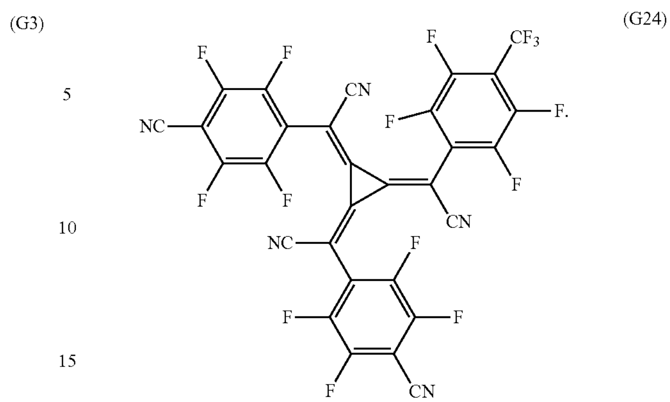
According to one embodiment, wherein the second organic p-dopant is selected from G13 to G22:
(G13)
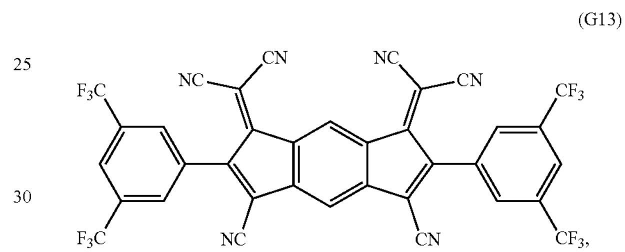
(G14)
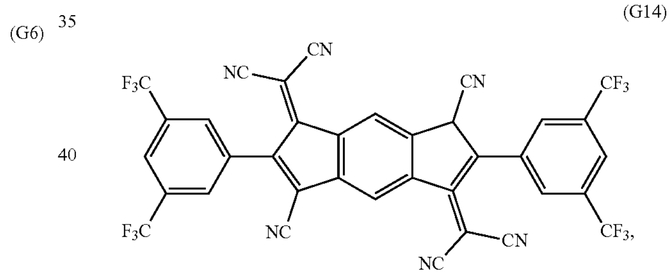
(G15)
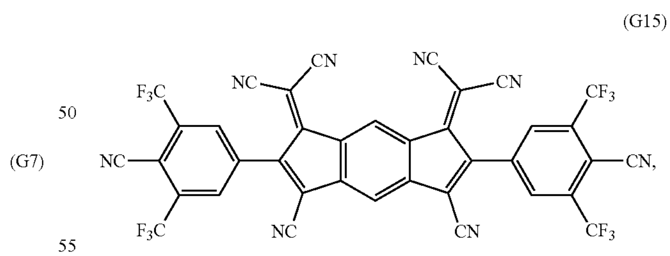
(G16)
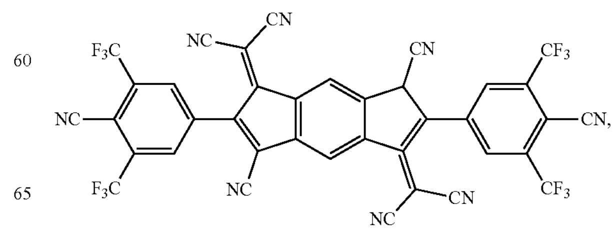

-continued (G17)

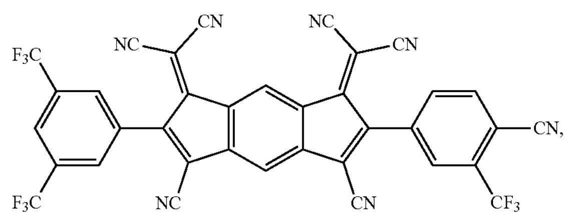

(G18)

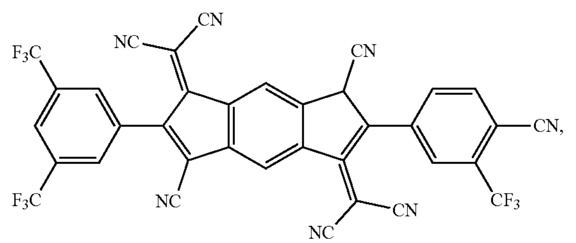

(G19)+

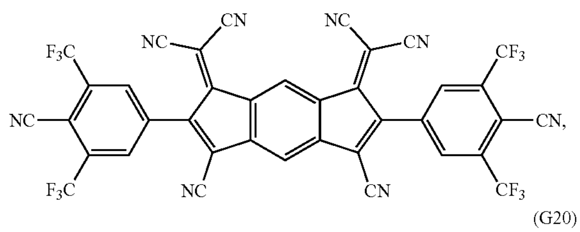

(G20)

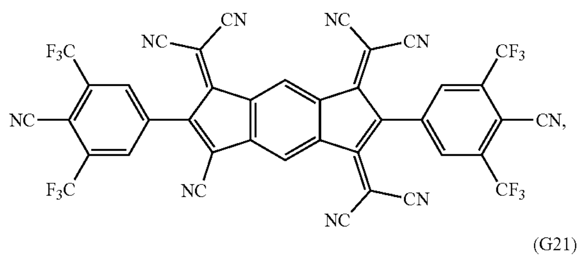

(G21)

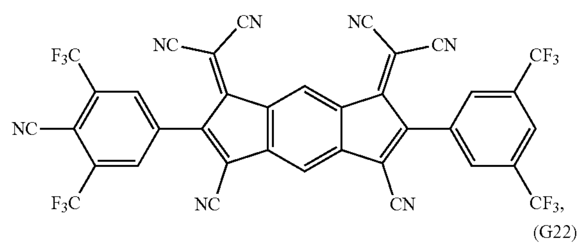

(G22)

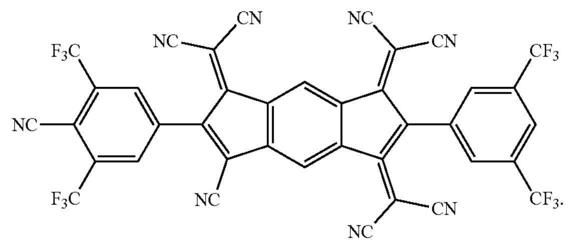

Second Hole Transport Matrix Compound Present in the First p-Type Charge Generation Layer According to one embodiment, wherein the second hole transport matrix compound is present in the first p-type charge generation layer in an amount of ≥0.1 vol %, preferably ≥1 vol %, more preferably ≥5 vol %, more preferably ≥10 vol %, more preferably ≥20 vol %, more preferably ≥30 vol %, more preferably ≥40 vol %, more preferably ≥50 vol %, more preferably ≥60 vol %, more preferably ≥70 vol %, more preferably ≥80 vol %, and more preferably ≥90 vol % based on the total volume of the first p-type charge generation layer.

According to one embodiment, the second organic p-dopant is present in the first p-type charge generation layer in an amount of ≤99.9 vol % based on the total volume of the first p-type charge generation layer, preferably ≤99 vol %, more preferably ≤95 vol %, more preferably ≤90 vol %, more preferably ≤80 vol %, more preferably ≤70 vol %, more preferably ≤60 vol %, more preferably ≤50 vol %, more preferably ≤40 vol %, more preferably ≤30 vol %, more preferably ≤20 vol %, and more preferably ≤10 vol %, According to one embodiment, wherein the second hole transport matrix compound is present in the first p-type charge generation layer in an amount of 0.1 vol % to ≤99.99 vol %, preferably ≥1 vol % to ≤99.99 vol %, more preferably ≥5 vol % to ≤99.99 vol %, more preferably ≥10 vol % to ≤99.99 vol %, more preferably 20 vol % to ≤99.99 vol %, more preferably 30 vol % to ≤99.99 vol % more preferably 40 vol % to ≤99.99 vol %, more preferably ≥50 vol % to ≤99.99 vol %, more preferably 60 vol % to ≤99.99 vol %, more preferably 70 vol % to ≤99.99 vol %, more preferably 80 vol % to ≤99.99 vol %, and more preferably 90 vol % to ≤99.99 vol %, based on the total volume of the first p-type charge generation layer.

Second Organic p-Dopant is Present in the First p-Type Charge Generation Layer

According to one embodiment, the second organic p-dopant is present in the first p-type charge generation layer in an amount of 0.01 vol % to ≤99.9 vol % based on the total volume of the first p-type charge generation layer, preferably 0.01 vol % to ≤99 vol %, more preferably 0.01 vol % to ≤95 vol %, more preferably 0.01 vol % to ≤90 vol %, more preferably 0.01 vol % to ≤80 vol %, more preferably 0.01 vol % to ≤70 vol %, more preferably 0.01 vol % to ≤60 vol %, more preferably 0.01 vol % to ≤50 vol %, more preferably 0.01 vol % to ≤40 vol %, more preferably 0.01 vol % to ≤30 vol %, more preferably 0.01 vol % to ≤20 vol %, and more preferably 0.01 vol % to ≤10 vol %.

Thickness of the First p-Type Charge Generation Layer

The thickness of the first p-type charge generation layer may be in the range from 0.5 nm to 50 nm; alternatively in the range from 1 nm to about 40 nm; alternatively in the range of 2 nm to 30 nm; alternatively 3 nm to 25 nm; alternatively 4 nm to 20 nm; or alternatively 5 nm to 15 nm.

If a second p-type charge generation layer or a second and third p-type charge generation layer is present, the thickness of the second p-type charge generation layer or the third charge generation layer can be independently of each other in the range from 0.5 nm to 50 nm; alternatively in the range from 1 nm to about 40 nm; or alternatively in the range of 2 nm to 30 nm; alternatively 3 nm to 25 nm, alternatively 4 nm to 20 nm; or alternatively 5 nm to 15 nm.

Hole Injection Layer (HIL)

The thickness of the hole injection layer may be in the range from 0.5 nm to 50 nm; alternatively in the range from 1 nm to about 40 nm; alternatively in the range of 2 nm to 30 nm; alternatively 3 nm to 25 nm; alternatively 4 nm to 20 nm; or alternatively 5 nm to 15 nm.

According to one embodiment, the organic hole transport material is present in the hole injection layer in an amount of ≥0.1 vol % based on the total volume of the hole injection layer, preferably ≥1 vol %, more preferably ≥5 vol %, more preferably ≥10 vol %, more preferably ≥20 vol %, more preferably ≥30 vol %, more preferably ≥40 vol %, more preferably ≥50 vol %, more preferably ≥60 vol %, more preferably ≥70 vol %, more preferably ≥80 vol %, more preferably ≥90 vol %, more preferably ≥95 vol %, more preferably ≥97.0 vol %, more preferably ≥97.25 vol %, more preferably ≥97.5 vol %, more preferably ≥97.75 vol %, and most preferably ≥98.0 vol %.

According to one embodiment, the first organic p-dopant is present in the hole injection layer in an amount of ≤99.9 vol % based on the total volume of the hole injection layer, preferably ≤99 vol %, more preferably ≤95 vol %, more preferably ≤90 vol %, more preferably ≤80 vol %, more preferably ≤70 vol %, more preferably ≤60 vol %, more preferably ≤50 vol %, more preferably ≤40 vol %, more preferably ≤30 vol %, more preferably ≤20 vol %, more preferably ≤10 vol %, more preferably ≤5 vol %, more preferably ≤3.0 vol %, more preferably ≤2.75 vol %, more preferably ≤2.5 vol %, more preferably ≤2.25 vol %, and most preferably ≤2.0 vol %.

First Hole Transport Matrix Compound and Second Hole Transport Matrix Compound According to an embodiment, the first hole transport matrix compound and/or the second hole transport matrix compound have independently of each other a HOMO energy level smaller than the HOMO energy level of N2,N2,N2',N2',N7,N7,N7',N7'-octakis(4-methoxyphenyl)-9,9'-spirobi[fluorene]-2,2',7,7'-tetraamine, preferably smaller than N4,N4,N4',N4'-tetrakis(4-methoxyphenyl)biphenyl-4,4'-diamine, more preferred smaller than N4,N4'-bis(9,9-dimethyl-9H-fluoren-2-yl)-N4,N4'-diphenyl-[1,1'-biphenyl]-4,4'-diamine, when determined by the same method. The HOMO energy level of N2,N2,N2',N2',N7,N7,N7',N7'-octakis(4-methoxyphenyl)-9,9'-spirobi[fluorene]-2,2',7,7'-tetraamine is −4.27 eV, the HOMO level of N4,N4,N4',N4'-tetrakis(4-methoxyphenyl)biphenyl-4,4'-diamine is −4.34 eV, and the HOMO level of N4,N4'-bis(9,9-dimethyl-9H-fluoren-2-yl)-N4,N4'-diphenyl-[1,1'-biphenyl]-4,4'-diamine is −4.64 eV, when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to an embodiment, the first hole transport matrix compound and/or the second hole transport matrix have independently of each other a HOMO energy level of ≤−4.27 eV, preferably ≤−4.34 eV, more preferably ≤−4.40 eV, even more preferably ≤−4.45 eV, even more preferably ≤−4.50 eV, even more preferably ≤−4.55 eV, even more preferably ≤−4.60 eV, even more preferably ≤−4.65 eV when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

According to one embodiment of the invention, the first hole transport matrix compound and/or the second hole transport matrix have independently of each other a HOMO energy level in the range of ≥−6.50 eV to ≤−4.27 eV, preferably ≥−6.00 eV ≤−4.34 eV, more preferably ≥−5.50 eV to ≤−4.40 eV, even more preferably ≥−5.40 eV ≤−4.45 eV, even more preferably ≥−5.30 eV to ≤−4.50 eV, even more preferably ≥−5.20 eV to ≤−4.55 eV, even more preferably ≥−5.10 eV to ≤−4.60 eV, even more preferably ≥−5.00 eV to ≤−4.65 eV when calculated using TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

The term "have a HOMO level smaller than" in the context means that the absolute value of the HOMO level is greater than the absolute value of the HOMO level to which it is compared to. Particularly, the term "having a HOMO level smaller than" in the context means that the HOMO level is further away from vacuum level than the value of the HOMO level to which it is compared to.

According to one embodiment, the hole transport compound has have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

The hole transport compound may be free of HTM014, HTM081, HTM163, HTM222, EL-301, HTM226, HTM355, HTM133, HTM334, HTM604 and EL-22T. The abbreviations denote the manufacturers' names, for example, of Merck or Lumtec.

According to an embodiment, the first hole transport matrix compound and/or the second hole transport matrix compound are independently of each other a substantially covalent matrix compound.

According to an embodiment, the substantially covalent matrix compound may be selected from at least one organic compound. The substantially covalent matrix may consists substantially from covalently bound C, H, O, N, S, which optionally comprise in addition covalently bound B, P, As and/or Se.

According to an embodiment, the substantially covalent matrix compound may be selected from organic compounds consisting substantially from covalently bound C, H, O, N, S, which optionally comprise in addition covalently bound B, P, As and/or Se.

In an embodiment, the substantially covalent matrix compound lacks metal atoms and majority of its skeletal atoms may be selected from C, O, S, N. Alternatively, the substantially covalent matrix compound lacks metal atoms and majority of its skeletal atoms may be selected from C and N.

According to one embodiment, the substantially covalent matrix compound may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

Preferably, the substantially covalent matrix compound is free of metals and/or ionic bonds.

The term "substantially covalent matrix compound is free of metals and/or ionic bonds" means that the substantially covalent matrix compound per se is free of metal and/or ionic bonds, i.e. the substantially covalent matrix compound per se being free of metal and/or ionic bonds can be doped.

According to an embodiment wherein $T^1$, $T^2$, $T^3$, $T^4$ and $T^5$ may be independently selected from a single bond, phenylene, biphenylene or terphenylene. According to an embodiment wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment, wherein $T^1$, $T^2$ and $T^3$ may be independently selected from phenylene and one of $T^1$, $T^2$ and $T^3$ are a single bond.

According to an embodiment, wherein $T^1$, $T^2$ and $T^3$ may be independently selected from phenylene and two of $T^1$, $T^2$ and $T^3$ are a single bond.

According to an embodiment, wherein $T^6$ may be phenylene, biphenylene, terphenylene.

According to an embodiment, wherein $T^6$ may be phenylene.

According to an embodiment, wherein $T^6$ may be biphenylene.

According to an embodiment, wherein $T^6$ may be terphenylene.

According to an embodiment, wherein $Ar^1$, $Ar^2$, $Ar^3$, $Ar^4$ and $Ar^5$ may be independently selected from W1 to W16:

(W1)

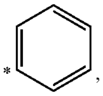

(W2)

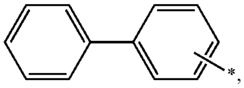

(W3)

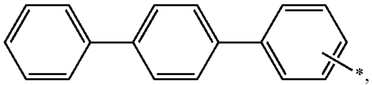

(W4)

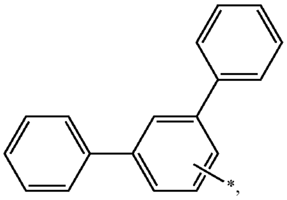

(W5)

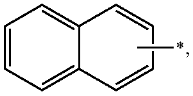

(W6)

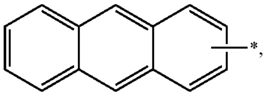

(W7)

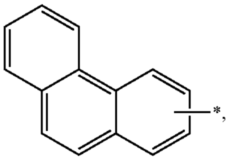

(W8)

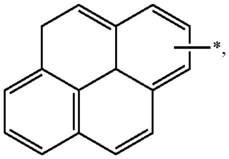

(W9)

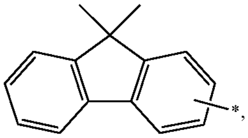

-continued (W10)

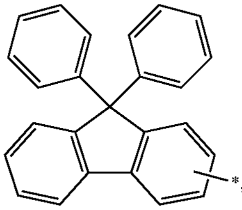

(W11)

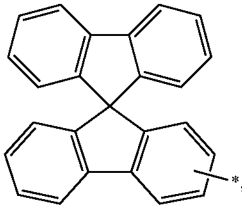

(W12)

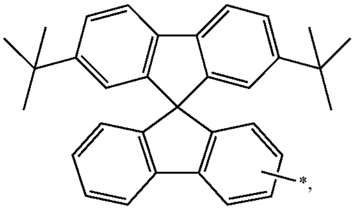

(W13)

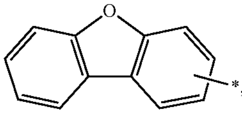

(W14)

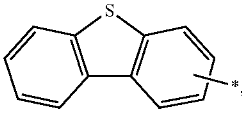

(W15)

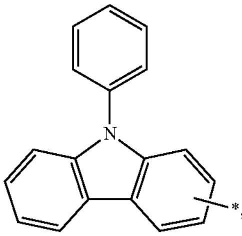

(W16)

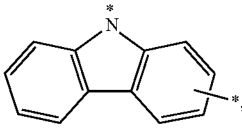

wherein the asterisk "*" denotes the binding position.

According to an embodiment, wherein $Ar^1$, $Ar^2$, $Ar^3$, $Ar^4$ and $Ar^5$ may be independently selected from W1 to W15; alternatively selected from W1 to W10 and W13 to W15.

According to an embodiment, wherein $Ar^1$, $Ar^2$, $Ar^3$, $Ar^4$ and $Ar^5$ may be independently selected from the group consisting of W1, W2, W5, W7, W9, W10, W13 to W16.

According to one embodiment, the substantially covalent matrix compound comprises at least one naphthyl group, carbazole group, dibenzofuran group, dibenzothiophene group and/or substituted fluorenyl group, wherein the substituents are independently selected from methyl, phenyl or fluorenyl.

According to an embodiment of the electronic device, wherein the matrix compound of formula (Ia) or formula (Ib) are selected from compounds of V1 to V19:
(V1)
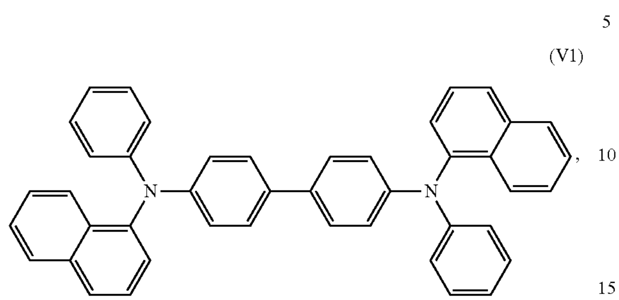
(V2)
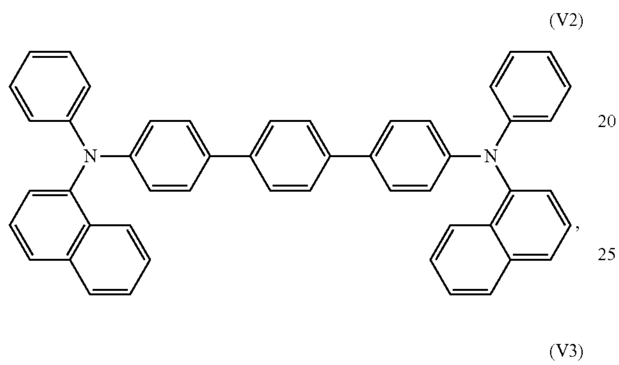
(V3)
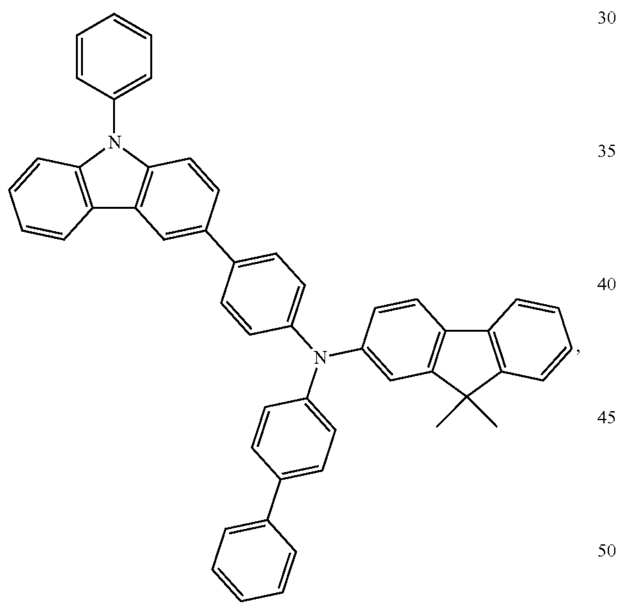
(V4)
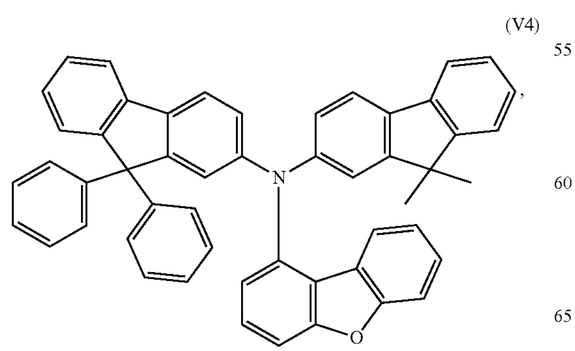
-continued
(V5)
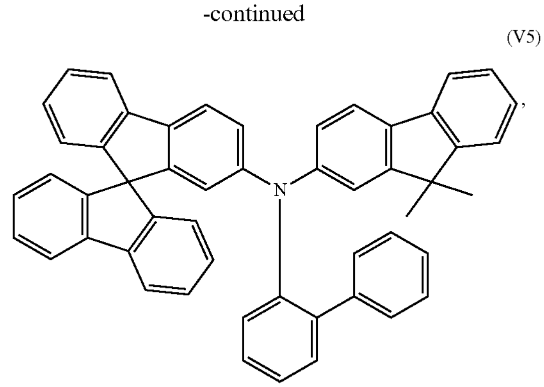
(V6)
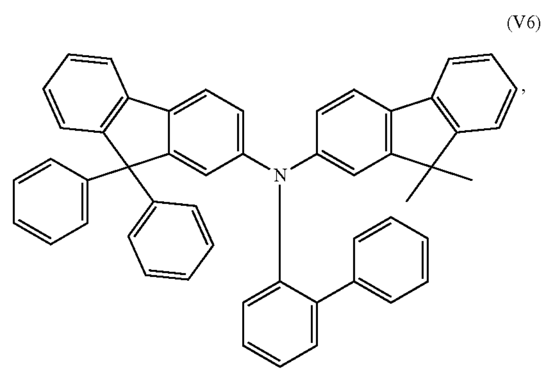
(V7)
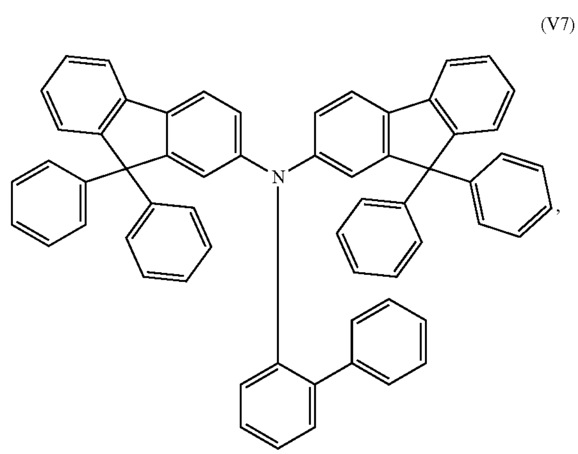
(V8)
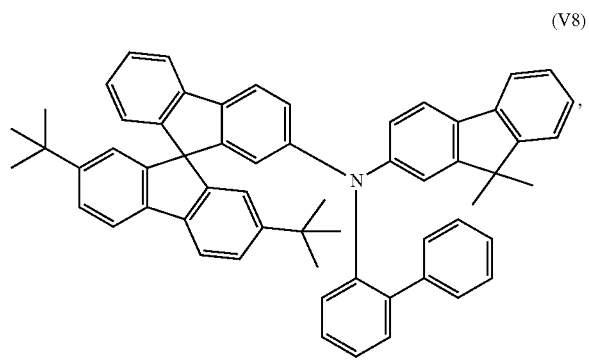

-continued
(V9)
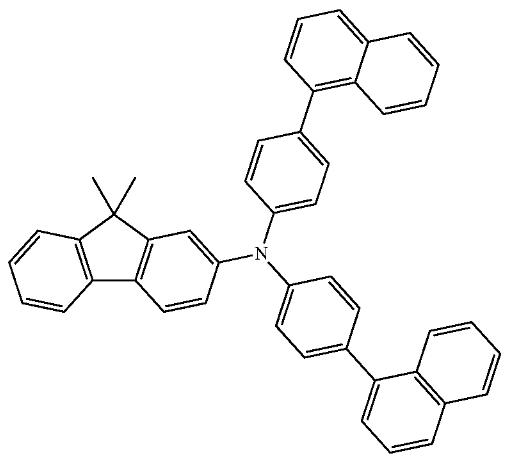
,
(V10)
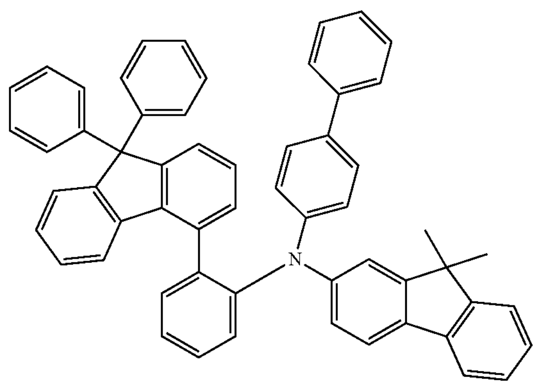
,
(V11)
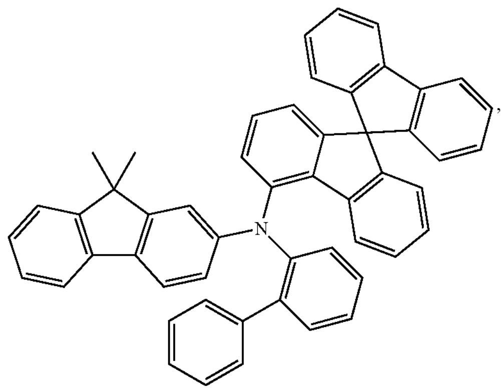
,
-continued
(V12)
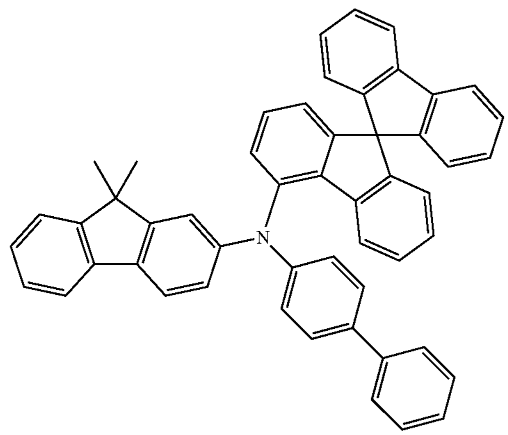
,
(V13)
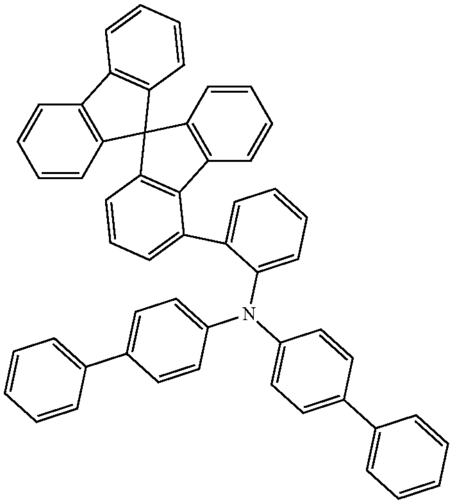
,
(V14)
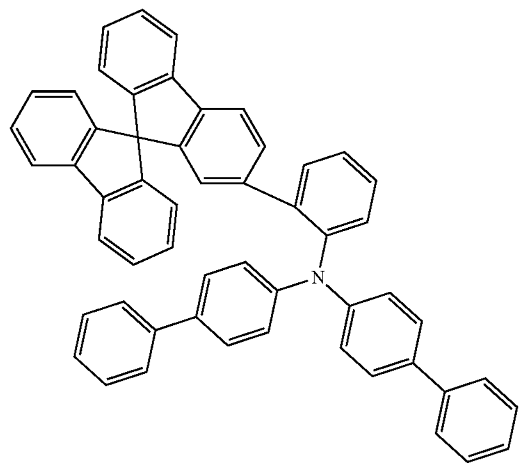
, -continued (V15)

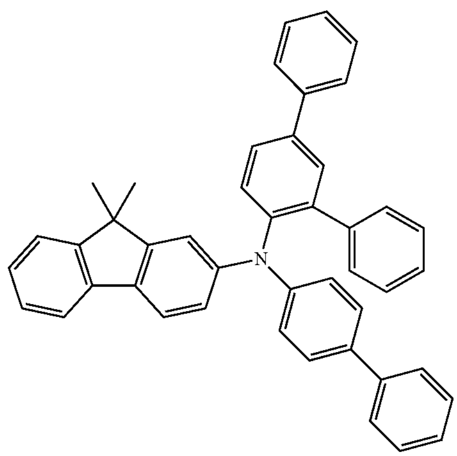

(V16)

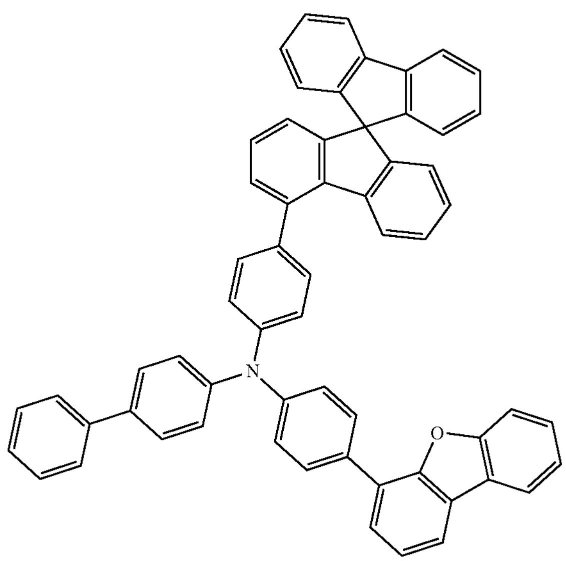

(V17)

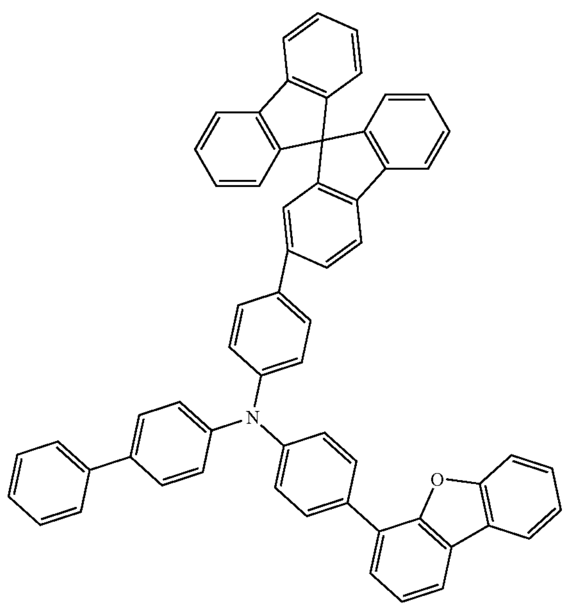

-continued (V18)

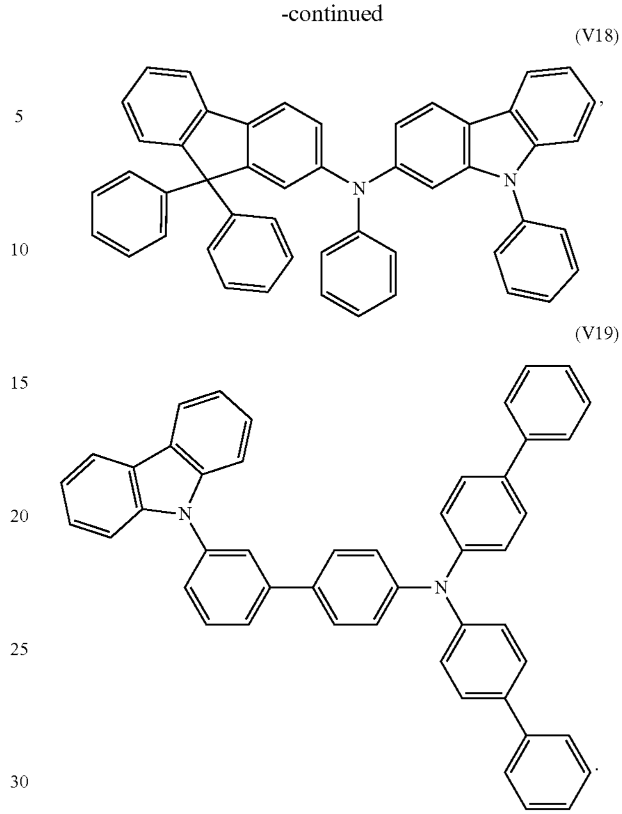

(V19)

Electron Injection Layer

Position

According to an embodiment, the electron injection layer is in direct contact with the cathode layer.

According to an embodiment, the thickness of the electron injection layer may be in the range from 0.1 nm to 50 nm; alternatively in the range from 0.5 nm to 40 nm; alternatively in the range from 0.5 nm to 30 nm; alternatively in the range from 0.75 nm to 20 nm; alternatively in the range from 1 nm to 15 nm, or alternatively 1 nm to 10 nm.

According to an embodiment, the electron injection layer consists essentially of Ytterbium.

In the context of the present specification the term "electron injection layer consists essentially of Ytterbium" means that ≥90.0 wt.-% (weight percent) of Ytterbium is present in the electron injection layer, ≥92.5 wt.-%, ≥95.0 wt.-%, ≥97.5 wt.-%, ≥98.0 wt.-%; wherein the wt.-% of the components based on the total weight of the electron injection layer.

According to an embodiment, the electron injection layer consists of Ytterbium.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the dependent claims and the following description of the respective figures which in an exemplary fashion show preferred embodiments according to the invention. Any embodiment does not necessarily represent the full scope of the invention, however, and reference is made therefore to the claims and herein for interpreting the scope of the invention. It is to be understood that both the foregoing general description and the following detailed description are exemplary and explanatory only and are intended to provide further explanation as claimed.

Hereinafter, the figures are illustrated in more detail with reference to examples. However, the present disclosure is not limited to the following figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

Figure 1:
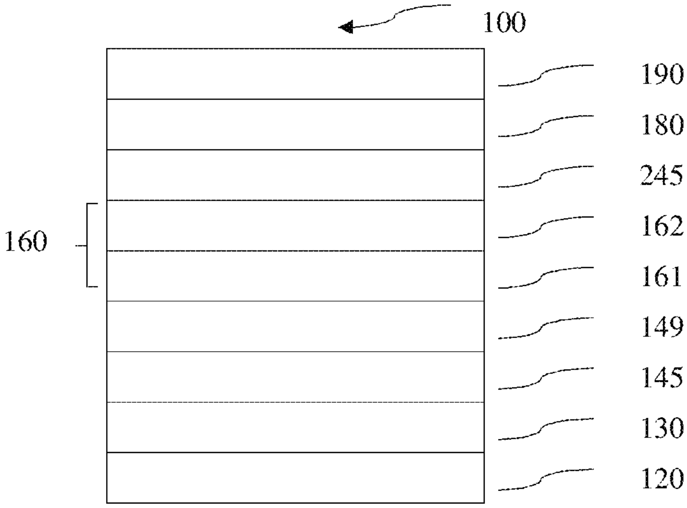
FIG. 1 is a schematic sectional view of an organic electroluminescent device according to an exemplary embodiment of the present invention.

FIG. 1 is a schematic sectional view of an organic electroluminescent device 100, according to one exemplary embodiment of the present invention.

Referring to FIG. 1 the organic electroluminescent device 100 includes an anode layer (ANO) 120; hole injection layer (HIL) 130, wherein the hole injection layer (HIL) 130 comprises a first organic p-dopant and a first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a first emission layer (EML1) 145; and a first electron transport layer (ETL1) 149; wherein the first electron transport layer (ETL1) 149 comprises an electron transport compound comprising a six-member heteroaromatic ring comprising at least two nitrogen ring atoms, wherein the first electron transport layer (ETL1) 149 is free of 8-hydroxyquinolinolato-lithium, preferably free of an lithium complex, and more preferably a metal complex, and wherein the first electron transport layer (ETL1) 149 is in direct contact with the first n-type charge generation layer (n-CGL1) 161.

The organic electroluminescent device further comprises a first charge generation layer (CGL1) 160 disposed over the first electron transport layer (ETL1) 149, wherein the first charge generation layer (CGL1) 160 comprises a first n-type charge generation layer (n-CGL1) 161, and a first p-type charge generation layer (p-CGL1) 162, wherein the n-type charge generation layer (n-CGL 1) 161 comprises an electron transport matrix compound comprising a heteroaromatic ring comprising at least one nitrogen ring atom and a metal dopant, wherein the first p-type charge generation layer (p-CGL1) 162 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant.

The organic electroluminescent device 100 further comprises a second emission layer (EML2) 245; an electron injection layer (EIL) 180, wherein the electron injection layer (EIL) 180 consists essentially of Ytterbium; and a cathode layer (CAT) 190.

Figure 2:
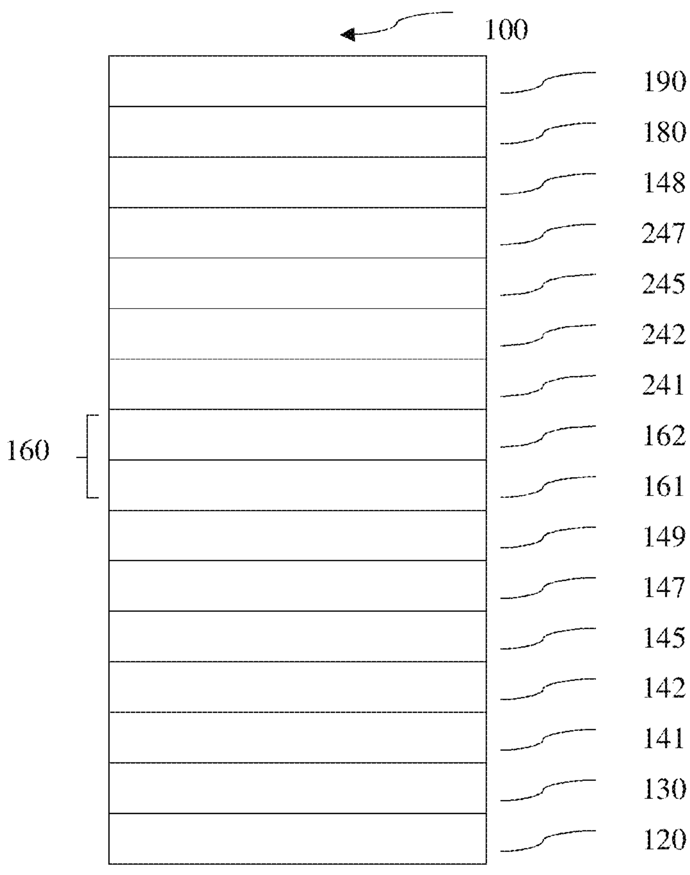
FIG. 2 is a schematic sectional view of an organic electroluminescent device according to an exemplary embodiment of the present invention.

FIG. 2 is a schematic sectional view of an organic electroluminescent device 100, according to one exemplary embodiment of the present invention.

Referring to FIG. 2 the organic electroluminescent device 100 includes an anode layer (ANO) 120; a hole injection layer (HIL) 130, wherein the hole injection layer (HIL) 130 comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a first hole transport layer (HTL1) 141; a first electron blocking layer (EBL1) 142; a first emission layer (EML1) 145; a first optional hole blocking layer (HBL1) 147; and a first electron transport layer (ETL1) 149, wherein the first electron transport layer (ETL1) 149 comprises an electron transport compound comprising a six-member heteroaromatic ring comprising at least two nitrogen ring atoms, wherein the first electron transport layer (ETL1) 149 is free of 8-hydroxyquinolinolato-lithium, preferably free of an lithium complex, and more preferably a metal complex, and wherein the first electron transport layer (ETL1) 149 is in direct contact with the first n-type charge generation layer (n-CGL1) 161.

The organic electroluminescent device further comprises a first charge generation layer (CGL1) 160 disposed over the first electron transport layer (ETL1) 149, wherein the first charge generation layer (CGL1) 160 comprises a first n-type charge generation layer (n-CGL1) 161, and a first p-type charge generation layer (p-CGL1) 162, wherein the n-type charge generation layer (n-CGL1) 161 comprises an electron transport matrix compound comprising a heteroaromatic ring comprising at least one nitrogen ring atom and a metal dopant, wherein the first p-type charge generation layer (p-CGL1) 162 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant.

The organic electroluminescent device 100 further comprises a second hole transport layer (HTL2) 241; and a second electron blocking layer (EBL2) 242.

The organic electroluminescent device 100 further comprises a second emission layer (EML2) 245.

The organic electroluminescent device 100 further comprises a second optional hole blocking layer (HBL2) 247; an electron transport layer (ETL) 148; an electron injection layer (EIL) 180, wherein the electron injection layer (EIL) 180 consists essentially of Ytterbium; and a cathode layer (CAT) 190.

Figure 3:
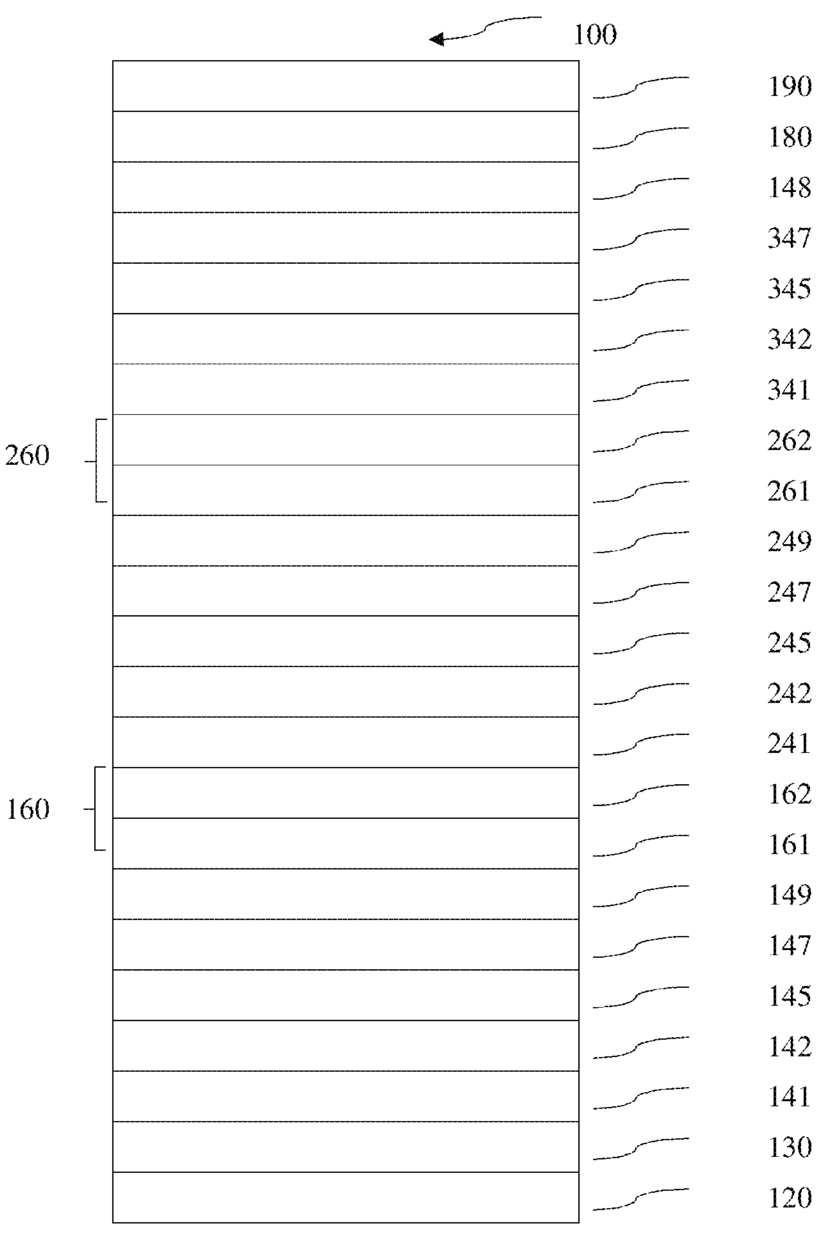
FIG. 3 is a schematic sectional view of an organic electroluminescent device according to an exemplary embodiment of the present invention.

FIG. 3 is a schematic sectional view of an organic electroluminescent device 100, according to one exemplary embodiment of the present invention.

Referring to FIG. 3 the organic electroluminescent device 100 includes an anode layer (ANO) 120; a hole injection layer (HIL) 130, wherein the hole injection layer (HIL) 130 comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a hole transport layer (HTL1) 141; a first electron blocking layer (EBL1) 142; and a first emission layer (EML1) 145.

The organic electroluminescent device 100 further comprises a first optional hole blocking layer (HBL1) 147.

The organic electroluminescent device 100 further comprises a first electron transport layer (ETL1) 149, wherein the first electron transport layer (ETL1) 149 comprises an electron transport compound comprising a six-member heteroaromatic ring comprising at least two nitrogen ring atoms, wherein the first electron transport layer (ETL1) 149 is free of 8-hydroxyquinolinolato-lithium and/or lithium quinolate (LiQ), preferably free of a lithium complex, and more preferably free of a metal complex, and wherein the first electron transport layer (ETL1) 149 is in direct contact with the first n-type charge generation layer (n-CGL1) 161.

The organic electroluminescent device further comprises a first charge generation layer (CGL1) 160 disposed over the first electron transport layer (ETL1) 149, wherein the first charge generation layer (CGL1) 160 comprises a first n-type charge generation layer (n-CGL1) 161, and a first p-type charge generation layer (p-CGL1) 162, wherein the first n-type charge generation layer (n-CGL1) 161 comprises an electron transport matrix compound comprising a heteroaromatic ring comprising at least one nitrogen ring atom and a metal dopant, wherein the p-type charge generation layer (p-CGL1) 162 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant.

The organic electroluminescent device 100 further comprises a second hole transport layer (HTL2) 241; and a second electron blocking layer (EBL2) 242.

The organic electroluminescent device 100 further comprises a second emission layer (EML2) 245.

The organic electroluminescent device 100 further comprises a second optional hole blocking layer (HBL2) 247.

The organic electroluminescent device 100 further comprises a second electron transport layer (ETL2) 249, wherein the second electron transport layer (ETL2) 249 comprises an electron transport compound comprising a six-member heteroaromatic ring comprising at least two nitrogen ring atoms, wherein the second electron transport layer (ETL2) 249 is free of 8-hydroxyquinolinolato-lithium, preferably free of a lithium complex, and more preferably free of a metal complex, wherein the second electron transport layer (ETL2) 249 is in direct contact with the second n-type charge generation layer (n-CGL2) 261.

The organic electroluminescent device further comprises a second charge generation layer (CGL2) 260 disposed over the second electron transport layer (ETL2) 249, wherein the second charge generation layer (CGL2) 260 comprises a second n-type charge generation layer (n-CGL2) 261, and a second p-type charge generation layer (p-CGL2) 262, wherein the second n-type charge generation layer (n-CGL2) 261 comprises a heteroaromatic ring comprising at least one nitrogen ring atom and a metal dopant, wherein the second p-type charge generation layer (p-CGL2) 262 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase; and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant; wherein the second n-type charge generation layer (n-CGL2) 261 can be selected the same or different than the first n-type charge generation layer (n-CGL1) 161, and wherein the second p-type charge generation layer (p-CGL2) 262 can be selected the same or different than the first p-type charge generation layer (p-CGL1) 161;

wherein the second n-type charge generation layer (n-CGL2) 261 can be selected the same or different than the first n-type charge generation layer (n-CGL1) 161, and wherein the second p-type charge generation layer (p-CGL2) 262 can be selected the same or different than the first p-type charge generation layer (p-CGL1) 161.

The organic electroluminescent device 100 further comprises a third hole transport layer (HTL3) 341; and a third electron blocking layer (EBL3) 342.

The organic electroluminescent device 100 further comprises a third emission layer (EML3) 345.

The organic electroluminescent device 100 further comprises a third optional hole blocking layer (HBL3) 347; an electron transport layer (ETL)148; an electron injection layer (EIL) 180, wherein the electron injection layer (EIL) 180 consists essentially of Ytterbium; and a cathode layer (CAT) 190.

Figure 4:
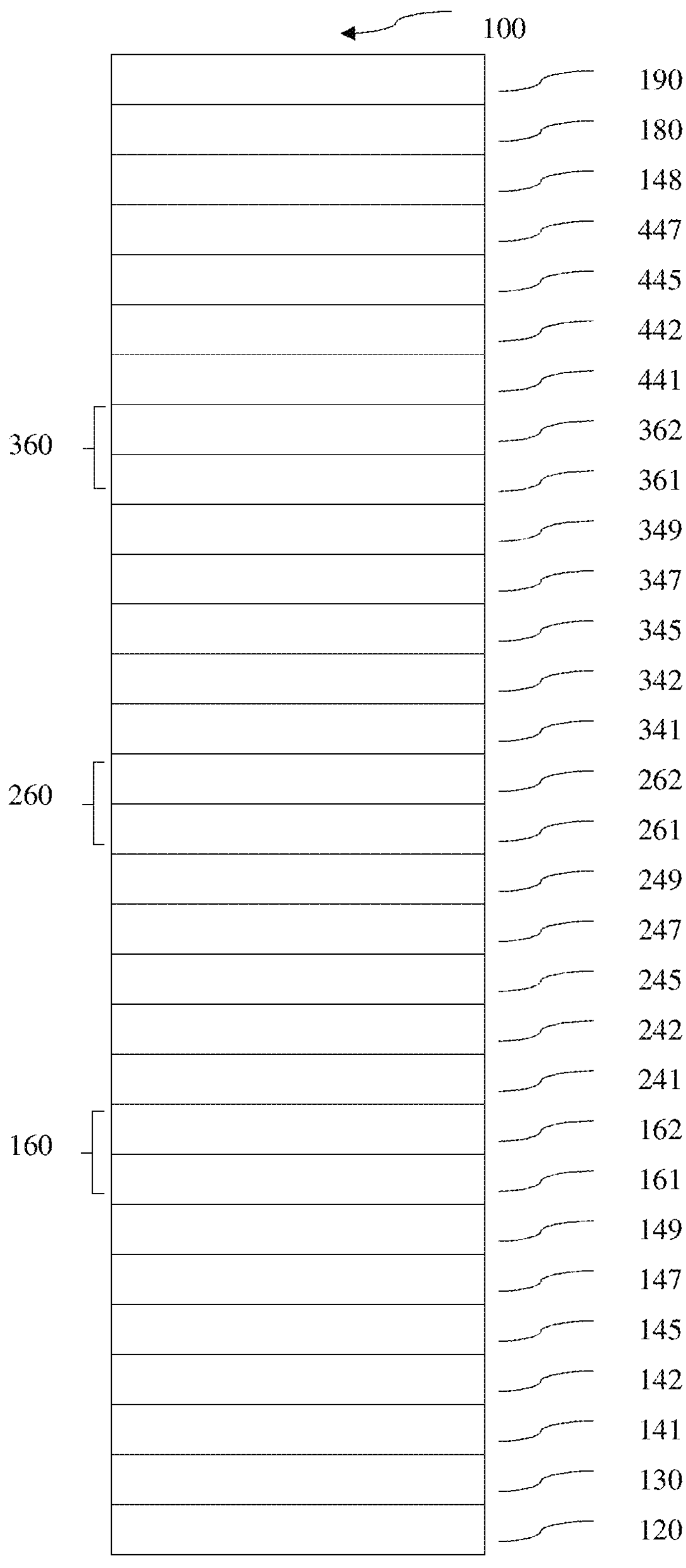
FIG. 4 is a schematic sectional view of an organic electroluminescent device according to an exemplary embodiment of the present invention.

FIG. 4 is a schematic sectional view of an organic electroluminescent device 100, according to one exemplary embodiment of the present invention.

Referring to FIG. 4 the organic electroluminescent device 100 includes an anode layer (ANO) 120; a hole injection layer (HIL) 130, wherein the hole injection layer (HIL) 130 comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a hole transport layer (HTL1) 141; a first electron blocking layer (EBL1) 142; a first emission layer (EML1) 145.

The organic electroluminescent device 100 further comprises a first optional hole blocking layer (HBL1) 147.

The organic electroluminescent device 100 further comprises a first electron transport layer (ETL1) 149, wherein the first electron transport layer (ETL1) 149 comprises an electron transport compound comprising a six-member heteroaromatic ring comprising at least two nitrogen ring atoms, wherein the first electron transport layer (ETL1) 149 is free of 8-hydroxyquinolinolato-lithium, preferably free of a lithium complex, and more preferably free of a metal complex and wherein the first electron transport layer (ETL1) 149 is in direct contact with the first n-type charge generation layer (n-CGL1) 161.

The organic electroluminescent device further comprises a first charge generation layer (CGL1) 160 disposed over the first electron transport layer (ETL1) 149, wherein the first charge generation layer (CGL1) 160 comprises a first n-type charge generation layer (n-CGL1) 161, and a first p-type charge generation layer (p-CGL1) 162, wherein the first n-type charge generation layer (n-CGL1) 161 comprises an electron transport matrix compound comprising a heteroaromatic ring comprising at least one nitrogen ring atom and a metal dopant, wherein the first p-type charge generation layer (p-CGL1) 162 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant.

The organic electroluminescent device 100 further comprises a second hole transport layer (HTL2) 241; and a second electron blocking layer (EBL2) 242.

The organic electroluminescent device 100 further comprises a second emission layer (EML2) 245.

The organic electroluminescent device 100 further comprises a second optional hole blocking layer (HBL2) 247.

The organic electroluminescent device 100 further comprises a second electron transport layer (ETL2) 249, wherein the second electron transport layer (ETL2) 249 comprises an electron transport compound comprising a six-member heteroaromatic ring comprising at least two nitrogen ring atoms, wherein the second electron transport layer (ETL2) 249 is free of 8-hydroxyquinolinolato-lithium, preferably free of a lithium complex, and more preferably free of a metal complex, wherein the second electron transport layer (ETL2) 249 is in direct contact with the second n-type charge generation layer (n-CGL2) 261.

The organic electroluminescent device further comprises a second charge generation layer (CGL2) 260 disposed over the second electron transport layer (ETL2) 249, wherein the second charge generation layer (CGL2) 260 comprises a second n-type charge generation layer (n-CGL2) 261, and a second p-type charge generation layer (p-CGL2) 262, wherein the second n-type charge generation layer (n-CGL2) 261 comprises a heteroaromatic ring comprising at least one nitrogen ring atom and a metal dopant, wherein the second p-type charge generation layer (p-CGL2) 262 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase; and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant; wherein the second n-type charge generation layer (n-CGL2) 261 can be selected the same or different than the first n-type charge generation layer (n-CGL1) 161, and wherein the second p-type charge generation layer (p-CGL2) 262 can be selected the same or different than the first p-type charge generation layer (p-CGL1) 161.

The organic electroluminescent device 100 further comprises a third hole transport layer (HTL3) 341, and a third electron blocking layer (EBL3) 342.

The organic electroluminescent device 100 further comprises a third emission layer (EML3) 345.

The organic electroluminescent device 100 further comprises a third optional hole blocking layer (HBL3) 347.

The organic electroluminescent device 100 further comprises a third electron transport layer (ETL3) 349, wherein the third electron transport layer (ETL3) 349 comprises an electron transport compound comprising a six-member heteroaromatic ring comprising at least two nitrogen ring atoms, wherein the third electron transport layer (ETL3) 349 is free of 8-hydroxyquinolinolato-lithium, preferably free of a lithium complex, and more preferably free of a metal complex, wherein the third electron transport layer (ETL3) 349 is in direct contact with the third n-type charge generation layer (n-CGL3) 361.

The organic electroluminescent device further comprises a third charge generation layer (CGL3) 360 disposed over the third electron transport layer (ETL3) 349, wherein the third charge generation layer (CGL3) 360 comprises a third n-type charge generation layer (n-CGL3) 361, and a third p-type charge generation layer (p-CGL3) 362, wherein the third n-type charge generation layer (n-CGL3) 361 comprises a heteroaromatic ring comprising at least one nitrogen ring atom and a metal dopant, wherein the third p-type charge generation layer (p-CGL3) 362 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase; and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant;

- wherein the third n-type charge generation layer (n-CGL3) 361 can be selected the same or different than the second n-type charge generation layer (n-CGL2) 261, and wherein the third p-type charge generation layer (p-CGL3) 362 can be selected the same or different than the second p-type charge generation layer (p-CGL2) 261;
- wherein the third n-type charge generation layer (n-CGL3) 361 can be selected the same or different than the first n-type charge generation layer (n-CGL1) 161, and wherein the third p-type charge generation layer (p-CGL3) 362 can be selected the same or different than the first p-type charge generation layer (p-CGL1) 161.

The organic electroluminescent device 100 further comprises a fourth hole transport layer (HTL4) 441; and a fourth electron blocking layer (EBL4) 442.

The organic electroluminescent device 100 further comprises a fourth emission layer (EML4) 345.

The organic electroluminescent device 100 further comprises a fourth optional hole blocking layer (HBL4) 447; an electron transport layer (ETL) 148; an electron injection layer (EIL) 180, wherein the electron injection layer (EIL) 180 consists essentially of Ytterbium; and a cathode layer (CAT) 190.

OLED stack

According to an embodiment (FIG. 2), the organic electroluminescent device comprises an anode layer (120); a hole injection layer (130), wherein the hole injection layer (130) comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a first hole transport layer (141); a first electron blocking layer (142); a first emission layer (145); a first optional hole blocking layer (147); and a first electron transport layer (149), wherein the first electron transport layer (149) comprises an electron transport compound comprising a six-member heteroaromatic ring comprising at least two nitrogen ring atoms, wherein the first electron transport layer (149) is free of 8-hydroxyquinolinolato-lithium, preferably free of an lithium complex, and more preferably a metal complex, and wherein the first electron transport layer (149) is in direct contact with the first n-type charge generation layer (161), wherein the first electron transport layer (149) is preferably in direct contact with the first emission layer (145); a first charge generation layer (160) disposed over the first electron transport layer (149), wherein the first charge generation layer (160) comprises a first n-type charge generation layer (161), and a first p-type charge generation layer (162), wherein the n-type charge generation layer (161) comprises an electron transport matrix compound comprising a heteroaromatic ring comprising at least one nitrogen ring atom and a metal dopant, wherein the first p-type charge generation layer (162) comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant; a second hole transport layer (241); and a second electron blocking layer (242); a second emission layer (245); a second optional hole blocking layer (247); an electron transport layer (148); an electron injection layer (180), wherein the electron injection layer (180) comprises Ytterbium; and a cathode layer (190).

According to an embodiment, the composition of $2^{nd}$CGL selected from the same or different as the compound/composition of the $1^{st}$ CGL.

Composition of 2nd ETL selected from the same or different as the compound/composition of the $1^{st}$ CGL.

According to an embodiment, the organic electroluminescent device further comprises a third emission layer, a second electron transport layer, a second charge generation layer,

- wherein the second charge generation layer is arranged between the second emission layer and the third emission layer;
- wherein the second charge generation layer comprises a second n-type charge generation layer and second p-type charge generation layer;
- wherein the second p-type charge generation layer is arranged closer to the cathode layer than the second n-type charge generation layer;
- wherein the second electron transport layer is arranged between the second emission layer and the second charge generation layer;
- wherein the second electron transport layer is in direct contact with the second n-type charge generation layer,
- wherein the second n-type charge generation layer comprises an electron transport matrix compound comprising a heteroaromatic ring comprising at least one nitrogen ring atom, and a metal dopant,
- wherein the second p-type charge generation layer comprises a second organic p-dopant and a second hole transport matrix compound;
- wherein the second organic p-dopant of the second p-type charge generation layer comprises at least four CN groups, wherein the second organic p-dopant of the second p-type charge generation layer has a molecular weight of ≥400 g/mol and of the second p-type charge generation layer has a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase;
- wherein the second hole transport matrix compound of the second p-type charge generation layer is independently selected from arylamine compound, diarylamine compound, triarylamine compound, a compound of formula (I) or a compound of formula (II); wherein the second electron transport layer is essentially free of 8-hydroxyquinolinolato-lithium preferably essentially free of a lithium complex, and most preferably free of a metal complex.

According to an embodiment (FIG. 3), the organic electroluminescent device includes an anode layer (120); a hole injection layer (130), wherein the hole injection layer (130) comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the first hole transport matrix compound is selected from arylamine compound, diarylamine compound, triarylamine compound, a compound of formula (I) or a compound of formula (II); a hole transport layer (141); a first electron blocking layer (142); and a first emission layer (145); a first optional hole blocking layer (147); a first electron transport layer (149), wherein the first electron transport layer (149) comprises an electron transport compound comprising a six-member heteroaromatic ring comprising at least two nitrogen ring atoms, wherein the first electron transport layer (149) is free of 8-hydroxyquinolinolato-lithium, preferably free of a lithium complex, and more preferably free of a metal complex, and wherein the first electron transport layer (149) is in direct contact with the first n-type charge generation layer (n-CGL1) 161, wherein the first electron transport layer (149) is preferably in direct contact with the first emission layer (161).

The organic electroluminescent device further comprises a first charge generation layer (CGL1) 160 disposed over the first electron transport layer (ETL1) 149, wherein the first charge generation layer (CGL1) 160 comprises a first n-type charge generation layer (n-CGL1) 161, and a first p-type charge generation layer (p-CGL1) 162, wherein the first n-type charge generation layer (n-CGL1) 161 comprises an electron transport matrix compound comprising a heteroaromatic ring comprising at least one nitrogen ring atom and a metal dopant, wherein the p-type charge generation layer (p-CGL1) 162 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant.

The organic electroluminescent device 100 further comprises a second hole transport layer (HTL2) 241; and a second electron blocking layer (EBL2) 242.

The organic electroluminescent device 100 further comprises a second emission layer (EML2) 245.

The organic electroluminescent device 100 further comprises a second optional hole blocking layer (HBL2) 247.

The organic electroluminescent device 100 further comprises a second electron transport layer (ETL2) 249, wherein the second electron transport layer (ETL2) 249 comprises an electron transport compound comprising a six-member heteroaromatic ring comprising at least two nitrogen ring atoms, wherein the second electron transport layer (ETL2) 249 is free of 8-hydroxyquinolinolato-lithium, preferably free of a lithium complex, and more preferably free of a metal complex, wherein the second electron transport layer (ETL2) 249 is in direct contact with the second n-type charge generation layer (n-CGL2) 261, wherein the second electron transport layer (249) is preferably in direct contact with the second emission layer (261).

The organic electroluminescent device further comprises a second charge generation layer (CGL2) 260 disposed over the second electron transport layer (ETL2) 249, wherein the second charge generation layer (CGL2) 260 comprises a second n-type charge generation layer (n-CGL2) 261, and a second p-type charge generation layer (p-CGL2) 262, wherein the second n-type charge generation layer (n-CGL2) 261 comprises a heteroaromatic ring comprising at least one nitrogen ring atom and a metal dopant, wherein the second p-type charge generation layer (p-CGL2) 262 comprises a second organic p-dopant and a second hole transport matrix compound; wherein the second organic p-dopant comprises at least four CN groups, wherein the second organic p-dopant has a molecular weight of ≥400 g/mol and a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase; and wherein the second hole transport matrix compound is selected from arylamine compound, diarylamine compound, triarylamine compound, a compound of formula (I) or a compound of formula (II); wherein the first hole transport matrix compound and the second hole transport matrix compound are selected the same or different; wherein the LUMO energy level of the first organic p-dopant is further away from vacuum level than the LUMO energy level of the second organic p-dopant; wherein the second n-type charge generation layer (n-CGL2) 261 can be selected the same or different than the first n-type charge generation layer (n-CGL1) 161, and wherein the second p-type charge generation layer (p-CGL2) 262 can be selected the same or different than the first p-type charge generation layer (p-CGL1) 161;

- wherein the second n-type charge generation layer (n-CGL2) 261 can be selected the same or different than the first n-type charge generation layer (n-CGL1) 161, and wherein the second p-type charge generation layer (p-CGL2) 262 can be selected the same or different than the first p-type charge generation layer (p-CGL1) 161.

The organic electroluminescent device 100 further comprises a third hole transport layer (HTL3) 341; and a third electron blocking layer (EBL3) 342.

The organic electroluminescent device 100 further comprises a third emission layer (EML3) 345.

The organic electroluminescent device 100 further comprises a third optional hole blocking layer (HBL3) 347; an electron transport layer (ETL)148; an electron injection layer (EIL) 180, wherein the electron injection layer (EIL) 180 consists essentially of Ytterbium; and a cathode layer (CAT) 190.

According to an embodiment, the organic electroluminescent device further comprises a third and fourth emission layer, a second and a third electron transport layer, a second and third charge generation layer;

- wherein the second charge generation layer is arranged between the second emission layer and the third emission layer;
- wherein the second charge generation layer comprises a second n-type charge generation layer and second p-type charge generation layer;
- wherein the second p-type charge generation layer is arranged closer to the cathode layer than the second n-type charge generation layer;
- wherein the second electron transport layer is arranged between the second emission layer and the second charge generation layer;
- wherein the second electron transport layer is in direct contact with the second n-type charge generation layer;
- wherein the third charge generation layer is arranged between the third emission layer and the fourth emission layer;
- wherein the third charge generation layer comprises a third n-type charge generation layer and third p-type charge generation layer;
- wherein the third p-type charge generation layer is arranged closer to the cathode layer than the third n-type charge generation layer;
- wherein the third electron transport layer is arranged between the third emission layer and the third charge generation layer;
- wherein the third electron transport layer is in direct contact with the third n-type charge generation layer;
- wherein the second organic p-dopant of the second p-type charge generation layer and second organic p-dopant of the third p-type charge generation layer comprises independently of each other at least four CN groups, wherein the second organic p-dopant of the second p-type charge generation layer and second organic p-dopant of the third p-type charge generation layer has independently of each other a molecular weight of ≥400 g/mol and wherein the second organic p-dopant of the second p-type charge generation layer and second organic p-dopant of the third p-type charge generation layer has independently of each other a LUMO energy level of less than −4.8 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase;
- wherein the second organic p-dopant of the second p-type charge generation layer and second organic p-dopant of the third p-type charge generation layer is independently selected from arylamine compound, diarylamine compound, triarylamine compound, a compound of formula (I) or a compound of formula (II);
- wherein the second electron transport layer and the third electron transport layer is essentially free of 8-hydroxyquinolinolato-lithium preferably essentially free of a lithium complex, and most preferably free of a metal complex

Intermediate Embodiment

An organic electroluminescent device comprising an anode layer, a cathode layer, a first emission layer, a second emission layer, a hole injection layer, an electron injection layer, a first electron transport layer, and a first charge generation layer,

- wherein the hole injection layer is in direct contact with the anode layer
- wherein the first charge generation layer is arranged between the first emission layer and the second emission layer,
- wherein the electron injection layer is in direct contact with the cathode layer;
- wherein the first charge generation layer comprises a first n-type charge generation layer and a first p-type charge generation layer, wherein the first n-type charge generation layer is closer to the anode layer than the first p-type charge generation layer, wherein the first electron transport layer is arranged between the first emission layer and the first charge generation layer, wherein the first electron transport layer is in direct contact with the first n-type charge generation layer;

wherein the hole injection layer comprises a first organic p-dopant and first hole transport matrix compound, wherein the first organic p-dopant comprises at least four CN groups, wherein the first organic p-dopant has a molecular weight of ≥400 g/mol, wherein the first organic p-dopant has a LUMO energy level of less than −5.10 eV when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase;

wherein the first electron transport layer comprises an electron transport compound according to formula (IIIa) or formula (IIIb) as described before.

Further Layers

In accordance with the invention, the organic electroluminescent device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either a first electrode or a second electrode comprised in the inventive organic electroluminescent device may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

A hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV.

The p-type dopant concentrations can be selected from 1 to 20 vol %, more preferably from 2 vol % to 10 vol %.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

A hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine(TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc ($Zn(BTZ)_2$).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, $Ir(piq)_3$, and Btp2lr(acac), but are not limited thereto. These compounds are phosphorescent emitters, however, fluorescent red emitter dopants could also be used.

Examples of phosphorescent green emitter dopants are $Ir(ppy)_3$ (ppy=phenylpyridine), $Ir(ppy)_2(acac)$, $Ir(mpyp)_3$.

Examples of phosphorescent blue emitter dopants are F2Irpic, (F2ppy)2Ir(tmd) and $Ir(dfppz)_3$ and ter-fluorene. 4,4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function. The hole blocking layer may be the inventive organic semiconductor layer comprising or consisting of the inventive compound represented by the general Formula (1) as defined above.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

The hole blocking layer may also be described as a-ETL or auxiliary ETL.

According to an embodiment, a hole blocking layer is arranged between the at least one photoactive layer and the organic semiconductor layer comprising compound of formula (1).

According to an embodiment, a hole blocking layer is arranged between the at least one photoactive layer and the organic semiconductor layer comprising compound of formula (1), wherein the organic semiconductor layer comprising compound of formula (1) further comprises a redox n-dopant.

According to an embodiment, a hole blocking layer is arranged between the at least one photoactive layer and the organic semiconductor layer comprising compound of formula (1), wherein the organic semiconductor layer comprising compound of formula (1) further comprises a metal or a metal organic complex, alternatively a metal or a lithium organic complex.

According to an embodiment, a hole blocking layer is arranged between the at least one photoactive layer and the organic semiconductor layer comprising compound of formula (1), wherein the organic semiconductor layer comprising compound of formula (1) further comprises a metal.

Electron Transport Layer (ETL)

The OLED according to the present invention may comprise an electron transport layer (ETL). In accordance with the invention, the first electron transport layer comprises an electron transport compound comprising a six-member heteroaromatic ring comprising at least two nitrogen ring atoms and the first electron transport layer is free of lithium quinolate (LiQ).

According to various embodiments the OLED may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the organic electroluminescent device may comprise further ETM materials known in the art.

Further, the electron transport layer may comprise one or more n-type dopants. The additive may be an n-type dopant. The additive can be alkali metal, alkali metal compound, alkaline earth metal, alkaline earth metal compound, transition metal, transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. In another embodiment, the n-type dopant can be one selected from a group consisting of Cs, K, Rb, Mg, Na, Ca, Sr, Eu and Yb. In an embodiment the alkali metal compound may be 8-hydroxyquinolinolato-lithium (LiQ), Lithium tetra(1H-pyrazol-1-yl)borate or Lithium 2-(diphenylphosphoryl)phenolate.

In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

Electron Injection Layer (EIL)

The EIL, which may facilitates injection of electrons from the cathode, may be formed on the ETL, preferably directly on the electron transport layer.

According to the invention the electron injection layer comprises Ytterbium.

Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode may be formed on the EIL. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generating Layer

The charge generation layer (CGL) may comprise a p-type and an n-type layer. An interlayer may be arranged between the p-type layer and the n-type layer.

Typically, the charge generation layer is a pn junction joining an n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers are used in tandem and stacked devices, for example, in tandem or stacked OLEDs comprising, between two electrodes, two or more emission layers. In a tandem or stacked OLED comprising two emission layers, the n-type charge generation layer provides electrons for the first light emission layer arranged near the anode, while the hole generating layer provides holes to the second light emission layer arranged between the first emission layer and the cathode.

The hole generating layer may be arranged in direct contact to the n-type charge generation layer.

According to one aspect, the organic semiconductor layer may be arranged between the first and second emission layer and further comprises a redox n-dopant.

According to one aspect, the organic semiconductor layer may be arranged between the first and second emission layer and further comprises a metal.

According to one aspect, the organic semiconductor layer may be arranged between the first and second emission layer and further comprises a metal selected from alkali, alkaline earth and rare earth metals.

Redox n-Dopant

According to one embodiment the organic semiconductor layer of the organic electroluminescent device comprises a redox n-dopant.

According to one embodiment the metal n-dopant is preferably a redox n-dopant.

Preferably the organic semiconductor layer comprising compound of formula (1) and a redox n-dopant is non-emissive.

Under a redox n-dopant, it is understood a compound which, if embedded into an electron transport matrix, improves, in comparison with the neat matrix under the same physical conditions, the electronic properties of the formed organic material, in particular in terms of electron injection, electron generation and/or electron conductivity. Preferably, the redox n-dopant is non-emissive.

In the context "embedded into an electron transport matrix" means the redox n-dopant forms a mixture with the electron transport matrix.

The redox n-dopant may be selected from elemental metals, metal salts, metal complexes and organic radicals.

For the use in consumer electronics, only metals containing stable nuclides or nuclides having very long halftime of radioactive decay might be applicable. As an acceptable level of nuclear stability, the nuclear stability of natural potassium can be taken.

In the context, a metal is understood to be a metal in its elemental form, a metal alloy, or in a state of free atoms or metal clusters. It is understood that metals deposited by vacuum thermal evaporation may from a metallic phase, e.g. from a neat bulk metal, vaporize in their elemental form.

It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

According to one embodiment, the organic semiconductor layer of the organic electroluminescent device comprises a metal, preferably selected from alkali metals, alkaline earth metals, rare earth metals and metals of the first transition period Ti, V, Cr and Mn, especially selected from_Li, Na, K, Rb, Cs, Mg, Ca, Sr, Ba, Sm, Eu, Tm, Yb; more preferably from Li, Na, K, Rb, Cs, Mg and Yb, even more preferably from Li, Na, Cs and Yb, most preferably from Li, Na and Yb.

In one embodiment, the redox n-dopant is selected from alkali metal salts and alkali metal complexes; preferably from lithium salts and lithium organic complexes; more preferably from lithium halides and lithium organic chelates; even more preferably from lithium fluoride, a lithium quinolinolate, lithium borate, lithium phenolate, lithium pyridinolate or from a lithium complex with a Schiff base ligand; most preferably, the lithium complex has the formula IX, X or XI:

(IX)

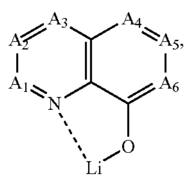

(X)

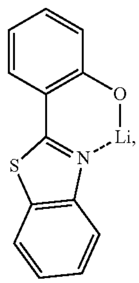

(XI)

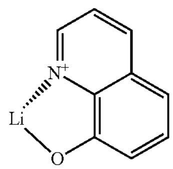

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred A1 to A6 are CH, the borate based organic ligand is a tetra(1H-pyrazol-1-yl)borate, the phenolate is a 2-(pyridin-2-yl)phenolate, a 2-(diphenylphosphoryl)phenolate, an imidazole phenolate, 2-(pyridin-2-yl)phenolate or 2-(1-phenyl-1H-benzo [d]-imidazol-2-yl)phenolate, the pyridinolate is a 2-(diphenylphosphoryl)pyridin-3-olate, the lithium Schiff base has the structure 100, 101, 102 or 103:

100

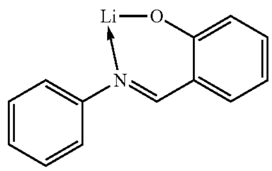

101

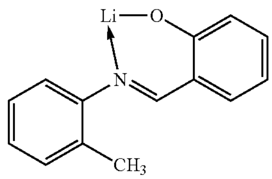

-continued

102

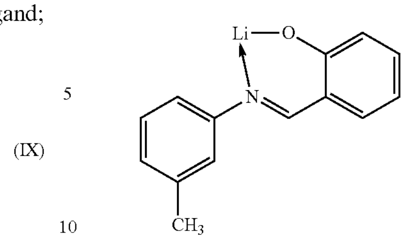

103

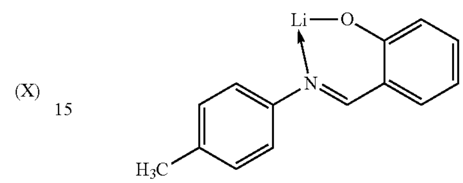

According to one embodiment of the invention, the organic semiconductor layer comprises a lithium organic complex, alternatively LiQ.

According to one embodiment of the invention, the organic semiconductor layer is an electron transport, electron injection or charge generation layer; alternatively an electron transport or charge generation layer.

Organic Light-Emitting Diode (OLED)

The organic electroluminescent device according to the invention may be an organic light-emitting device.

According to one aspect, there is provided an organic light-emitting diode (OLED) comprising: a substrate; an anode electrode formed on the substrate; a hole injection layer, a hole transport layer, an emission layer, an organic semiconductor layer comprising a compound of Formula (1) and a cathode electrode.

According to another aspect, there is provided an OLED comprising: a substrate; an anode electrode formed on the substrate; a hole injection layer, a hole transport layer, an electron blocking layer, an emission layer, a hole blocking layer, an organic semiconductor layer comprising a compound of Formula (1) and a cathode electrode.

According to another aspect, there is provided an OLED comprising: a substrate; an anode electrode formed on the substrate; a hole injection layer, a hole transport layer, an electron blocking layer, an emission layer, a hole blocking layer, an organic semiconductor layer comprising a compound of Formula (1), an electron injection layer, and a cathode electrode.

According to various embodiments, there may be provided OLEDs layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

The organic semiconductor layer according to the invention may be the electron transport layer, first electron transport layer, n-type charge generation layer and/or second electron transport layer.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Organic Electroluminescent Device

The organic electroluminescent device according to the invention may be a light emitting device, or a photovoltaic cell, and preferably a light emitting device.

According to another aspect, there is provided a method of manufacturing an organic electroluminescent device, the method using:

at least one deposition source, preferably two deposition sources and more preferred at least three deposition sources.

The methods for deposition that can be suitable comprise:

deposition via vacuum thermal evaporation;

deposition via solution processing, preferably the processing is selected from spin-coating, printing, casting; and/or slot-die coating.

According to various embodiments, there is provided a method using:

a first deposition source to release the compound of Formula (1) according to the invention, and a second deposition source to release the metal, a metal salt or an alkali or alkaline earth metal complex; alternatively an organic alkali or alkaline earth metal complex; alternatively 8-hydroxyquinolinolato lithium;

the method comprising the steps of forming the organic semiconductor layer; whereby for an organic light-emitting diode (OLED):

the organic semiconductor layer is formed by releasing the compound of Formula (1) according to the invention from the first deposition source and a metal, a metal salt or an alkali or alkaline earth metal complex; alternatively an organic alkali or alkaline earth metal complex; alternatively 8-hydroxyquinolinolato lithium, from the second deposition source.

According to various embodiments, the method may further include forming on the anode electrode, an emission layer and at least one layer selected from the group consisting of forming a hole injection layer, forming a hole transport layer, or forming a hole blocking layer, between the anode electrode and the first electron transport layer.

According to various embodiments, the method may further include the steps for forming an organic light-emitting diode (OLED), wherein on a substrate a first anode electrode is formed, on the first anode electrode an emission layer is formed, on the emission layer an electron transport layer stack is formed, optionally a hole blocking layer is formed on the emission layer and an organic semiconductor layer is formed, and finally a cathode electrode is formed, optional a hole injection layer, a hole transport layer, and a hole blocking layer, formed in that order between the first anode electrode and the emission layer, optional an electron injection layer is formed between the organic semiconductor layer and the cathode electrode.

According to various embodiments, the method may further comprise forming an electron injection layer on the organic semiconductor layer. However, according to various embodiments of the OLED, the OLED may not comprise an electron injection layer.

According to various embodiments, the OLED may have the following layer structure, wherein the layers having the following order:

anode, hole injection layer, first hole transport layer, second hole transport layer, emission layer, optional hole blocking layer, organic semiconductor layer comprising a compound of Formula (1) according to the invention, optional electron injection layer, and cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

In one embodiment, the organic electroluminescent device according to the invention comprising an organic semiconductor layer comprising a compound according to Formula (1) may further comprise a layer comprising a radialene compound and/or a quinodimethane compound.

Layer Position

According to one embodiment the layers of the organic electroluminescent device may be arranged as follows:

the hole injection layer is in direct contact with the anode layer; and/or the electron injection layer is in direct contact with the cathode layer; and/or the first electron transport layer is in direct contact with the first emission layer; and/or the first electron transport layer is in direct contact with the first n-type charge generation layer.

According to one embodiment the layers of the organic electroluminescent device may be arranged as follows, wherein the first electron transport layer (149) is in direct contact with the first n-type charge generation layer (161), wherein the first electron transport layer (149) is in direct contact with the first emission layer (145); a first charge generation layer (160) is disposed over the first electron transport layer (149), wherein the first charge generation layer (160) comprises a first n-type charge generation layer (161), and a first p-type charge generation layer (162), wherein the n-type charge generation layer (161) comprises an electron transport matrix compound.

Device

The present invention furthermore relates to a display device comprising an organic electroluminescent device according to the present invention.

According to one embodiment, the organic electroluminescent device can be preferably an organic light emitting diode.

According to another embodiment the electronic device can be preferably a display device, a light emitting device, a thin film transistor, a battery, a display device or a photovoltaic device, and preferably a light emitting device, preferably the electronic device is part of a display device or lighting device.

Experimental Data

Calculated HOMO and LUMO

The HOMO (HOMO energy level) and LUMO (LUMO energy level) are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

Table IV shows the LUMO energy level of first organic p-dopant and second p-dopants, wherein the first organic p-dopant has a LUMO energy level of less than −5.10 eV and the second organic p-dopant has a LUMO energy level of less than −4.80 eV.

TABLE IV

| | Compound | LUMO energy level |
|---|---|---|
| NP-2/G1 | 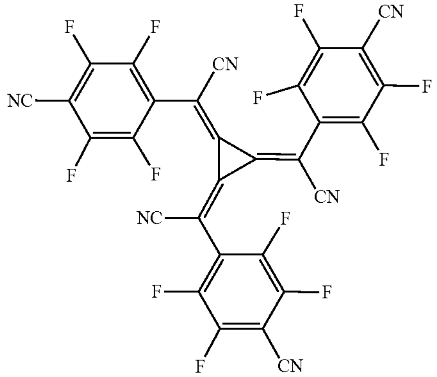 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] | −5.19 |
| NP-5/G2 | 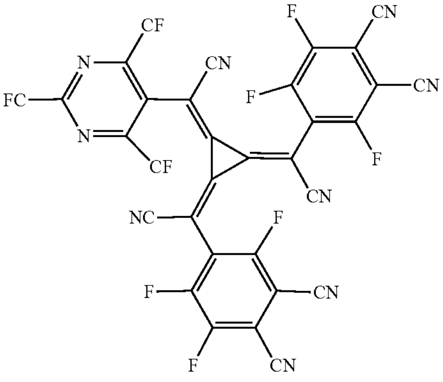 | −5.44 |
| NP-4/G3 | 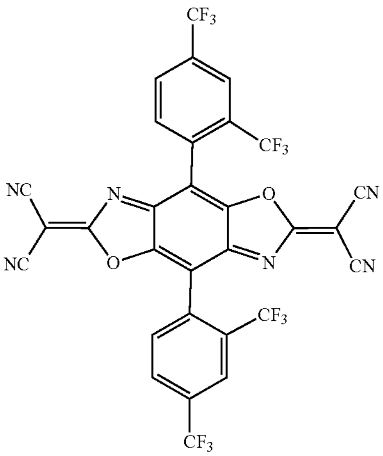 [SMILES: N#CC(C#N)=c1nc2c(-c3ccc(C(F)(F)F)cc3C(F)(F)F)c3oc(=C(C#N)C#N)nc3c(-c3ccc(C(F)(F)F)cc3C(F)(F)F)c2o1] | −5.35 |

TABLE IV-continued
| | Compound | LUMO energy level |
|---|---|---|
| NP-6/G4 | 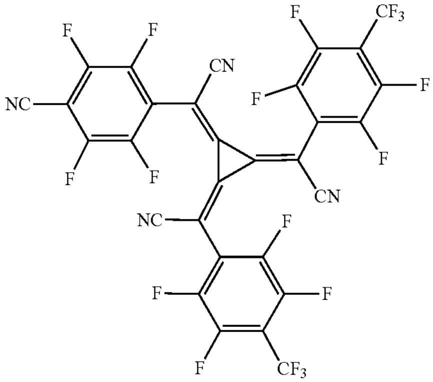 [SMILES: N#C/C(=C1\C(=C(\C#N)c2c(F)c(F)c(C(F)(F)F)c(F)c2F)\C1=C(\C#N)c1c(F)c(F)c(C(F)(F)F)c(F)c1F)c1c(F)c(F)c(C#N)c(F)c1F] | −5.00 |
| NP-7/G5 | 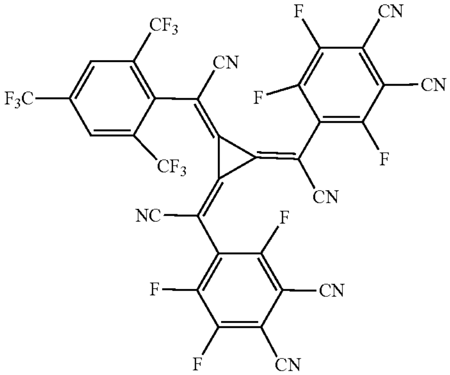 [SMILES: N#C/C(=C1\C(=C(\C#N)c2c(F)c(F)c(C#N)c(C#N)c2F)\C1=C(\C#N)c1c(F)c(F)c(C#N)c(C#N)c1F)c1c(C(F)(F)F)cc(C(F)(F)F)cc1C(F)(F)F] | −5.22 |
| NP-8/G24 | 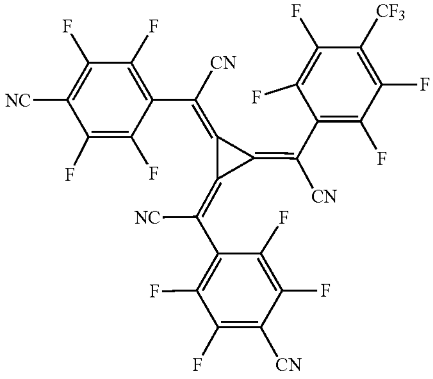 | −5.10 |
| NP-9/G6 | 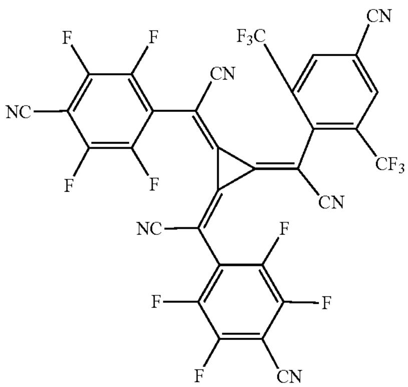 [SMILES: N#C/C(=C1\C(=C(\C#N)c2c(F)c(F)c(C#N)c(F)c2F)\C1=C(\C#N)c1c(F)c(F)c(C#N)c(F)c1F)c1c(C(F)(F)F)cc(C#N)cc1C(F)(F)F] | −5.07 |

TABLE IV-continued
| | Compound | LUMO energy level |
|---|---|---|
| NP-10/G7 | 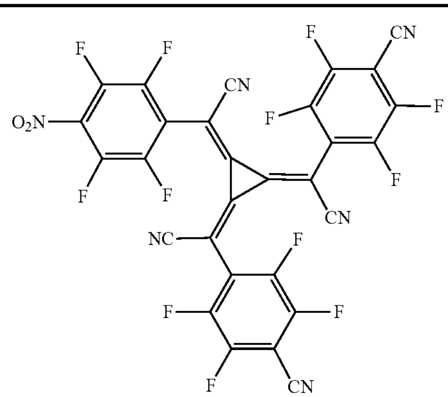 | −5.21 |
| NP-11/G8 | 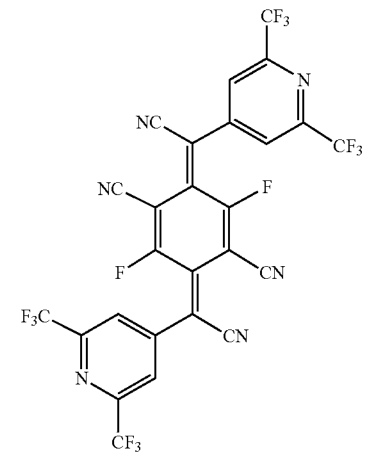 [SMILES: N#C/C(c1cc(C(F)(F)F)nc(C(F)(F)F)c1)=c1/c(F)c(C#N)/c(=C(\C#N)c2cc(C(F)(F)F)nc(C(F)(F)F)c2)c(F)c1C#N] | −5.31 |
| NP-12/G9 | 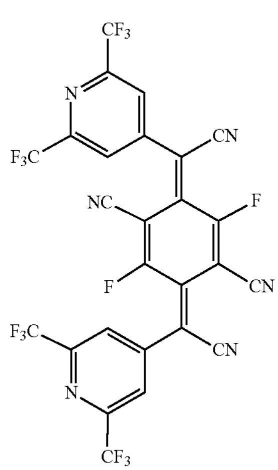 [SMILES: N#C/C(c1cc(C(F)(F)F)nc(C(F)(F)F)c1)=c1\c(F)c(C#N)/c(=C(\C#N)c2cc(C(F)(F)F)nc(C(F)(F)F)c2)c(F)c1C#N] | −5.24 |

TABLE IV-continued
| | Compound | LUMO energy level |
|---|---|---|
| NP-13/G10 | 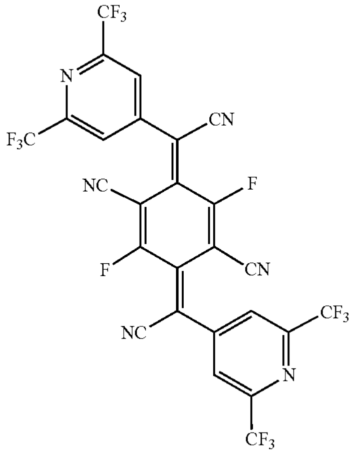 [SMILES: N#C/C(c1cc(C(F)(F)F)nc(C(F)(F)F)c1)=c1\c(F)c(C#N)/c(=C(/C#N)c2cc(C(F)(F)F)nc(C(F)(F)F)c2)c(F)c1C#N] | −5.20 |
| NP-14/G11 | 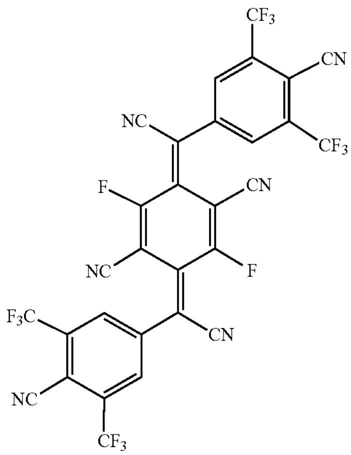 [SMILES: N#C/C(c1cc(C(F)(F)F)c(C#N)c(C(F)(F)F)c1)=c1\c(F)c(C#N)/c(=C(/C#N)c2cc(C(F)(F)F)c(C#N)c(C(F)(F)F)c2)c(F)c1C#N] | −5.25 |
| NP-15/G12 | 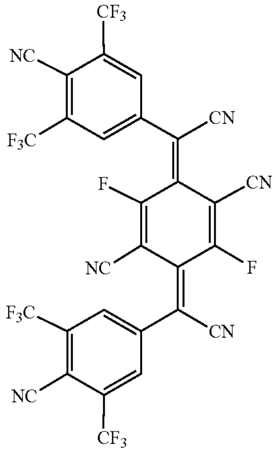 [SMILES: N#C/C(c1cc(C(F)(F)F)c(C#N)c(C(F)(F)F)c1)=c1\c(F)c(C#N)/c(=C(\C#N)c2cc(C(F)(F)F)c(C#N)c(C(F)(F)F)c2)c(F)c1C#N] | −5.28 |

TABLE IV-continued
| | Compound | LUMO energy level |
|---|---|---|
| NP-16/G23 | 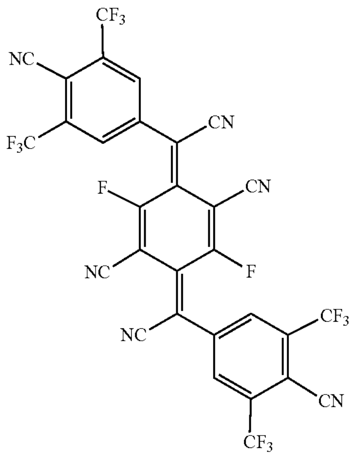 [SMILES: N#C/C(c1cc(C(F)(F)F)c(C#N)c(C(F)(F)F)c1)=c1/c(F)c(C#N)/c(=C(\C#N)c2cc(C(F)(F)F)c(C#N)c(C(F)(F)F)c2)c(F)c1C#N] | −5.32 |
| F1 | 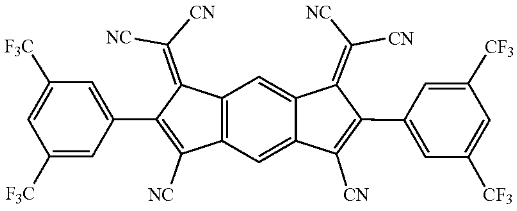 [SMILES: N#CC(C#N)=C1C(c2cc(C(F)(F)F)cc(C(F)(F)F)c2)=C(C#N)c2cc3c(cc21)C(=C(C#N)C#N)C(c1cc(C(F)(F)F)cc(C(F)(F)F)c1)=C3C#N] | −4.99 |
| F2 | 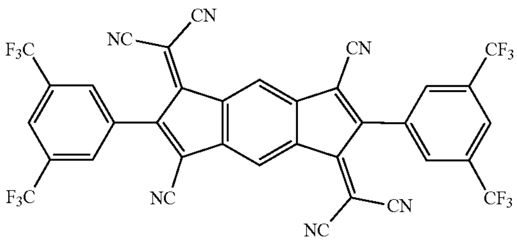 [SMILES: N#CC(C#N)=C1C(c2cc(C(F)(F)F)cc(C(F)(F)F)c2)=C(C#N)c2cc3c(cc21)C(C#N)=C(c1cc(C(F)(F)F)cc(C(F)(F)F)c1)C3=C(C#N)C#N] | −5.07 |
| F3 | 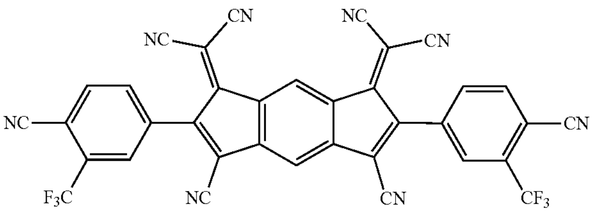 [SMILES: N#CC(C#N)=C1C(c2ccc(C#N)c(C(F)(F)F)c2)=C(C#N)c2cc3c(cc21)C(=C(C#N)C#N)C(c1ccc(C#N)c(C(F)(F)F)c1)=C3C#N] | −5.15 |
| F4 | 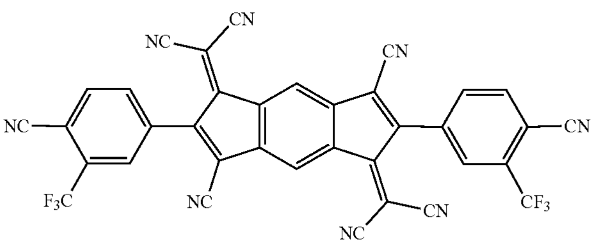 [SMILES: N#CC(C#N)=C1C(c2ccc(C#N)c(C(F)(F)F)c2)=C(C#N)c2cc3c(cc21)C(C#N)=C(c1ccc(C#N)c(C(F)(F)F)c1)C3=C(C#N)C#N] | −5.22 |

TABLE IV-continued
| | Compound | LUMO energy level |
|---|---|---|
| F5 | 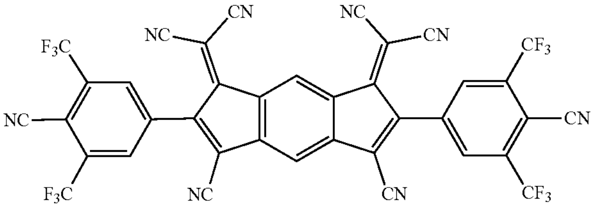 [SMILES: N#CC(C#N)=C1C(c2cc(C(F)(F)F)c(C#N)c(C(F)(F)F)c2)=C(C#N)c2cc3c(cc21)C(=C(C#N)C#N)C(c1cc(C(F)(F)F)c(C#N)c(C(F)(F)F)c1)=C3C#N] | −5.31 |
| F6 | 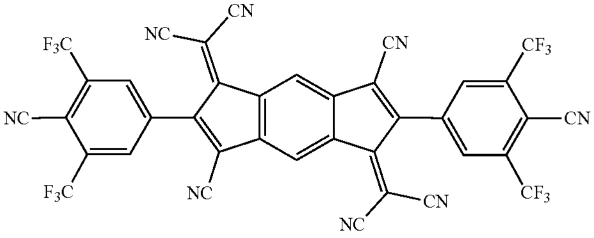 [SMILES: N#CC(C#N)=C1C(c2cc(C(F)(F)F)c(C#N)c(C(F)(F)F)c2)=C(C#N)c2cc3c(cc21)C(C#N)=C(c1cc(C(F)(F)F)c(C#N)c(C(F)(F)F)c1)C3=C(C#N)C#N] | −5.38 |
| F7 | 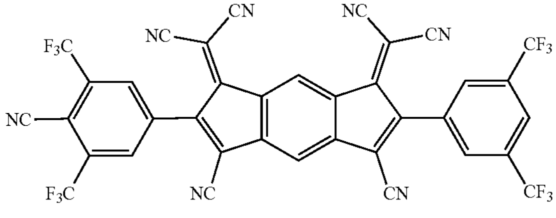 [SMILES: N#CC(C#N)=C1C(c2cc(C(F)(F)F)cc(C(F)(F)F)c2)=C(C#N)c2cc3c(cc21)C(=C(C#N)C#N)C(c1cc(C(F)(F)F)c(C#N)c(C(F)(F)F)c1)=C3C#N] | −5.16 |
| F8 | 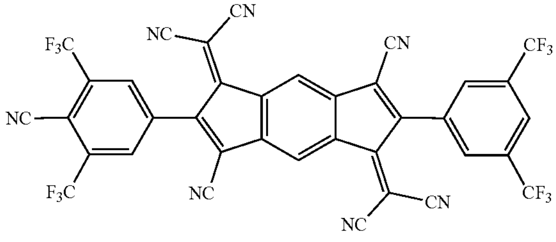 [SMILES: N#CC(C#N)=C1C(c2cc(C(F)(F)F)cc(C(F)(F)F)c2)=C(C#N)c2cc3c(cc21)C(C#N)=C(c1cc(C(F)(F)F)c(C#N)c(C(F)(F)F)c1)C3=C(C#N)C#N] | −5.22 |
| F9 | 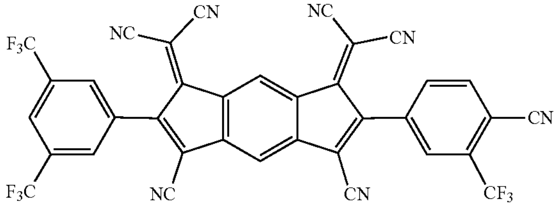 [SMILES: N#CC(C#N)=C1C(c2cc(C(F)(F)F)cc(C(F)(F)F)c2)=C(C#N)c2cc3c(cc21)C(=C(C#N)C#N)C(c1ccc(C#N)c(C(F)(F)F)c1)=C3C#N] | −5.07 |
| F10 | 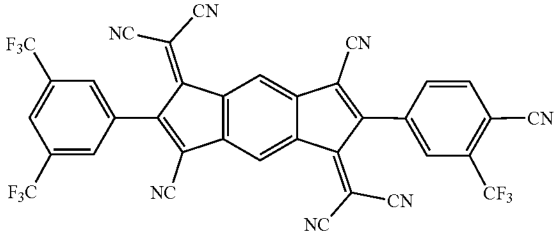 [SMILES: N#CC(C#N)=C1C(c2cc(C(F)(F)F)cc(C(F)(F)F)c2)=C(C#N)c2cc3c(cc21)C(C#N)=C(c1ccc(C#N)c(C(F)(F)F)c1)C3=C(C#N)C#N] | −5.14 |

TABLE V
Table V shows compounds for LiQ-free first ETL contacting the first n-CGL.
| | Structure | LUMO [eV] | Dipole moment [debye] | HOMO [eV]] | Egap [eV]] | S1 [eV] | T1 [eV] |
|---|---|---|---|---|---|---|---|
| N-1 | 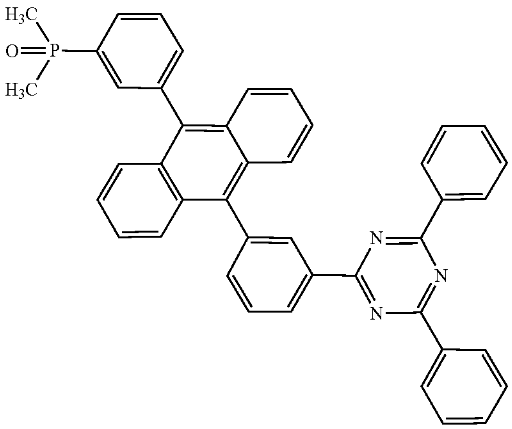 [SMILES: CP(C)(=O)c1cccc(-c2c3ccccc3c(-c3cccc(-c4nc(-c5ccccc5)nc(-c5ccccc5)n4)c3)c3ccccc23)c1] | −1.90 | 4.47 | −5.28 | 3.37 | 2.92 | 1.73 |
| N-2 | 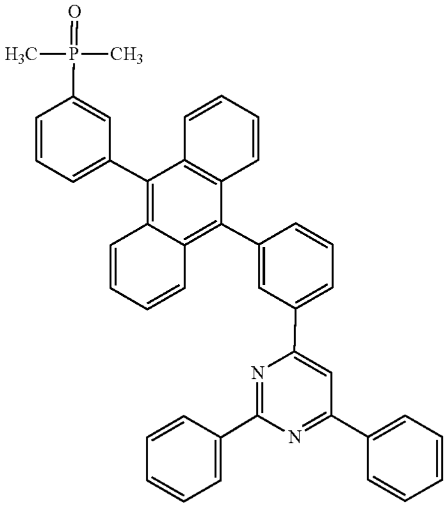 [SMILES: CP(C)(=O)c1cccc(-c2c3ccccc3c(-c3cccc(-c4cc(-c5ccccc5)nc(-c5ccccc5)n4)c3)c3ccccc23)c1] | −1.86 | 2.59 | −5.34 | 3.48 | 3.07 | 1.73 |
| N-3 | 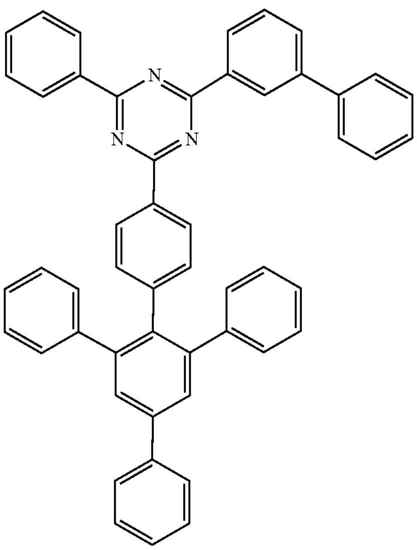 [SMILES: c1ccc(-c2cccc(-c3nc(-c4ccccc4)nc(-c4ccc(-c5c(-c6ccccc6)cc(-c6ccccc6)cc5-c5ccccc5)cc4)n3)c2)cc1] | −1.83 | 0.37 | −5.82 | 3.99 | 3.55 | 2.83 |

TABLE V-continued
| Table V shows compounds for LiQ-free first ETL contacting the first n-CGL. | | | | | | | |
|---|---|---|---|---|---|---|---|
| | Structure | LUMO [eV] | Dipole moment [debye] | HOMO [eV]] | Egap [eV]] | S1 [eV] | T1 [eV] |
| N-4 | 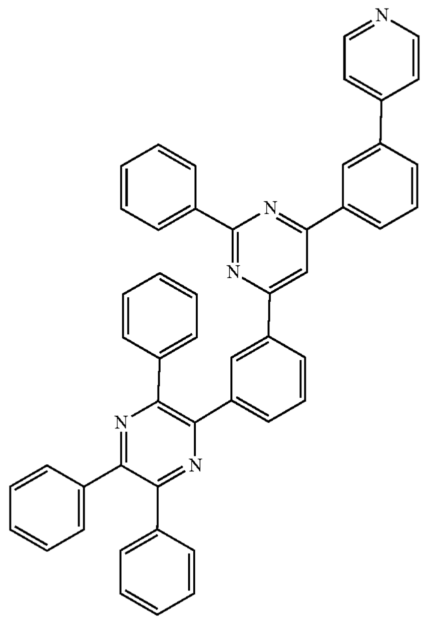 [SMILES: c1ccc(-c2nc(-c3cccc(-c4ccncc4)c3)cc(-c3cccc(-c4nc(-c5ccccc5)c(-c5ccccc5)nc4-c4ccccc4)c3)n2)cc1] | −1.87 | 0.98 | −5.74 | 3.87 | 3.47 | 2.57 |
| N-5:N-6 | N-5:N-6 20/80 weight %<br>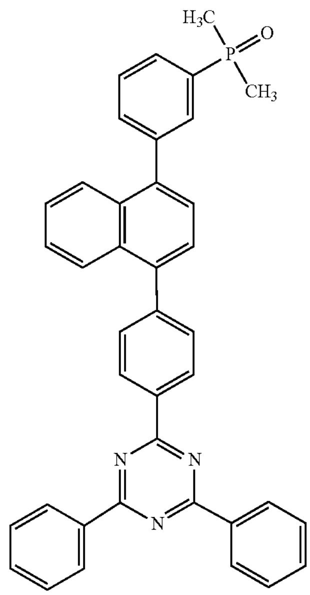<br>N-5 | | | | | | |

TABLE V-continued
| Structure | LUMO [eV] | Dipole moment [debye] | HOMO [eV]] | Egap [eV]] | S1 [eV] | T1 [eV] |
|---|---|---|---|---|---|---|
| Table V shows compounds for LiQ−free first ETL contacting the first n−CGL. | | | | | | |
| 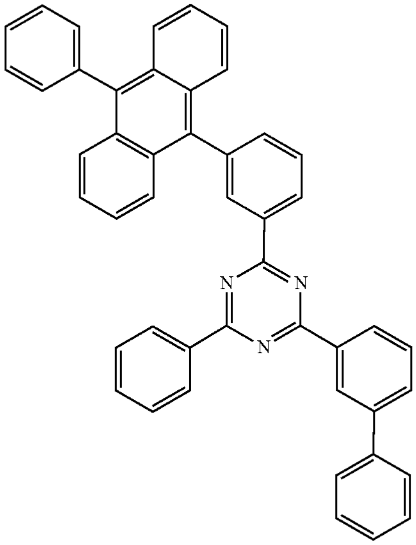 N-6 | | | | | | |
| 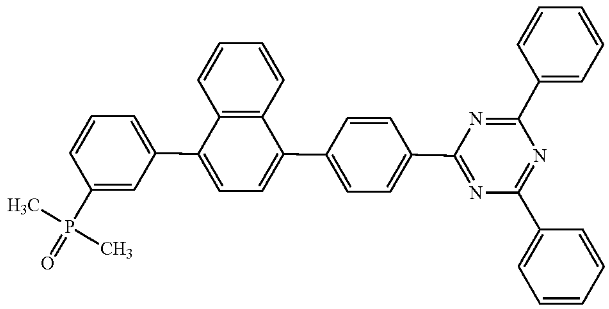 N-5 | −1.97 | 4.27 | −5.76 | 3.78 | 3.36 | 2.51 |
| 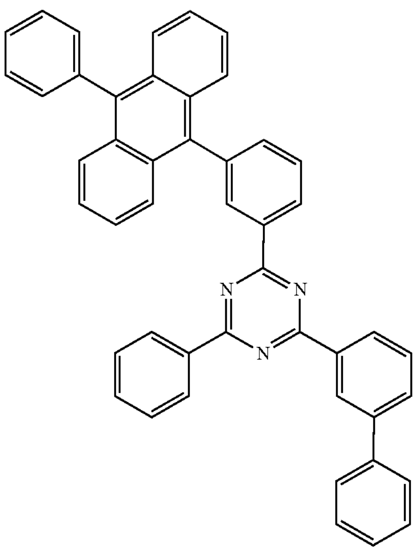 N-6 | −1.84 | 0.37 | −5.19 | 3.20 | 2.84 | 1.72 |

TABLE V-continued
Table V shows compounds for LiQ-free first ETL contacting the first n-CGL.
| | Structure | LUMO [eV] | Dipole moment [debye] | HOMO [eV]] | Egap [eV]] | S1 [eV] | T1 [eV] |
|---|---|---|---|---|---|---|---|
| N-7 | 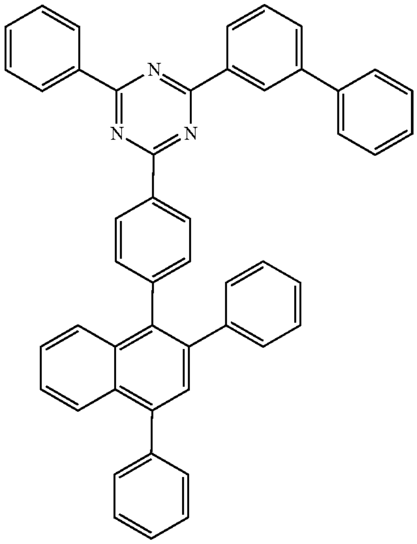 [SMILES: c1ccc(-c2cccc(-c3nc(-c4ccccc4)nc(-c4ccc(-c5c(-c6ccccc6)cc(-c6ccccc6)c6ccccc56)cc4)n3)c2)cc1] | −1.85 | 0.20 | −5.54 | 3.68 | 3.25 | 2.50 |
| N-8 | 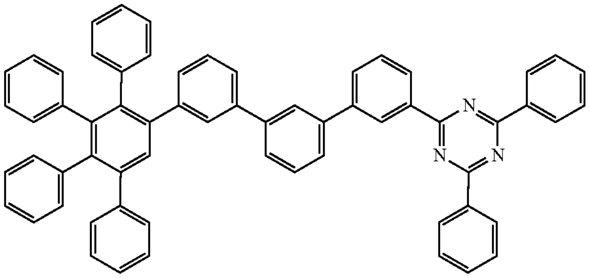 [SMILES: c1ccc(-c2nc(-c3ccccc3)nc(-c3cccc(-c4cccc(-c5cccc(-c6cc(-c7ccccc7)c(-c7ccccc7)c(-c7ccccc7)c6-c6ccccc6)c5)c4)c3)n2)cc1] | −1.82 | 0.30 | −5.72 eV | 3.89 | 3.55 | 2.95 |
| N-9 | 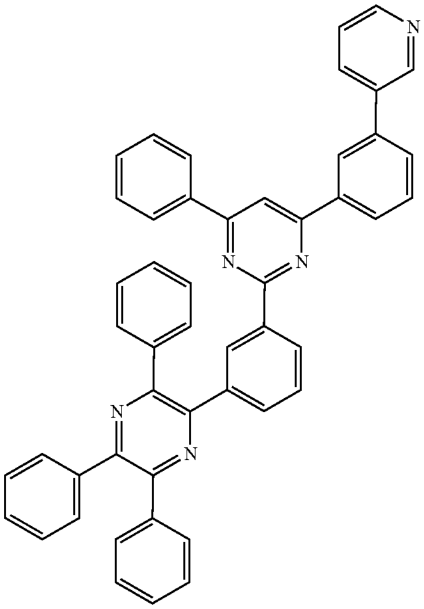 [SMILES: c1ccc(-c2cc(-c3cccc(-c4cccnc4)c3)nc(-c3cccc(-c4nc(-c5ccccc5)c(-c5ccccc5)nc4-c4ccccc4)c3)n2)cc1] | −1.78 | 1.54 | −5.60 | 3.82 | 3.44 | 2.56 |

TABLE VI
| Table VI shows compounds that can be suitable used for the first n-CGL. | | | | | | | |
|---|---|---|---|---|---|---|---|
| Internal names Delete before filing | Structure | LUMO [eV] | Dipole moment [debye] | HOMO [eV]] | Egap [eV] | S1 [eV] | T1 [eV] |
| N-10 | 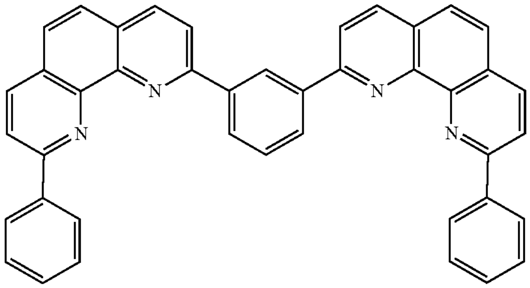 [SMILES: c1ccc(-c2ccc3ccc4ccc(-c5cccc(-c6ccc7ccc8ccc(-c9ccccc9)nc8c7n6)c5)nc4c3n2)cc1] | −1.75 | 2.66 | −5.62 | 3.87 | — | 2.46 |
| N-2 | 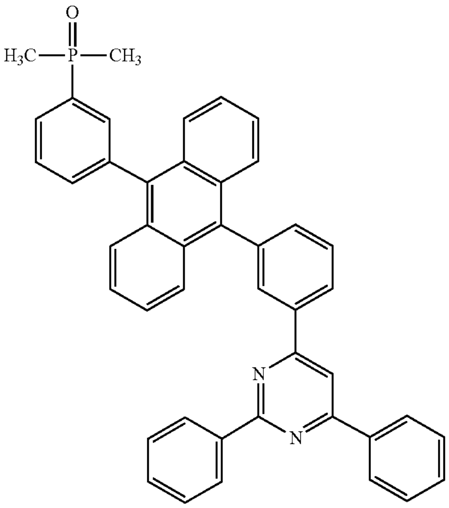 [SMILES: CP(C)(=O)c1cccc(-c2c3ccccc3c(-c3cccc(-c4cc(-c5ccccc5)nc(-c5ccccc5)n4)c3)c3ccccc23)c1] | −1.86 | 2.59 | −5.34 | 3.48 | 3.07 | 1.73 |
| N-11 | 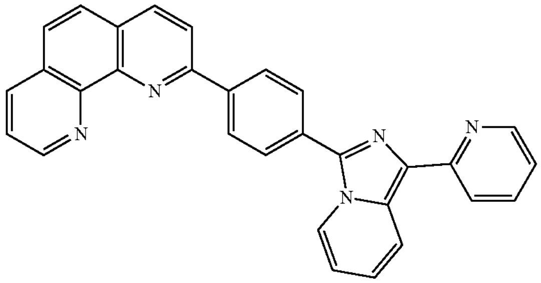 [SMILES: c1ccc(-c2nc(-c3ccc(-c4ccc5ccc6cccnc6c5n4)cc3)n3ccccc23)nc1] | −1.73 | 3.39 | −4.88 | 3.15 | 2.82 | 2.26 |

TABLE VI-continued
| Internal names Delete before filing | Structure | LUMO [eV] | Dipole moment [debye] | HOMO [eV]] | Egap [eV] | S1 [eV] | T1 [eV] |
|---|---|---|---|---|---|---|---|
| Table VI shows compounds that can be suitable used for the first n−CGL. | | | | | | | |
| N-12 | 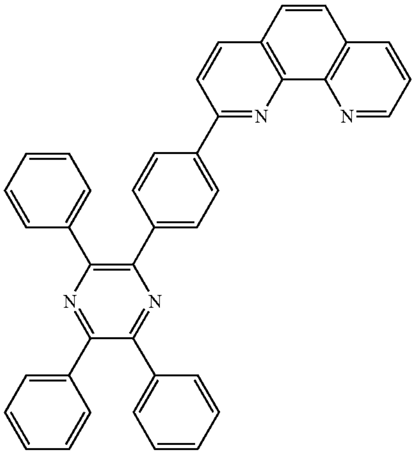 [SMILES: c1ccc(-c2nc(-c3ccccc3)c(-c3ccc(-c4ccc5ccc6cccnc6c5n4)cc3)nc2-c2ccccc2)cc1] | −1.84 | 2.75 | −5.48 | 3.62 | 3.23 | 2.38 |
| N-13 | 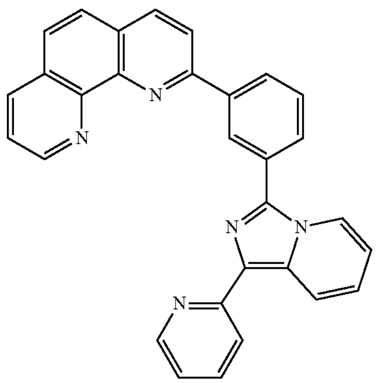 [SMILES: c1ccc(-c2nc(-c3cccc(-c4ccc5ccc6cccnc6c5n4)c3)n3ccccc23)nc1] | −1.54 | 2.03 | 2.03 | 3.39 | 2.98 | 2.29 |
| N-12 | 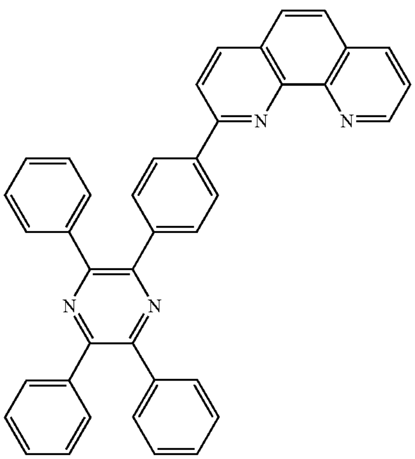 [SMILES: c1ccc(-c2nc(-c3ccccc3)c(-c3ccc(-c4ccc5ccc6cccnc6c5n4)cc3)nc2-c2ccccc2)cc1] | −1.84 | 2.75 | −5.48 | 3.62 | 3.23 | 2.38 |

TABLE VI-continued
| Internal names Delete before filing | Structure | LUMO [eV] | Dipole moment [debye] | HOMO [eV]] | Egap [eV] | S1 [eV] | T1 [eV] |
|---|---|---|---|---|---|---|---|
| Table VI shows compounds that can be suitable used for the first n-CGL. | | | | | | | |
| N-16 | 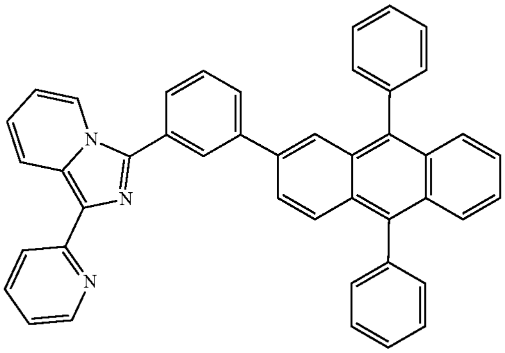 [SMILES: c1ccc(-c2c3ccccc3c(-c3ccccc3)c3cc(-c4cccc(-c5nc(-c6ccccn6)c6ccccn56)c4)ccc23)cc1] | −1.74 | 3.68 | −5.01 | 3.27 | 2.85 | 1.69 |
| N-17 | 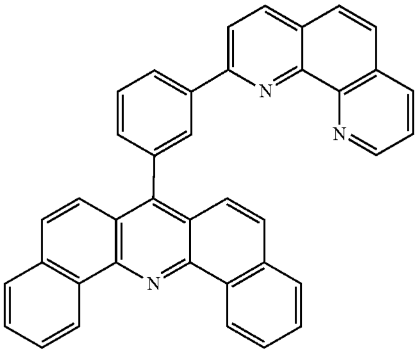 [SMILES: c1cc(-c2ccc3ccc4cccnc4c3n2)cc(-c2c3ccc4ccccc4c3nc3c2ccc2ccccc23)c1] | −1.72 | 4.75 | −5.49 | 3.77 | 3.33 | 2.29 |
| N-18 | 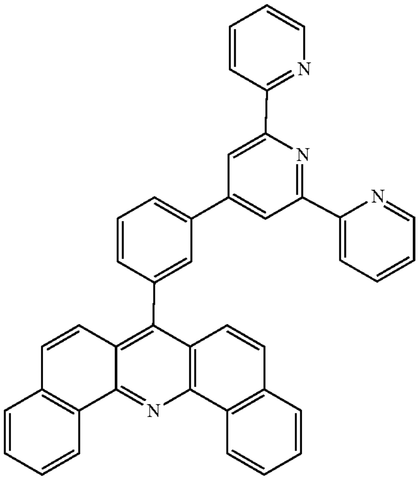 [SMILES: c1ccc(-c2cc(-c3cccc(-c4c5ccc6ccccc6c5nc5c4ccc4ccccc45)c3)cc(-c3ccccn3)n2)nc1] | −1.79 | 0.47 | −5.70 | 3.91 | 3.36 | 2.30 |
| N-19 | 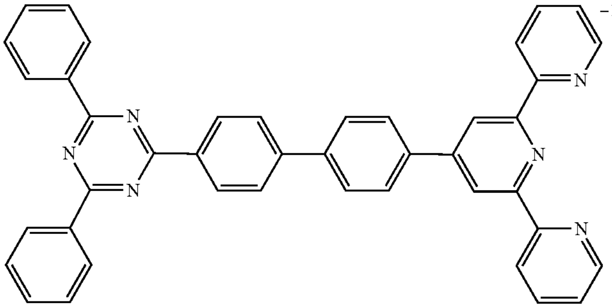 | −1.99 | 1.74 | −6.08 | 4.09 | — | 2.73 |

TABLE VI-continued

Table VI shows compounds that can be suitable used for the first n–CGL.

| Internal names Delete before filing | Structure | LUMO [eV] | Dipole moment [debye] | HOMO [eV]] | Egap [eV] | S1 [eV] | T1 [eV] |
|---|---|---|---|---|---|---|---|
| N-20 | 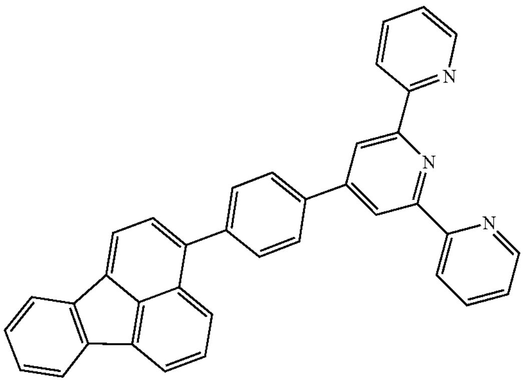 [SMILES: c1ccc(-c2cc(-c3ccc(-c4ccc5c6c(cccc46)-c4ccccc4-5)cc3)cc(-c3ccccn3)n2)nc1] | −1.88 | 2.00 | −5.61 | 3.73 | 3.25 | 2.26 |

TABLE VII

| Internal names Delete before filing | Structure | LUMO [eV] | Dipole moment [debye] | HOMO [eV]] | Egap [eV]] | S1 [eV] | T1 [eV] |
|---|---|---|---|---|---|---|---|
| N-14 this compound is used in the HBL | 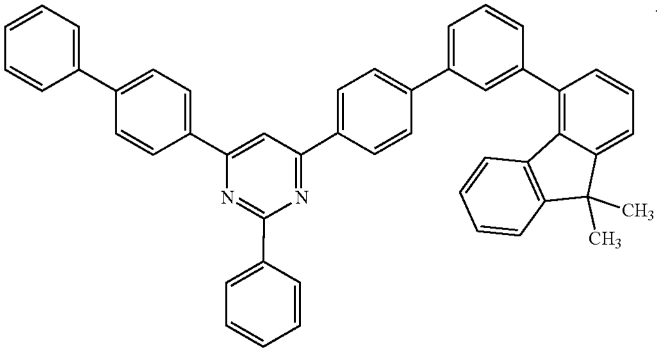 [SMILES: CC1(C)c2ccccc2-c2c(-c3cccc(-c4ccc(-c5cc(-c6ccc(-c7ccccc7)cc6)nc(-c6ccccc6)n5)cc4)c3)cccc21] | −1.80 | 1.77 | −5.74 | 3.9'4 | 3.62 | 2.78 |
| N-15 this compound is used in the second ETL | 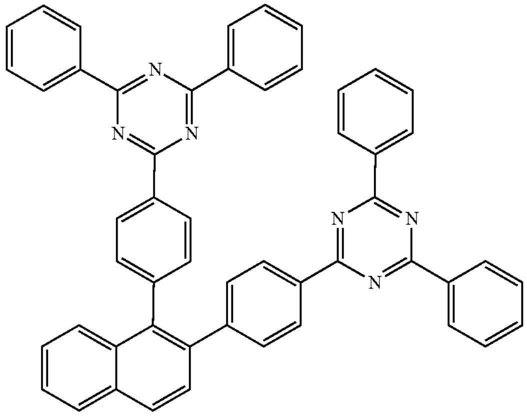 [SMILES: c1ccc(-c2nc(-c3ccccc3)nc(-c3ccc(-c4ccc5ccccc5c4-c4ccc(-c5nc(-c6ccccc6)nc(-c6ccccc6)n5)cc4)cc3)n2)cc1] | −1.92 | 0.35 | −5.73 | 3.81 | — | 2.54 |

General Procedure for Fabrication of OLEDs

For the examples according to the invention and comparative examples in Table IX, a glass substrate with an anode layer comprising a first anode sub-layer of 10 nm ITO, a second anode sub-layer of 120 nm Ag and a third anode sub-layer of 8 nm ITO was cut to a size of 100 mm×100 mm×0.7 mm, ultrasonically washed with water for 60 minutes and then with isopropanol for 20 minutes. The liquid film was removed in a nitrogen stream, followed by plasma treatment, see Table 2, to prepare the anode layer. The plasma treatment was performed in an atmosphere comprising 97.6 vol.-% nitrogen and 2.4 vol.-% oxygen.

Then N-([1,1'-biphenyl]-4-yl)-9,9-dimethyl-N-(4-(9-phenyl-9H-carbazol-3-yl)phenyl)-9H-fluoren-2-amine (V3) as first hole transport matrix compound (HTMC1) was vacuum deposited with 2 vol % of a first organic p-dopant (OPD1/G1) to form a hole injection layer (pHIL) having a thickness 10 nm according to Table IX.

Then N-([1,1'-biphenyl]-4-yl)-9,9-dimethyl-N-(4-(9-phenyl-9H-carbazol-3-yl)phenyl)-9H-fluoren-2-amine (V3) was vacuum deposited, to form a first hole transport layer having a thickness of 29 nm.

Then N,N-di([1,1'-biphenyl]-4-yl)-3'-(9H-carbazol-9-yl)-[1,1'-biphenyl]-4-amine (V19) was vacuum deposited on the HTL, to form an electron blocking layer (EBL) having a thickness of 5 nm.

Then, a first emission layer (EML1) having a thickness of 19 nm is formed on the EBL1 by co-depositing 99 vol.-% Dibenzofuran, 7-(phenyl-2,3,4,5,6-d)-1-[10-(phenyl-2,3,4,5,6-d)-9-anthracenyl] [2457172-82-4] as EML host and 1 vol.-% 5H,9H-[1]Benzothieno[2',3': 5,6][1,4]azaborino[2,3,4-kl]phenazaborine, 2,7,11-tris(1,1-dimethylethyl)-5,9-bis[4-(1,1-dimethylethyl)phenyl] [2482607-57-6] as blue dopant.

Then, the first electron transporting layer (ETL1) having a thickness of 15 nm is formed on first emission layer by depositing a compound ETM according Table IX.

Then a first n-type charge generation layer (n-CGL1) having a thickness of 8 nm is formed on the first electron transport layer (ETL1) by co-depositing 98 vol % of an electron transport compound (ETM of n-CGL) according to Table VIII and 2 vol % Yb.

Then a first p-type charge generation layer (p-CGL1) having a thickness of 10 nm is formed on the first n-type CGL by co-depositing 90 vol.-% of N-(9,9-diphenyl-9H-fluoren-2-yl)-N,9-diphenyl-9H-carbazol-2-amine (V18) as second hole transport matrix compound (HTMC2) with 10 vol.-% of a second organic p-dopant (OPD2).

Then a second hole transport layer having a thickness of 45 nm is formed on the first p-type CGL by depositing N-(9,9-diphenyl-9H-fluoren-2-yl)-N,9-diphenyl-9H-carbazol-2-amine (V18).

Then a second electron blocking layer having a thickness of 5 nm is formed on the second hole transport layer by depositing N,N-di([1,1'-biphenyl]-4-yl)-3'-(9H-carbazol-9-yl)-[1,1'-biphenyl]-4-amine (V19).

Then, a second emission layer (EML2) having a thickness of 19 nm is formed on the EBL1 by co-depositing 99 vol.-% Dibenzofuran, 7-(phenyl-2,3,4,5,6-d)-1-[10-(phenyl-2,3,4,5,6-d)-9-anthracenyl] [2457172-82-4] as EML host and 1 vol.-% 5H,9H-[1]Benzothieno[2',3': 5,6][1,4]azaborino[2,3,4-kl]phenazaborine, 2,7,11-tris(1,1-dimethylethyl)-5,9-bis[4-(1,1-dimethylethyl)phenyl] [2482607-57-6] as blue dopant.

Then, a first hole blocking layer (HBL1) having a thickness of 5 nm is formed on the EML2 by depositing compound 4-([1,1'-biphenyl]-4-yl)-6-(3'-(9,9-dimethyl-9H-fluoren-4-yl)-[1,1'-biphenyl]-4-yl)-2-phenylpyrimidine (N-14).

Then, a second electron transport layer (ETL2) having a thickness of 31 nm is formed on the HBL by co-depositing compound 6,6'-(naphthalene-1,2-diylbis(4,1-phenylene))bis(2,4-diphenyl-1,3,5-triazine) (N-15) and LiQ in a ratio of 50:50 wt.-%.

Then Yb was evaporated at a rate of 0.01 to 1 Å/s at 10-7 mbar to form an electron injection layer (EIL) with a thickness of 2 nm on the electron transporting layer.

Ag/Mg (1.8 wt %) is evaporated at a rate of 0.01 to 1 Å/s at 10-7 mbar to form a cathode with a thickness of 13 nm.

Then, N-({[1,1-'biphenyl]-4-yl)-9,9,dimethyl-N-(4-(9-phenyl-9H-carbazol-3-yl)phenyl)-9H-fluoren-2-amine} was vacuum deposited on the cathode layer to form a capping layer with a thickness of 75 nm.

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/$m^2$ using an Instrument Systems CAS-140CT array spectrometer (calibrated by Deutsche Akkreditierungsstelle (DAkkS)) for each of the voltage values. The cd/A efficiency at 15 mA/$cm^2$ is determined by interpolating the luminance-voltage and current-voltage characteristics, respectively.

In bottom emission devices, the emission is predominately Lambertian and quantified in percent external quantum efficiency (EQE). To determine the efficiency EQE in % the light output of the device is measured using a calibrated photodiode at 15 mA/$cm^2$.

In top emission devices, the emission is forward directed, non-Lambertian and also highly dependent on the mirco-cavity. Therefore, the efficiency EQE will be higher compared to bottom emission devices. To determine the efficiency EQE in % the light output of the device is measured using a calibrated photodiode at 15 mA/$cm^2$.

Lifetime LT of the device is measured at ambient conditions (20° C.) and 30 mA/$cm^2$, using a Keithley 2400 source meter, and recorded in hours.

The brightness of the device is measured using a calibrated photo diode. The lifetime LT is defined as the time till the brightness of the device is reduced to 97% of its initial value.

The increase in operating voltage AU is used as a measure of the operational voltage stability of the device. This increase is determined during the LT measurement and by subtracting the operating voltage after 1 hour after the start of operation of the device from the operating voltage after 100 hours.

$$\Delta U=[U100\ h)-U(1h)].$$

The smaller the value of AU the better is the operating voltage stability.

Technical Effect of the Invention

Compounds for the First n-CGL

TABLE VIII

HATCN

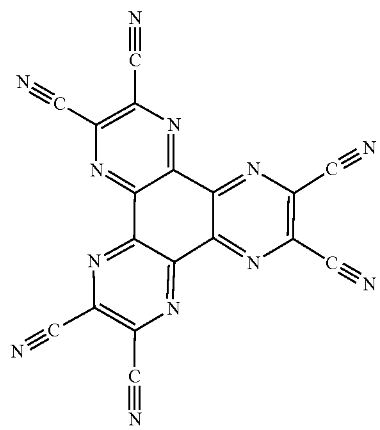 [SMILES: N#Cc1nc2c3nc(C#N)c(C#N)nc3c3nc(C#N)c(C#N)nc3c2nc1C#N]

TABLE VIII-continued
NP-1
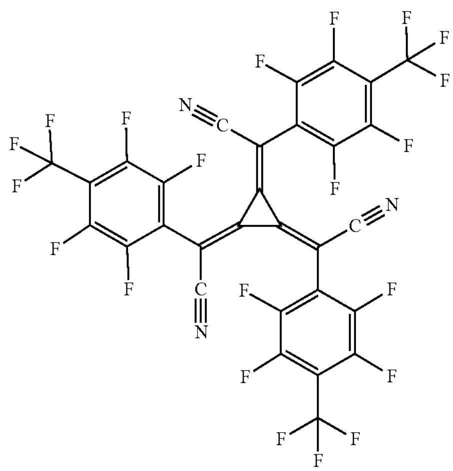 [SMILES: N#CC(=C1C(=C(C#N)c2c(F)c(F)c(C(F)(F)F)c(F)c2F)C1=C(C#N)c1c(F)c(F)c(C(F)(F)F)c(F)c1F)c1c(F)c(F)c(C(F)(F)F)c(F)c1F]
NP-2/G1
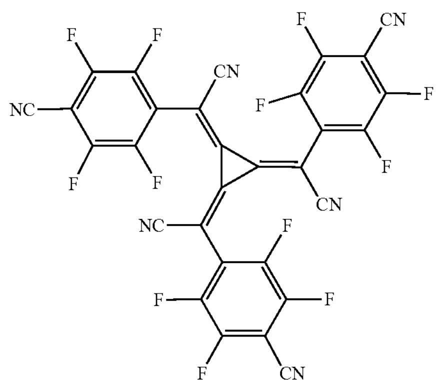 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]
NP-3
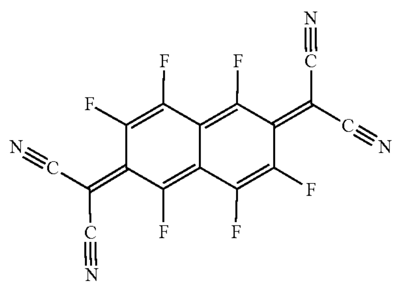 [SMILES: N#CC(C#N)=c1c(F)c(F)c2c(F)c(=C(C#N)C#N)c(F)c(F)c2c1F]
NP-4/G3
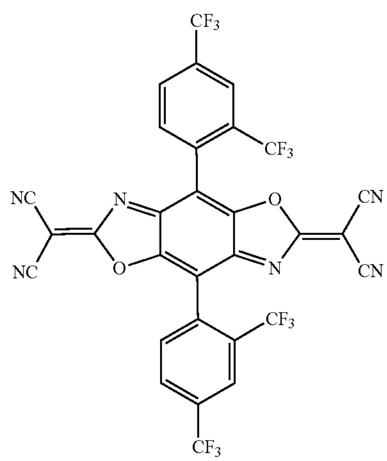 [SMILES: N#CC(C#N)=c1nc2c(-c3ccc(C(F)(F)F)cc3C(F)(F)F)c3oc(=C(C#N)C#N)nc3c(-c3ccc(C(F)(F)F)cc3C(F)(F)F)c2o1]
TABLE VIII-continued
NP-5/G2
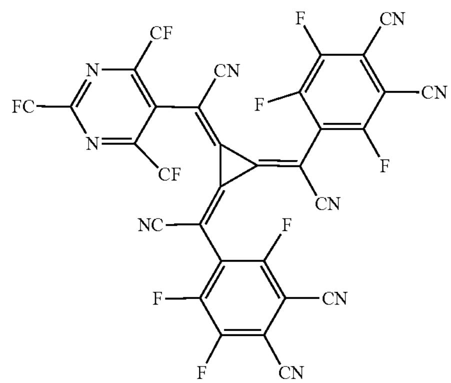
NP-6/G4
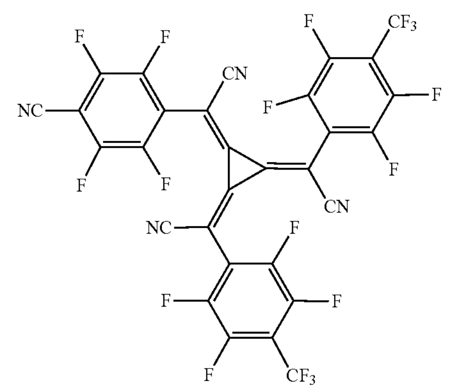 [SMILES: N#C/C(=C1\C(=C(\C#N)c2c(F)c(F)c(C(F)(F)F)c(F)c2F)\C1=C(\C#N)c1c(F)c(F)c(C(F)(F)F)c(F)c1F)c1c(F)c(F)c(C#N)c(F)c1F]
NP-7/G5
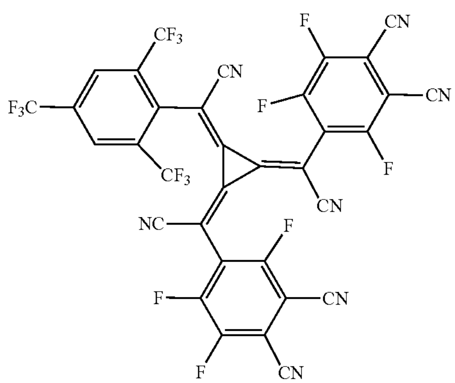 [SMILES: N#C/C(=C1\C(=C(\C#N)c2c(F)c(F)c(C#N)c(C#N)c2F)\C1=C(\C#N)c1c(F)c(F)c(C#N)c(C#N)c1F)c1c(C(F)(F)F)cc(C(F)(F)F)cc1C(F)(F)F]
NP-8/G24
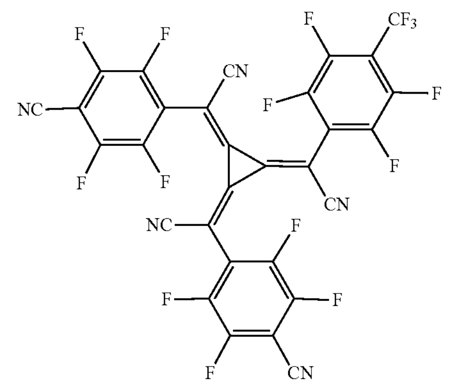

TABLE VIII-continued

| | |
|---|---|
| NP-9/G6 | 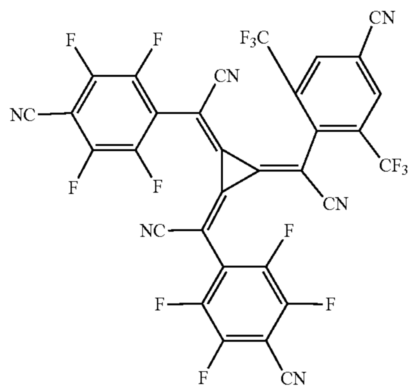 [SMILES: N#C/C(=C1\C(=C(\C#N)c2c(F)c(F)c(C#N)c(F)c2F)\C1=C(\C#N)c1c(F)c(F)c(C#N)c(F)c1F)c1c(C(F)(F)F)cc(C#N)cc1C(F)(F)F] |
| NP-17/G25 | 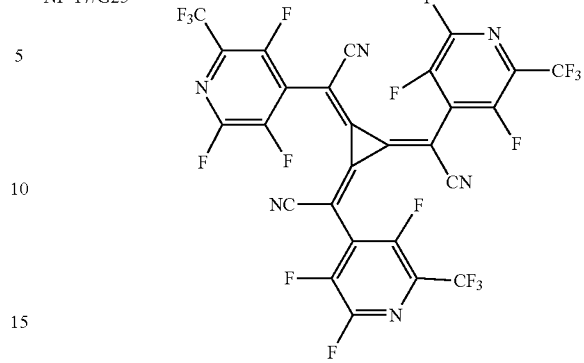 |

TABLE IX

| | HIL* | ETL | Additive in ETL | n-CGL** | p-CGL*** | EIL | CIEy | Voltage at 15 mA/cm$^2$ [V] | Ceff at 15 mA/cm$^2$ [cd/A] | EQE at 15 mA/cm2 [%] | CEff/CIEy at 15 mA/cm$^2$ [cd/A] | LT97 at 30 mA/cm$^2$ [h] | Vrise (1–100 h) at 30 mA/cm$^2$ [V] |
|---|---|---|---|---|---|---|---|---|---|---|---|---|---|
| Comp. 1 | NP-1 | N-8 | — | N-10 | NP-1 | Yb | 0.055 | 7.19 | 17.0 | 31.4 | 314 | 46 | 0.33 |
| Comp. 2 | CNHAT | N-8 | — | N-10 | CNHAT | Yb | 0.055 | 8.31 | 13.7 | 25.3 | 249 | 33 | 0.05 |
| Comp. 3 | CNHAT | N-8 | — | N-10 | NP-1 | Yb | 0.055 | 7.19 | 17.1 | 31.5 | 314 | 28 | 0.35 |
| Comp. 4 | NP-2 | N-8 | — | N-10 | NP-1 | Yb | 0.054 | 7.17 | 16.8 | 31.2 | 313 | 44 | 0.30 |
| Comp. 5 | NP-2 | BPhen | — | N-10 | NP-6 | Yb | 0.054 | 9.18 | 12.1 | 22.5 | 224 | 2 | 2.06 |
| Comp. 6 | NP-2 | N-8 | — | N-10 | NP-6 | LiQ | 0.055 | 7.10 | 17.0 | 30.6 | 301 | 48 | 0.27 |
| Comp. 7 | NP-2 | N-8 | LiQ(50%) | N-10 | NP-6 | Yb | 0.056 | 7.03 | 16.9 | 30.3 | 298 | 38 | 0.29 |
| Inv. 1 | NP-2 | N-8 | — | N-10 | NP-6 | Yb | 0.055 | 7.05 | 16.8 | 30.6 | 304 | 47 | 0.26 |
| Inv. | NP-2 | N-2 | — | N-10 | NP-8 | Yb | 0.055 | 6.52 | 16.2 | 29.9 | 297 | 95 | 0.08 |
| Inv. | NP-2 | N-2 | — | N-10 | NP-9 | Yb | 0.055 | 6.60 | 16.3 | 30.0 | 298 | 92 | 0.08 |
| Inv. | NP-2 | N-2 | — | N-10 | NP-6 | Yb | 0.055 | 6.59 | 16.2 | 30.1 | 300 | 96 | 0.08 |
| Inv. | NP-5 | N-2 | — | N-10 | NP-2 | Yb | 0.054 | 6.45 | 16.1 | 29.9 | 299 | 97 | 0.07 |
| Inv. | NP-5 | N-2 | — | N-12 | NP-2 | Yb | 0.054 | 6.42 | 16.1 | 29.9 | 298 | 96 | 0.08 |
| Inv. | NP-5 | N-2 | — | N-13 | NP-2 | Yb | 0.054 | 6.48 | 16.1 | 30.0 | 300 | 96 | 0.07 |
| Inv. | NP-5 | N-2 | — | N-11 | NP-2 | Yb | 0.054 | 6.37 | 15.7 | 29.3 | 293 | 97 | 0.05 |
| Inv. | NP-5 | N-2 | — | N-2 | NP-2 | Yb | 0.056 | 6.50 | 16.3 | 29.6 | 292 | 96 | 0.07 |
| Inv. | NP-5 | N-7 | — | N-10 | NP-2 | Yb | 0.055 | 6.48 | 17.0 | 31.3 | 312 | 90 | 0.14 |
| Inv. | NP-5 | N-8 | — | N-10 | NP-2 | Yb | 0.058 | 6.91 | 17.2 | 30.8 | 302 | 47 | 0.24 |
| Inv. | NP-5 | N-3 | — | N-10 | NP-2 | Yb | 0.055 | 6.56 | 17.2 | 31.6 | 313 | 70 | 0.20 |
| Inv. | NP-5 | N-4 | — | N-10 | NP-2 | Yb | 0.055 | 6.51 | 16.9 | 31.1 | 309 | 76 | 0.20 |
| Inv. | NP-5 | N-5:N-6 | — | N-10 | NP-2 | Yb | 0.055 | 6.64 | 15.9 | 29.5 | 294 | 107 | 0.05 |
| Inv. | NP-17 | N-2 | — | N-10 | NP-7 | Yb | 0.053 | 6.49 | 16.2 | 30.4 | 306 | 93 | 0.07 |
| Inv. | NP-5 | N-2 | — | N-10 | NP-7 | Yb | 0.054 | 6.48 | 16.2 | 30.4 | 305 | 92 | 0.08 |
| Inv. | NP-4 | N-2 | — | N-10 | NP-7 | Yb | 0.054 | 6.49 | 16.2 | 30.1 | 300 | 92 | 0.08 |

8-hydroxyquinolinolato-lithium complex (LiQ; also named 8-hydroxyquinolinolato-lithium or lithium quinolin-8-olate) has the following structure:

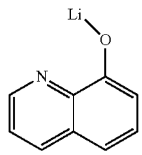

HIL = hole injection layer;
ETL = electron transport layer;
n-CGL = n-type charge generation layer;
p-CGL = p-type charge generation layer;
EIL= electron injection layer
*HIL: 2 vol % t % of dopant; first hole transport matrix compound (V3);
**n-CGL: 2 vol % of Yb.
***p-CGL: 10 vol % of dopant; in case of NP-9 12 vol %; second hole transport matrix compound V18-

The use of a p-dopant in the HIL comprising at least 3 CN groups and a LUMO energy level of less than −5.10 eV and p-CGL comprising a p-dopant comprising at least 4 CN groups and a LUMO energy level of less than −4.80 eV (inventive device 1) exhibits a lower operational voltage and lower operational voltage over time compared to a device which contains a dopant in the HIL larger than −5.10 eV and a dopant in p-CGL having less than 3 CN groups in the p-CGL (comparative device 1 and 3).

The use of a p-dopant in the HIL comprising at least 3 CN groups and a LUMO energy level of less than −5.10 eV and p-CGL comprising a p-dopant comprising at least 4 CN groups and a LUMO energy level of less than −4.80 eV (inventive device 1) exhibits a lower operational voltage and lower operational voltage over time compared to a device which contains a dopant in the HIL larger than −5.10 eV and a dopant in p-CGL having LUMO energy level larger than −4.80 eV (comparative device 2).

The use of a p-dopant in the HIL comprising at least 3 CN groups and a LUMO energy level of less than −5.10 eV and p-CGL comprising a p-dopant comprising at least 4 CN groups and a LUMO energy level of less than −4.80 eV (inventive device 1) exhibits a lower operational voltage and lower operational voltage over time compared to a device which contains a dopant in the HIL less than −5.10 eV and comprising at least 3 CN groups and a dopant in p-CGL comprising only 3 CN groups (comparative device 4).

The use of an electron transport layer having an electron transport compounds containing two nitrogen ring atoms in a six-member heterocyclic ring (inventive device 1) exhibits a lower operational voltage, lower operational voltage over time, a higher current efficiency, a higher external quantum efficiency, and a higher life time than the comparative device 5, wherein the electron transport layer have an electron transport compound containing only one nitrogen ring atom in a six-member heterocyclic ring.

The use of Yb in EIL (inventive device 1) exhibits a lower operational voltage and lower operational voltage over time than a comparative device 6 comprising LiQ (8-hydroxyquinolinolato-lithium) in the EIL.

The use of electron transport layer free of LiQ (8-hydroxyquinolinolato-lithium) (inventive device 1) exhibits a higher life time and lower operational voltage over time than a comparative device 7 comprising an electron transport containing LiQ (8-hydroxyquinolinolato-lithium) (comparative example 7).

It can be seen that the combination of the feature exhibit a remarkable improvement of the operational voltage and the operational voltage over time.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. An organic electroluminescent device comprising an anode layer, a cathode layer, a first emission layer, a second emission layer, a hole injection layer, an electron injection layer, a first electron transport layer, and a first charge generation layer, wherein the first charge generation layer is arranged between the first emission layer and the second emission layer, the electron injection layer is arranged adjacent to the cathode layer;

the first charge generation layer comprises a first n-type charge generation layer and a first p-type charge generation layer, the first n-type charge generation layer is arranged closer to the anode layer than the first p-type charge generation layer, the first electron transport layer is arranged between the first emission layer and the first charge generation layer, the first electron transport layer is arranged in direct contact with the first n-type charge generation layer, wherein the hole injection layer comprises a first organic p-dopant and first hole transport matrix compound, wherein the first organic p-dopant comprises at least three CN groups, and wherein the first organic p-dopant has a molecular weight of ≥400 g/mol, and wherein the first organic p-dopant has a LUMO energy level of less than −5.10 eV;

the first electron transport layer comprises an electron transport compound comprising a six-member heteroaromatic ring comprising at least two nitrogen ring atoms and wherein the first electron transport layer is:

essentially free of a compound selected from the group comprising a 8-hydroxyquinolinolato-lithium complex; or comprises ≥0 wt.-% to ≤1 wt.-% of a compound selected from the group comprising a 8-hydroxyquinolinolato-lithium complex, wherein the wt.-% of the components is based on the total weight of the first electron transport layer;

the first n-type charge generation layer comprises an electron transport matrix compound comprising a heteroaromatic ring comprising at least one nitrogen ring atom, and a metal dopant;

the first p-type charge generation layer comprises a second organic p-dopant and a second hole transport matrix compound;

wherein the second organic p-dopant comprises at least four CN groups, and wherein the second organic p-dopant has a molecular weight of ≥400 g/mol and a LUMO energy level of less than −4.80 eV;

wherein the first hole transport matrix compound and the second hole transport matrix compound are selected the same or different from the group comprising an arylamine compound, diarylamine compound, triarylamine compound, a compound of formula (Ia) or a compound of formula (Ib):

(Ia)

(Ib)

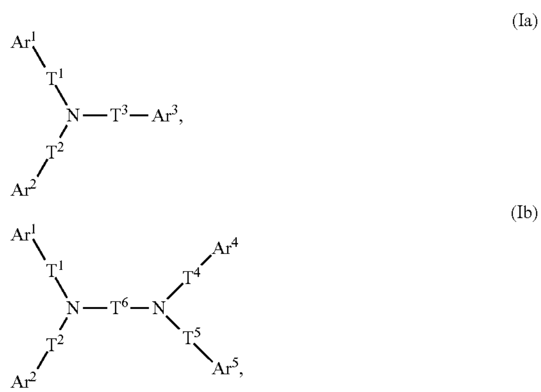

wherein:

$T^1$, $T^2$, $T^3$, $T^4$ and $T^5$ are independently selected from a single bond, phenylene, biphenylene, terphenylene or naphthenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C(=O)R'^1$, CN, $Si(R'^1)_3$, $P(=O)(R'^1)_2$, $OR'^1$, $S(=O)R'^1$, $S(=O)_2R'^1$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R'^1$ is selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl;

wherein the LUMO energy level of the first organic p-dopant is further away from vacuum level than the LUMO energy level of the second organic p-dopant; and wherein the electron injection layer comprises Ytterbium.

2. The organic electroluminescent device according to claim 1, wherein the LUMO energy level of the first organic p-dopant and the LUMO energy level of the second organic p-dopant are calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase.

3. The organic electroluminescent device according to claim 1, wherein the first electron transport layer is essentially free of a compound selected from the group comprising a 8-hydroxyquinolinolato-lithium complex, a metal complex or a metal salt.

4. The organic electroluminescent device according to claim 1, wherein the first electron transport layer comprises ≥0 wt.-% to ≤1 wt.-% a compound selected from the group comprising a metal complex, a metal salt, a lithium complex, lithium salt, a lithium quinolate (LiQ) or a 8-hydroxyquinolinolato-lithium complex; wherein the wt.-% of the components is based on the total weight of the first electron transport layer.

5. The organic electroluminescent device according to claim 1, wherein the electron transport matrix compound of the n-type charge generation layer is selected from a compound comprising from the group of formula (IIa) or formula (IIb):

(IIa)

(IIb)

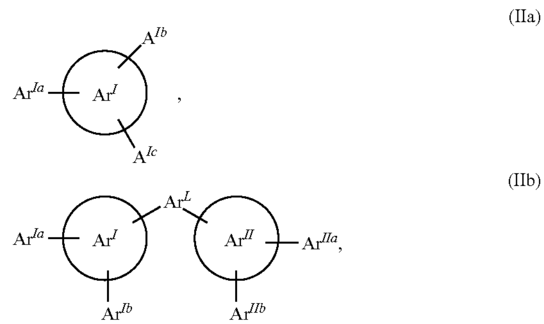

wherein $Ar^I$ is a substituted or unsubstituted $C_3$ to $C_{40}$ heteroaromatic ring comprising at least one nitrogen atom, $Ar^{II}$ is a substituted or unsubstituted $C_3$ to $C_{40}$ heteroaromatic ring comprising at least one nitrogen atom, wherein the substituents on $Ar^{I}$ and $Ar^{II}$ are, identically or differently on each occurrence, D, a monovalent aromatic or heteroaromatic ring system having 5 to 60 aromatic ring atoms, a straight-chain $C_1$ to $C_{20}$ alkyl, a straight-chain $C_1$ to $C_{20}$ alkenyl, a straight-chain $C_1$ to $C_{20}$ alkynyl, a branched $C_3$ to $C_{20}$ alkyl, a branched $C_3$ to $C_{20}$ alkenyl, a branched $C_3$ to $C_{20}$ alkynyl, CN, $NO_2$, F, which may in each case be substituted by one or more radicals $R^a$, a monovalent aromatic or heteroaromatic ring system having 5 to 60 aromatic ring atoms which may in each case be substituted by one or more radicals $R^a$;

wherein $Ar^{Ia}$, $Ar^{Ib}$ $Ar^{Ic}$, $Ar^{IIa}$ and $Ar^{IIb}$ are, identically or differently on each occurrence, H, D, a monovalent aromatic or heteroaromatic ring system having 5 to 60 aromatic ring atoms, which may in each case be substituted by one or more radicals $R^a$;

wherein at least one of $Ar^{Ia}$, $Ar^{Ib}$, $Ar^{Ic}$ in formula (Ha) and in case of formula (IIb) at least one of $Ar^{Ia}$, $Ar^{Ib}$, $Ar^{IIa}$ and $Ar^{IIb}$ is independently selected from a monovalent aromatic or heteroaromatic ring system having 5 to 60 aromatic ring atoms, which may in each case be substituted by one or more radicals $R^a$;

wherein $Ar^{L}$ is a divalent aromatic or heteroaromatic ring system having 5 to 60 aromatic ring atoms, which is optionally substituted by one or more radicals $R^a$, $R^a$ is selected the same or different from the group comprising H, D, F, Cl, Br, I, CHO, $N(Rb)_2$, $N(Ar^{1s})_2$, $B(Ar^{1s})_2$, $C(=O)Ar^{1s}$, $P(=Y)(R^c)_2$, $S(=O)Ar^{1s}$, $S(=O)_2Ar^{1s}$, $CR^b=CR^bAr^{1s}$, CN, $NO_2$, $Si(R^b)_3$, $B(OR^b)_2$, $B(R^b)_2$, $B(N(R^b)_2)_2$, $OSO_2R^b$, a substituted or unsubstituted straight-chain $C_1$ to $C_{20}$ alkyl, a substituted or unsubstituted straight-chain $C_1$ to $C_{20}$ alkenyl, a substituted or unsubstituted straight-chain $C_1$ to $C_{20}$ alkynyl, a substituted or unsubstituted straight-chain $C_1$ to $C_{20}$ alkoxy, a substituted or unsubstituted straight-chain $C_1$ to $C_{20}$ thioalkoxy, substituted or unsubstituted branched $C_3$ to $C_{20}$ alkyl, a substituted or unsubstituted branched $C_3$ to $C_{20}$ alkenyl, a substituted or unsubstituted branched $C_3$ to $C_{20}$ alkynyl, a substituted or unsubstituted $C_3$ to $C_{20}$ alkoxy or a substituted or unsubstituted $C_3$ to $C_{20}$ thioalkoxy, substituted or unsubstituted cyclic $C_3$ to $C_{40}$ alkyl, substituted or unsubstituted cyclic $C_3$ to $C_{40}$ alkenyl, substituted or unsubstituted cyclic $C_3$ to $C_{40}$ alkynyl, substituted or unsubstituted cyclic $C_3$ to $C_{40}$ alkoxy or substituted or unsubstituted cyclic $C_3$ to $C_{40}$ thioalkoxy substituted or unsubstituted heterocyclic $C_3$ to $C_{40}$ alkyl, substituted or unsubstituted heterocyclic $C_3$ to $C_{40}$ alkenyl, substituted or unsubstituted heterocyclic $C_3$ to $C_{40}$ alkynyl, substituted or unsubstituted heterocyclic $C_3$ to $C_{40}$ alkoxy or substituted or unsubstituted heterocyclic $C_3$ to $C_{40}$ thioalkoxy;

wherein the substituent of $R^a$ is selected from the group comprising Rb, D, F, Cl, Br, I, CN or $NO_2$, an aromatic or heteroaromatic ring system having 5 to 60 aromatic ring atoms, an aromatic or heteroaromatic ring system having 5 to 60 aromatic ring atoms substituted by one or more radicals Rb, an aryloxy or heteroaryloxy group having 5 to 60 aromatic ring atoms, an aryloxy or heteroaryloxy group having 5 to 60 aromatic ring atoms which is substituted by one or more radicals Rb, two or more adjacent substituents $R^a$ form a mono- or polycyclic, aliphatic or aromatic ring system with one another, or one or more non-adjacent $CH_2$ groups of $R^a$ is replaced by $R^bC=CR^b$, C≡C, $Si(R^b)_2$, $Ge(R^b)_2$, $Sn(R^b)_2$, C=O, C=S, C=Se, $C=NR^b$, $P(=O)(R^b)$, SO, $SO_2$, $NR^b$, O, S or $CONR^b$, or any combination thereof;

wherein $Ar^{1s}$ is selected the same or different from the group comprising an aromatic or heteroaromatic ring system having 5 to 30 aromatic ring atoms, an aromatic or heteroaromatic ring system having 5 to 30 aromatic ring atoms which is substituted by one or more radicals $R^b$, or two radicals $Ar^{1s}$ which are bonded to the same nitrogen, phosphorus or boron atom can be linked to one another by a single bond or a bridge selected from $B(R^b)$, $C(R^b)_2$, $Si(R^b)_2$, C=O, $C=NR^b$, $C=C(R^b)_2$, O, S, S=O, $SO_2$, $N(R^b)$, $P(R^b)$ and $P(=Y)R^c$, or any combination thereof;

$R^b$ is selected the same or different from the group comprising H, D or a $C_1$ to $C_{20}$ aliphatic hydrocarbyl, a $C_1$ to $C_{20}$ aryl or $C_1$ to $C_{20}$ heteroaryl, a $C_1$ to $C_{20}$ aryl or $C_1$ to $C_{20}$ heteroaryl in which at least one H atoms is replaced by D or F, or two or more adjacent substituents $R^b$ form a mono- or polycyclic, aliphatic or aromatic ring system with one another, or any combination thereof;

Y is selected from O, S or Se;

$R^c$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, or any combination thereof.

6. The organic electroluminescent device according to claim 1, wherein the electron transport compound is selected from a compound of the group comprising formula (IIIa) or formula (IIIb):

(IIIa)

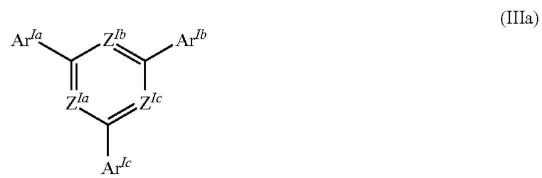

(IIIb)

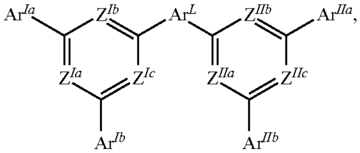

wherein $Z^{Ia}$ is selected from N or CH, $Z^{Ib}$ is selected from N or CH, $Z^{Ic}$ is selected from N or CH, $Z^{IIa}$ is selected from N or CH, $Z^{IIb}$ is selected from N or CH, and $Z^{IIc}$ is selected from N or CH, wherein in formula (IIIa) at least two of $Z^{Ia}$, $Z^{Ib}$ and $Z^{Ic}$ are selected from N, wherein in formula (IIIb) at least two of $Z^{Ia}$, $Z^{ib}$, $Z^{Ic}$, or at least two of $Z^{IIa}$, $Z^{IIb}$, and $Z^{IIc}$ are selected from N, wherein $Ar^{Ia}$, $Ar^{Ib}$, $Ar^{Ic}$, $Ar^{IIa}$ and $Ar^{IIb}$ are selected the same or different from the group comprising a monovalent aromatic or heteroaromatic ring system having 5 to 60 aromatic ring atoms, which may in each case be substituted by one or more radicals $R^a$;

wherein $Ar^L$ is a divalent aromatic or heteroaromatic ring system having 5 to 60 aromatic ring atoms, which is optionally substituted by one or more radicals $R^a$, $R^a$ is selected the same or different from the group comprising H, D, F, Cl, Br, I, CHO, $N(R^b)_2$, $N(Ar^{1s})_2$, $B(Ar^{1s})_2$, $C(=O)Ar^{1s}$, $P(=Y)(R^c)_2$, $S(=O)Ar^{1s}$, $S(=O)_2Ar^{1s}$, $CR^b=CR^bAr^{1s}$, CN, $NO_2$, $Si(R^b)_3$, $B(OR^b)_2$, $B(R^b)_2$, $B(N(R^b)_2)_2$, $OSO_2R^b$, a substituted or unsubstituted straight-chain $C_1$ to $C_{20}$ alkyl, a substituted or unsubstituted straight-chain $C_1$ to $C_{20}$ alkenyl, a substituted or unsubstituted straight-chain $C_1$ to $C_{20}$ alkynyl, a substituted or unsubstituted straight-chain $C_1$ to $C_{20}$ alkoxy, a substituted or unsubstituted straight-chain $C_1$ to $C_{20}$ thioalkoxy, substituted or unsubstituted branched $C_3$ to $C_{20}$ alkyl, a substituted or unsubstituted branched $C_3$ to $C_{20}$ alkenyl, a substituted or unsubstituted branched $C_3$ to $C_{20}$ alkynyl, a substituted or unsubstituted $C_3$ to $C_{20}$ alkoxy or a substituted or unsubstituted $C_3$ to $C_{20}$ thioalkoxy, substituted or unsubstituted cyclic $C_3$ to $C_{40}$ alkyl, substituted or unsubstituted cyclic $C_3$ to $C_{40}$ alkenyl, substituted or unsubstituted cyclic $C_3$ to $C_{40}$ alkynyl, substituted or unsubstituted cyclic $C_3$ to $C_{40}$ alkoxy or substituted or unsubstituted cyclic $C_3$ to $C_{40}$ thioalkoxy substituted or unsubstituted heterocyclic $C_3$ to $C_{40}$ alkyl, substituted or unsubstituted heterocyclic $C_3$ to $C_{40}$ alkenyl, substituted or unsubstituted heterocyclic $C_3$ to $C_{40}$ alkynyl, substituted or unsubstituted heterocyclic $C_3$ to $C_{40}$ alkoxy or substituted or unsubstituted heterocyclic $C_3$ to $C_{40}$ thioalkoxy;

wherein the substituent of $R^a$ is selected from the group comprising $R^b$, D, F, Cl, Br, I, CN or $NO_2$, an aromatic or heteroaromatic ring system having 5 to 60 aromatic ring atoms, an aromatic or heteroaromatic ring system having 5 to 60 aromatic ring atoms substituted by one or more radicals $R^b$, an aryloxy or heteroaryloxy group having 5 to 60 aromatic ring atoms, an aryloxy or heteroaryloxy group having 5 to 60 aromatic ring atoms which is substituted by one or more radicals $R^b$, two or more adjacent substituents $R^a$ form a mono- or polycyclic, aliphatic or aromatic ring system with one another, or one or more non-adjacent $CH_2$ groups of $R^a$ is replaced by $R^bC=CR^b$, C≡C, $Si(R^b)_2$, $Ge(R^b)_2$, $Sn(R^b)_2$, C=O, C=S, C=Se, $C=NR^b$, $P(=O)(R^b)$, SO, $SO_2$, $NR^b$, O, S or $CONR^b$, or any combination thereof;

wherein $Ar^{1s}$ is selected the same or different from the group comprising an aromatic or heteroaromatic ring system having 5 to 30 aromatic ring atoms, an aromatic or heteroaromatic ring system having 5 to 30 aromatic ring atoms which is substituted by one or more radicals $R^b$, or two radicals $Ar^{1s}$ which are bonded to the same nitrogen, phosphorus or boron atom can be linked to one another by a single bond or a bridge selected from $B(R^b)$, $C(R^b)_2$, $Si(R^b)_2$, C=O, $C=NR^b$, $C=C(R^b)_2$, O, S, S=O, $SO_2$, $N(R^b)$, $P(R^b)$ and $P(=Y)R^c$, or any combination thereof;

$R^b$ is selected the same or different from the group comprising H, D or a $C_1$ to $C_{20}$ aliphatic hydrocarbyl, a $C_1$ to $C_{20}$ aryl or $C_1$ to $C_{20}$ heteroaryl, a $C_1$ to $C_{20}$ aryl or $C_1$ to $C_{20}$ heteroaryl in which at least one H atoms is replaced by D or F, or two or more adjacent substituents $R^b$ form a mono- or polycyclic, aliphatic or aromatic ring system with one another, or any combination thereof;

Y is selected from O, S or Se;

$R^c$ is independently selected from $C_6$ to $C_{12}$ aryl, $C_3$ to $C_{12}$ heteroaryl, $C_1$ to $C_6$ alkyl, $C_1$ to $C_6$ alkoxy, partially or perfluorinated $C_1$ to $C_6$ alkyl, partially or perfluorinated $C_1$ to $C_6$ alkoxy, partially or perdeuterated $C_1$ to $C_6$ alkyl, partially or perdeuterated $C_1$ to $C_6$ alkoxy, or any combination thereof.

7. The organic electroluminescent device according to claim 1, wherein the electron transport compound is selected from the group comprising the compounds D1 to D9:

(D1)

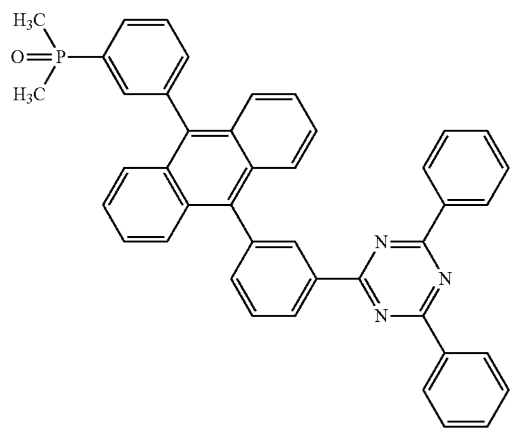

, (D2)

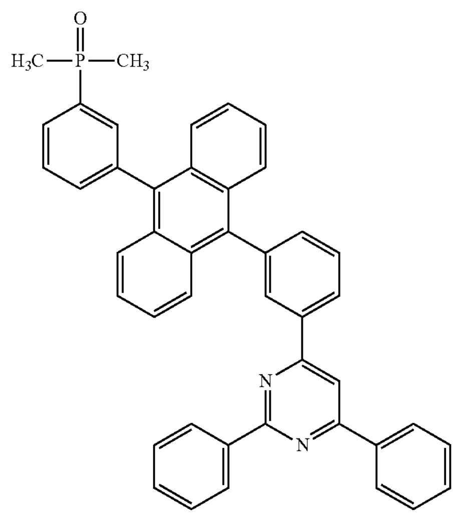

,

-continued
(D3)
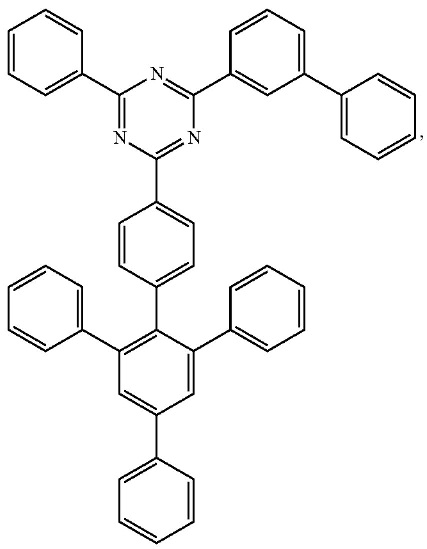
(D4)
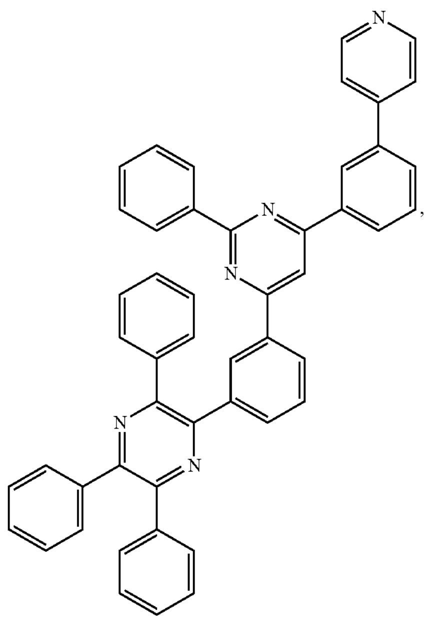
(D5)
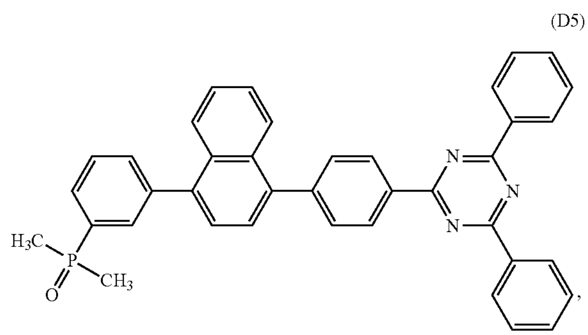
-continued
(D6)
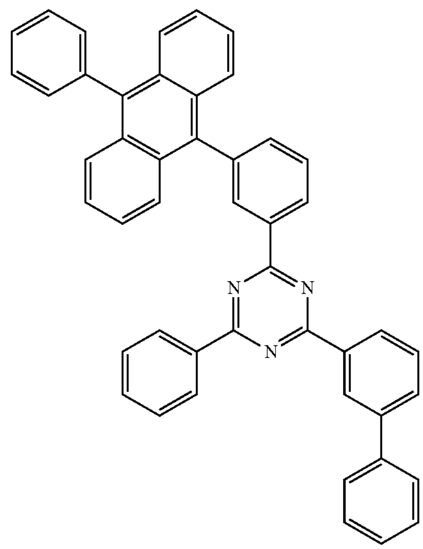
(D7)
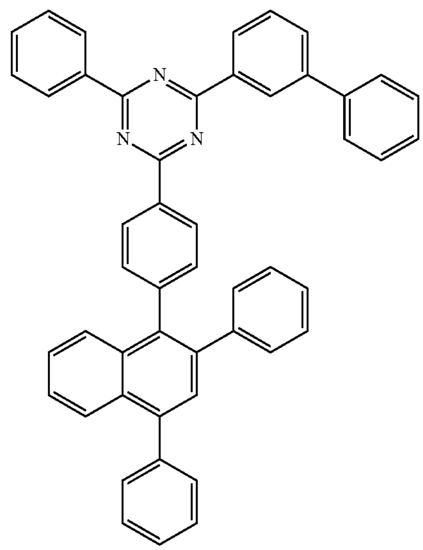
(D8)
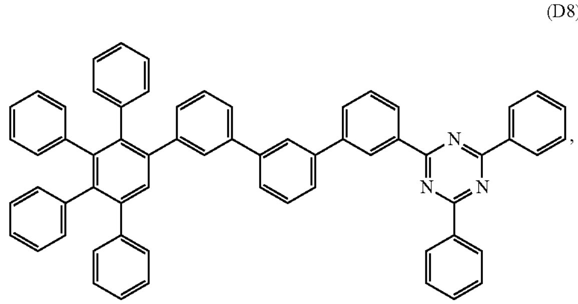

-continued (D9)

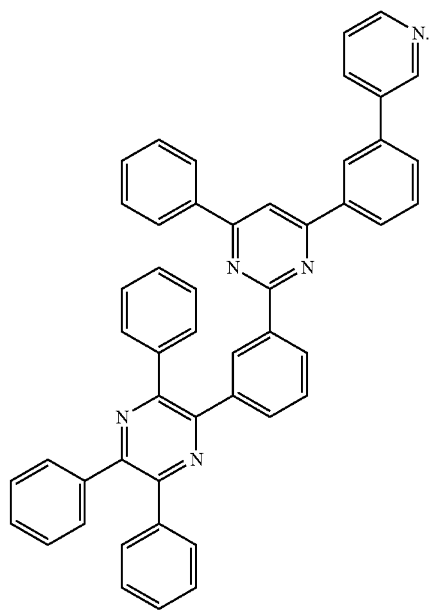

8. The organic electroluminescent device according to claim 1, wherein the metal dopant is selected from the group comprising a metal with an electronegativity of ≤1.4 eV by Pauling scale, a metal alloy comprising a metal with an electronegativity of ≤1.4 eV by Pauling scale, a metal selected from the group consisting of Li, Na, K, Rb, Cs, Mg, Ca, Sr, Ba, a rare earth metal or a metal alloy comprising a metal selected from the group consisting of Li, Na, K, Rb, Cs, Mg, Ca, Sr, Ba, and a rare earth metal.

9. The organic electroluminescent device according to claim 1, wherein the metal dopant of the n-type charge generation layer is selected from a rare earth metal, an alloy containing a rare earth metal or a combination thereof, Ytterbium or Ytterbium in the oxidation state 0.

10. The organic electroluminescent device according to claim 1, wherein the first organic p-dopant comprises at least ≥4 CN groups.

11. The organic electroluminescent device according to claim 1, wherein the first organic p-dopant comprises at least ≥5 to ≤8 CN groups.

12. The organic electroluminescent device according to claim 1, wherein the first organic p-dopant comprises independently of each other at least two groups selected from substituted $C_6$ to $C_{19}$ aryl group or substituted $C_3$ to $C_{12}$ heteroaryl group, wherein the one or more substituents of the substituted $C_6$ to $C_{19}$ aryl group or substituted $C_3$ to $C_{12}$ heteroaryl group are independently selected from halogen, F, CN, partially perfluorinated $C_1$ to $C_{12}$ alkyl, perfluorinated $C_1$ to $C_{12}$ alkyl, $CF_3$.

13. The organic electroluminescent device according to claim 1, wherein the second organic p-dopant comprises independently of each other at least two groups selected from substituted $C_6$ to $C_{19}$ aryl group or substituted $C_3$ to $C_{12}$ heteroaryl group, wherein the one or more substituents of the substituted $C_6$ to $C_{19}$ aryl group or substituted $C_3$ to $C_{12}$ heteroaryl group are independently selected from halogen, F, CN, partially perfluorinated $C_1$ to $C_{12}$ alkyl, perfluorinated $C_1$ to $C_{12}$ alkyl, $CF_3$.

14. The organic electroluminescent device according to claim 1, wherein the dopant selected from the group of a first organic p-dopant or a the second organic p-dopant, is selected from a compound of formula (IV):

(IV)

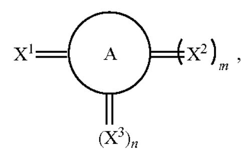

wherein n is an integer including 0, 1, 2, 3, 4, 5 or 6;

m is an integer selected from 0 or 1;

$X^1$, $X^2$ and $X^3$ are independently selected from O, S, $CR^{1a}R^{2a}$, $CR^{1b}R^{2b}$, $NR^{3a}$, $NR^{3b}$ or at least one of $X^1$, $X^2$, and $X^3$ form a fused ring with A, and wherein each $X^3$ is selected the same or different, $R^{1a}$, $R^{2a}$, $R^{1b}$, and $R^{2b}$ are independently selected from an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted aryl, substituted or unsubstituted heteroaryl, wherein the one or more substituents on $R^{1a}$, $R^{2a}$, $R^{1b}$, and $R^{2b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$R^{3a}$ and $R^{3b}$ is selected from an electron-withdrawing group, CN, partially fluorinated $C_1$ to $C_6$ alkyl, perfluorinated $C_1$ to $C_6$ alkyl, $CF_3$, substituted or unsubstituted $C_6$ to $C_{30}$ aryl, or substituted or unsubstituted $C_3$ to $C_{30}$ heteroaryl, wherein the one or more substituents on $R^{3a}$ and $R^{3b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

A is selected from substituted or unsubstituted $C_3$ to $C_{40}$ cyclohydrocarbon group, substituted or unsubstituted $C_3$ to $C_{40}$ cycloalkane group, substituted or unsubstituted $C_3$ to $C_{40}$ cycloalkane group containing one or more double-bonds, substituted or unsubstituted $C_3$ to $C_{40}$ cycloalkene group, substituted or unsubstituted $C_2$ to $C_{40}$ heterocycloalkane group, substituted or unsubstituted $C_2$ to $C_{40}$ heterocycloalkane group containing one or more double-bonds, substituted or unsubstituted $C_2$ to $C_{40}$ heterocycloalkene group, substituted or unsubstituted $C_6$ to $C_{40}$ aromatic group, substituted or unsubstituted $C_2$ to $C_{40}$ heteroaromatic group, wherein the one or more substituents on A are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, substituted or unsubstituted $C_2$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, $—NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

15. The organic electroluminescent device according to claim 14, wherein the compound of formula (IV) comprises at least two groups selected from substituted $C_6$ to $C_{19}$ aryl group or substituted $C_3$ to $C_{12}$ heteroaryl group, wherein each of the substituents of $C_6$ to $C_{19}$ aryl group or $C_3$ to $C_{12}$ heteroaryl group are independently of each other selected from halogen, F, CN, partially perfluorinated $C_1$ to $C_{12}$ alkyl, perfluorinated $C_1$ to $C_{12}$ alkyl, or $CF_3$.

16. The organic electroluminescent device according to claim 14, wherein A of formula (IV) is selected from a group of E1 to E72:

(E1)

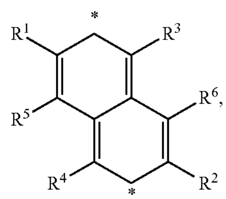

(E2)

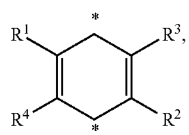

-continued (E3)

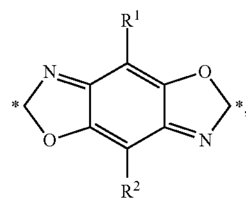

(E4)

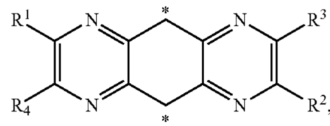

(E5)

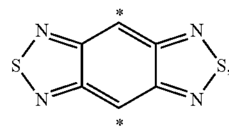

(E6)

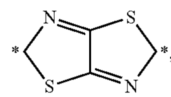

(E7)

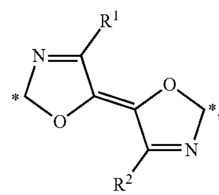

(E8)

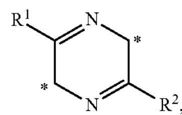

(E9)

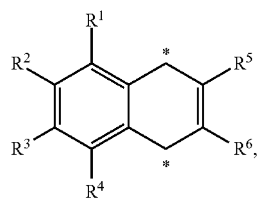

(E10)

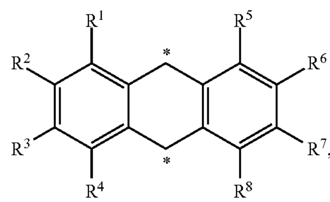

(E11)

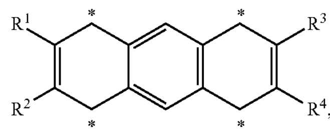

-continued
(E12)
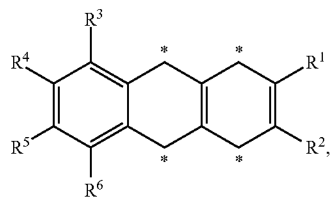
(E13)
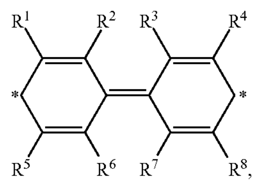
(E14)
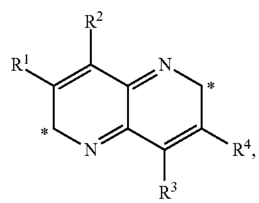
(E15)
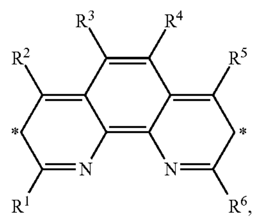
(E16)
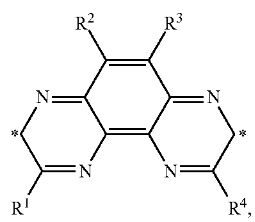
(E17)
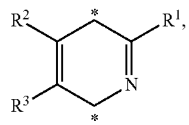
(E18)
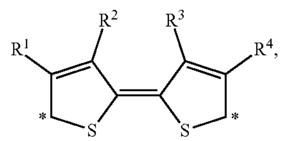
(E19)
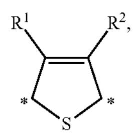
-continued
(E20)
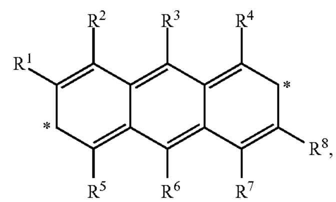
(E21)
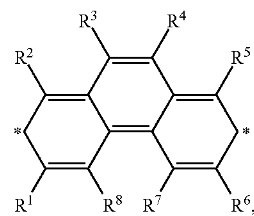
(E22)
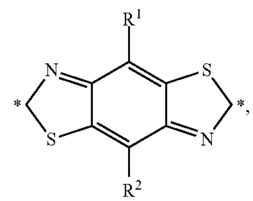
(E23)
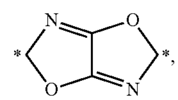
(E24)
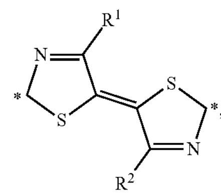
(E25)
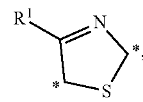
(E26)
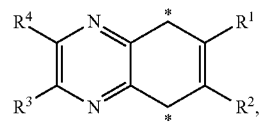
(E27)
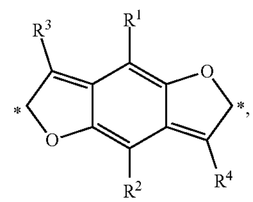
(E28)
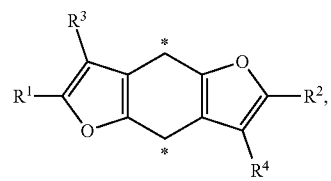

-continued
(E29)
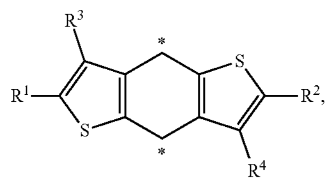
(E30)
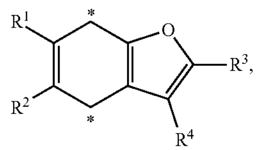
(E31)
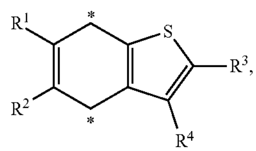
(E32)
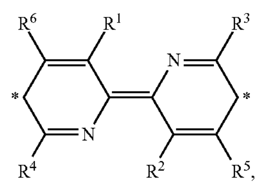
(E33)
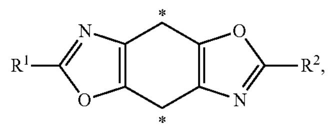
(E34)
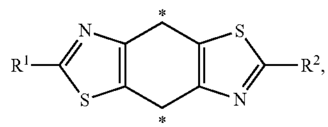
(E35)
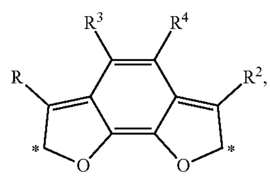
(E36)
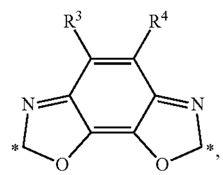
(E37)
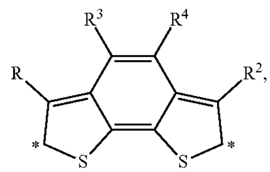
-continued
(E38)
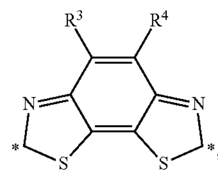
(E39)
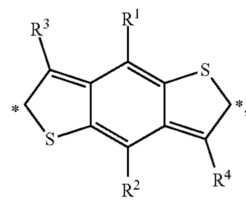
(E40)
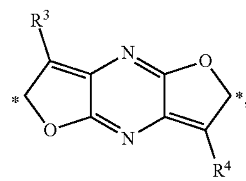
(E41)
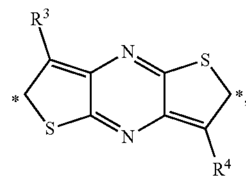
(E42)
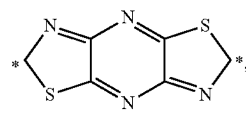
(E43)
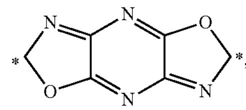
(E44)
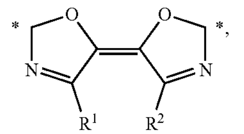
(E45)
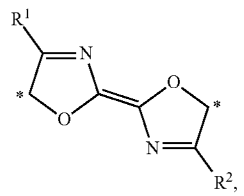
(E46)
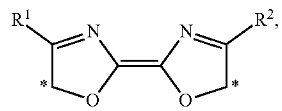
(E47)
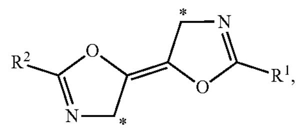

-continued
(E48)
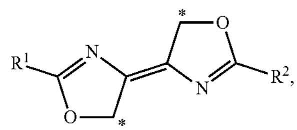
(E49)
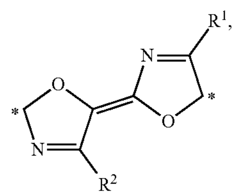
(E50)
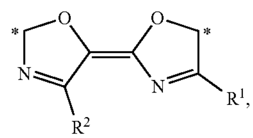
(E51)
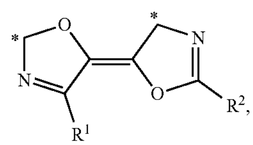
(E52)
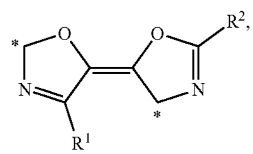
(E53)
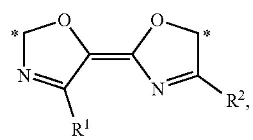
(E54)
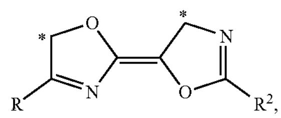
(E55)
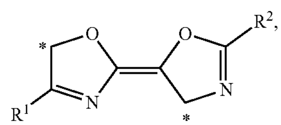
(E56)
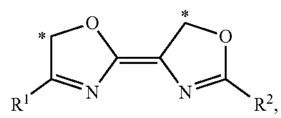
(E57)
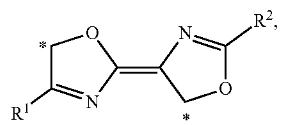
-continued
(E58)
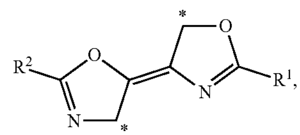
(E59)
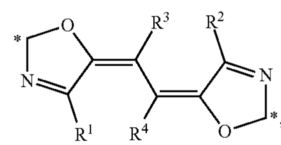
(E60)
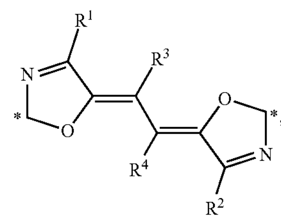
(E61)
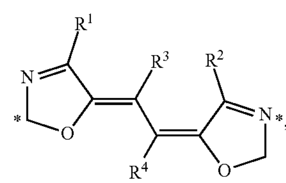
(E62)
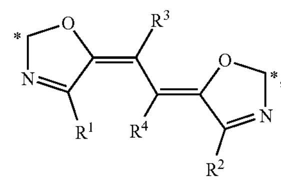
(E63)
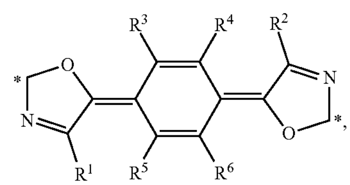
(E64)
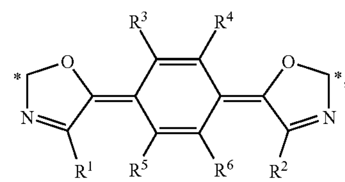
(E65)
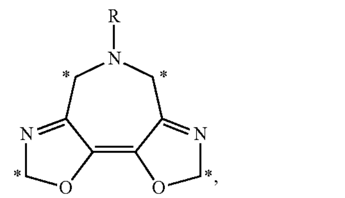
(E66)
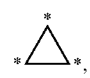

-continued (E67)

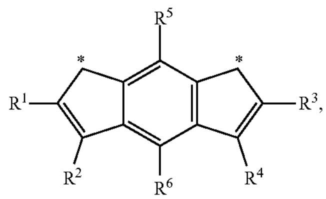

(E68)

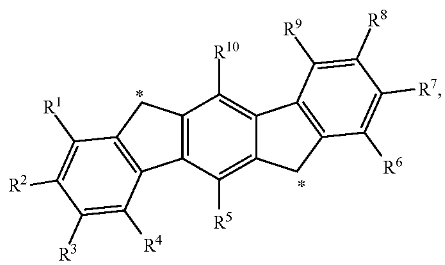

(E69)

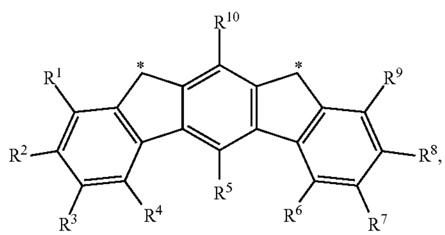

(E70)

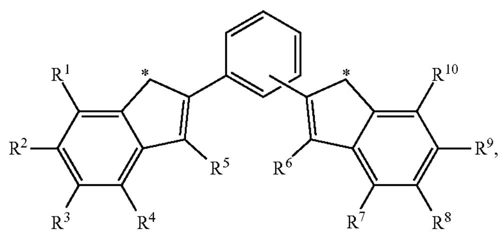

(E71)

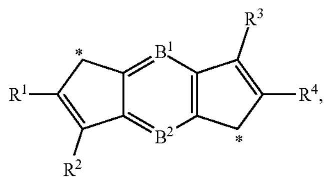

(E72)

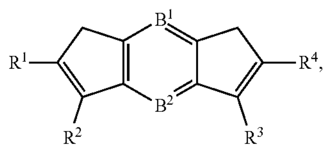

wherein the asterisk "*" denotes the binding position;

$R^1$, $R^2$, $R^3$, $R^4$, $R^5$, $R^6$, $R^7$ and $R^8$ are independently selected from H, D, halogen, Cl, F, substituted or unsubstituted $C_1$ to $C_6$ alkyl, partially fluorinated $C_1$ to $C_6$ alkyl, perfluorinated $C_1$ to $C_6$ alkyl, $CF_3$, substituted or unsubstituted $C_1$ to $C_6$ alkoxy, partially fluorinated $C_1$ to $C_6$ alkoxy, perfluorinated $C_1$ to $C_6$ alkoxy, $OCF_3$, substituted or unsubstituted $C_6$ to $C_{30}$ aryloxy, partially fluorinated $C_6$ to $C_{30}$ aryloxy, perfluorinated $C_6$ to $C_{30}$ aryloxy, substituted or unsubstituted $C_6$ to $C_{30}$ aryl, substituted or unsubstituted $C_3$ to $C_{30}$ heteroaryl, CN, isocyano, SCN, OCN, $NO_2$, $SF_5$, wherein the substituents are selected from D, halogen, Cl, F, partially fluorinated $C_1$ to $C_6$ alkyl, perfluorinated $C_1$ to $C_6$ alkyl, $CF_3$, partially fluorinated $C_1$ to $C_6$ alkoxy, perfluorinated $C_1$ to $C_6$ alkoxy, $OCF_3$, CN, isocyano, SCN, OCN, $NO_2$, $SF_5$, $B^1$ and $B^2$ are independently of each other selected from N, $CR^{5A'}$, or $CR^{6A'}$, wherein $CR^{5A'}$, or $CR^{6A'}$ are each independently selected from other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, wherein the one or more substituents on $CR^{5A'}$, or $CR^{6A'}$ are independently selected from each other from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from each other from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

17. The organic electroluminescent device according to claim 14, wherein A of formula (IV) is selected from a group of E1 to E27, E44 to E46, E59, E50, E66 to E72:

(E1)

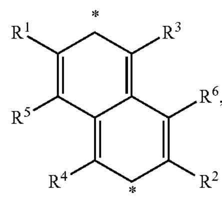

(E2)

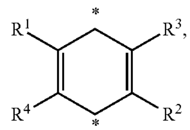

(E3)

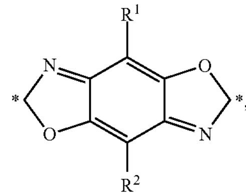

-continued
(E4)
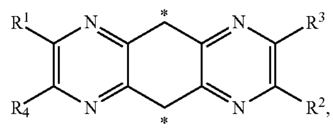
(E5)
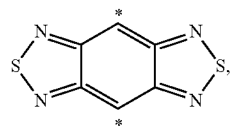
(E6)
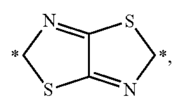
(E7)
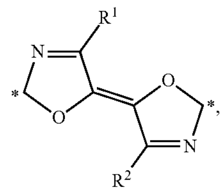
(E8)
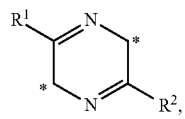
(E9)
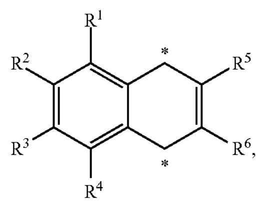
(E10)
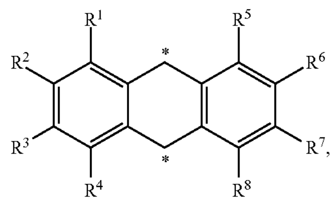
(E11)
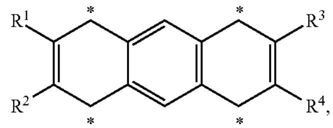
(E12)
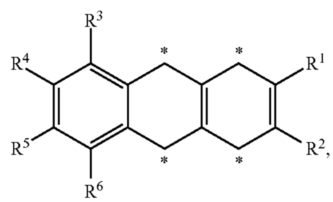
-continued
(E13)
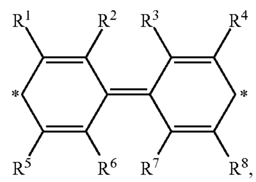
(E14)
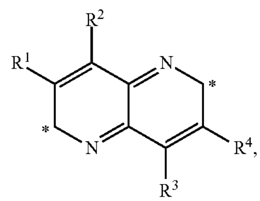
(E15)
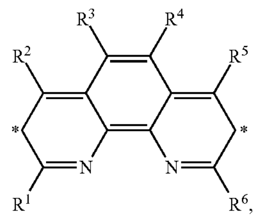
(E16)
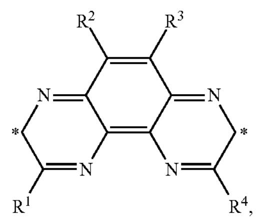
(E17)
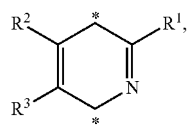
(E18)
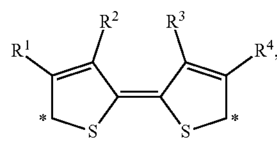
(E19)
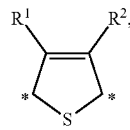
(E20)
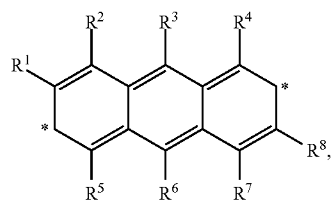

-continued
(E21)
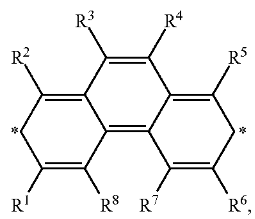
(E22)
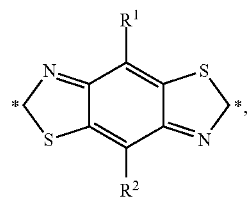
(E23)
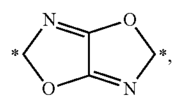
(E24)
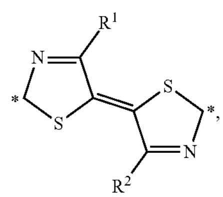
(E25)
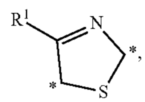
(E26)
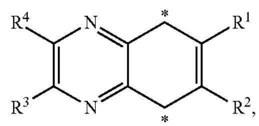
(E27)
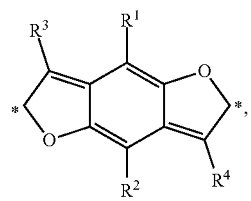
(E44)
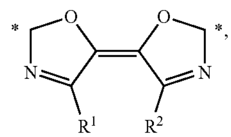
(E45)
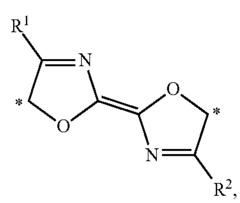
-continued
(E46)
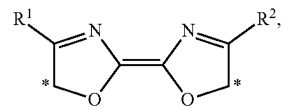
(E49)
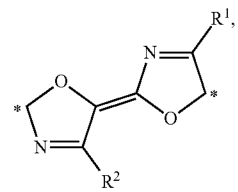
(E50)
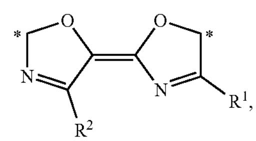
(E66)
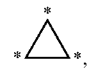
(E67)
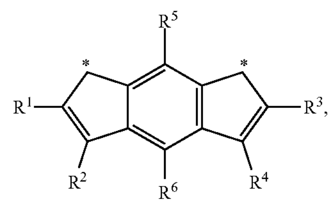
(E68)
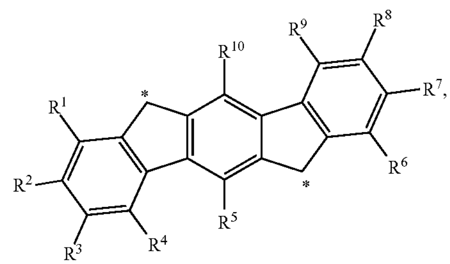
(E69)
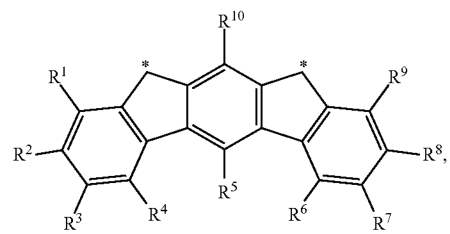
(E70)
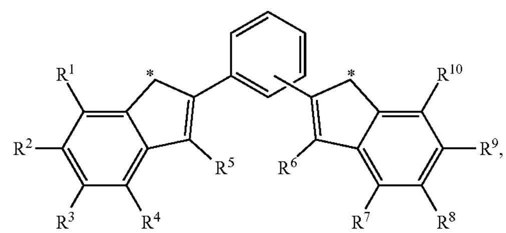

-continued (E71)

(E72)

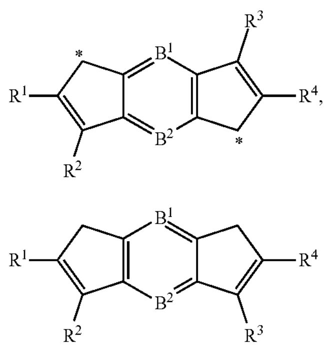

wherein the asterisk "*" denotes the binding position;

$R^1$, $R^2$, $R^3$, $R^4$, $R^5$, $R^6$, $R^7$ and $R^8$ are independently selected from H, D, halogen, Cl, F, substituted or unsubstituted $C_1$ to $C_6$ alkyl, partially fluorinated $C_1$ to $C_6$ alkyl, perfluorinated $C_1$ to $C_6$ alkyl, $CF_3$, substituted or unsubstituted $C_1$ to $C_6$ alkoxy, partially fluorinated $C_1$ to $C_6$ alkoxy, perfluorinated $C_1$ to $C_6$ alkoxy, $OCF_3$, substituted or unsubstituted $C_6$ to $C_{30}$ aryloxy, partially fluorinated $C_6$ to $C_{30}$ aryloxy, perfluorinated $C_6$ to $C_{30}$ aryloxy, substituted or unsubstituted $C_6$ to $C_{30}$ aryl, substituted or unsubstituted $C_3$ to $C_{30}$ heteroaryl, CN, isocyano, SCN, OCN, $NO_2$, $SF_5$, wherein the substituents are selected from D, halogen, Cl, F, partially fluorinated $C_1$ to $C_6$ alkyl, perfluorinated $C_1$ to $C_6$ alkyl, $CF_3$, partially fluorinated $C_1$ to $C_6$ alkoxy, perfluorinated $C_1$ to $C_6$ alkoxy, $OCF_3$, CN, isocyano, SCN, OCN, $NO_2$, $SF_5$, $B^1$ and $B^2$ are independently of each other selected from N, $CR^{5A'}$, or $CR^{6A'}$, wherein $CR^{5A'}$, or $CR^{6A'}$ are each independently selected from each other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, or at least one among $R^1$ to $R^6$ comprises CN, wherein the one or more substituents on $CR^{5A'}$, or $CR^{6A'}$ are independently of each other selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently of each other selected from D, an electron-withdrawing group, halogen, Cl, F, CN, $-NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

18. The organic electroluminescent device according to claim 1, wherein the dopant selected from the group comprising a first organic p-dopant or a second organic p-dopant is selected from a compound of formula (V):

(V)

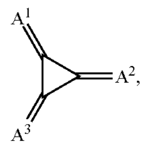

wherein in formula (V)

$A^1$ is independently selected from a group of formula (Va):

(Va)

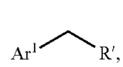

wherein $Ar^1$ is independently selected from substituted or unsubstituted aryl and substituted or unsubstituted heteroaryl, wherein for the case that $Ar^1$ is substituted, one or more of the substituents are independently selected from the group consisting of D, an electron-withdrawing group, halogen, Cl, F, CN, $-NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, $-NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$A^2$ is independently selected from a group of formula (Vb):

(Vc)

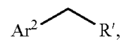

wherein $Ar^2$ is independently selected from substituted or unsubstituted aryl and substituted or unsubstituted heteroaryl, wherein for the case that $Ar^2$ is substituted, one or more of the substituents are independently selected from the group consisting of D, an electron-withdrawing group, halogen, Cl, F, CN, $-NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$A^3$ is independently selected from a group of formula (Vc)

(Vc)

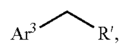

wherein $Ar^3$ is independently selected from substituted or unsubstituted aryl and substituted or unsubstituted heteroaryl, wherein for the case that $Ar^3$ is substituted, one or more of the substituents are independently selected from the group consisting of D, an electron-withdrawing group, halogen, Cl, F, CN, —$NO_2$, substituted or unsubstituted $C_1$ to $C_8$ alkyl, partially fluorinated $C_1$ to $C_8$ alkyl, perfluorinated $C_1$ to $C_8$ alkyl, substituted or unsubstituted $C_1$ to $C_8$ alkoxy, partially fluorinated $C_1$ to $C_8$ alkoxy, perfluorinated $C_1$ to $C_8$ alkoxy, substituted or unsubstituted $C_6$ to $C_{30}$ aryl, and substituted or unsubstituted $C_6$ to $C_{30}$ heteroaryl, and wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

wherein in $A^1$, $A^2$, $A^3$ each R' is independently selected from substituted or unsubstituted $C_6$ to $C_{18}$ aryl, $C_3$ to $C_{18}$ heteroaryl, electron-withdrawing group, substituted or unsubstituted $C_1$ to $C_8$ alkyl, partially fluorinated $C_1$ to $C_8$ alkyl, perfluorinated $C_1$ to $C_8$ alkyl, halogen, F and CN.

19. The organic electroluminescent device according to claim 18, wherein the compound of formula (V) comprises at least two groups selected from $C_6$ to $C_{19}$ aryl groups, or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

20. The organic electroluminescent device according to claim 1, wherein the first organic p-dopant is selected from a compound comprising a quinoid structure, an indacenedione structure or a compound of formula (IV):

(IV)

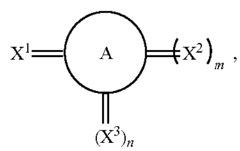

n is an integer including 0, 1, 2, 3, 4, 5 or 6;

m is an integer selected from 0 or 1;

$X^1$, $X^2$ and $X^3$ are independently selected from O, S, $CR^{1a}R^{2a}$, $CR^{1b}R^{2b}$, $NR^{3a}$, $NR^{3b}$ or at least one of $X^1$, $X^2$, and $X^3$ form a fused ring with A, and wherein each $X^3$ is selected the same or different, $R^{1a}$, $R^{2a}$, $R^{1b}$, and $R^{2b}$ are independently selected from an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted aryl, substituted or unsubstituted heteroaryl, wherein the one or more substituents on $R^{1a}$, $R^{2a}$, $R^{1b}$, and $R^{2b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$R^{3a}$ and $R^{3b}$ is selected from an electron-withdrawing group, CN, partially fluorinated $C_1$ to $C_6$ alkyl, perfluorinated $C_1$ to $C_6$ alkyl, $CF_3$, substituted or unsubstituted $C_6$ to $C_{30}$ aryl, or substituted or unsubstituted $C_3$ to $C_{30}$ heteroaryl, wherein the one or more substituents on $R^{3a}$ and $R^{3b}$ are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl;

wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

A is selected from substituted or unsubstituted $C_3$ to $C_{40}$ cycloalkane group containing at least one or more double-bonds, substituted or unsubstituted $C_3$ to $C_{40}$ cycloalkene group, substituted or unsubstituted $C_2$ to $C_{40}$ heterocycloalkane group, substituted or unsubstituted $C_2$ to $C_{40}$ heterocycloalkane group containing one or more double-bonds, substituted or unsubstituted $C_2$ to $C_{40}$ heterocycloalkene group, substituted or unsubstituted $C_6$ to $C_{40}$ aromatic group, substituted or unsubstituted $C_2$ to $C_{40}$ heteroaromatic group, wherein $X^1$, $X^2$, and/or $X^3$ are conjugated to each other via a double-bond in A;

wherein the substituent on A are independently selected from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, substituted or unsubstituted $C_2$ to $C_{30}$ heteroaryl, wherein the substituent of $C_6$ to $C_{30}$ aryl, $C_6$ to $C_{30}$ heteroaryl, $C_1$ to $C_8$ alkyl, $C_1$ to $C_8$ alkoxy are independently selected from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy.

21. The organic electroluminescent device according to claim 20, wherein the compound of formula (IV) comprises at least two groups selected from substituted $C_6$ to $C_{19}$ aryl group or substituted $C_3$ to $C_{12}$ heteroaryl group, wherein each of the substituted $C_6$ to $C_{19}$ aryl group or substituted $C_3$ to $C_{12}$ heteroaryl group is substituted with a substituent independently selected from halogen, F, CN, partially perfluorinated $C_1$ to $C_{12}$ alkyl, perfluorinated $C_1$ to $C_{12}$ alkyl, or $CF_3$.

22. The organic electroluminescent device according to claim 1, wherein the second organic p-dopant is selected from a compound comprising a indacenedione group, a radialene from a compound of formula (V), from a compound of formula (IV), or a compound of formula (VIa) or (VIb):

(VIa)

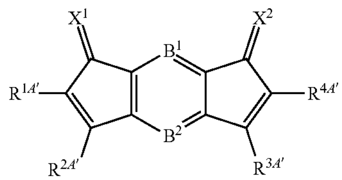

(VIb)

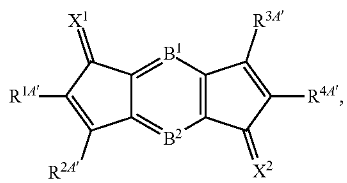

wherein $B^1$ and $B^2$ are independently of each other selected from N, $CR^{5A'}$ or $CR^{6A'}$;

$R^{1A'}$, $R^{2A'}$, $R^{3A'}$, $R^{4A'}$, $R^{IA'}$, and $R^{6A'}$ are independently selected from each other from H, D, F, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$, or at least one among $R^1$ to $R^6$ comprises CN, wherein the one or more substituents on $CR^{5A'}$, or $CR^{6A'}$ are independently selected from each other from D, an electron-withdrawing group, halogen, Cl, F, substituted or unsubstituted $C_1$ to $C_8$ alkyl, partially fluorinated $C_1$ to $C_8$ alkyl, perfluorinated $C_1$ to $C_8$ alkyl, $CF_3$, substituted or unsubstituted $C_1$ to $C_8$ alkoxy, partially fluorinated $C_1$ to $C_8$ alkoxy, perfluorinated $C_1$ to $C_8$ alkoxy, $OCF_3$, CN, isocyano, SCN, OCN, $NO_2$, $SF_5$, substituted or unsubstituted $C_6$ to $C_{30}$ aryl, and substituted or unsubstituted $C_6$ to $C_{30}$ heteroaryl, wherein the one or more substituents of $C_6$ to $C_{30}$ aryl, $C_6$ to $C_{30}$ heteroaryl, $C_1$ to $C_8$ alkyl, $C_1$ to $C_8$ alkoxy are independently selected from each other from D, an electron-withdrawing group, halogen, Cl, F, CN, —$NO_2$, isocyano, SCN, OCN, $SF_5$, partially fluorinated $C_1$ to $C_8$ alkyl, perfluorinated $C_1$ to $C_8$ alkyl, partially fluorinated $C_1$ to $C_8$ alkoxy, perfluorinated $C_1$ to $C_8$ alkoxy;

$X^1$ and $X^2$ are independently of each other selected from formula (VII)

(VII)

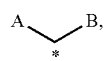

wherein

A and B are independently of each other is selected from H, D, a substituted or unsubstituted $C_6$ to $C_{12}$ aryl, a substituted or unsubstituted $C_1$ to $C_{12}$ heteroaryl with 1 to 4 heteroatoms one among O, N, S and Si, a substituted or unsubstituted $C_1$ to $C_{12}$ alkyl, a substituted or unsubstituted $C_1$ to $C_{12}$ alkoxy, a substituted or unsubstituted $C_1$ to $C_{12}$ ether group, CN, $CF_3$, $OCF_3$, halogen, Cl, F, $Si(CH_3)_3$.

23. The organic electroluminescent device according to claim 22, wherein the compound of formula (VIa) or (VIb) comprises at least two groups selected from $C_6$ to $C_{19}$ aryl group or $C_3$ to $C_{12}$ heteroaryl group, wherein each of the $C_6$ to $C_{19}$ aryl group or $C_3$ to $C_{12}$ heteroaryl group is substituted, wherein the one or more substituents are independently of each other selected from halogen, F, CN, partially perfluorinated $C_1$ to $C_{12}$ alkyl, perfluorinated $C_1$ to $C_{12}$ alkyl, $CF_3$.

24. The organic electroluminescent device according to claim 1, wherein the compound of formula (VIa) or (VIb) is selected from a compound F1 to F10:

(F1)

(F2)

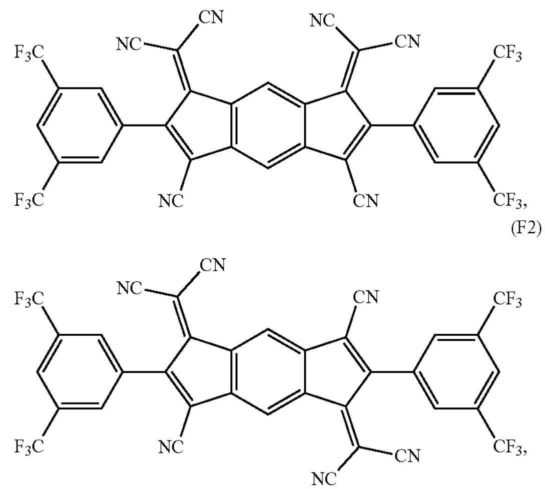

-continued
(F3)
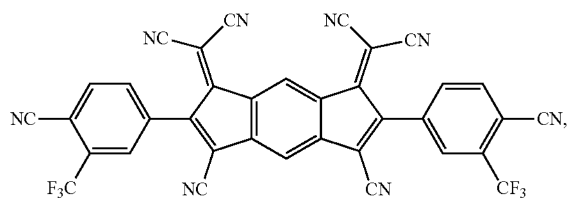
(F4)
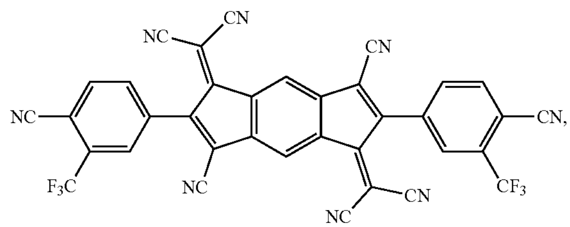
(F5)
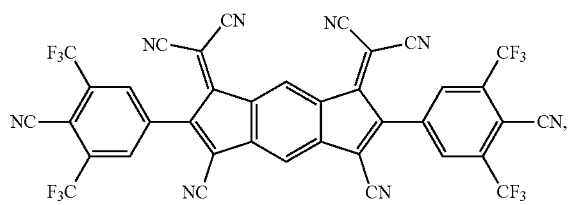
(F6)
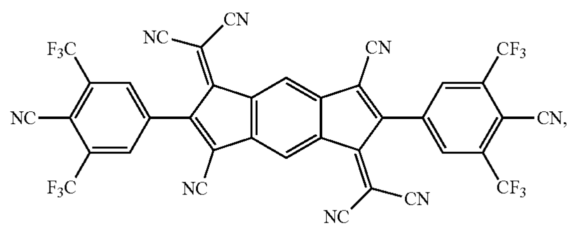
(F7)
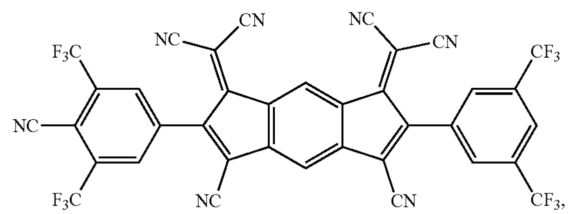
(F8)
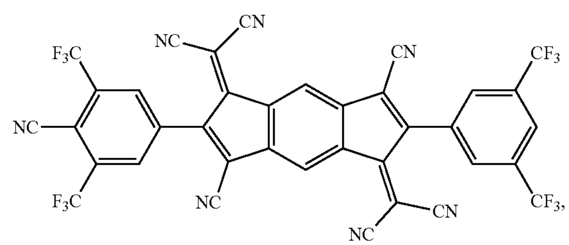
-continued
(F9)
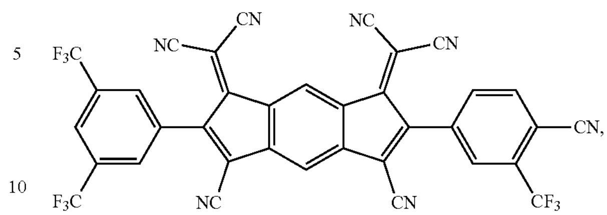
(F10)
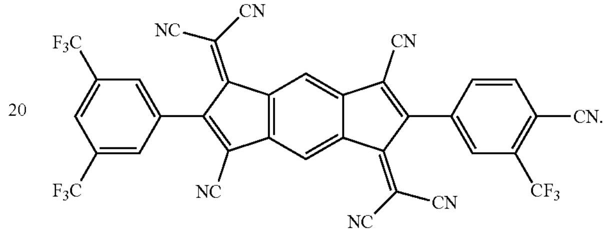
25. The organic electroluminescent device according to claim 1, wherein the dopant selected from the group comprising a first organic p-dopant or a second p-dopant are selected from a compound selected from the group of G1 to G25:
(G1)
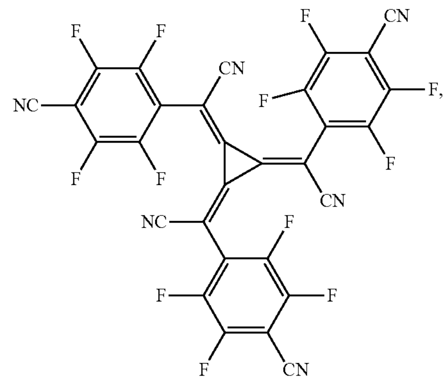
(G2)
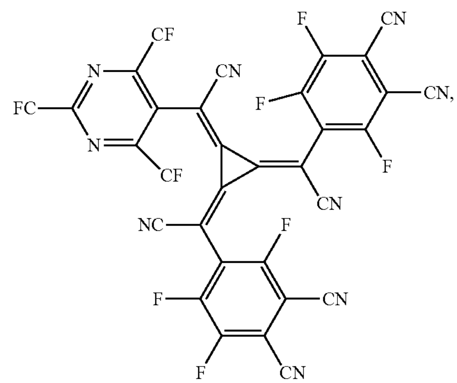

-continued
(G3)
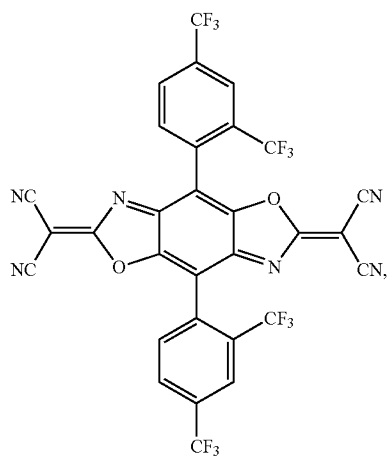
(G4)
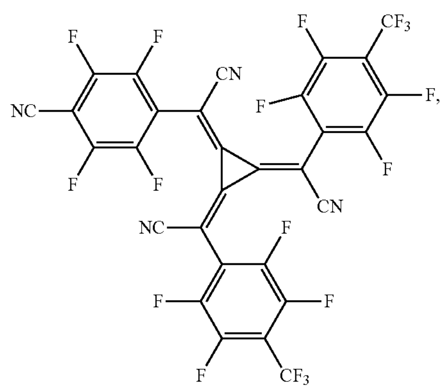
(G5)
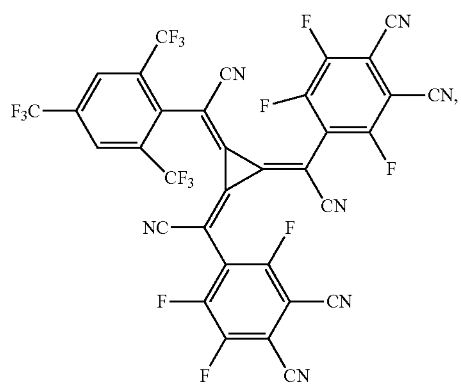
(G6)
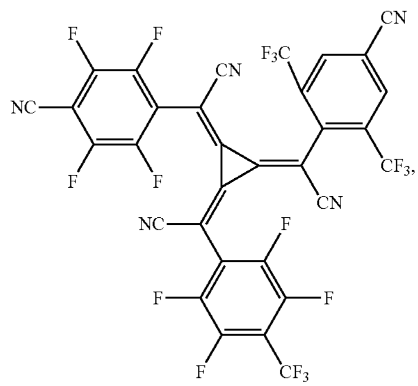
-continued
(G7)
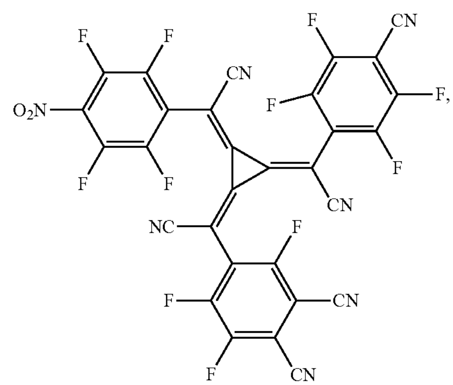
(G8)
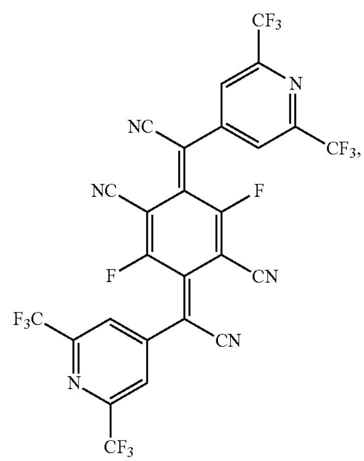
(G9)
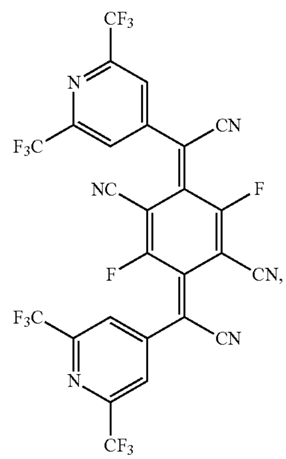

-continued
(G10)
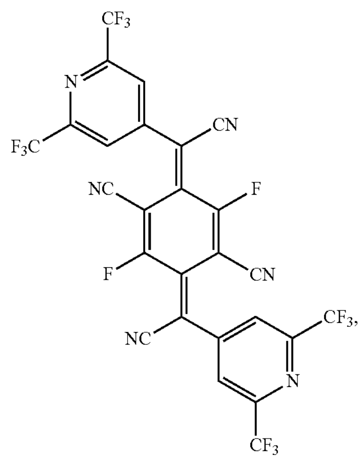
(G11)
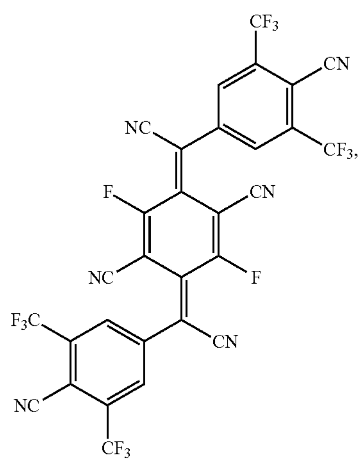
(G12)
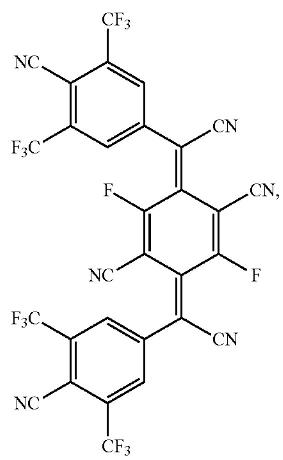
(G13)
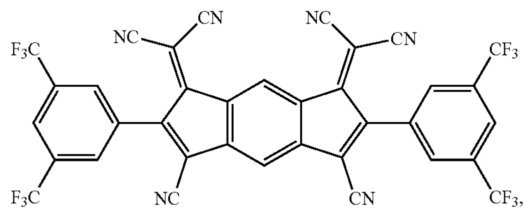
-continued
(G14)
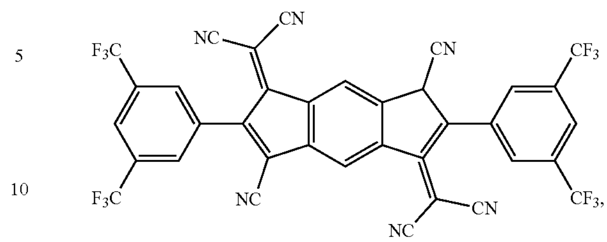
(G15)
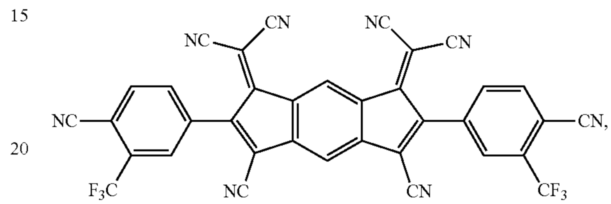
(G16)
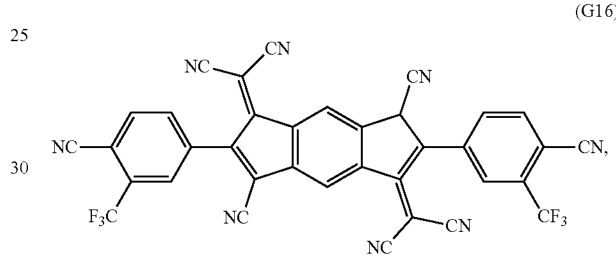
(G17)
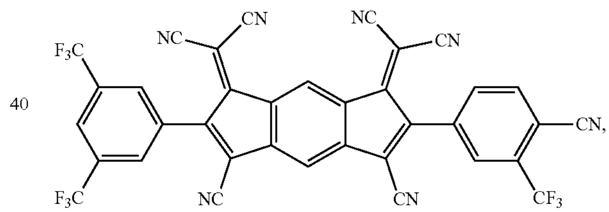
(G18)
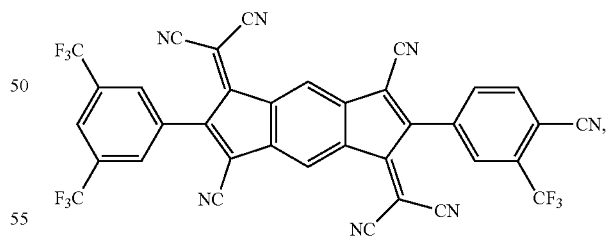
(G19)
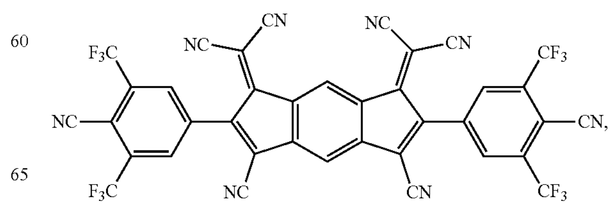

-continued
(G20)
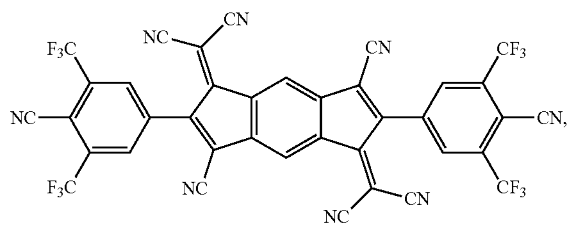
(G21)
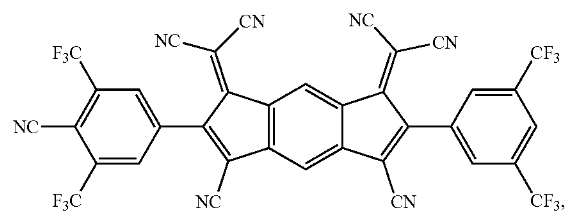
(G22)
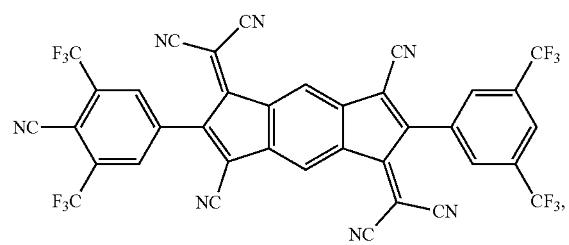
(G23)
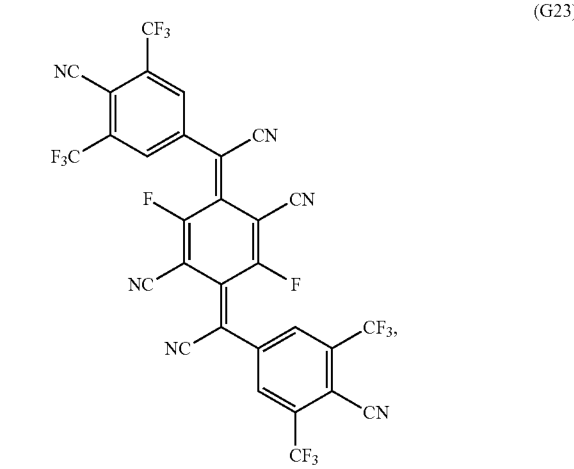
(G24)
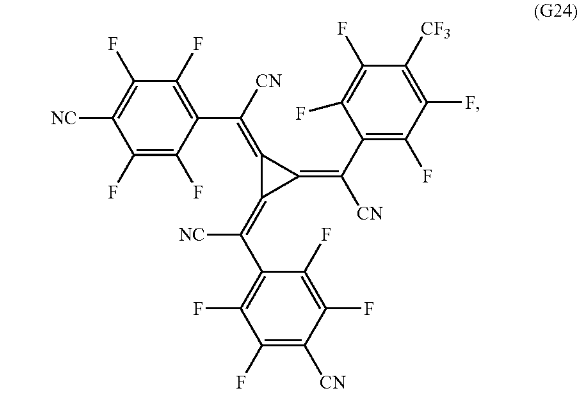
-continued
(G25)
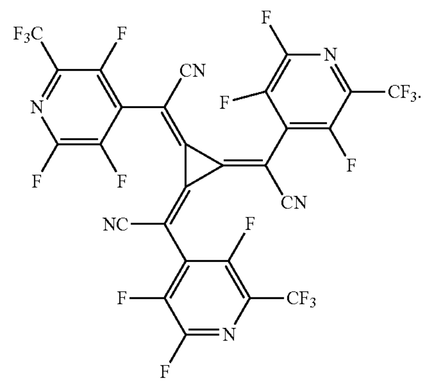
26. The organic electroluminescent device according to claim 1, wherein the matrix compound selected from the group of a first hole transport matrix compound and a second hole transport matrix compound of formula (Ia) or formula (Ib) are selected from a compound of V1 to V19:
(V1)
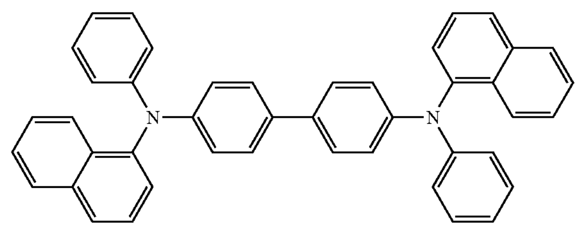
(V2)
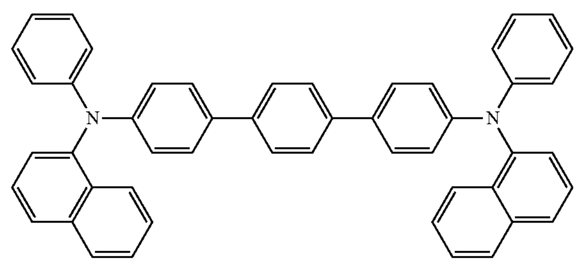

-continued
(V3)
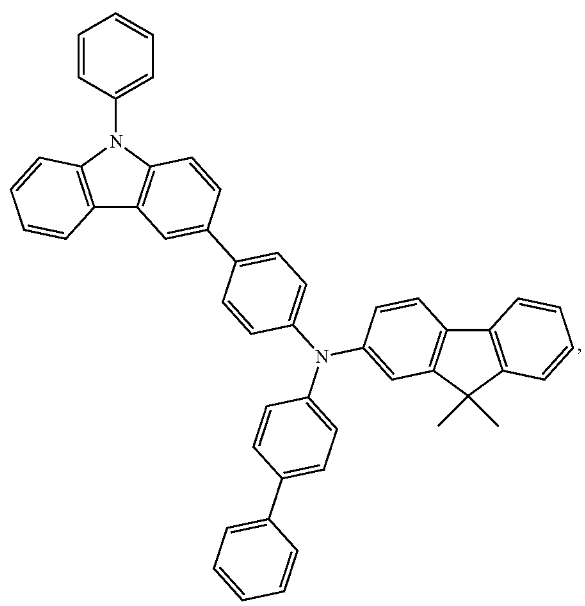
,
(V4)
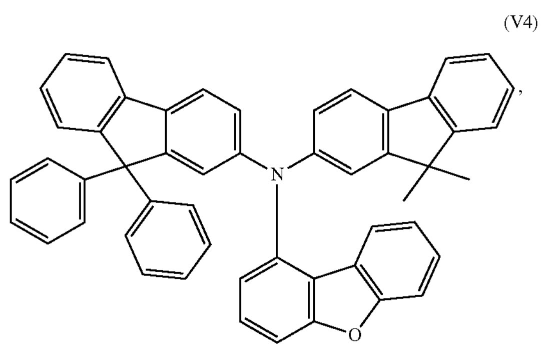
,
(V5)
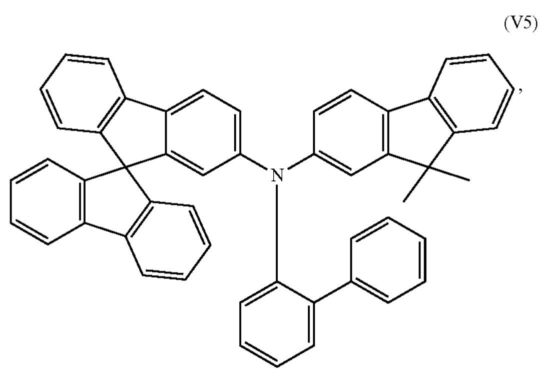
,
(V6)
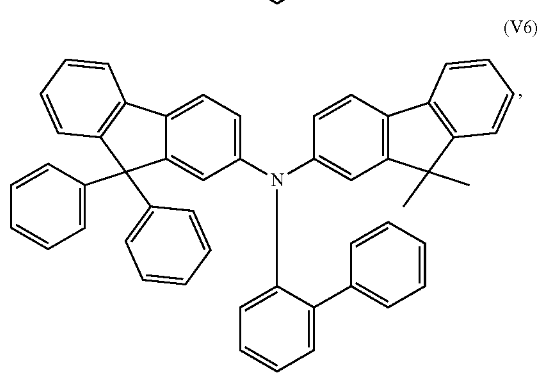
,
-continued
(V7)
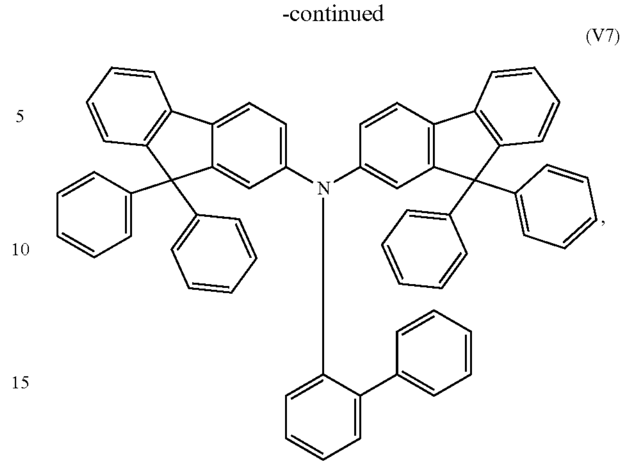
,
(V8)
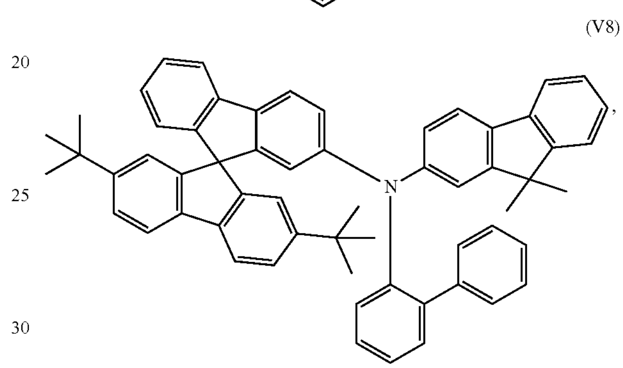
,
(V9)
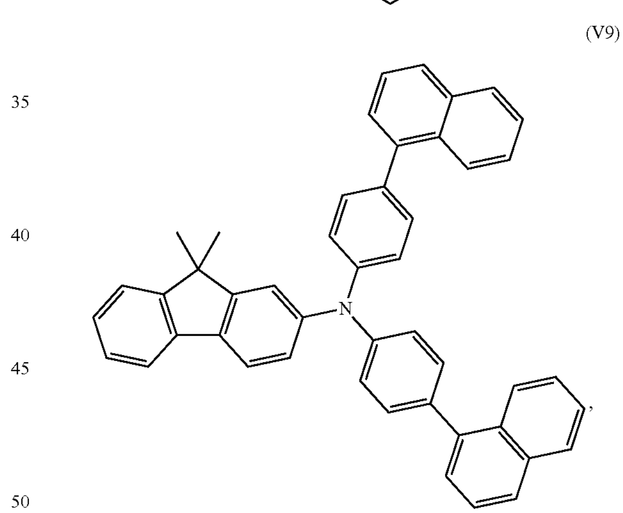
,
(V10)
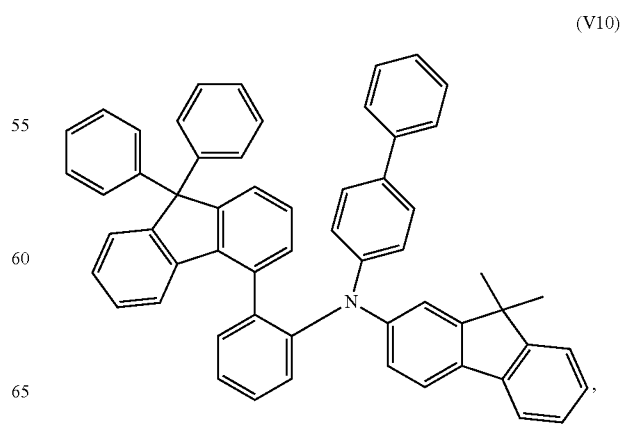
, -continued
(V11)
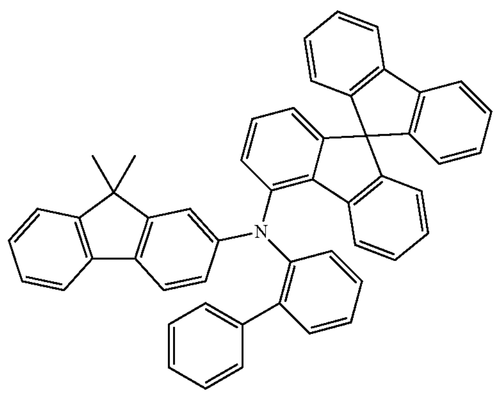
(V12)
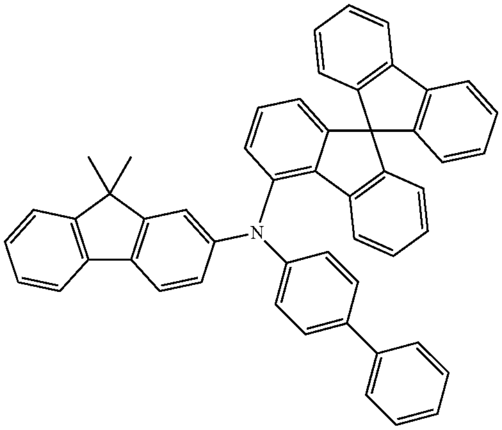
(V13)
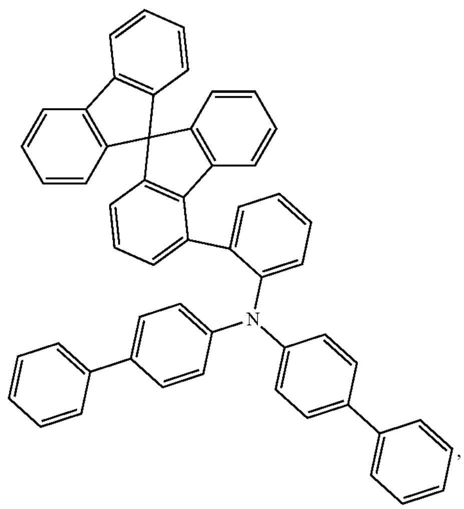
-continued
(V14)
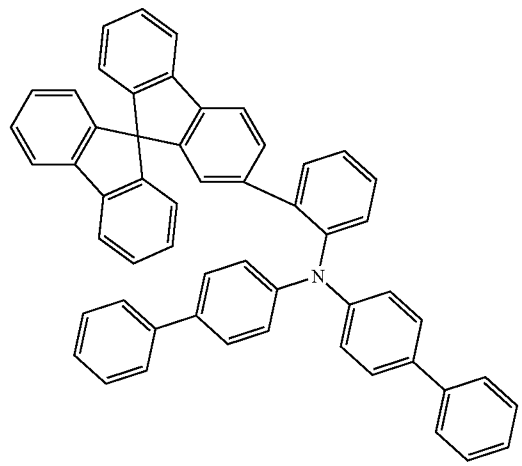
(V15)
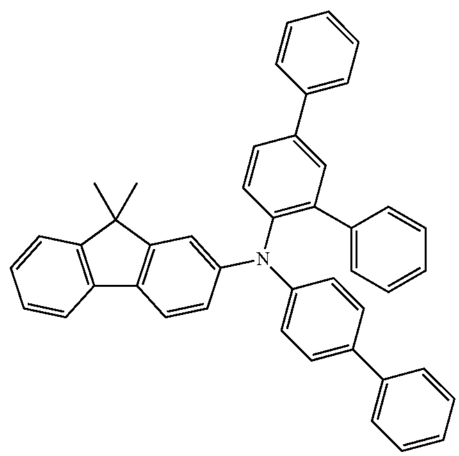
(V16)
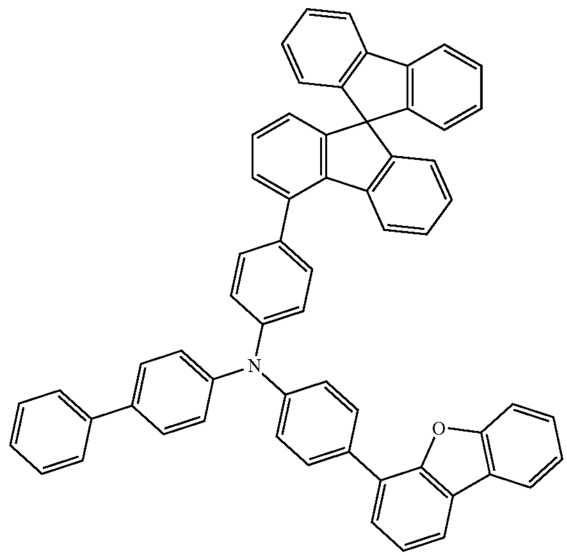

-continued (V17)

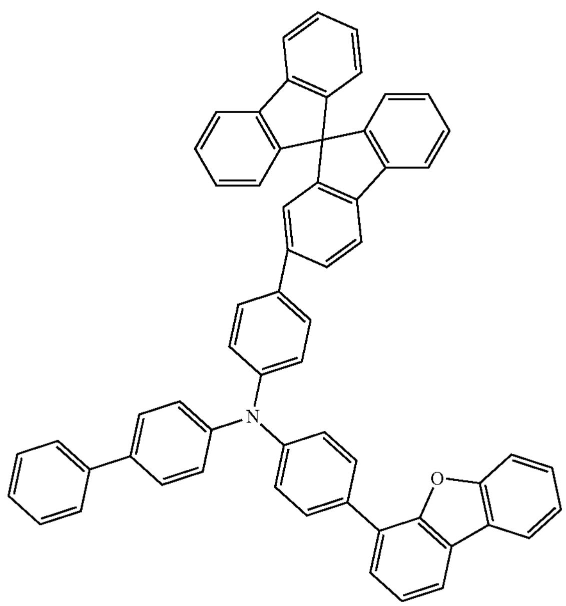

, (V18)

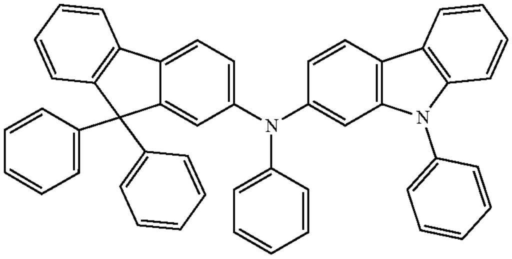

,

-continued (V19)

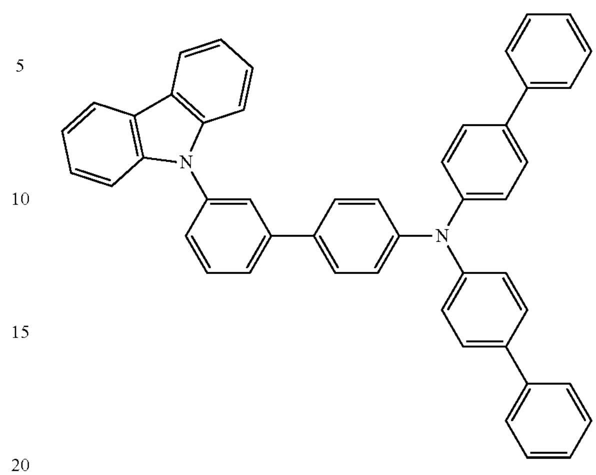

.

27. The organic electroluminescent device according to claim 1, wherein the hole injection layer is in direct contact with the anode layer.

28. The organic electroluminescent device according to claim 1, wherein the electron injection layer is in direct contact with the cathode layer.

29. The organic electroluminescent device according to claim 1, wherein the first electron transport layer is in direct contact with the first emission layer.

30. The organic electroluminescent device according to claim 1, wherein the first electron transport layer is in direct contact with the first n-type charge generation layer.

31. The organic electroluminescent device according to claim 1, wherein the first electron transport layer is in direct contact with the first n-type charge generation layer, wherein the first electron transport layer is in direct contact with the first emission layer; a first charge generation layer is disposed over the first electron transport layer, wherein the first charge generation layer comprises a first n-type charge generation layer, and a first p-type charge generation layer, wherein the n-type charge generation layer comprises an electron transport matrix compound.

32. The organic electroluminescent device of claim 1, whereby the organic electroluminescent device is an organic light emitting diode.

33. An electronic device comprising an organic electroluminescent device according to claim 1, wherein the electronic device is selected from the group comprising a display device, a light emitting device, a thin film transistor, a battery, a display device or a photovoltaic device.

* * * * *